US010903230B2

(12) United States Patent
Kaminaga et al.

(10) Patent No.: US 10,903,230 B2
(45) Date of Patent: Jan. 26, 2021

(54) THREE-DIMENSIONAL MEMORY DEVICE CONTAINING THROUGH-MEMORY-LEVEL CONTACT VIA STRUCTURES AND METHOD OF MAKING THE SAME

(71) Applicant: SANDISK TECHNOLOGIES LLC, Addison, TX (US)

(72) Inventors: Michimoto Kaminaga, Nagoya (JP); Zhixin Cui, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/181,721

(22) Filed: Nov. 6, 2018

(65) Prior Publication Data

US 2019/0252403 A1 Aug. 15, 2019

Related U.S. Application Data

(63) Continuation-in-part of application No. 15/950,505, filed on Apr. 11, 2018, now Pat. No. 10,304,852.

(Continued)

(51) Int. Cl.
*H01L 27/11582* (2017.01)
*H01L 27/1157* (2017.01)

(Continued)

(52) U.S. Cl.
CPC .. *H01L 27/11582* (2013.01); *H01L 21/76831* (2013.01); *H01L 21/76832* (2013.01);

(Continued)

(58) Field of Classification Search
CPC ........... H01L 27/11582; H01L 27/1157; H01L 27/11573; H01L 27/11565;

(Continued)

(56) References Cited

U.S. PATENT DOCUMENTS 5,915,167 A 6/1999 Leedy
8,193,571 B2 6/2012 Katsumata et al.

(Continued)

OTHER PUBLICATIONS

International Search Report and Written Opinion of the International Search Authority for International Patent Application No. PCT/US2018/061854, dated Mar. 11, 2019, 13 pages.

(Continued)

*Primary Examiner* — Khiem D Nguyen
(74) *Attorney, Agent, or Firm* — The Marbury Law Group, PLLC

(57) ABSTRACT

A contact via structure vertically extending through an alternating stack of insulating layers and electrically conductive layers is provided in a staircase region having stepped surfaces. The contact via structure is electrically isolated from each electrically conductive layer of the alternating stack except for an electrically conductive layer that directly underlies a horizontal interface of the stepped surfaces. A laterally-insulated structure includes a conductive via structure having an upper conductive via portion overlying and contacting an annular area of a top surface of one of the electrically conductive layers, a lower conductive via portion having a lesser lateral dimension than the upper conductive via portion and extending through at least a bottommost one of the electrically conductive layers, and an interconnection conductive via portion located between the upper conductive via portion and the lower conductive via portion and contacting a cylindrical sidewall of the one of the electrically conductive layers.

20 Claims, 121 Drawing Sheets

Related U.S. Application Data

(60) Provisional application No. 62/630,930, filed on Feb. 15, 2018.

(51) Int. Cl.

| | |
|---|---|
| ***H01L 27/11573*** | (2017.01) |
| ***H01L 27/11565*** | (2017.01) |
| ***H01L 21/768*** | (2006.01) |
| ***H01L 27/11556*** | (2017.01) |
| ***H01L 23/532*** | (2006.01) |
| ***H01L 23/522*** | (2006.01) |
| ***H01L 27/11575*** | (2017.01) |
| *H01L 27/11519* | (2017.01) |
| *H01L 27/11524* | (2017.01) |
| *H01L 27/11526* | (2017.01) |

(52) U.S. Cl.
CPC .. *H01L 21/76877* (2013.01); *H01L 21/76897* (2013.01); *H01L 23/5226* (2013.01); *H01L 23/53295* (2013.01); *H01L 27/1157* (2013.01); *H01L 27/11556* (2013.01); *H01L 27/11565* (2013.01); *H01L 27/11573* (2013.01); *H01L 27/11575* (2013.01); *H01L 21/76805* (2013.01); *H01L 27/11519* (2013.01); *H01L 27/11524* (2013.01); *H01L 27/11526* (2013.01)

(58) Field of Classification Search
CPC ......... H01L 27/11556; H01L 27/11519; H01L 21/76831; H01L 21/76877; H01L 21/76897; H01L 27/11524; H01L 27/11529; H01L 27/11575; H01L 21/76805; H01L 21/76832; H01L 23/5226; H01L 23/53295
See application file for complete search history.

(56) References Cited

U.S. PATENT DOCUMENTS 8,395,190 B2 3/2013 Shim et al.
8,890,235 B2 11/2014 Kidoh et al.
8,912,060 B2 12/2014 Uenaka et al.
9,412,749 B1 8/2016 Shimabukuro et al.
9,455,267 B2 9/2016 Zhang et al.
9,466,531 B2 10/2016 Freeman et al.
9,570,463 B1 2/2017 Zhang et al.
9,576,967 B1 2/2017 Kimura et al.
9,627,403 B2 4/2017 Liu et al.
9,659,956 B1 5/2017 Pachamuthu et al.
9,673,213 B1 * 6/2017 Yu ......................... H01L 23/535
9,728,499 B2 8/2017 Shimabukuro et al.
9,728,547 B1 * 8/2017 Ohsaki .............. H01L 21/02178
9,754,963 B1 9/2017 Kawamura et al.
9,786,681 B1 10/2017 Ariyoshi
9,806,093 B2 10/2017 Toyama et al.
9,853,038 B1 12/2017 Cui
9,881,929 B1 1/2018 Ravikirthi et al.
9,978,766 B1 5/2018 Hosoda et al.
9,991,280 B2 6/2018 Nakamura et al.
10,014,316 B2 7/2018 Yu et al.
10,038,006 B2 7/2018 Furihata et al.
10,090,321 B2 10/2018 Nakajima
2006/0110880 A1 5/2006 Yuan
2009/0230449 A1 9/2009 Sakaguchi et al.
2010/0090188 A1 4/2010 Futatsuyama
2010/0133598 A1 6/2010 Chae et al.
2010/0213527 A1 8/2010 Shim et al.
2010/0224962 A1 9/2010 Kim
2010/0254191 A1 10/2010 Son et al.
2011/0031546 A1 2/2011 Uenaka et al.
2011/0065272 A1 3/2011 Mizukami et al.
2011/0198687 A1 8/2011 Lee
2011/0248327 A1 10/2011 Son et al.
2011/0266606 A1 11/2011 Park et al.
2012/0061744 A1 3/2012 Hwang et al.
2012/0098050 A1 4/2012 Shim et al.
2012/0181701 A1 7/2012 Chen et al.
2012/0306090 A1 12/2012 Smith et al.
2013/0313627 A1 * 11/2013 Lee ................... H01L 21/76816 257/324
2014/0042519 A1 2/2014 Lee
2014/0092686 A1 4/2014 Shim et al.
2014/0192594 A1 7/2014 Lue
2014/0231954 A1 8/2014 Lue
2015/0055413 A1 2/2015 Alsmeier
2015/0076586 A1 3/2015 Rabkin et al.
2015/0115455 A1 4/2015 Chen
2015/0155292 A1 6/2015 Son et al.
2015/0179662 A1 6/2015 Makala et al.
2015/0187425 A1 7/2015 Nam et al.
2015/0236038 A1 8/2015 Pachamuthu et al.
2016/0049421 A1 2/2016 Zhang et al.
2016/0086969 A1 3/2016 Zhang et al.
2016/0329341 A1 11/2016 Shimabukuro et al.
2017/0110402 A1 * 4/2017 Smith ............... H01L 27/11548
2017/0179026 A1 6/2017 Toyama et al.
2017/0179151 A1 6/2017 Kai et al.
2017/0236835 A1 8/2017 Nakamura et al.
2017/0287926 A1 10/2017 Ariyoshi
2017/0358590 A1 * 12/2017 Kang ................ H01L 27/11575
2017/0373087 A1 * 12/2017 Ito ..................... H01L 27/11582
2017/0373197 A1 * 12/2017 Sharangpani ..... H01L 27/11565
2018/0040627 A1 * 2/2018 Kanakamedala ............................ H01L 27/11582
2018/0108671 A1 4/2018 Yu et al.
2018/0130812 A1 5/2018 Hosoda et al.
2018/0138194 A1 * 5/2018 Shigemura ........ H01L 21/28008
2018/0151588 A1 * 5/2018 Tsutsumi .......... H01L 27/11582
2018/0182771 A1 6/2018 Costa et al.
2018/0277596 A1 * 9/2018 Mori ..................... H01L 27/249

OTHER PUBLICATIONS

Office Action for U.S. Appl. No. 15/950,505, dated Nov. 15, 2018, 14 pages.

U.S. Appl. No. 15/877,219, filed Jan. 22, 2018, SanDisk Technologies LLC.

U.S. Appl. No. 15/902,169, filed Feb. 22, 2018, SanDisk Technologies LLC.

Endoh et al., "Novel Ultra High Density Memory with a Stacked-Surrounding Gate Transistor (S-SGT) Structured Cell," IEDM Proc., (2001), 33-36.

International Searching Authority, Invitation to Pay Additional Fees and Partial International Search for PCT/US2015/048513, dated Dec. 1, 2015, 8 pages.

USPTO Office Communication, Non-Final Office Action for U.S. Appl. No. 16/251,780, dated Sep. 18, 2019, 19 pages.

USPTO Office Communication, Non-Final Office Action for U.S. Appl. No. 16/589,337, dated Feb. 6, 2020, 20 pages.

USPTO Office Communication, Non Final Office Action for U.S. Appl. No. 16/589,337, dated Aug. 4, 2020, 27 pages.

USPTO Office Communication, Non Final Office Action for U.S. Appl. No. 16/881,353, dated Sep. 3, 2020, 21 pages.

* cited by examiner

THREE-DIMENSIONAL MEMORY DEVICE CONTAINING THROUGH-MEMORY-LEVEL CONTACT VIA STRUCTURES AND METHOD OF MAKING THE SAME

RELATED APPLICATIONS

The present application is a continuation-in-part application of U.S. application Ser. No. 15/950,505 filed on Apr. 11, 2018, issued as U.S. Pat. No. 10,304,852, which claims priority from U.S. Provisional Application Ser. No. 62/630,930 filed on Feb. 15, 2018, the entire contents of which are incorporated herein by reference.

FIELD

The present disclosure relates generally to the field of semiconductor devices and specifically to a three-dimensional memory device including through-memory-level contact via structures and methods of making the same.

BACKGROUND

Recently, ultra-high density storage devices employing three-dimensional (3D) memory stack structures have been proposed. For example, a 3D NAND stacked memory device can be formed from an array of an alternating stack of insulating materials and spacer material layers that are formed as electrically conductive layers or replaced with electrically conductive layers over a substrate containing peripheral devices (e.g., driver/logic circuits). Memory openings are formed through the alternating stack, and are filled with memory stack structures, each of which includes a vertical stack of memory elements and a vertical semiconductor channel.

SUMMARY

According to an aspect of the present disclosure, a device structure is provided, which comprises:

According to another aspect of the present disclosure, a method of forming a device structure is provided, which comprises the steps of:

DETAILED DESCRIPTION

Figure 1A:
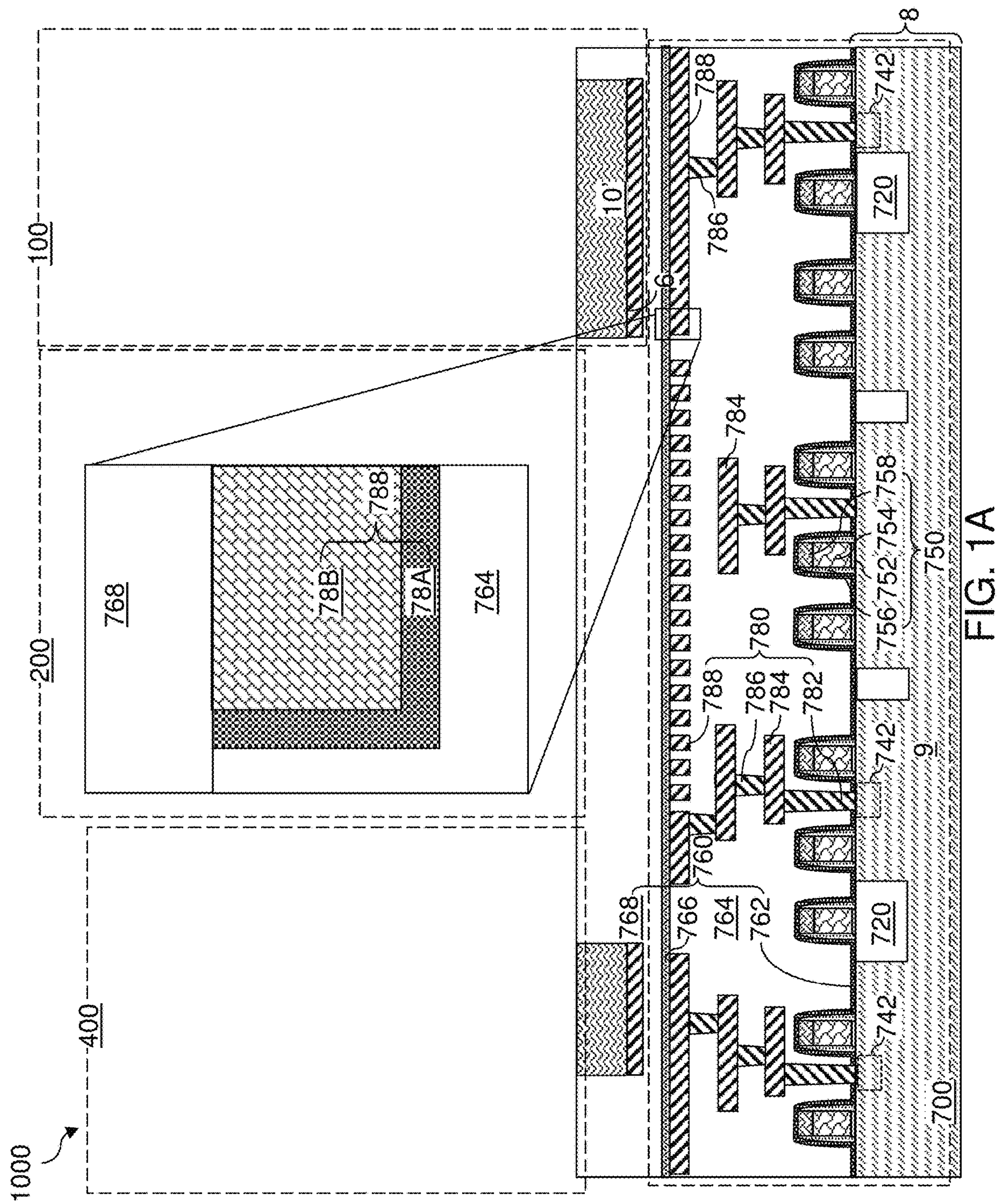
FIG. 1A is a vertical cross-sectional view of a first exemplary structure after formation of semiconductor devices, lower-level dielectric layers including a silicon nitride layer, lower-level metal interconnect structures, and in-process source-level material layers on a semiconductor substrate according to a first embodiment of the present disclosure.

Various interconnection structures are used to provide electrical connection between the electrically conducive lines of the alternating stack (which function as word lines) and the peripheral device provided underneath the alternating stack on a semiconductor substrate. Generally, such interconnect structures include word line contact via structures that vertically extend upward from stepped surfaces of the electrically conductive layers in a staircase region, metal line structures that are connected to an upper end of each word line contact via structure, and peripheral region interconnection via structures that vertically extend through a dielectric material portion that is laterally offset from the alternating stack. Further, in case the electrically conductive layers are formed by replacement of sacrificial material layers, formation of support pillar structures in the staircase region provides structural support during replacement of sacrificial material layers with the electrically conductive layers. This configuration increases the chip size and introduces additional processing steps, thereby increasing the total cost for manufacture of a three-dimensional memory device.

The number of word lines is expected to increase in future three-dimensional memory devices. Correspondingly, the contact area for forming word line contact via structures and support pillar structures, and additional area for providing peripheral region interconnection via structures are expected to increase in next generation three-dimensional memory devices. In addition, the depth of via cavities formed by reactive ion etching increases with an increase in the total number of electrically conductive layers, and the processing cost and the etch selectivity need to be addressed as well.

In view of the above, an embodiment of the present disclosure provides a combined support pillar/word line contact via structure/peripheral region interconnection via structure which provides structural support for the stack insulating layers during word line replacement step and also provides electrical contact between the word lines and underlying peripheral devices. This combined structure reduces the chip area and cost for interconnecting peripheral devices to word lines. As discussed above, the present disclosure is directed to a three-dimensional memory device including through-memory-level contact via structures and methods of making the same, the various aspect of which are described herein in detail.

As used herein, a “through-memory-level contact via structure” refers to a contact via structure that extends through a level including memory devices. As used herein, a “level” refers to a region defined by a volume between a pair of horizontal planes that are vertically offset by two different separation distances from a top surface of a substrate. The embodiments of the present disclosure can be used to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as “first,” “second,” and “third” are used merely to identify similar elements, and different ordinals may be used across the specification and the claims of the instant disclosure. As used herein, a first element located “on” a second element can be located on the exterior side of a surface of the second element or on the interior side of the second element. As used herein, a first element is located “directly on” a second element if there exist a physical contact between a surface of the first element and a surface of the second element. As used herein, an “in-process” structure or a “transient” structure refers to a structure that is subsequently modified.

As used herein, a “layer” refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a “memory level” or a “memory array level” refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulating material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

The various three-dimensional memory devices of the present disclosure include a monolithic three-dimensional NAND string memory device, and can be fabricated employing the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Figure 1B:
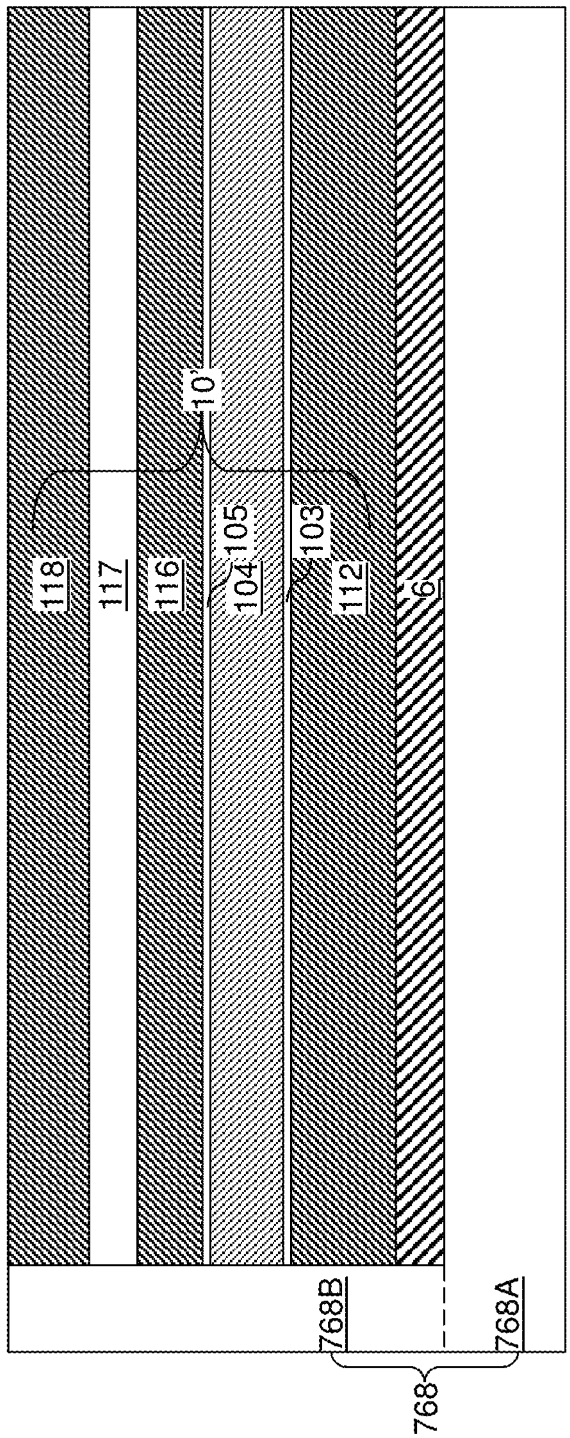
FIG. 1B is a magnified view of the in-process source-level material layers of FIG. 1A.

Referring to FIGS. 1A and 1B, a first exemplary structure according to the first embodiment of the present disclosure is illustrated. FIG. 1B is a magnified view of an in-process source-level material layers 10' illustrated in FIG. 1A. The first exemplary structure includes a semiconductor substrate 8, and semiconductor devices 710 formed thereupon. The semiconductor substrate 8 includes a substrate semiconductor layer 9 at least at an upper portion thereof. Shallow trench isolation structures 720 can be formed in an upper portion of the substrate semiconductor layer 9 to provide electrical isolation among the semiconductor devices. The semiconductor devices 710 can include, for example, field effect transistors including respective transistor active regions 742 (i.e., source regions and drain regions), channel regions 746 and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which is herein referred to as lower-level dielectric layers 760. The lower-level dielectric layers 760 constitute a dielectric layer stack in which each lower-level dielectric layer 760 overlies or underlies other lower-level dielectric layers 760. The lower-level dielectric layers 760 can include, for example, a dielectric liner 762 such as a silicon nitride liner that blocks diffusion of mobile ions and/or apply appropriate stress to underlying structures, at least one first dielectric material layer 764 that overlies the dielectric liner 762, a silicon nitride layer (e.g., hydrogen diffusion barrier) 766 that overlies the dielectric material layer 764, and at least one second dielectric layer 768.

The dielectric layer stack including the lower-level dielectric layers 760 functions as a matrix for lower-level metal interconnect structures 780 that provide electrical wiring among the various nodes of the semiconductor devices and landing pads for through-stack contact via structures to be subsequently formed. The lower-level metal interconnect structures 780 are embedded within the dielectric layer stack of the lower-level dielectric layers 760, and comprise a lower-level metal line structure located under and optionally contacting a bottom surface of the silicon nitride layer 766.

For example, the lower-level metal interconnect structures 780 can be embedded within the at least one first dielectric material layer 764. The at least one first dielectric material layer 764 may be a plurality of dielectric material layers in which various elements of the lower-level metal interconnect structures 780 are sequentially embedded. Each dielectric material layer among the at least one first dielectric material layer 764 may include any of doped silicate glass, undoped silicate glass, organosilicate glass, silicon nitride, silicon oxynitride, and dielectric metal oxides (such as aluminum oxide). In one embodiment, the at least one first dielectric material layer 764 can comprise, or consist essentially of, dielectric material layers having dielectric constants that do not exceed the dielectric constant of undoped silicate glass (silicon oxide) of 3.9.

The lower-level metal interconnect structures 780 can include various device contact via structures 782 (e.g., source and drain electrodes which contact the respective source and drain nodes of the device or gate electrode contacts), intermediate lower-level metal line structures 784, lower-level metal via structures 786, and topmost lower-level metal line structures 788 that are configured to function as landing pads for through-stack contact via structures to be subsequently formed. In this case, the at least one first dielectric material layer 764 may be a plurality of dielectric material layers that are formed level by level while incorporating components of the lower-level metal interconnect structures 780 within each respective level. For example, single damascene processes may be used to form the lower-level metal interconnect structures 780, and each level of the lower-level metal via structures 786 may be embedded within a respective via level dielectric material layer and each level of the lower-level metal line structures (784, 788) may be embedded within a respective line level dielectric material layer. Alternatively, a dual damascene process may be used to form integrated line and via structures, each of which includes a lower-level metal line structure and at least one lower-level metal via structure.

The topmost lower-level metal line structures 788 can be formed within a topmost dielectric material layer of the at least one first dielectric material layer 764 (which can be a plurality of dielectric material layers). Each of the lower-level metal interconnect structures 780 can include a metallic nitride liner 78A and a metal fill portion 78B. Each metallic nitride liner 78A can include a conductive metallic nitride material such as TiN, TaN, and/or WN. Each metal fill portion 78B can include an elemental metal (such as Cu, W, Al, Co, Ru) or an intermetallic alloy of at least two metals. Top surfaces of the topmost lower-level metal line structures 788 and the topmost surface of the at least one first dielectric material layer 764 may be planarized by a planarization process, such as chemical mechanical planarization. In this case, the top surfaces of the topmost lower-level metal line structures 788 and the topmost surface of the at least one first dielectric material layer 764 may be within a horizontal plane that is parallel to the top surface of the substrate 8.

The silicon nitride layer 766 can be formed directly on the top surfaces of the topmost lower-level metal line structures 788 and the topmost surface of the at least one first dielectric material layer 764. Alternatively, a portion of the first dielectric material layer 764 can be located on the top surfaces of the topmost lower-level metal line structures 788 below the silicon nitride layer 766. In one embodiment, the silicon nitride layer 766 is a substantially stoichiometric silicon nitride layer which has a composition of $Si_3N_4$. A silicon nitride material formed by thermal decomposition of a silicon nitride precursor is preferred for the purpose of blocking hydrogen diffusion. In one embodiment, the silicon nitride layer 766 can be deposited by a low pressure chemical vapor deposition (LPCVD) employing dichlorosilane ($SiH_2Cl_2$) and ammonia ($NH_3$) as precursor gases. The temperature of the LPCVD process may be in a range from 750 degrees Celsius to 825 degrees Celsius, although lesser and greater deposition temperatures can also be used. The sum of the partial pressures of dichlorosilane and ammonia may be in a range from 50 mTorr to 500 mTorr, although lesser and greater pressures can also be used. The thickness of the silicon nitride layer 766 is selected such that the silicon nitride layer 766 functions as a sufficiently robust hydrogen diffusion barrier for subsequent thermal processes. For example, the thickness of the silicon nitride layer 766 can be in a range from 6 nm to 100 nm, although lesser and greater thicknesses may also be used.

The at least one second dielectric material layer 768 may include a single dielectric material layer or a plurality of dielectric material layers. Each dielectric material layer among the at least one second dielectric material layer 768 may include any of doped silicate glass, undoped silicate glass, and organosilicate glass. In one embodiment, the at least one first second material layer 768 can comprise, or consist essentially of, dielectric material layers having dielectric constants that do not exceed the dielectric constant of undoped silicate glass (silicon oxide) of 3.9.

An optional layer of a metallic material and a layer of a semiconductor material can be deposited over, or within patterned recesses of, the at least one second dielectric material layer 768, and is lithographically patterned to provide an optional planar conductive material layer 6 and in-process source-level material layers 10'. The optional planar conductive material layer 6, if present, provides a high conductivity conduction path for electrical current that flows into, or out of, the in-process source-level material layers 10'. The optional planar conductive material layer 6 includes a conductive material such as a metal or a heavily doped semiconductor material. The optional planar conductive material layer 6, for example, may include a tungsten layer having a thickness in a range from 3 nm to 100 nm, although lesser and greater thicknesses can also be used. A metal nitride layer (not shown) may be provided as a diffusion barrier layer on top of the planar conductive material layer 6. The planar conductive material layer 6 may function as a special source line in the completed device. In addition, the planar conductive material layer 6 may comprise an etch stop layer and may comprise any suitable conductive, semiconductor or insulating layer. The optional planar conductive material layer 6 can include a metallic compound material such as a conductive metallic nitride (e.g., TiN) and/or a metal (e.g., W). The thickness of the optional planar conductive material layer 6 may be in a range from 5 nm to 100 nm, although lesser and greater thicknesses can also be used.

As shown in FIG. 1B, the in-process source-level material layers 10' can include various layers that are subsequently modified to form source-level material layers. The source-level material layers, upon formation, include a buried source layer that functions as a common source region for vertical field effect transistors of a three-dimensional memory device. In one embodiment, the in-process source-level material layer 10' can include, from bottom to top, a lower source layer 112, a lower sacrificial liner 103, a source-level sacrificial layer 104, an upper sacrificial liner 105, an upper source layer 116, a source-level insulating layer 117, and an optional source selective level conductive layer 118.

The lower source layer 112 and the upper source layer 116 can include a doped semiconductor material such as doped polysilicon or doped amorphous silicon. The conductivity type of the lower source layer 112 and the upper source layer 116 can be the opposite of the conductivity of vertical semiconductor channels to be subsequently formed. For example, if the vertical semiconductor channels to be subsequently formed have a doping of a first conductivity type, the lower source layer 112 and the upper source layer 116 have a doping of a second conductivity type that is the opposite of the first conductivity type. The thickness of each of the lower source layer 112 and the upper source layer 116 can be in a range from 10 nm to 300 nm, such as from 20 nm to 150 nm, although lesser and greater thicknesses can also be used.

The source-level sacrificial layer 104 includes a sacrificial material that can be removed selective to the lower sacrificial liner 103 and the upper sacrificial liner 105. In one embodiment, the source-level sacrificial layer 104 can include a semiconductor material such as undoped amorphous silicon or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be used.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be used.

The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be used. The optional source selective level conductive layer 118 can include a conductive material that can be used as a source-select-level gate electrode. For example, the optional source-select-level conductive layer 118 can include a doped semiconductor material such as doped polysilicon or doped amorphous silicon that can be subsequently converted into doped polysilicon by an anneal process. The thickness of the optional source-level conductive layer 118 can be in a range from 30 nm to 200 nm, such as from 60 nm to 100 nm, although lesser and greater thicknesses can also be used.

The in-process source-level material layers 10' can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8).

The optional planar conductive material layer 6 and the in-process source-level material layers 10' may be patterned to provide openings in areas in which through-stack contact via structures and through-dielectric contact via structures are to be subsequently formed. Patterned portions of the stack of the planar conductive material layer 6 and the in-process source-level material layers 10' are present in each memory array region 100 in which three-dimensional memory stack structures are to be subsequently formed. The at least one second dielectric material layer 768 can include a blanket layer portion 768A underlying the planar conductive material layer 6 and the in-process source-level material layers 10' and a patterned portion 768B that fills gaps among the patterned portions of the planar conductive material layer 6 and the in-process source-level material layers 10'.

Openings in the optional planar conductive material layer 6 and the in-process source-level material layers 10' can be formed within the area of a staircase region 200 in which contact via structures contacting word line electrically conductive layers are to be subsequently formed. In one embodiment, additional openings in the optional planar conductive material layer 6 and the in-process source-level material layers 10' can be formed within the area of a memory array region 100, in which a three-dimensional memory array including memory stack structures is to be subsequently formed. A peripheral device region 400 that is subsequently filled with a field dielectric material portion can be provided adjacent to the staircase region 200.

The region of the semiconductor devices 710 and the combination of the lower-level dielectric layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are embedded in the lower-level dielectric layers 760.

The lower-level metal interconnect structures 780 can be electrically connected to active nodes (e.g., transistor active regions 742 or gate electrodes 754) of the semiconductor devices 710 (e.g., CMOS devices), and are located at the level of the lower-level dielectric layers 760. Through-stack contact via structures can be subsequently formed directly on the lower-level metal interconnect structures 780 to provide electrical connection to memory devices to be subsequently formed. In one embodiment, the pattern of the lower-level metal interconnect structures 780 can be selected such that the topmost lower-level metal line structures 788 (which are a subset of the lower-level metal interconnect structures 780 located at the topmost portion of the lower-level metal interconnect structures 780) can provide landing pad structures for the through-stack contact via structures to be subsequently formed.

Figure 2:
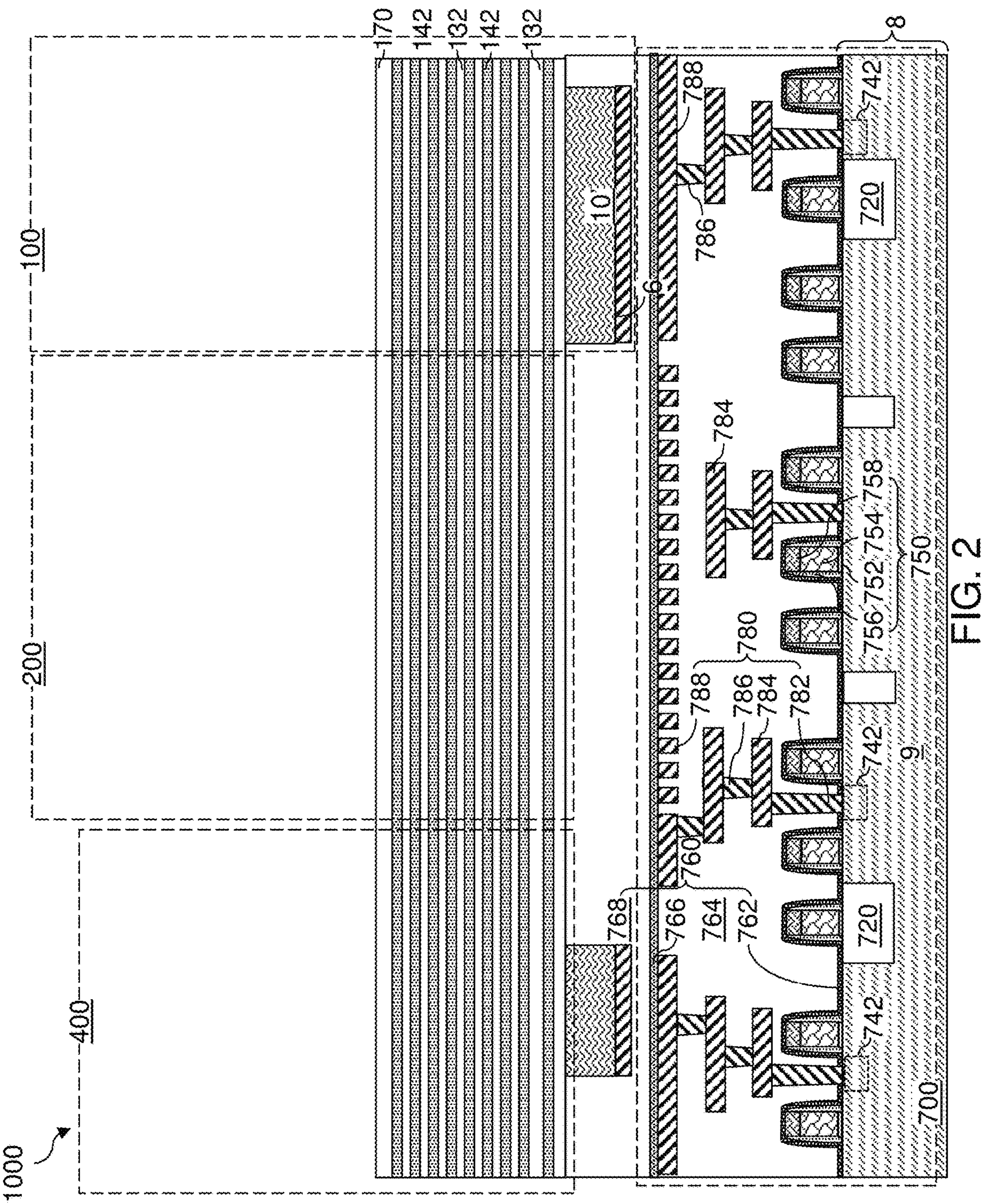
FIG. 2 is a vertical cross-sectional view of the first exemplary structure after formation of a first-tier alternating stack of first insulting layers and first spacer material layers according to the first embodiment of the present disclosure.

Referring to FIG. 2, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulting layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is used for the first insulating layers 132, tetraethylorthosilicate (TEOS) can be used as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be used for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be used. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be used for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be used.

Figure 3:
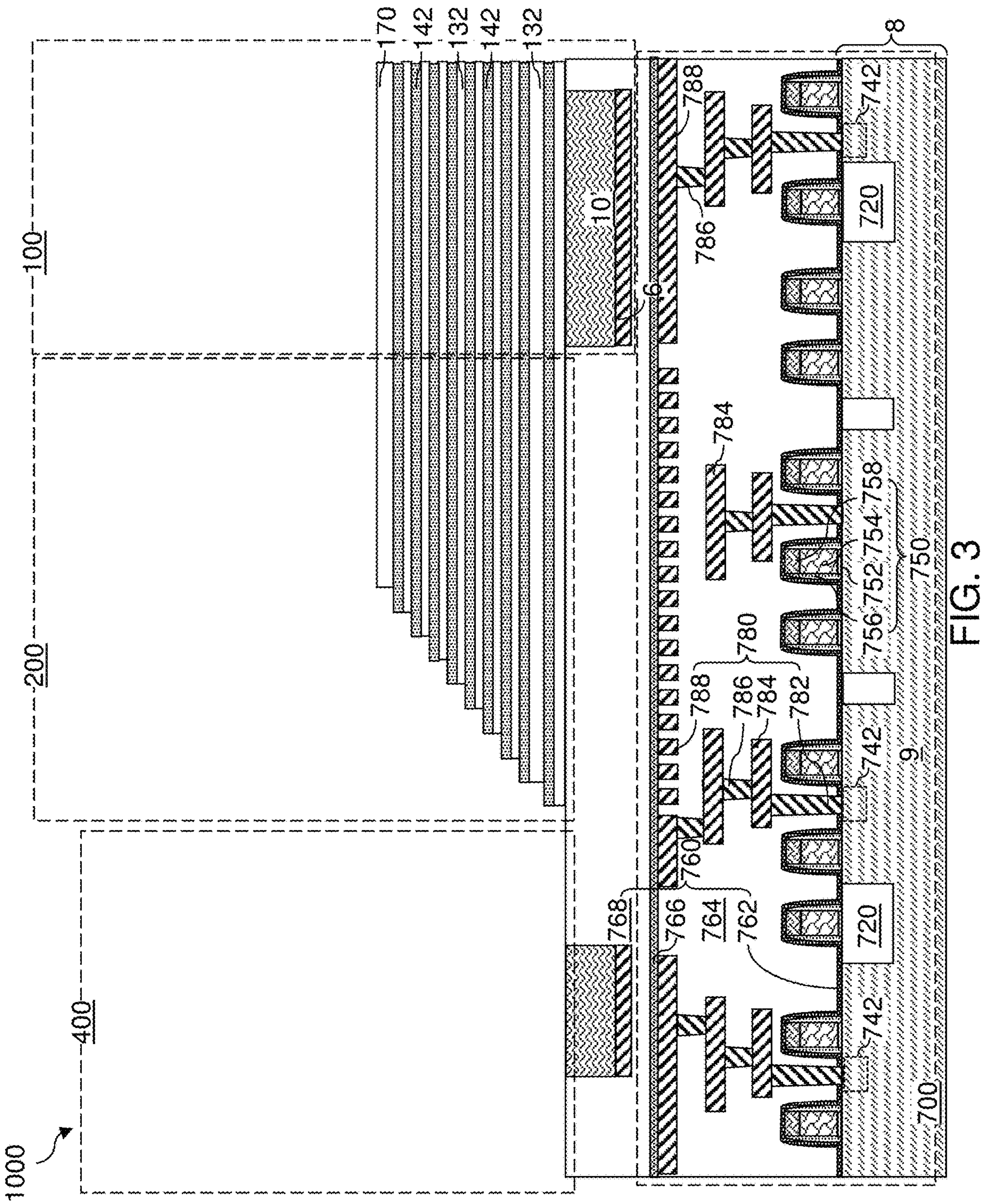
FIG. 3 is a vertical cross-sectional view of the first exemplary structure after patterning a first-tier staircase region on the first-tier alternating stack according to the first embodiment of the present disclosure.

Referring to FIG. 3, the first insulating cap layer 170 and the first-tier alternating stack (132, 142) can be patterned to form first stepped surfaces in the staircase region 200. The staircase region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area.

Figure 4:
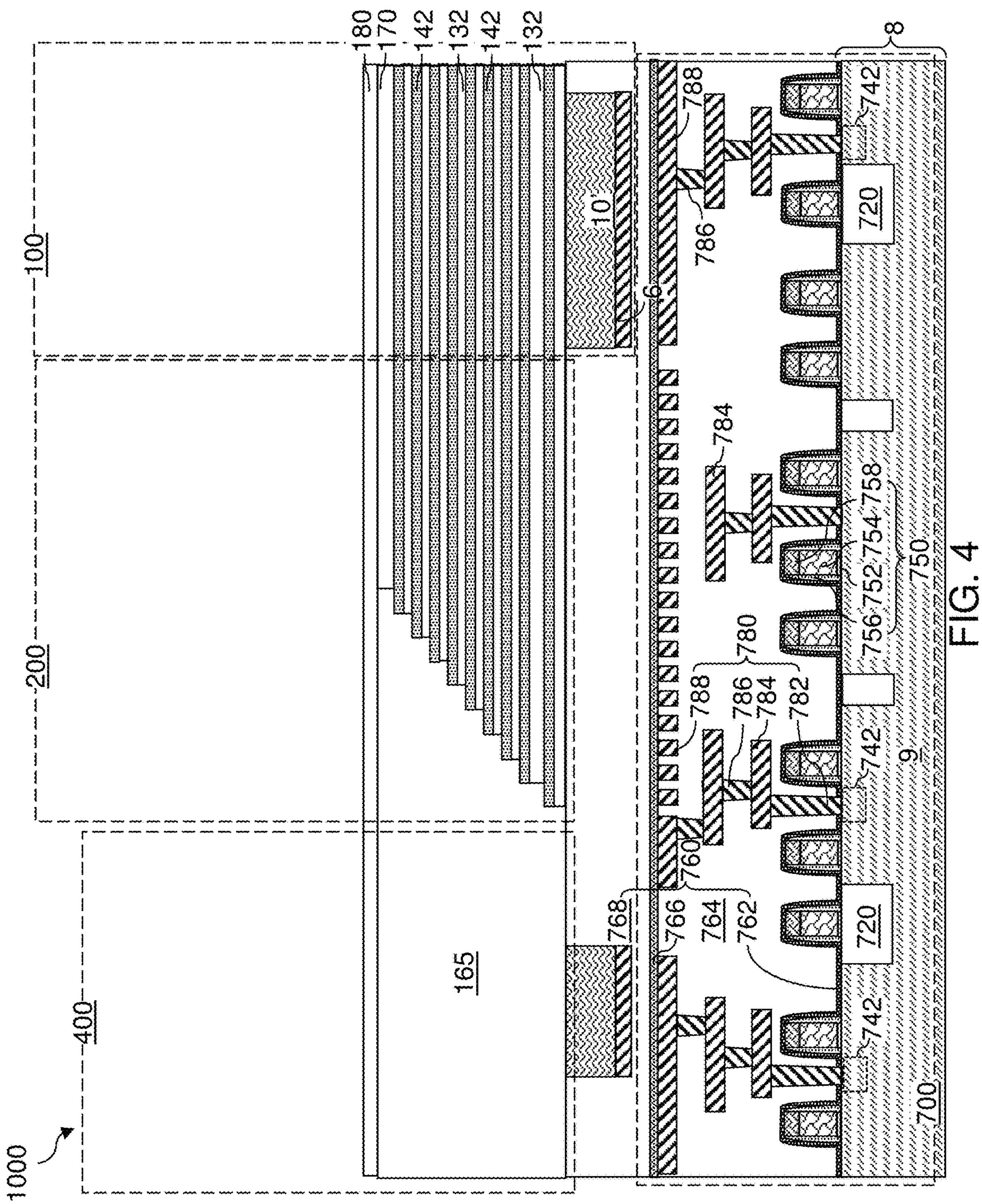
FIG. 4 is a vertical cross-sectional view of the first exemplary structure after formation of a first retro-stepped dielectric material portion and an inter-tier dielectric layer according to the first embodiment of the present disclosure.

Referring to FIG. 4, a dielectric material can be deposited to fill the first stepped cavity to form a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 165, 170). The inter-tier dielectric layer 180 includes a dielectric material such as silicon oxide. In one embodiment, the inter-tier dielectric layer 180 can include a doped silicate glass having a greater etch rate than the material of the first insulating layers 132 (which can include an undoped silicate glass). For example, the inter-tier dielectric layer 180 can include phosphosilicate glass. The thickness of the inter-tier dielectric layer 180 can be in a range from 30 nm to 300 nm, although lesser and greater thicknesses can also be used.

Figure 5A:
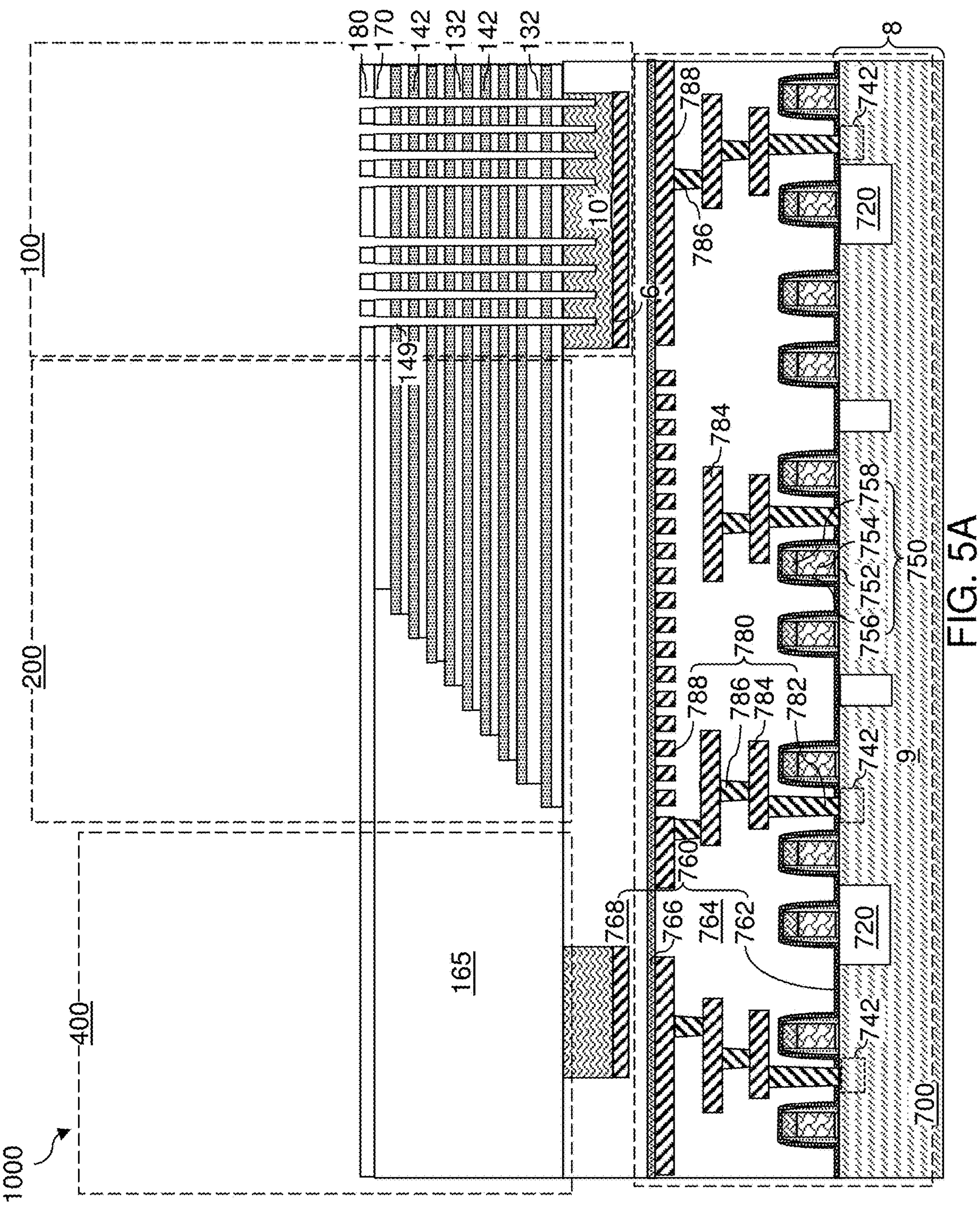
FIG. 5A is a vertical cross-sectional view of the first exemplary structure after formation of first-tier memory openings according to the first embodiment of the present disclosure.
Figure 5B:
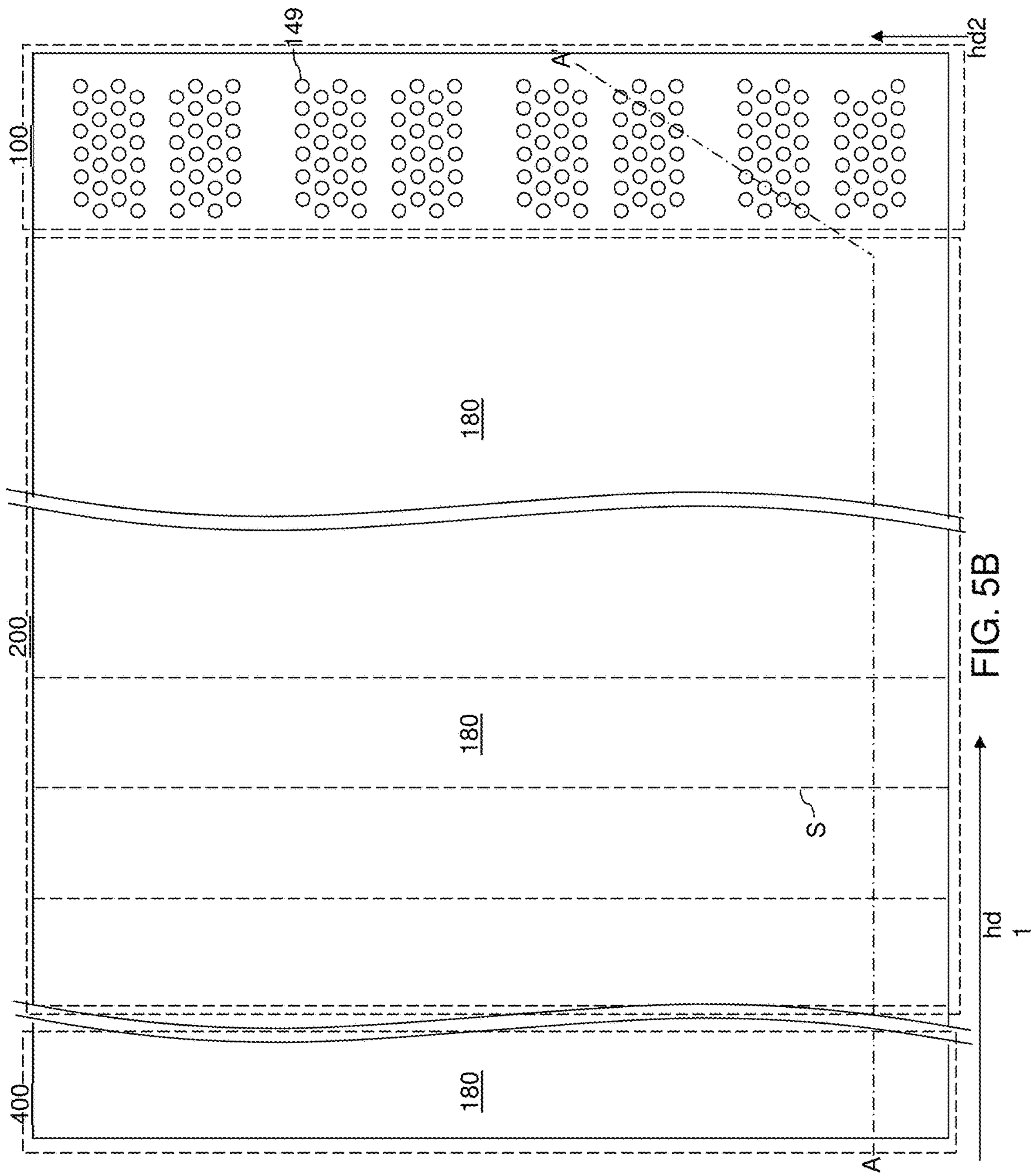
FIG. 5B is a top-down view of the first exemplary structure of FIG. 5A. The hinged vertical plane A-A' corresponds to the plane of the vertical cross-sectional view of FIG. 5A.

Referring to FIGS. 5A and 5B, first-tier memory openings 149 can be formed. Locations of steps S in the first-tier alternating stack (132, 142) are illustrated as dotted lines in FIG. 5B. The first-tier memory openings 149 extend through the first-tier alternating stack (132, 142) at least to a top surface of the in-process source-level material layers 10'. The first-tier memory openings 149 can be formed in the memory array region 100 at locations at which memory stack structures including vertical stacks of memory elements are to be subsequently formed. For example, a lithographic material stack (not shown) including at least a photoresist layer can be formed over the first insulating cap layer 170 (and the optional inter-tier dielectric layer 180, if present), and can be lithographically patterned to form openings within the lithographic material stack. The pattern in the lithographic material stack can be transferred through the first insulating cap layer 170 (and the optional inter-tier dielectric layer 180), and through the entirety of the first-tier alternating stack (132, 142) by at least one anisotropic etch that employs the patterned lithographic material stack as an etch mask. Portions of the first insulating cap layer 170 (and the optional inter-tier dielectric layer 180), and the first-tier alternating stack (132, 142) underlying the openings in the patterned lithographic material stack are etched to form the first-tier memory openings 149. In other words, the transfer of the pattern in the patterned lithographic material stack through the first insulating cap layer 170 and the first-tier alternating stack (132, 142) forms the first-tier memory openings 149.

In one embodiment, the chemistry of the anisotropic etch process used to etch through the materials of the first-tier alternating stack (132, 142) can alternate to optimize etching of the first and second materials in the first-tier alternating stack (132, 142). The anisotropic etch can be, for example, a series of reactive ion etches or a single etch (e.g., $CF_4/O_2/Ar$ etch). The sidewalls of the first-tier memory openings 149 can be substantially vertical, or can be tapered. Subsequently, the patterned lithographic material stack can be subsequently removed, for example, by ashing.

Figure 6B:
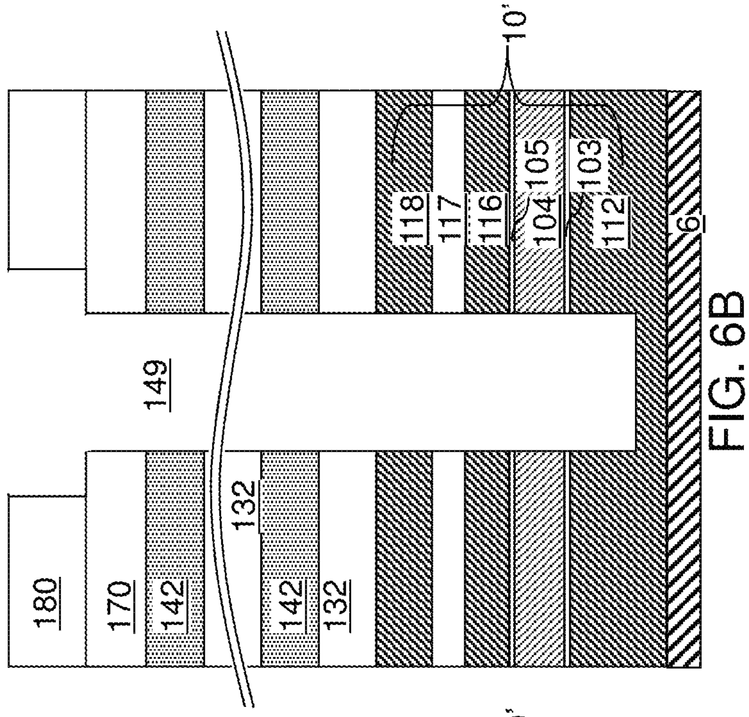
FIGS. 6A-6B illustrate a sequential vertical cross-sectional view of a first-tier memory opening during expansion of an upper region of the first-tier memory opening according to the first embodiment of the present disclosure.
Figure 6A:
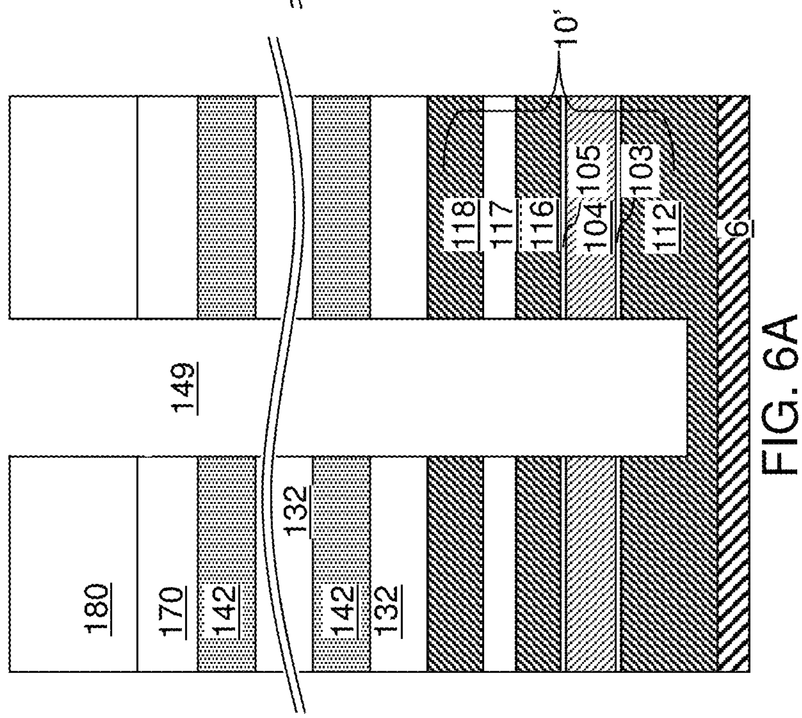

Optionally, the portions of the first-tier memory openings 149 at the level of the inter-tier dielectric layer 180 can be laterally expanded by an isotropic etch. FIGS. 6A and 6B illustrate a processing sequence for laterally expanding portions of the first-tier memory openings 149 at the level of the inter-tier dielectric layer 180. FIG. 6A illustrates a first-tier memory opening 149 immediately after the anisotropic etch that forms the first-tier memory openings 149. The anisotropic etch can terminate after each of the first-tier memory openings 149 extends to the lower source layer 112. The inter-tier dielectric layer 180 can comprise a dielectric material (such as borosilicate glass) having a greater etch rate than the first insulating layers 132 (that can include undoped silicate glass). Referring to FIG. 6B, an isotropic etch (such as a wet etch employing HF) can be used to expand the lateral dimensions of the first-tier memory openings at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 7:
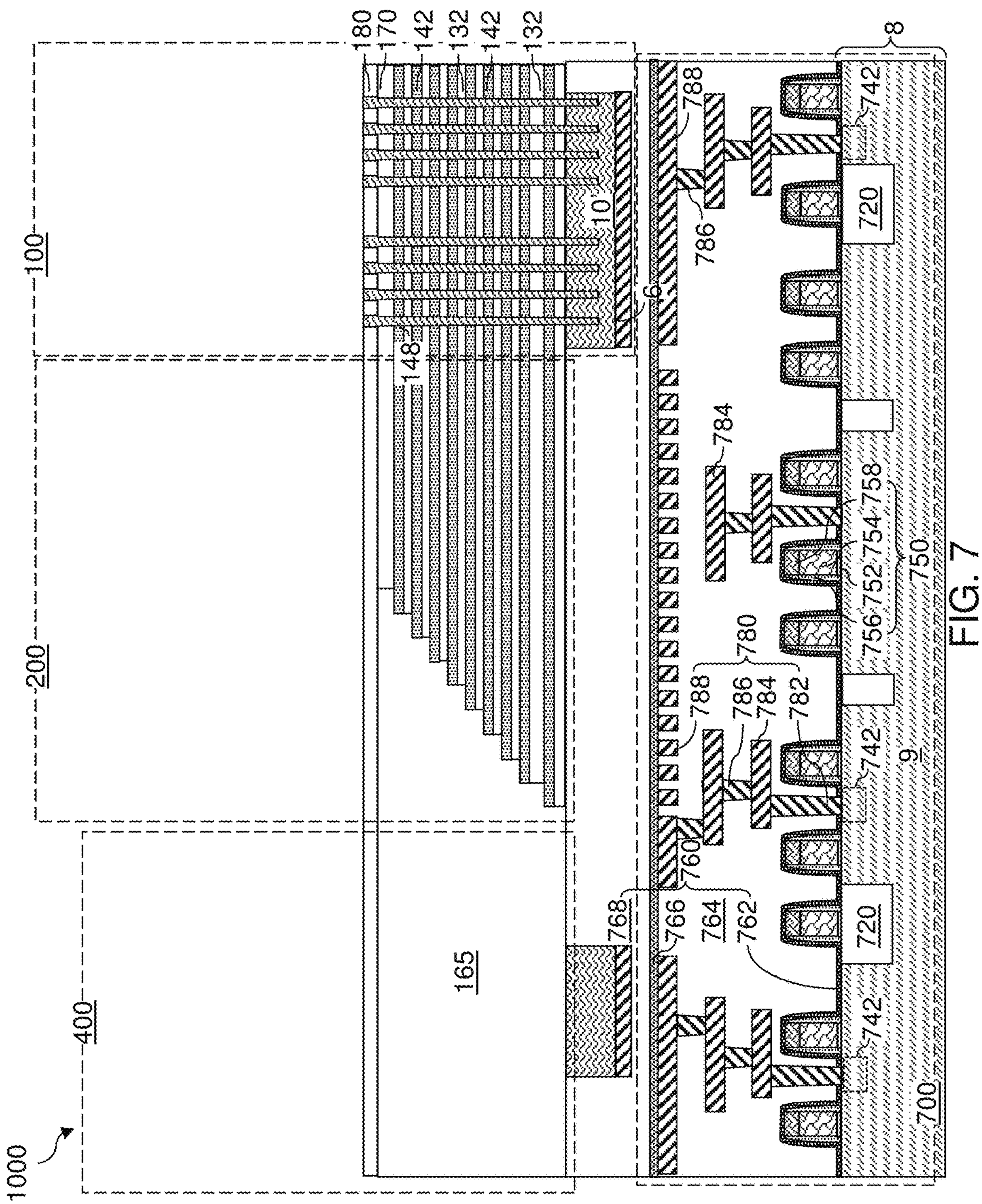
FIG. 7 is a vertical cross-sectional view of the first exemplary structure after formation of sacrificial memory opening fill portions according to the first embodiment of the present disclosure.

Referring to FIG. 7, sacrificial memory opening fill portions 148 can be formed in the first-tier memory openings 149. For example, a sacrificial fill material layer is deposited in the first-tier memory openings 149. The sacrificial fill material layer includes a sacrificial material which can be subsequently removed selective to the materials of the first insulator layers 132 and the first sacrificial material layers 142. In one embodiment, the sacrificial fill material layer can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer having a thickness in a range from 1 nm to 3 nm) may be used prior to depositing the sacrificial fill material layer. The sacrificial fill material layer may be formed by a non-conformal deposition or a conformal deposition method. In another embodiment, the sacrificial fill material layer can include amorphous silicon or a carbon-containing material (such as amorphous carbon or diamond-like carbon) that can be subsequently removed by ashing.

Portions of the deposited sacrificial material can be removed from above the first insulating cap layer 170 (and the optional inter-tier dielectric layer 180, if present). For example, the sacrificial fill material layer can be recessed to a top surface of the first insulating cap layer 170 (and the optional inter-tier dielectric layer 180) employing a planarization process. The planarization process can include a recess etch, chemical mechanical planarization (CMP), or a combination thereof. The top surface of the first insulating layer 170 (and optionally layer 180 if present) can be used as an etch stop layer or a planarization stop layer. Each remaining portion of the sacrificial material in a first-tier memory opening 149 constitutes a sacrificial memory opening fill portion 148. The top surfaces of the sacrificial memory opening fill portions 148 can be coplanar with the top surface of the inter-tier dielectric layer 180 (or the first insulating cap layer 170 if the inter-tier dielectric layer 180 is not present). The sacrificial memory opening fill portion 148 may, or may not, include cavities therein.

Figure 8A:
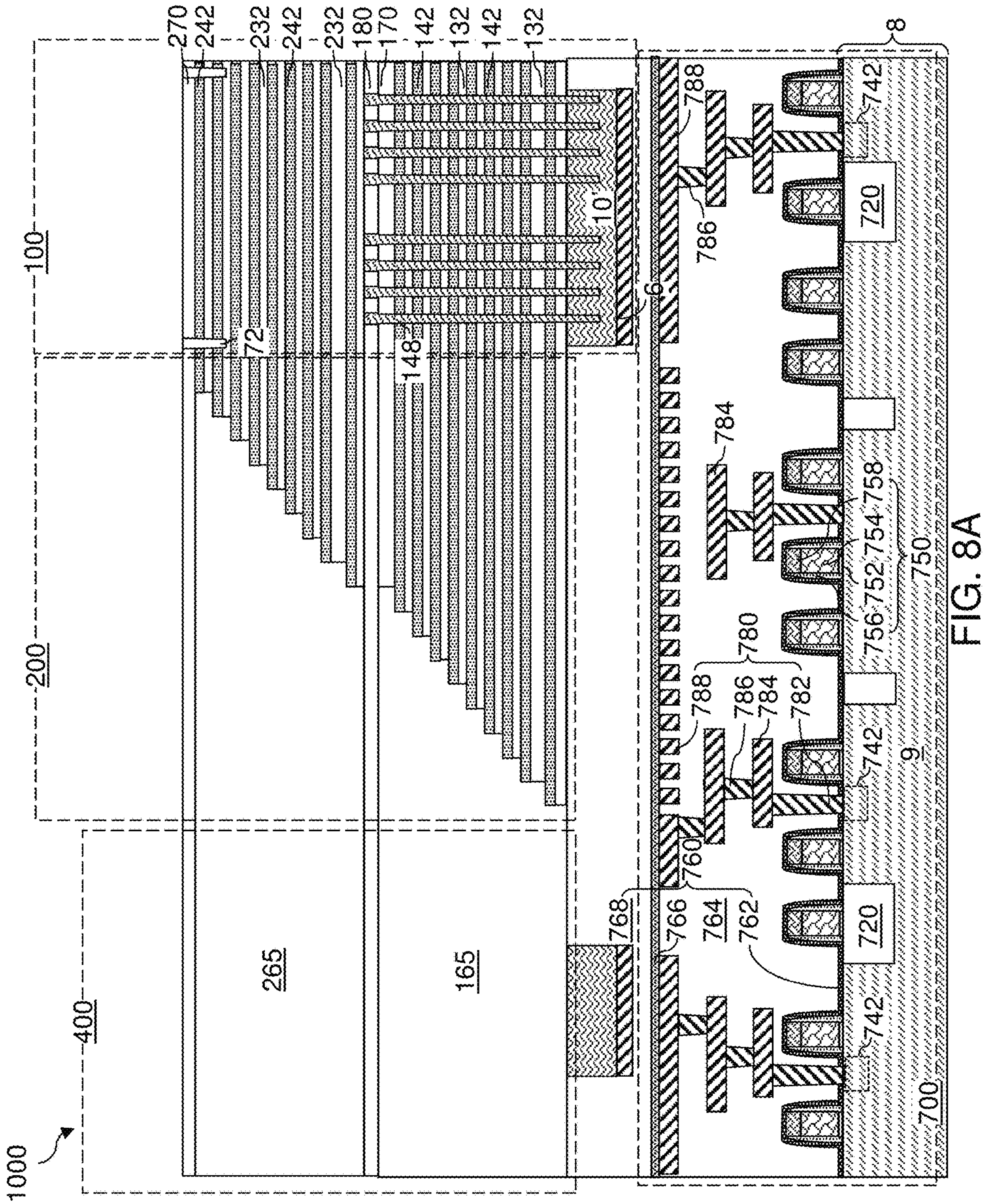
FIG. 8A is a vertical cross-sectional view of the first exemplary structure after formation of a second-tier alternating stack of second insulating layers and second spacer material layers, a second retro-stepped dielectric material portion, and a second insulating cap layer according to the first embodiment of the present disclosure.
Figure 8B:
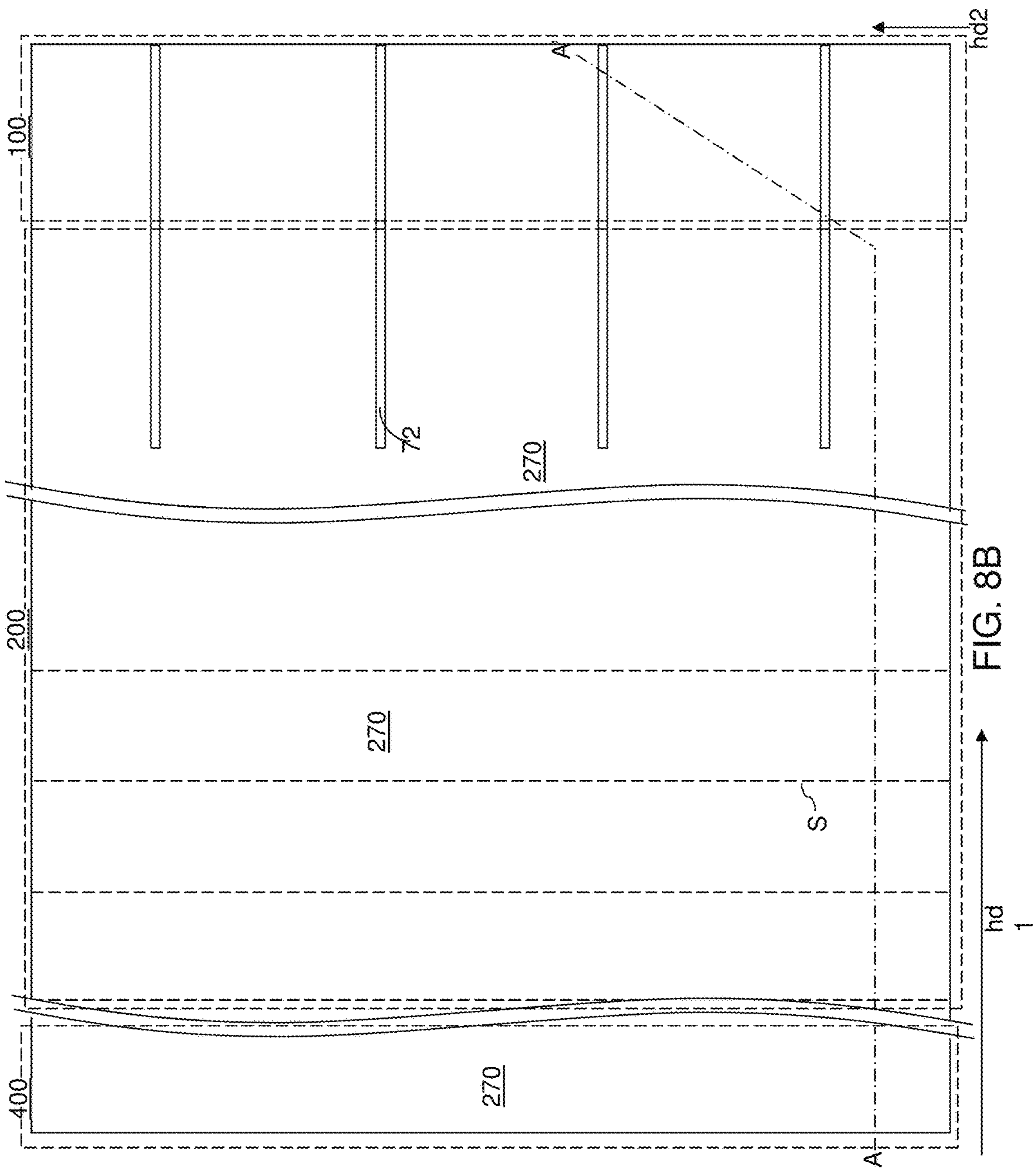
FIG. 8B is a top-down view of the first exemplary structure of FIG. 8A. The hinged vertical plane A-A' corresponds to the plane of the vertical cross-sectional view of FIG. 8A.

Referring to FIGS. 8A and 8B, a second-tier structure can be formed over the first-tier structure (132, 142, 170, 148). The second-tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be used for the second insulating layers 232 can be any material that can be used for the first insulating layers 132. The fourth material of the second sacrificial material layers 242 is a sacrificial material that can be removed selective to the third material of the second insulating layers 232. Sacrificial materials that can be used for the second sacrificial material layers 242 can be any material that can be used for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be used for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be used. In one embodiment, each second sacrificial material layer 242 in the second stack (232, 242) can have a uniform thickness that is substantially invariant within each respective second sacrificial material layer 242.

Second stepped surfaces in the second stepped area can be formed in the staircase region 200 employing a same set of processing steps as the processing steps used to form the first stepped surfaces in the first stepped area with suitable adjustment to the pattern of at least one masking layer. A second retro-stepped dielectric material portion 265 can be formed over the second stepped surfaces in the staircase region 200.

A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the in-process source-level material layers 10', and at least one retro-stepped dielectric material portion (165, 265) can be formed over the staircase regions on the at least one alternating stack (132, 142, 232, 242).

Optionally, drain-select-level isolation structures 72 can be formed through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level isolation structures 72 include a dielectric material such as silicon oxide. The drain-select-level isolation structures 72 can laterally extend along a first horizontal direction hd1, and can be laterally spaced apart along a second horizontal direction hd2 that is perpendicular to the first horizontal direction hd1.

Figure 9A:
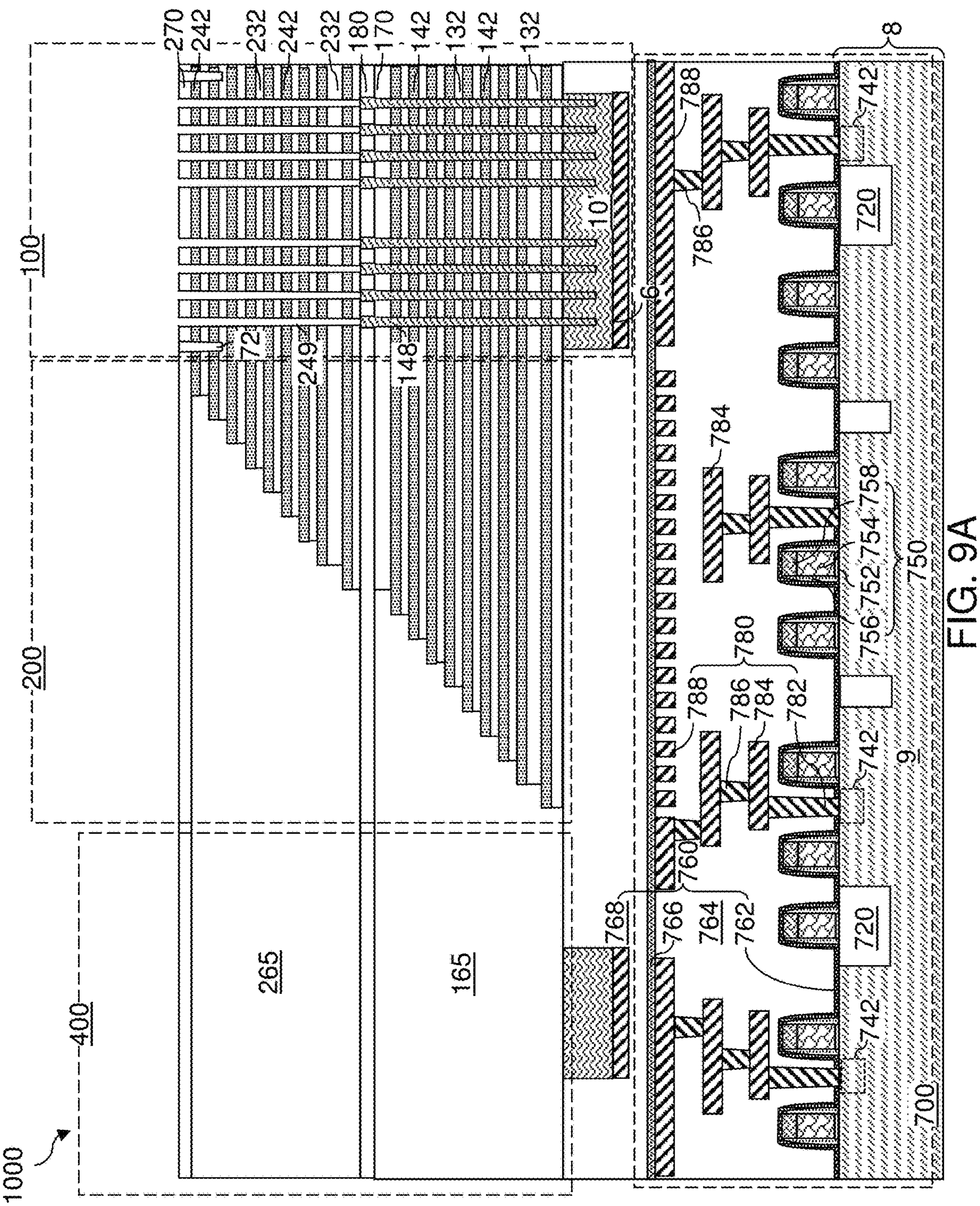
FIG. 9A is a vertical cross-sectional view of the first exemplary structure after formation of second-tier memory openings according to the first embodiment of the present disclosure.
Figure 9B:
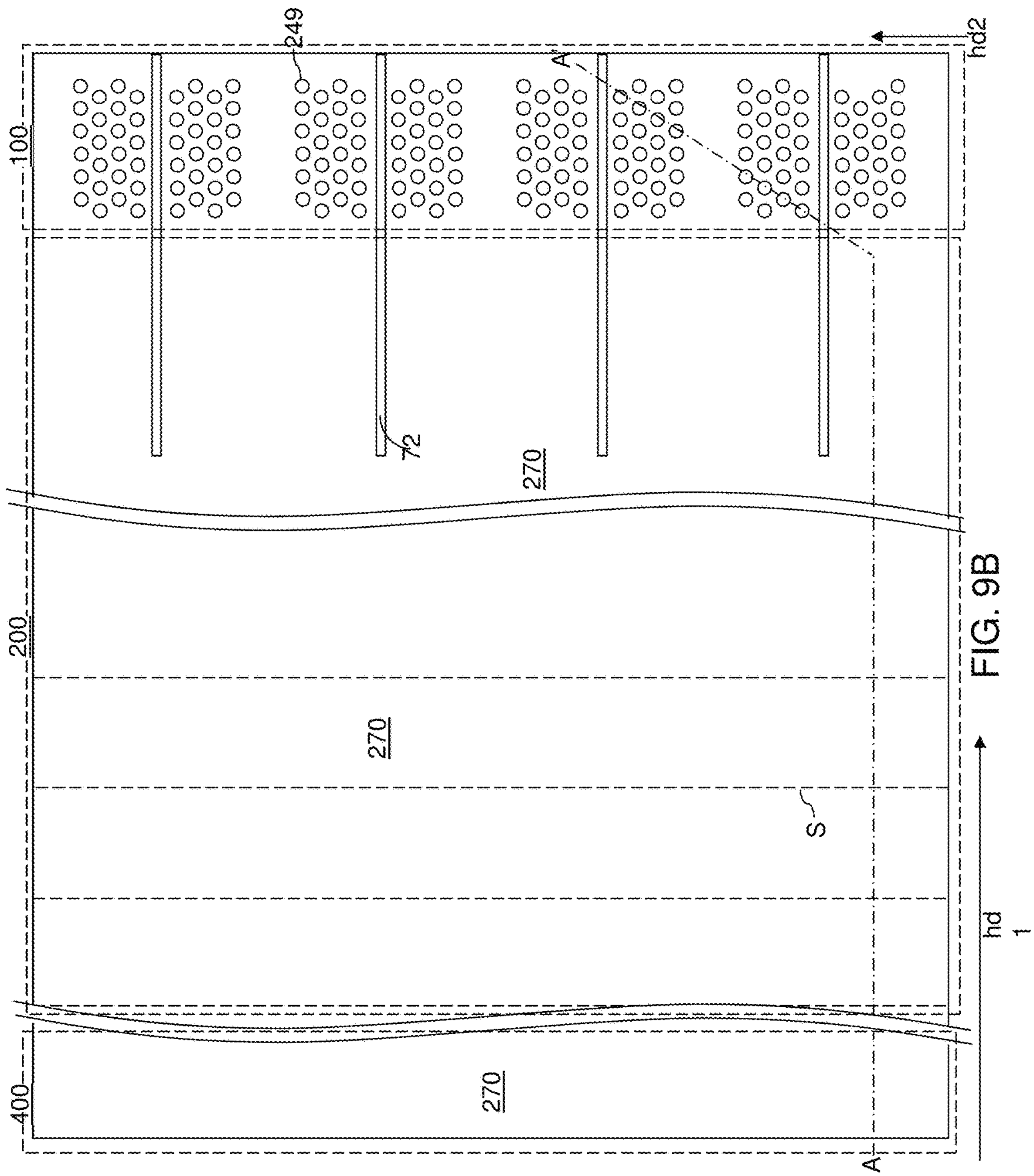
FIG. 9B is a top-down view of the first exemplary structure of FIG. 9A. The hinged vertical plane A-A' corresponds to the plane of the vertical cross-sectional view of FIG. 9A.

Referring to FIGS. 9A and 9B, second-tier memory openings 249 extending through the second-tier structure (232, 242, 270, 265) are formed in areas overlying the sacrificial memory opening fill portions 148. For example, a photoresist layer can be applied over the second-tier structure (232, 242, 270, 265), and can be lithographically patterned to form a same pattern as the pattern of the sacrificial memory opening fill portions 148, i.e., the pattern of the first-tier memory openings 149. Thus, the lithographic mask used to pattern the first-tier memory openings 149 can be used to pattern the second-tier memory openings 249. An anisotropic etch can be performed to transfer the pattern of the lithographically patterned photoresist layer through the second-tier structure (232, 242, 270, 265). In one embodiment, the chemistry of the anisotropic etch process used to etch through the materials of the second-tier alternating stack (232, 242) can alternate to optimize etching of the alternating material layers in the second-tier alternating stack (232, 242). The anisotropic etch can be, for example, a series of reactive ion etches. The patterned lithographic material stack can be removed, for example, by ashing after the anisotropic etch process. A top surface of an underlying sacrificial memory opening fill portion 148 can be physically exposed at the bottom of each second-tier memory opening 249.

Figure 10A:
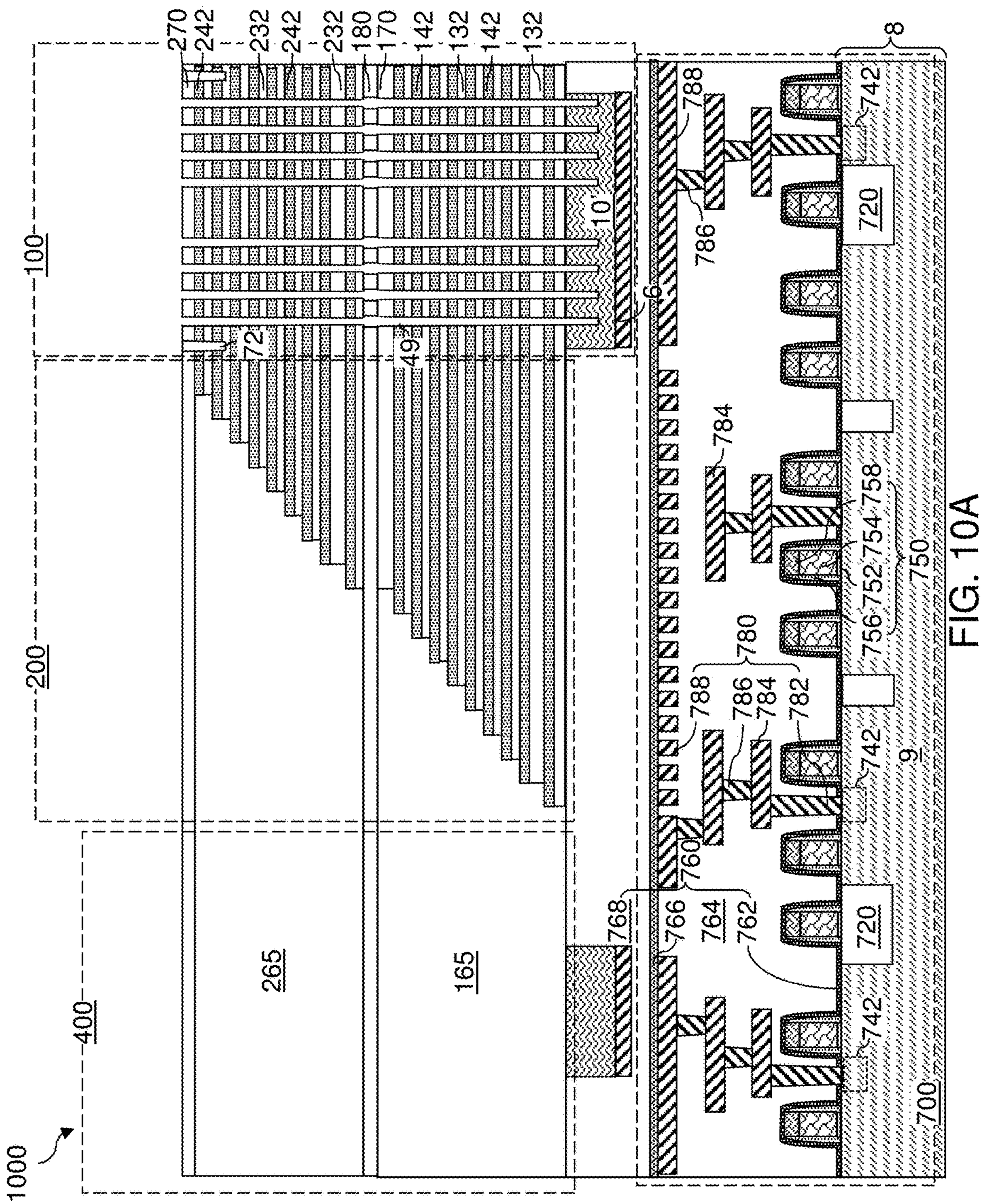
FIG. 10A is a vertical cross-sectional view of the first exemplary structure after formation of inter-tier memory openings according to the first embodiment of the present disclosure.
Figure 10B:
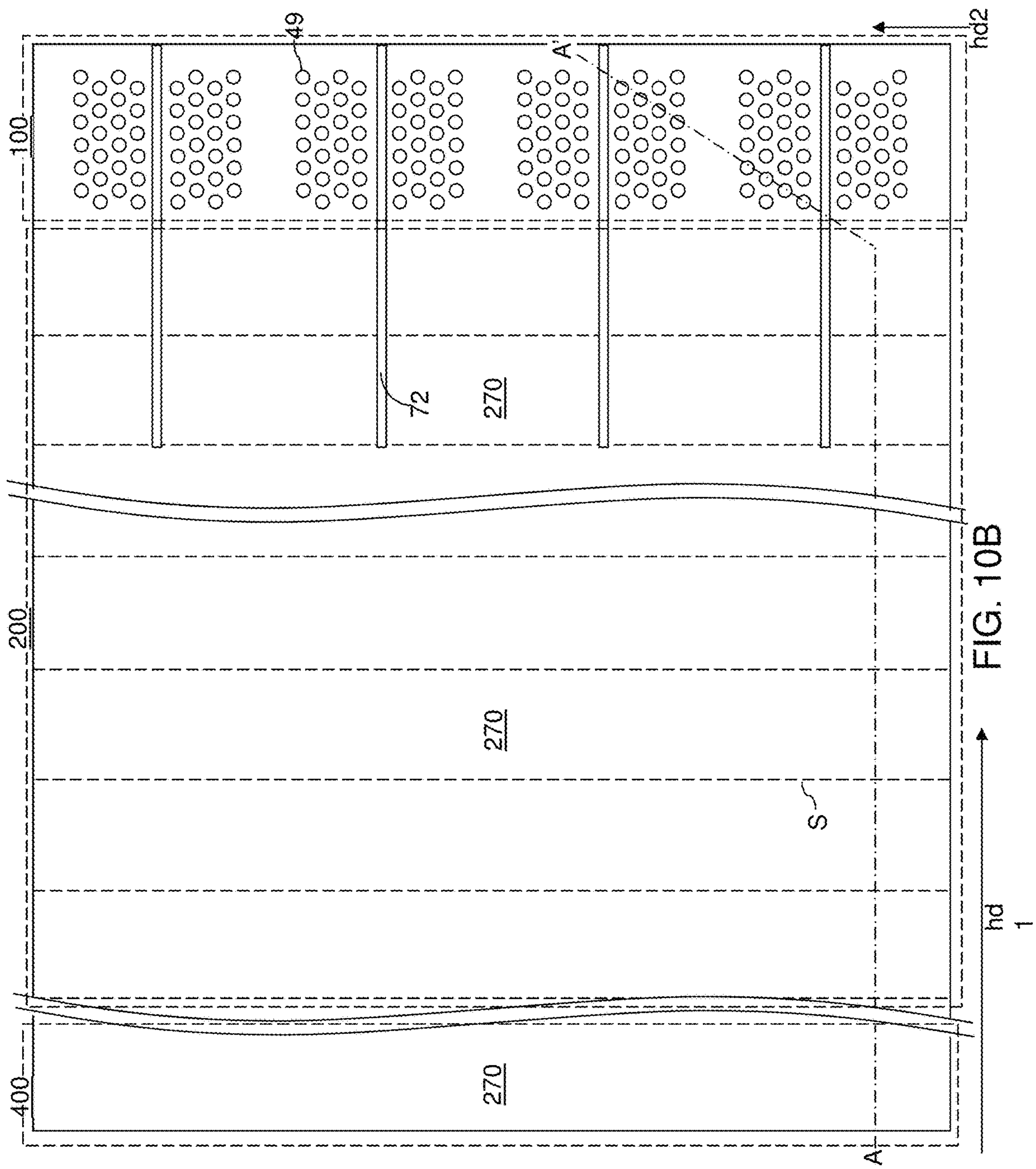
FIG. 10B is a top-down view of the first exemplary structure of FIG. 10A. The hinged vertical plane A-A' corresponds to the plane of the vertical cross-sectional view of FIG. 10A.

Referring to FIGS. 10A and 10B, an etch process can be performed to remove the sacrificial material of the sacrificial memory opening fill portions 148 selective to the materials of the second-tier alternating stack (232, 242) and the first-tier alternating stack (132, 142) (e.g., $C_4F_8/O_2/Ar$ etch). Upon removal of the sacrificial memory opening fill portions 148, each vertically adjoining pair of a second-tier memory opening 249 and a first-tier memory opening 149 forms a continuous cavity that extends through the first-tier alternating stack (132, 142) and the second-tier alternating stack (232, 242). The continuous cavities are herein referred to as memory openings 49 (or inter-tier memory openings). Surfaces of the in-process source-level material layers 10' can be physically exposed at the bottom of each memory opening 49. Locations of steps S in the first-tier alternating stack (132, 142) and the second-tier alternating stack (232, 242) are illustrated as dotted lines.

FIGS. 11A-11D provide sequential cross-sectional views of a memory opening 49 during formation of a memory opening fill structure 58. The same structural change occurs in each memory openings 49.

Figure 11B:
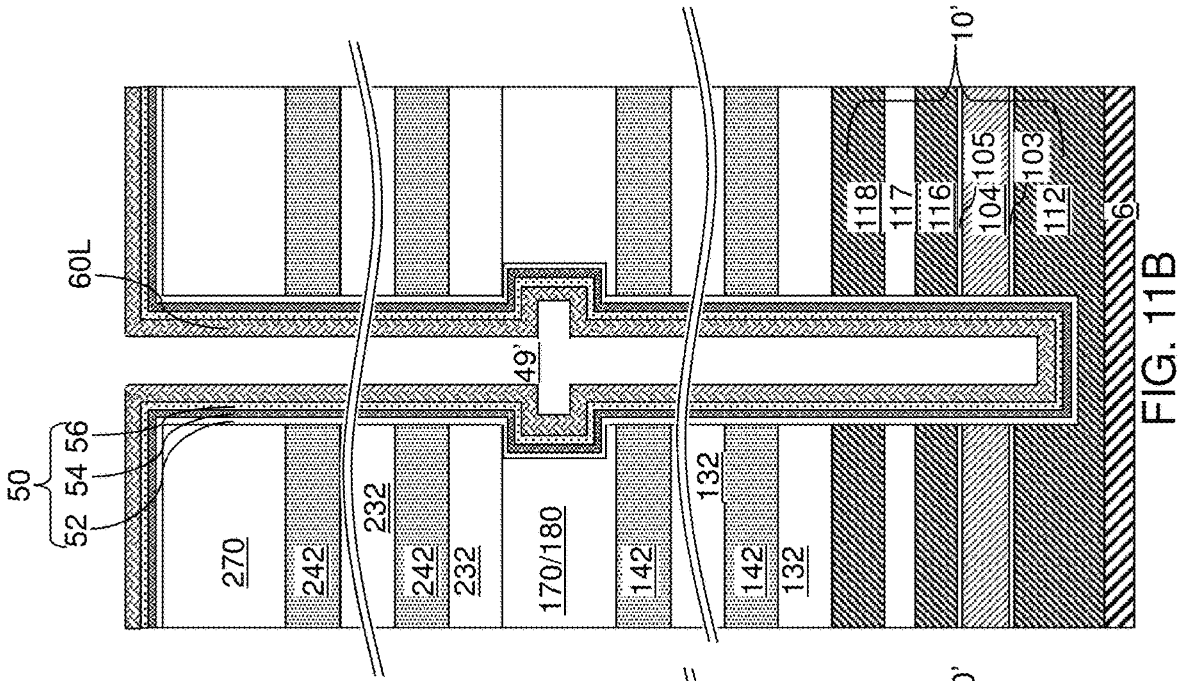
FIGS. 11A-11D are sequential vertical cross-sectional views of an inter-tier memory opening during formation of a memory opening fill structure according to the first embodiment of the present disclosure.
Figure 11A:
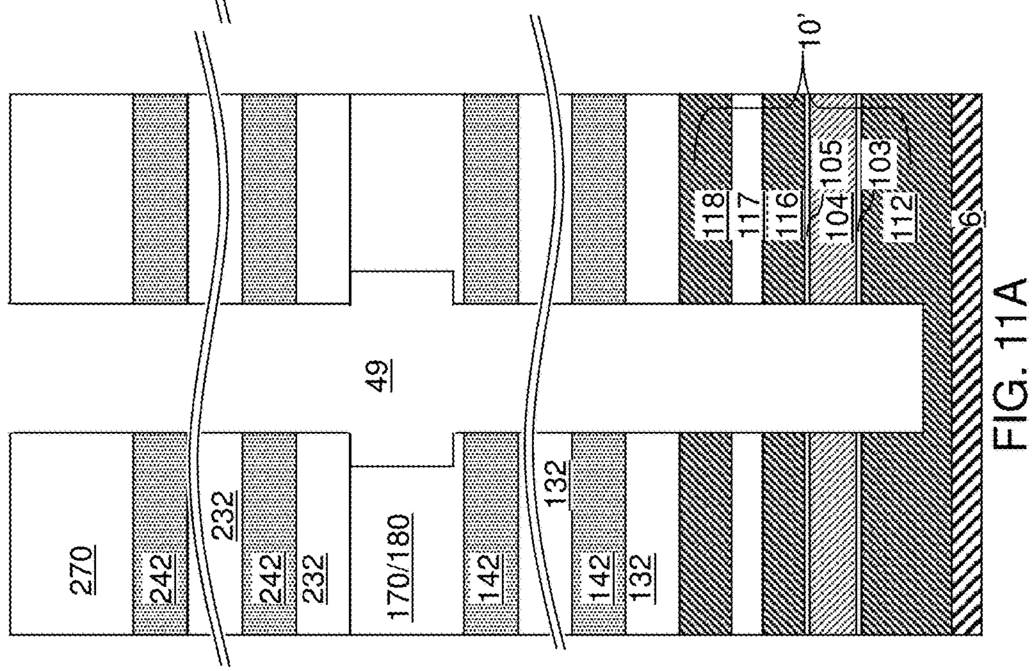

Referring to FIG. 11A, a memory opening 49 in the first exemplary device structure of FIGS. 10A and 10B is illustrated. The memory opening 49 extends through the first-tier structure and the second-tier structure.

Referring to FIG. 11B, a stack of layers including a blocking dielectric layer 52, a charge storage layer 54, a tunneling dielectric layer 56, and a semiconductor channel material layer 60L can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be used. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be used. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be used to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if used, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used. The stack of the blocking dielectric layer 52, the charge storage layer 54, and the tunneling dielectric layer 56 constitutes a memory film 50 that stores memory bits.

The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be used. A cavity 49' is formed in the volume of each memory opening 49 that is not filled with the deposited material layers (52, 54, 56, 60L).

Figure 11D:
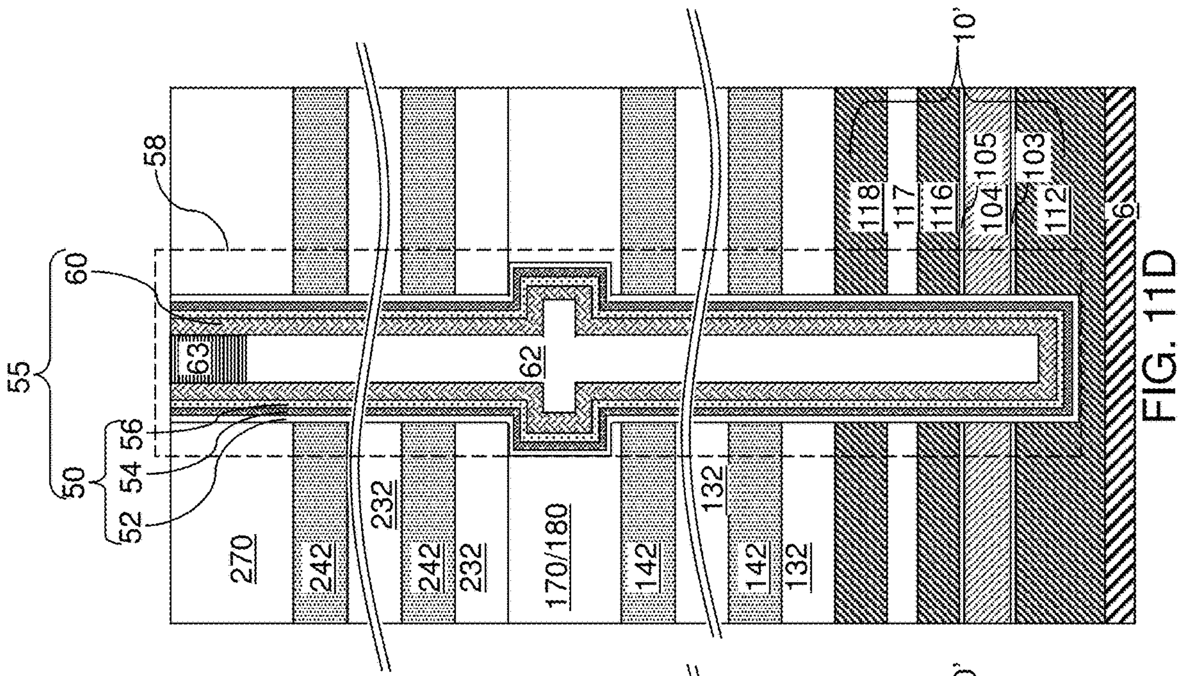
Figure 11C:
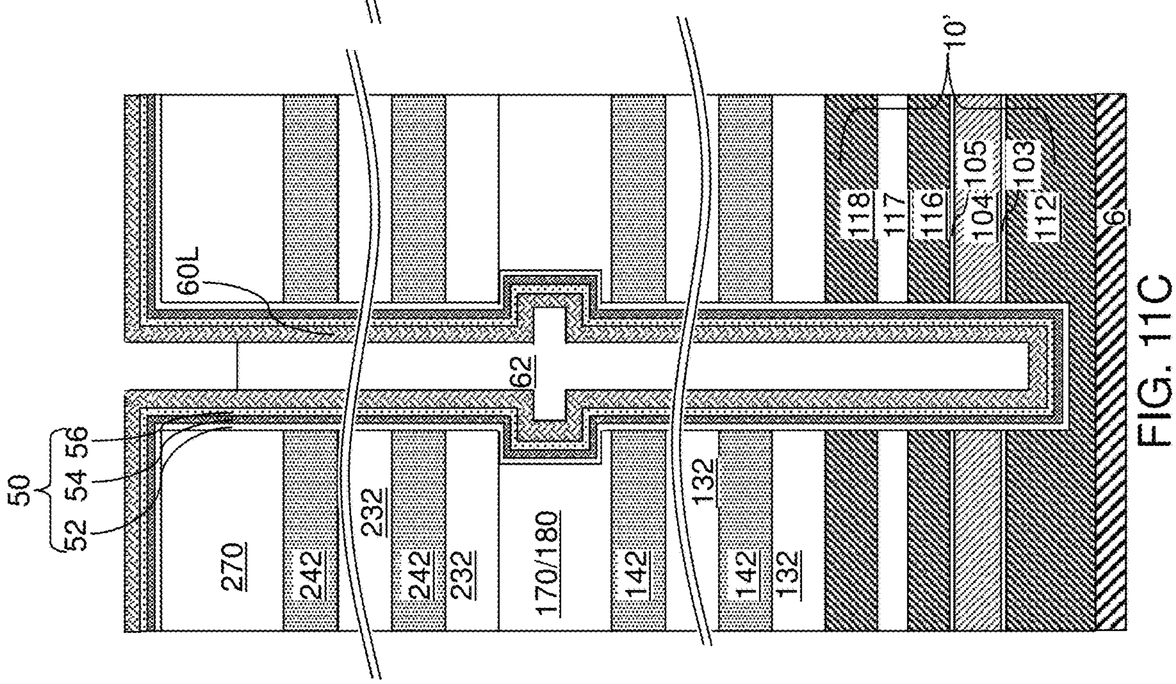

Referring to FIG. 11C, in case the cavity 49' in each memory opening is not completely filled by the semiconductor channel material layer 60L, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The horizontal portion of the dielectric core layer overlying the second insulating cap layer 270 can be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 11D, a doped semiconductor material can be deposited in cavities overlying the dielectric cores 62. The doped semiconductor material has a doping of the opposite conductivity type of the doping of the semiconductor channel material layer 60L. Thus, the doped semiconductor material has a doping of the second conductivity type. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 can be removed by a planarization process such as a chemical mechanical planarization (CMP) process.

Each remaining portion of the doped semiconductor material having a doping of the second conductivity type constitutes a drain region 63. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{19}/cm^3$ to $2.0\times10^{21}/cm^3$, although lesser and greater dopant concentrations can also be used. The doped semiconductor material can be, for example, doped polysilicon.

Each remaining portion of the semiconductor channel material layer 60L constitutes a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 10', the first-tier structure (132, 142, 170, 165), the second-tier structure (232, 242, 270, 265), the inter-tier dielectric layer 180, and the memory opening fill structures 58 collectively constitute a memory-level assembly.

Figure 12A:
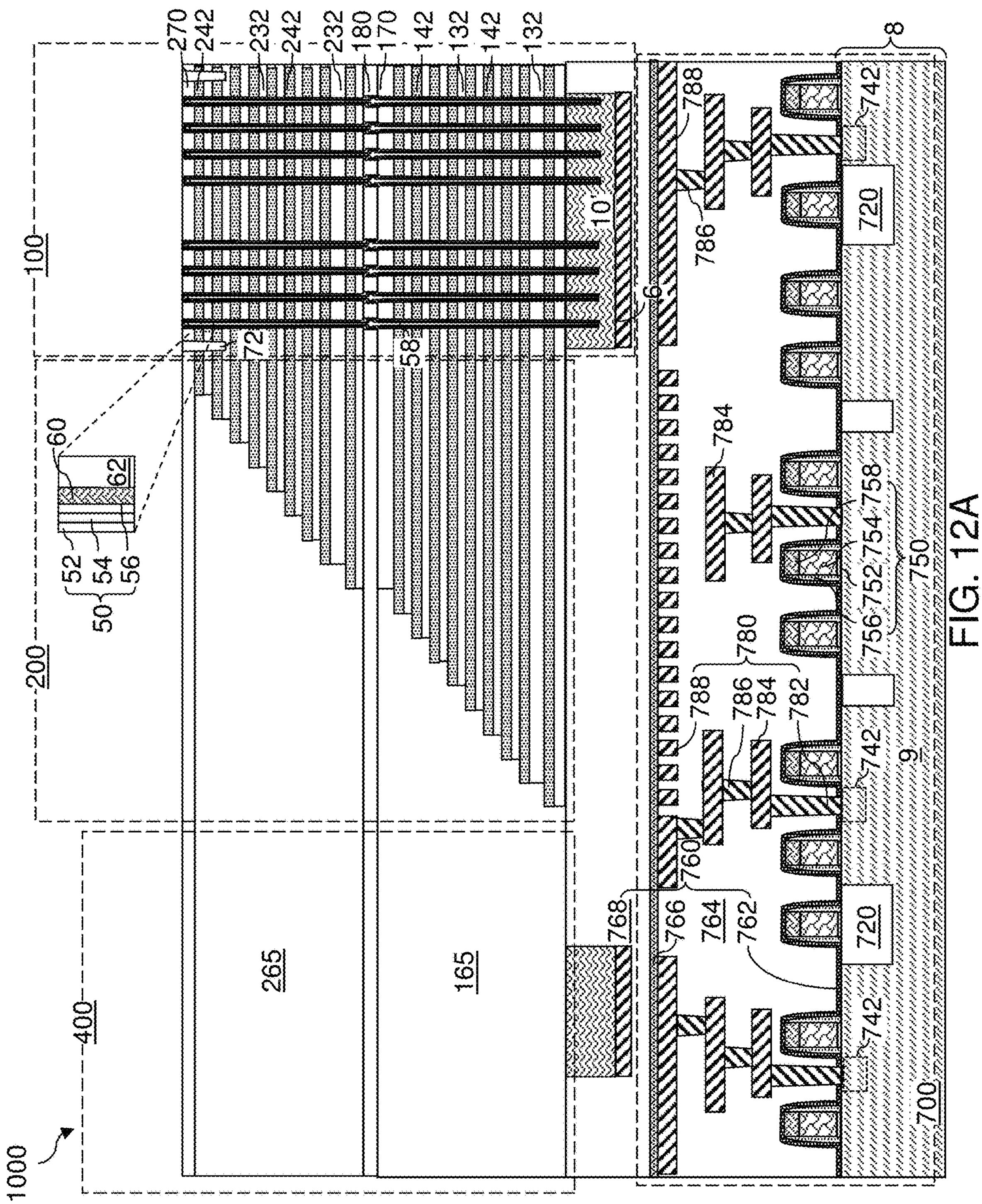
FIG. 12A is a vertical cross-sectional view of the first exemplary structure after formation of memory stack structures according to the first embodiment of the present disclosure.
Figure 12B:
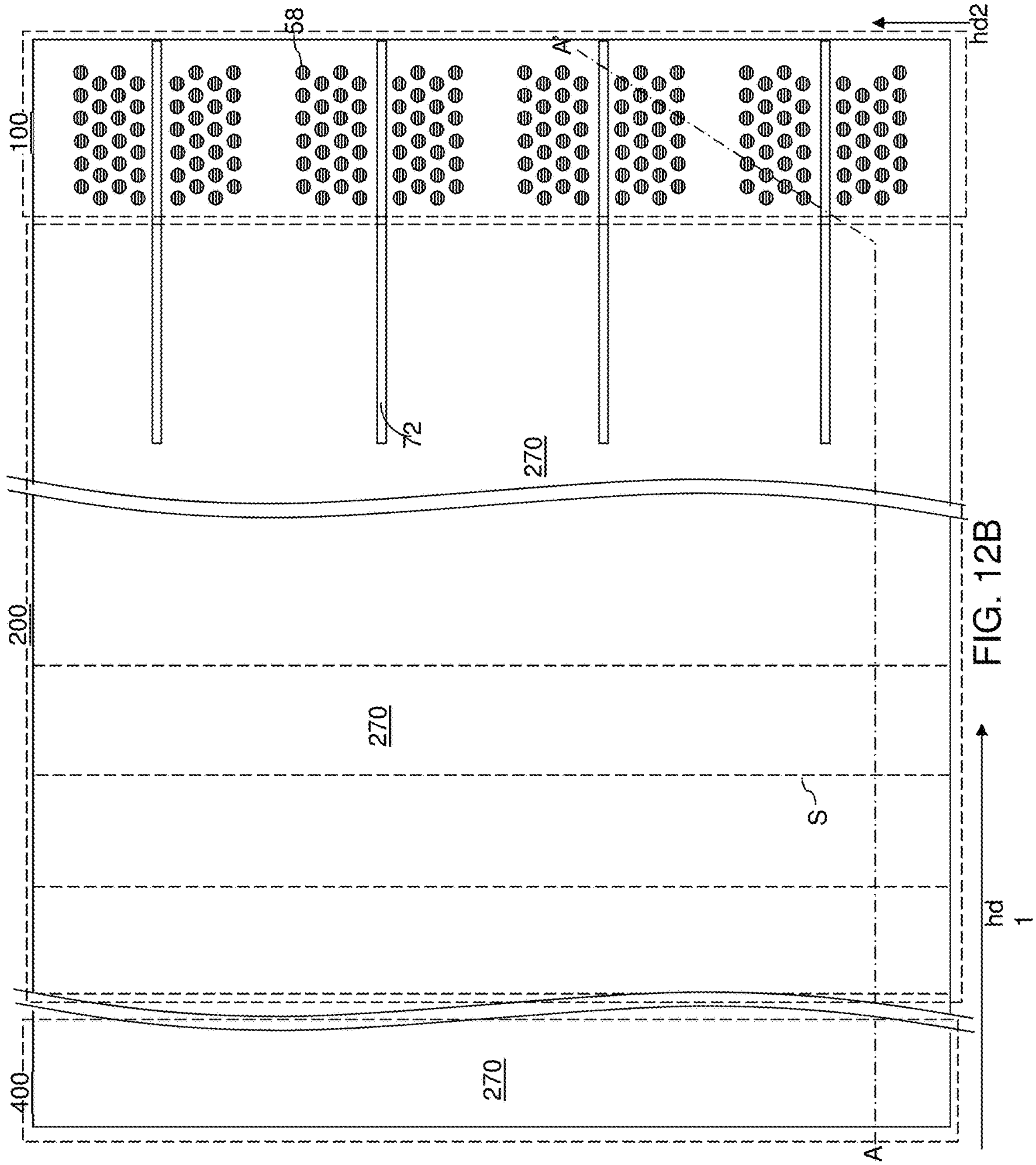
FIG. 12B is a top-down view of the first exemplary structure of FIG. 12A. The hinged vertical plane A-A' corresponds to the plane of the vertical cross-sectional view of FIG. 12A.

Referring to FIGS. 12A and 12B, the first exemplary structure is illustrated after formation of the memory opening fill structures 58.

Figure 13A:
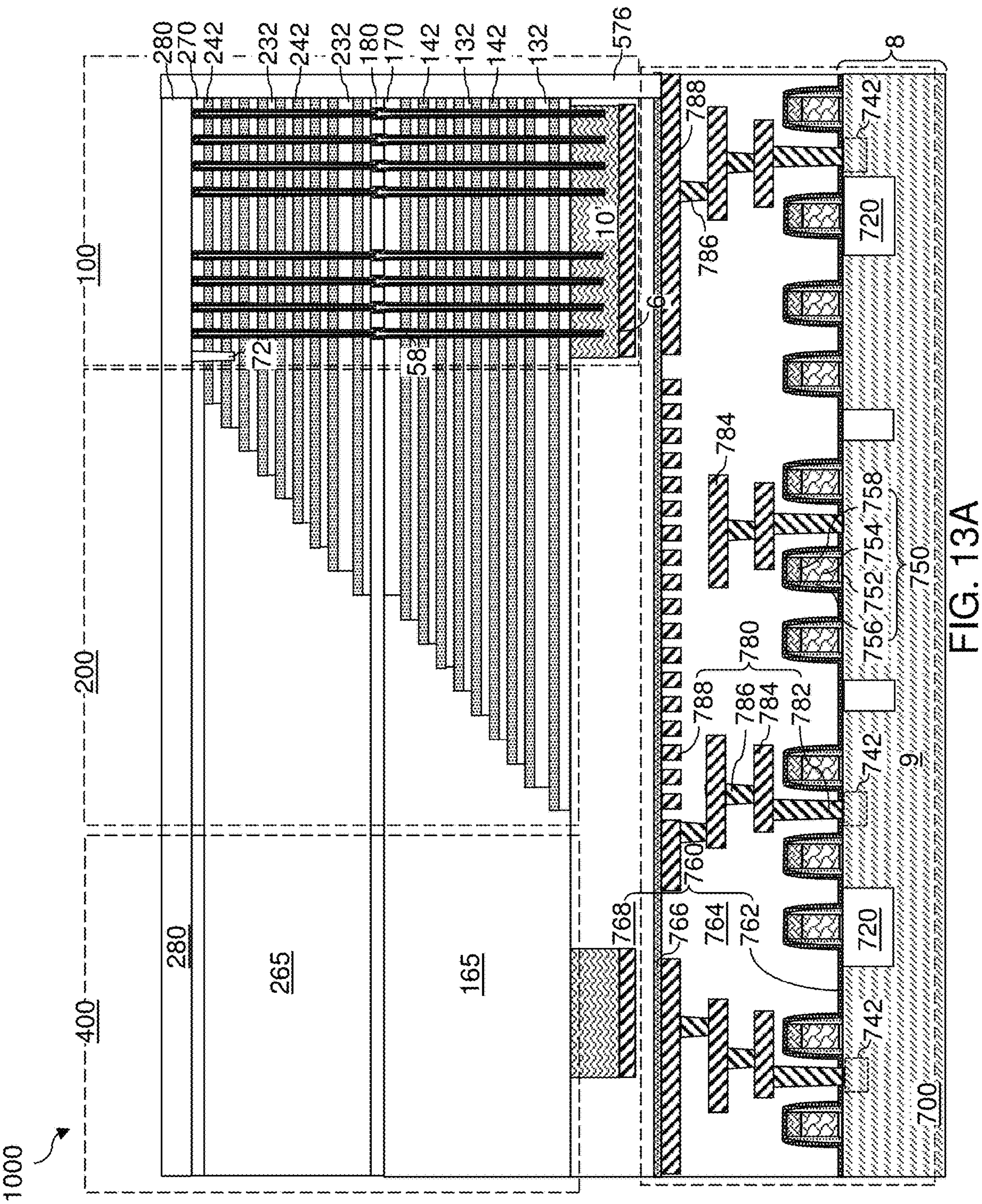
FIG. 13A is a vertical cross-sectional view of the first exemplary structure after formation of through-stack insulating material portion according to the first embodiment of the present disclosure.
Figure 13B:
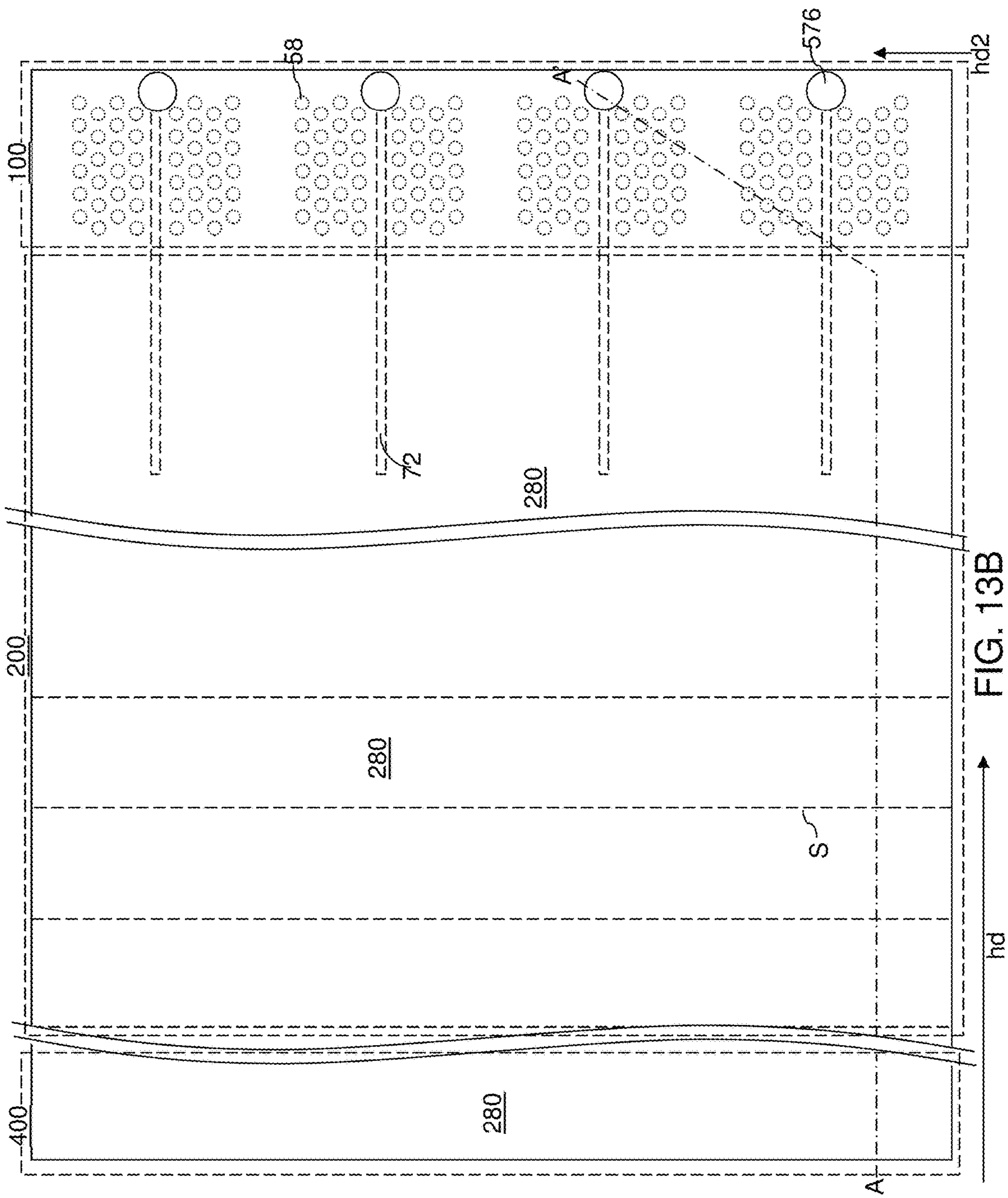
FIG. 13B is a top-down view of the first exemplary structure of FIG. 13A. The hinged vertical plane A-A' corresponds to the plane of the vertical cross-sectional view of FIG. 13A.
Figure 14A:
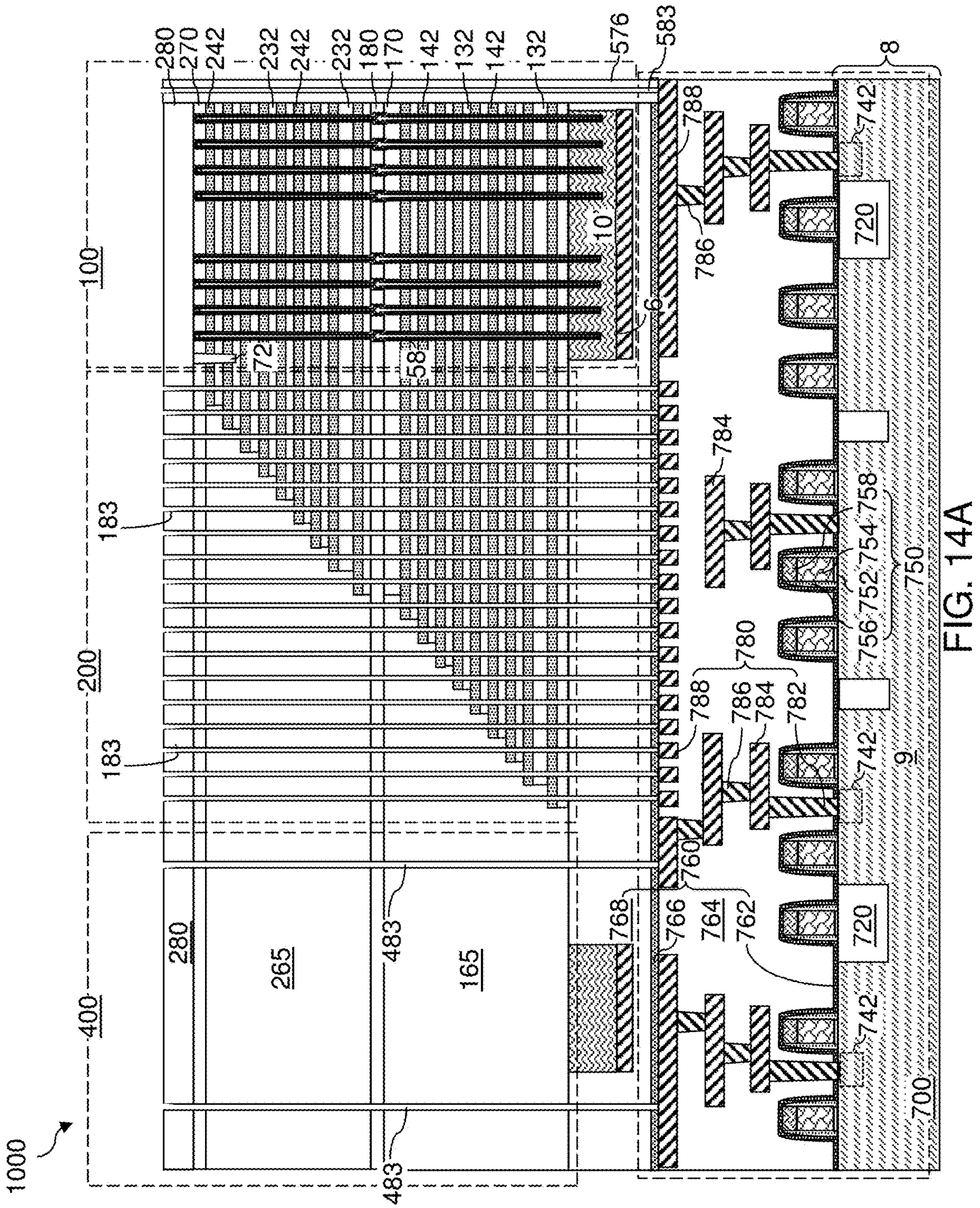
FIG. 14A is a vertical cross-sectional view of the first exemplary structure after formation of staircase region via cavities, peripheral region via cavities, and array region via cavities according to the first embodiment of the present disclosure.
Figure 14B:
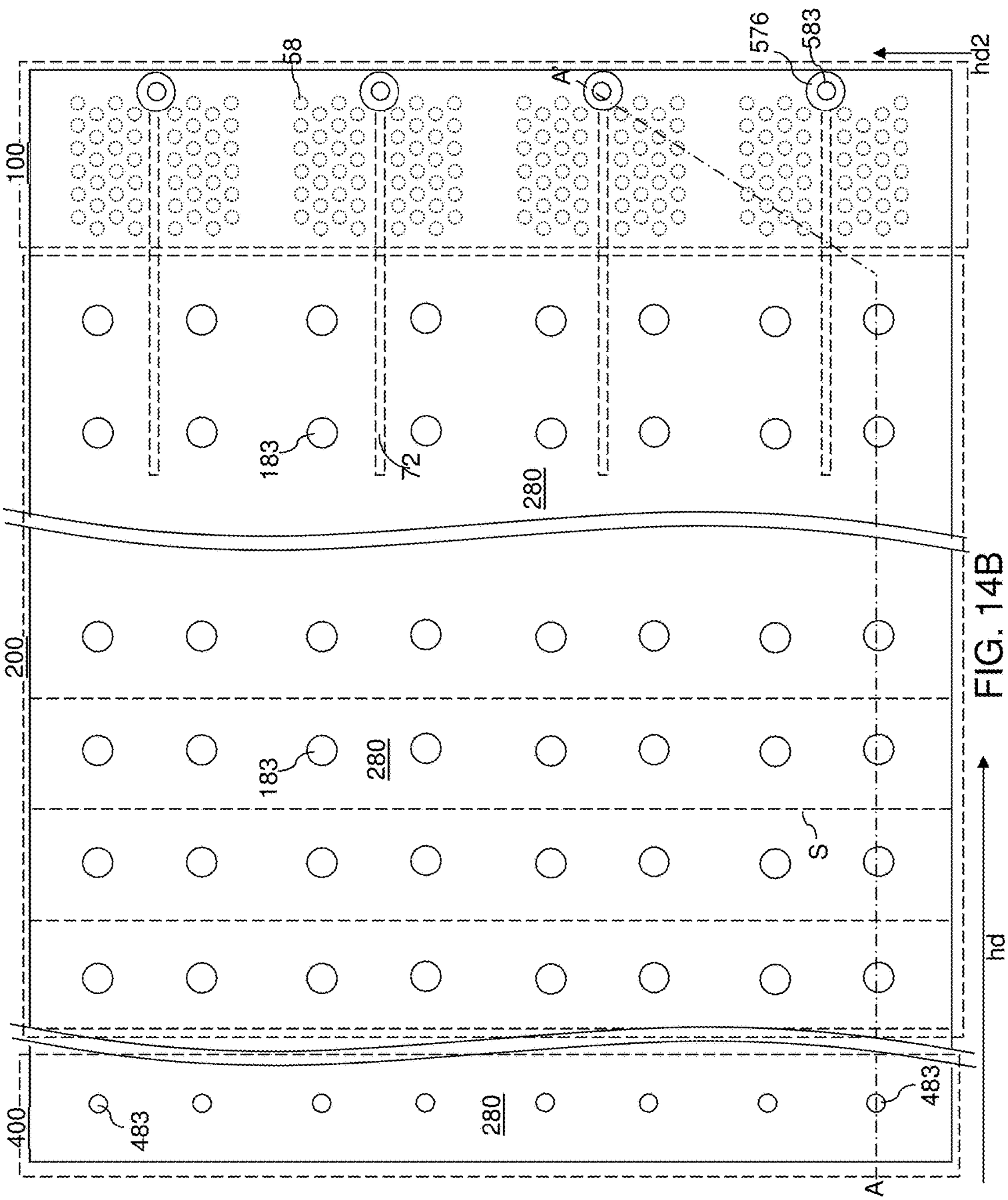
FIG. 14B is a top-down view of the first exemplary structure of FIG. 14A. The hinged vertical plane A-A' corresponds to the plane of the vertical cross-sectional view of FIG. 14A.
Figure 15A:
FIGS. 15A, 15B, and 15C are magnified vertical cross-sectional views of a staircase region via cavity, a peripheral region via cavity, and an array region via cavity, respectively, at the processing steps of FIGS. 14A and 14B.
Figure 15C:
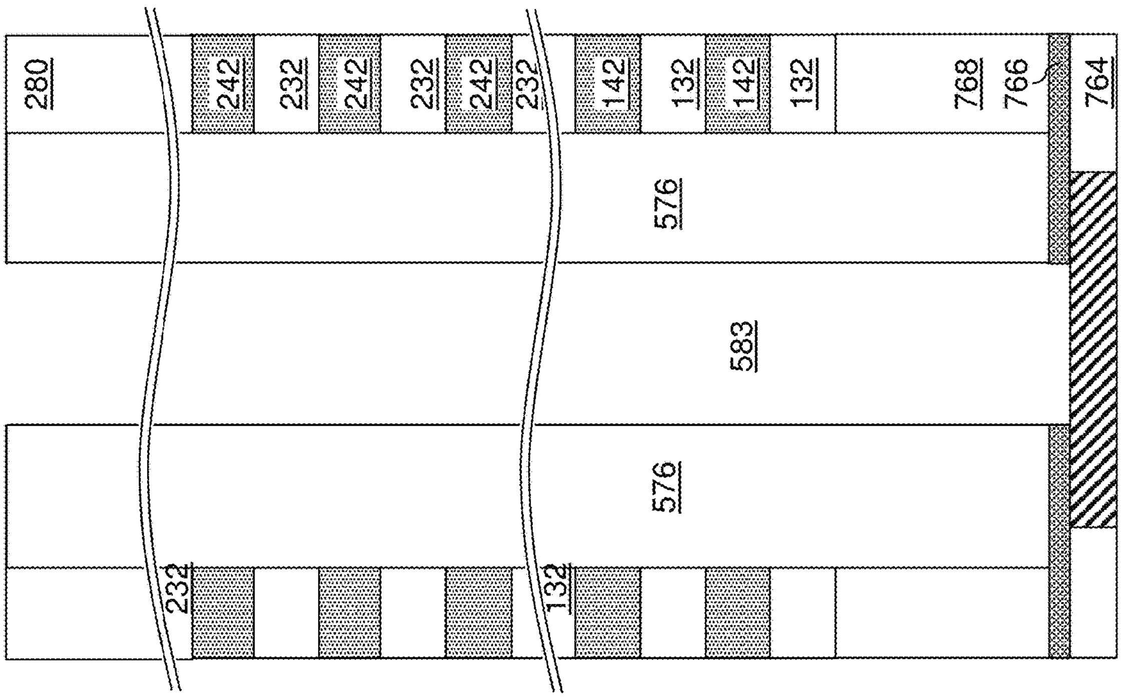
Figure 15B:
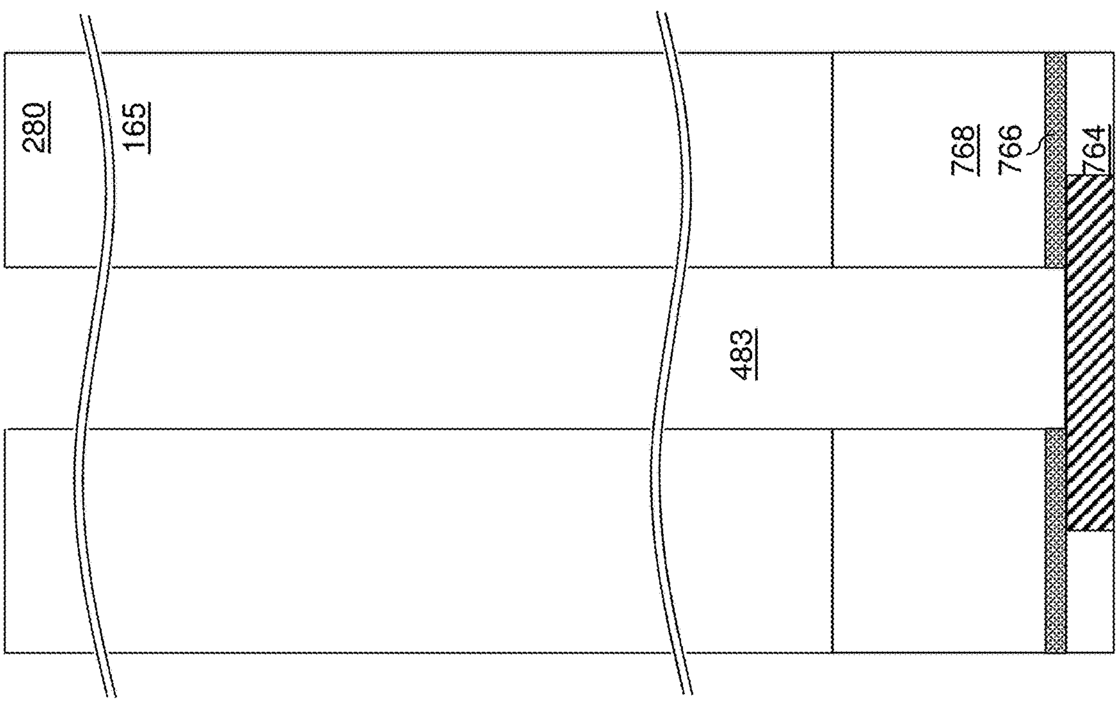

Referring to FIGS. 13A and 13B, a first contact level dielectric layer 280 can be formed over the memory-level assembly. The first contact level dielectric layer 280 is formed at a contact level through which various contact via structures are subsequently formed to the drain regions 63 and the various electrically conductive layers that replaces the sacrificial material layers (142, 242) in subsequent processing steps.

In one optional embodiment, through-stack via cavities can be formed with the memory array region 100, for example, by applying and patterning of a photoresist layer to form openings therein, and by anisotropically etching the portions of the first contact level dielectric layer 280, the alternating stacks (132, 146, 232, 246), and the at least one second dielectric material layer 768 that underlie the openings in the photoresist layer. In one embodiment, each of the through-stack via cavities can be formed within a respective three-dimensional memory array so that each through-stack via cavities is laterally surrounded by memory opening fill structures 58. In one embodiment, one or more of the through-stack via cavities can be formed through the drain-select-level isolation structures 72. However, other locations may also be selected. In one embodiment, the first-through-stack via cavities can be formed within areas of openings in the in-process source-level material layers 10' and the optional planar conductive material layer 6. The bottom surface of each through-stack via cavity can be formed at, or above, the silicon nitride layer 766. In one embodiment, the silicon nitride layer 766 can be used as an etch stop layer during the anisotropic etch process that forms the through-stack via cavities. In this case, the bottom surface of each through-stack via cavity can be formed at the silicon nitride layer 766, and the silicon nitride layer 766 can be physically exposed at the bottom of each through-stack via cavity.

A dielectric material is deposited in the through-stack via cavities. The dielectric material can include a silicon-oxide based material such as undoped silicate glass, doped silicate glass, or a flowable oxide material. The dielectric material can be deposited by a conformal deposition method such as chemical vapor deposition or spin coating. A void may be formed within an unfilled portion of each through-stack via cavity. Excess portion of the deposited dielectric material may be removed from above a horizontal plane including the top surface of the first contact level dielectric layer 280, for example, by chemical mechanical planarization or a recess etch. Each remaining dielectric material portion filling a respective one of the through-stack via cavity constitutes a through-stack insulating material portion 576. The through-stack insulating material portions 576 contact sidewalls of the alternating stacks (132, 146, 232, 246), and may contact the silicon nitride layer 766. In another embodiment, the through-stack via cavities and the through-stack insulating material portions 576 can be omitted.

Referring to FIGS. 14A, 14B, 15A, 15B, and 15C, a photoresist layer (not shown) can be applied over the first contact level dielectric layer 280, and can be lithographically patterned to form various openings in areas in which via cavities are to be subsequently formed. An optional opening can be formed over the through-stack insulating material portions 576 in the memory array region 100, and openings can be formed over horizontal surfaces of the stepped surfaces in the staircase region 200, and in the peripheral device region 400. An anisotropic etch process can be performed to transfer the pattern of the openings in the photoresist layer through the various material portions in the memory-level assembly. Various contact via cavities (183, 483, and optionally 583) can be formed through the memory-level assembly. Specifically, the various contact via cavities (183, 483, 583) can vertically extend to the top surfaces of the topmost lower-level metal line structures 788. In one embodiment, the silicon nitride layer 766 may be used as an etch stop layer in the final phase of the anisotropic etch process, and the anisotropic etch process can include a silicon nitride breakthrough etch step that etches through the silicon nitride layer 766 and physically exposes top surface of the topmost lower-level metal line structures 788.

The various contact via cavities (183, 483, 583) that are formed through the memory-level assembly include staircase region via cavities 183 that extend through a respective one of the horizontal surfaces of the stepped surfaces in the staircase region 200, peripheral region via cavities 483 that extend through the retro-stepped dielectric material portions (265, 165) in the peripheral device region 400, and optional array region via cavities 583 that are formed through a respective one of the through-stack insulating material portions 576 in the memory array region 100. In one embodiment, each of the various contact via cavities (183, 483, 583) can be a cylindrical via cavity. As used herein, a "cylindrical via cavity" refers to a via cavity having only a straight sidewall or straight sidewalls such that each straight sidewall is vertical or substantially vertical. As used herein, a surface is "substantially vertical" if the taper angle of the surface with respect to a vertical direction is less than 5 degrees. Each staircase region via cavity 183 is a cylindrical via cavity that extends through a second retro-stepped dielectric material portion 265 and a subset of layers within the second alternating stack (232, 242) and the first alternating stack (132, 142) and over the lower-level metal interconnect structures 780. A top surface of a respective one of the lower-level metal interconnect structures 780 (such as the topmost lower-level metal line structures 788) can be physically exposed at the bottom of each of the various contact via cavities (183, 483, 583).

Figure 16A:
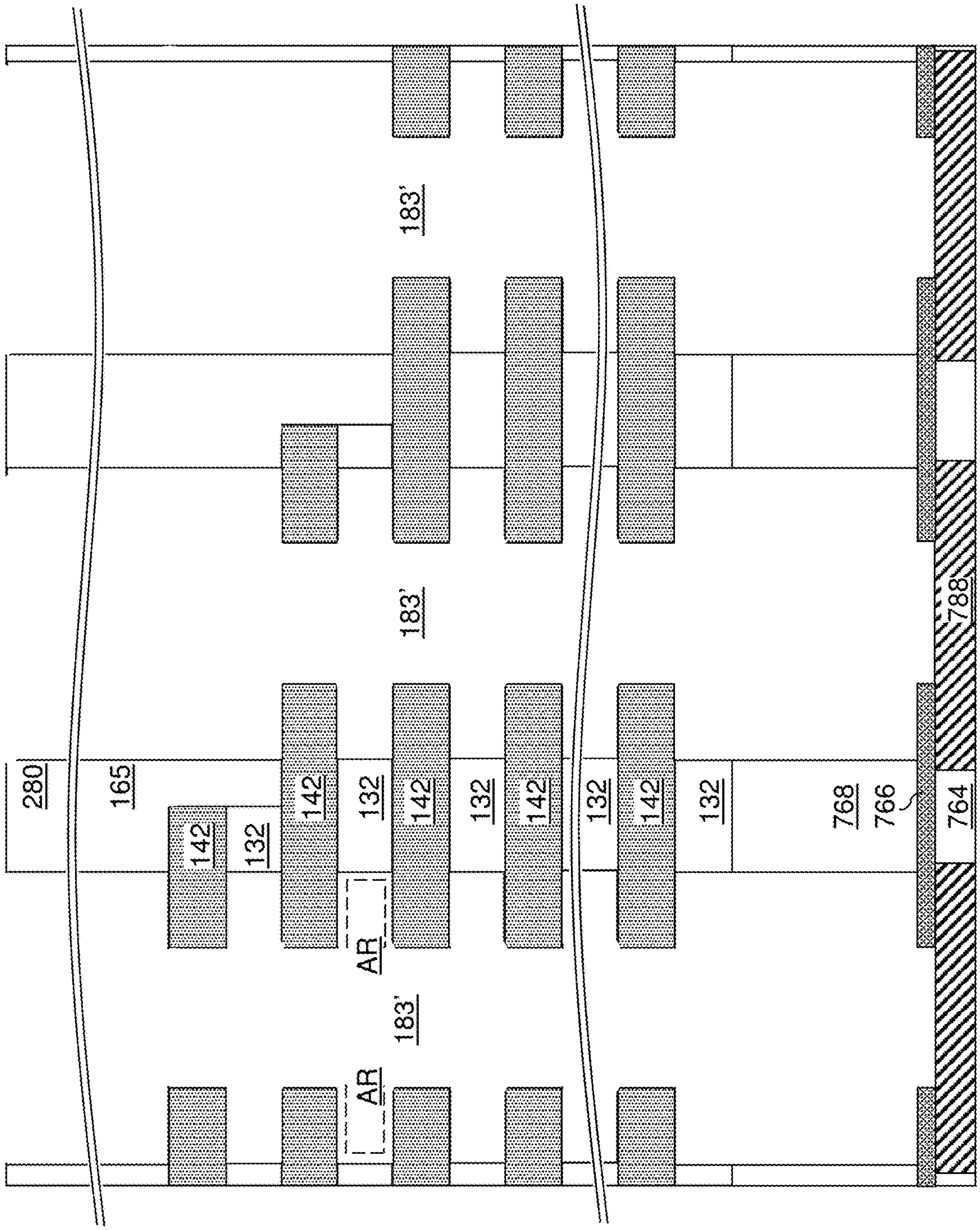
FIGS. 16A. 16B, and 16C are magnified vertical cross-sectional views of a staircase region via cavity, a peripheral region via cavity, and an array region via cavity, respectively, after an isotropic etch process that converts the staircase region via cavity into a ribbed via cavity according to the first embodiment of the present disclosure.
Figure 16C:
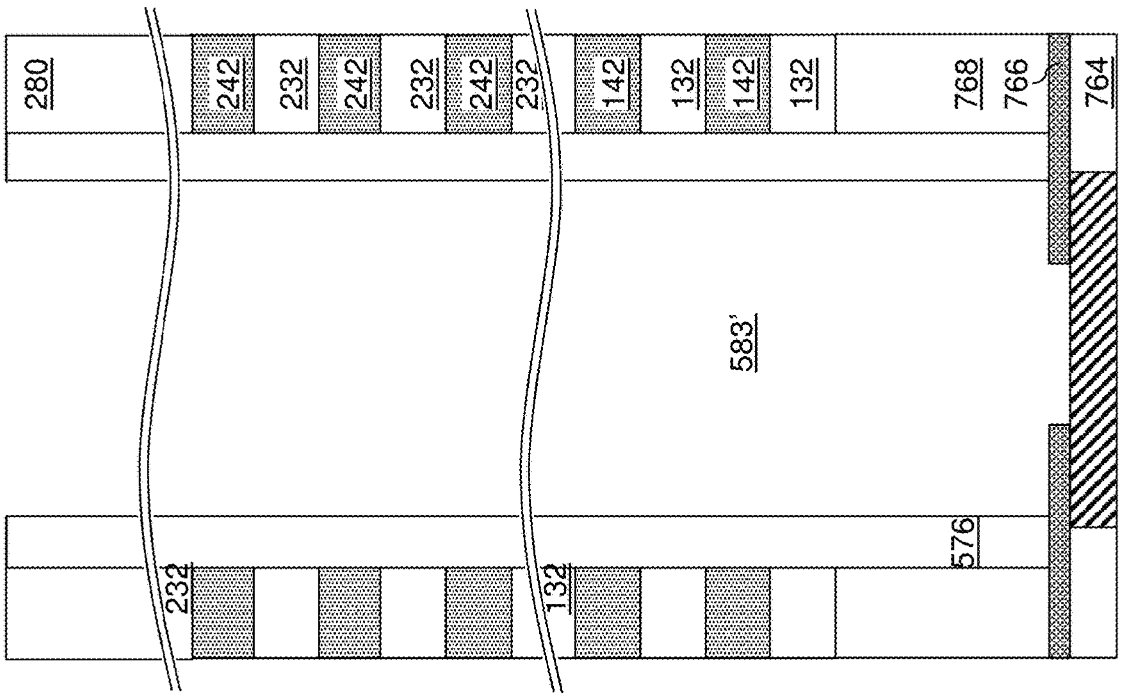
Figure 16B:
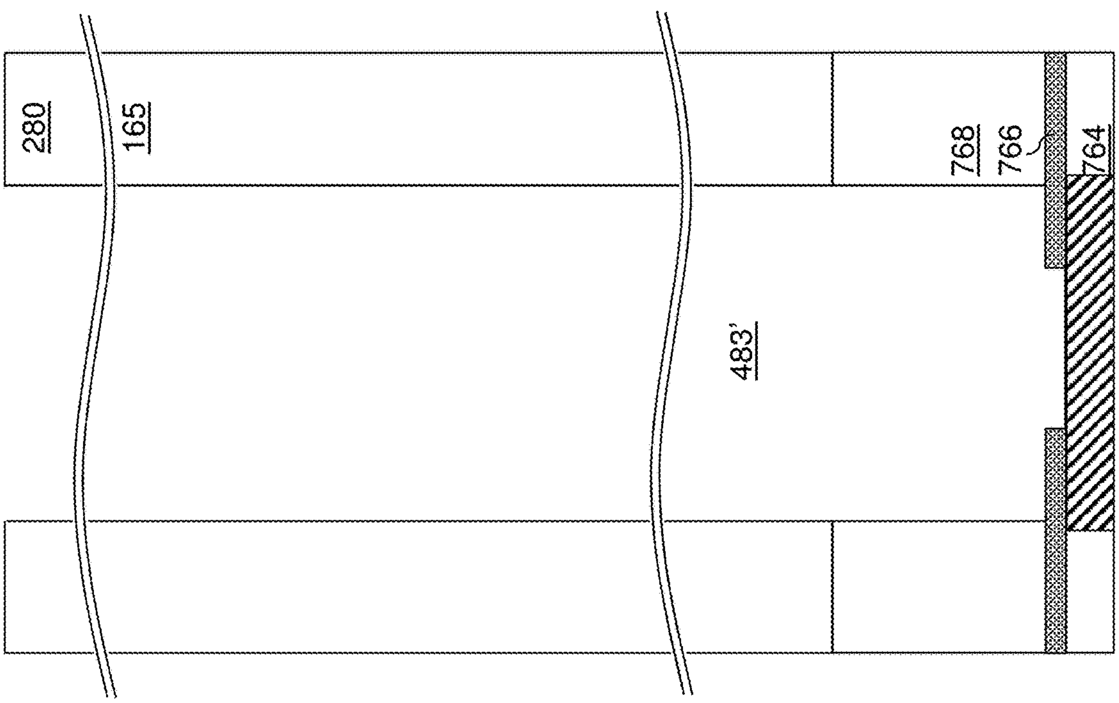

Referring to FIGS. 16A, 16B, and 16C, an isotropic etch process can be performed to laterally recess the insulating layers (132, 232) with respect to the spacer material layers such as the first and second sacrificial material layers (142, 242). Each staircase region via cavity 183 can be converted from a cylindrical via cavity to a ribbed via cavity 183'. As used herein, a "ribbed via cavity" refers to a via cavity including at least one annular laterally protruding volume. Each annular laterally protruding volume of a ribbed via cavity is herein referred to as a "rib region."

In one embodiment, the retro-stepped dielectric material portions (165, 265) can include a same dielectric material or a similar dielectric material as the insulating layers (132, 232). For example, the first and second insulating layers (132, 232) can include undoped silicate glass, and the retro-stepped dielectric material portions (165, 265) can include undoped silicate glass or doped silicate glass. In this case, the ribbed via cavities 183' can be formed from the cylindrical staircase region via cavities 183 by etching materials of the retro-stepped dielectric material portions (165, 265) and the insulating layers (132, 232) selective to the spacer material layers (i.e., the first and second sacrificial material layers (142, 242)).

In one embodiment, the dielectric materials of the first contact level dielectric layer 270, the first and second insulating cap layers (170, 270), the first and second retro-stepped dielectric material portions (165, 265), and the insulating layers (132, 232) can comprise silicon oxide materials (such as undoped silicate glass and various doped silicate glasses), and the first and second sacrificial material layers (142, 242) can include a sacrificial material that is not a silicate glass material (such as silicon nitride or a semiconductor material). In this case, the isotropic etch process can etch the dielectric materials of the first contact level dielectric layer 270, the first and second insulating cap layers (170, 270), the first and second retro-stepped dielectric material portions (165, 265), and the insulating layers (132, 232) can be etched selective to the materials of the first and second sacrificial material layers (142, 242) to form the ribbed via cavities 183'.

In one embodiment, the spacer material layers of the alternating stacks (132, 142, 232, 242) can include sacrificial material layers (142, 242) that are composed of silicon nitride, and the insulating layers (132, 232) and the retro-stepped dielectric material portions (265, 165) can include silicon oxide materials. In this case, the retro-stepped dielectric material portions (165, 265) and each insulating layer (132, 232) physically exposed to the staircase region via cavities 183 can be isotropically recessed by a wet etch process employing hydrofluoric acid. Each ribbed via cavity 183' can include a ribbed cavity region extending through the alternating stacks (132, 142, 232, 242), an overlying cavity laterally surrounded by the second retro-stepped dielectric material portion 265 and optionally by the first retro-stepped dielectric material portion 165 (in case the ribbed via cavity 183' extends only through the first-tier alternating stack (132, 142) and does not extend through the second-tier alternating stack (232, 242)), an underlying cavity that underlies the alternating stacks (132, 142, 232, 242), and annular recesses AR, or rib regions, formed at levels of insulating layers (132, 232) in the subset of layers within the alternating stacks (132, 142, 232, 242) through which the ribbed via cavity 183' vertically extends.

Each of the peripheral region via cavities 483 and the array region via cavities 583 can be isotropically expanded laterally to form expanded peripheral region via cavities 483' and expanded array region via cavities 583'. In one embodiment, the dielectric materials of the first contact level dielectric layer 280, the first and second insulating cap layers (170, 270), the first and second retro-stepped dielectric material portions (165, 265), and the insulating layers (132, 232) can include a same dielectric material such as undoped silicate glass, and the peripheral region via cavities 483' and the expanded array region via cavities 583' can be cylindrical cavities. Alternatively, the dielectric materials of the first contact level dielectric layer 280, the first and second insulating cap layers (170, 270), the first and second retro-stepped dielectric material portions (165, 265), and the insulating layers (132, 232) can have different etch rates during the isotropic etch process, and the peripheral region via cavities 483' and expanded array region via cavities 583' may include lateral steps having a lesser lateral dimension than the recess distance by which the sacrificial material layers (142, 242) are laterally recessed.

Figure 17A:
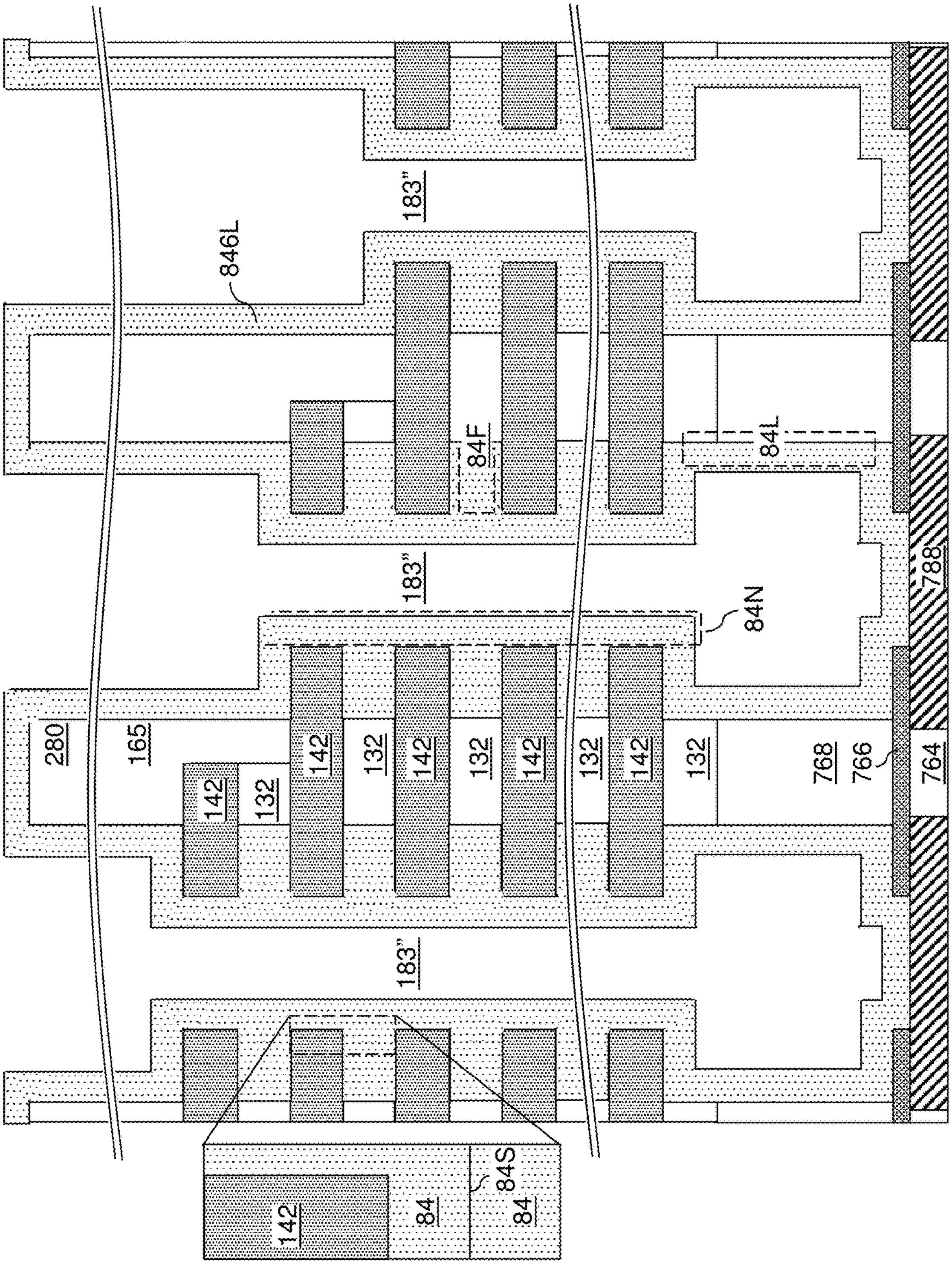
FIGS. 17A. 17B, and 17C are magnified vertical cross-sectional views of a staircase region via cavity, a peripheral region via cavity, and an array region via cavity, respectively, after deposition of a conformal dielectric via liner according to the first embodiment of the present disclosure.
Figure 17C:
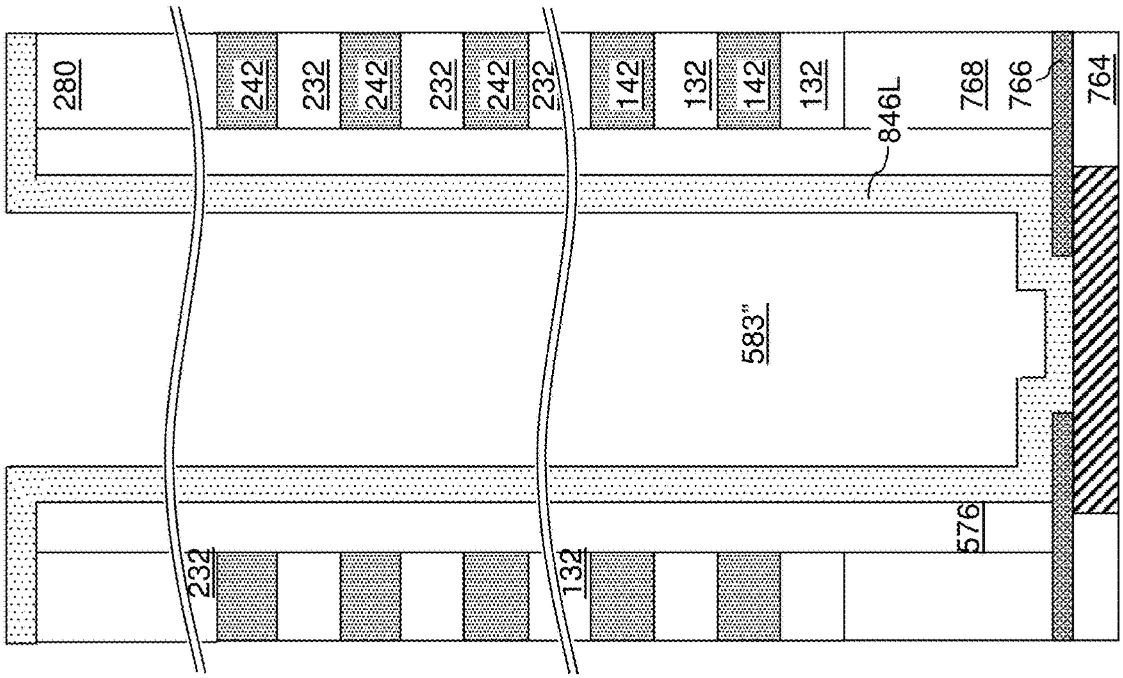
Figure 17B:
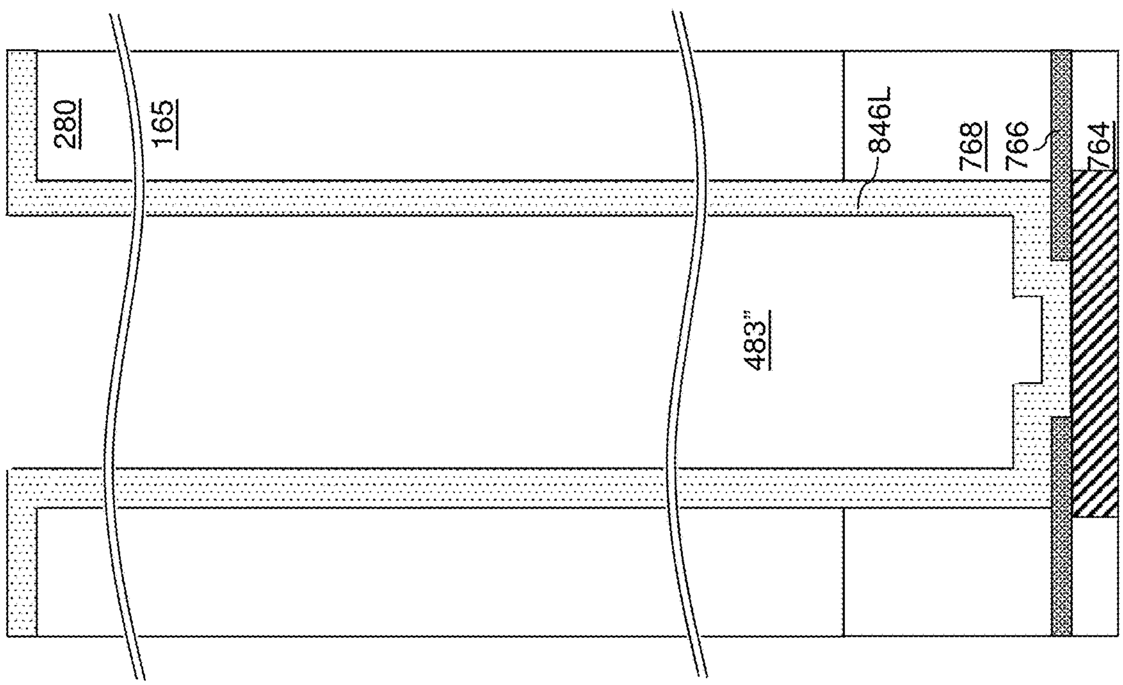
Figure 18A:
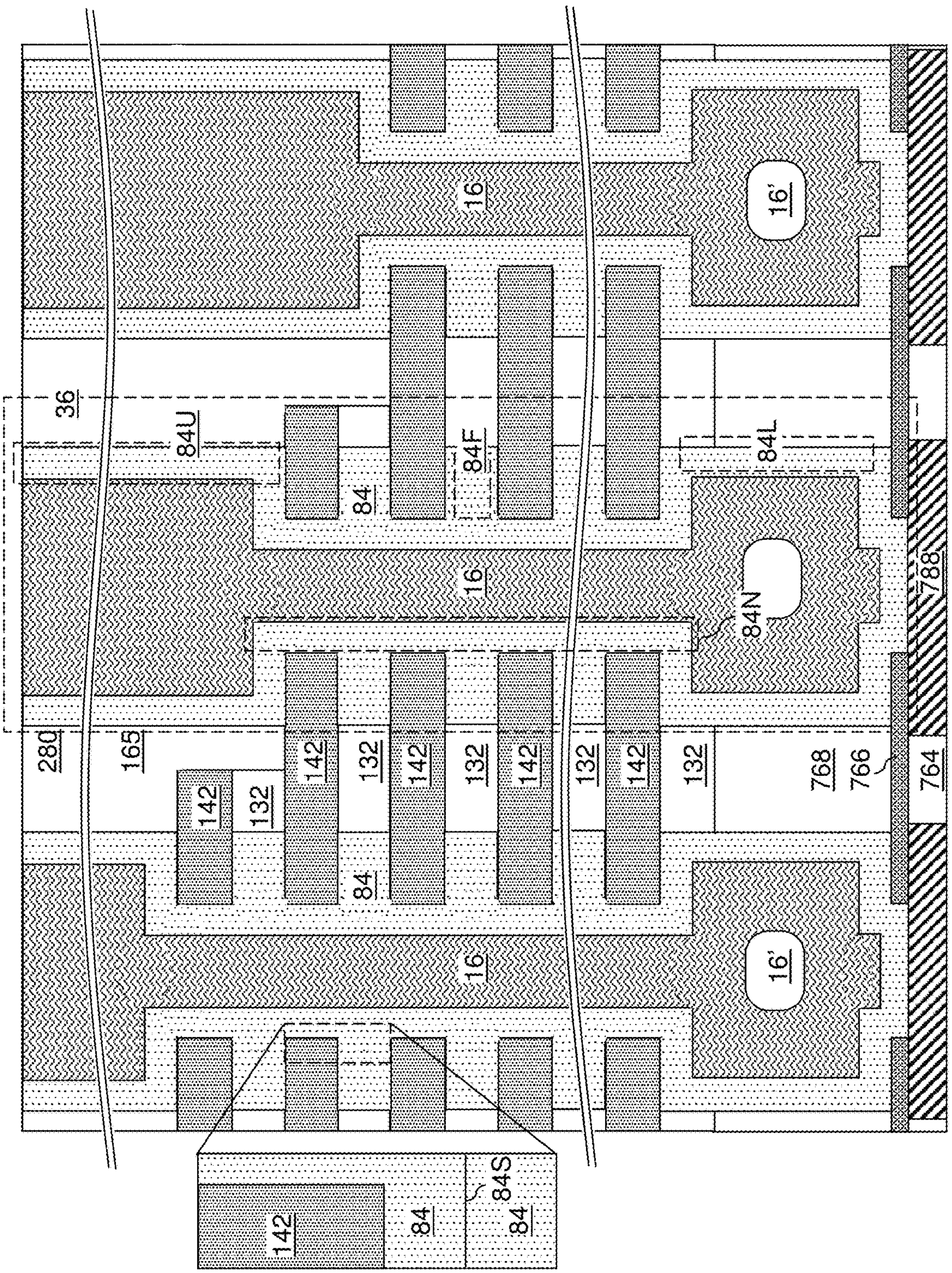
FIGS. 18A, 18B, and 18C are magnified vertical cross-sectional views of a staircase region via cavity, a peripheral region via cavity, and an array region via cavity, respectively, after formation of various sacrificial via fill material portions therein according to the first embodiment of the present disclosure.
Figure 18C:
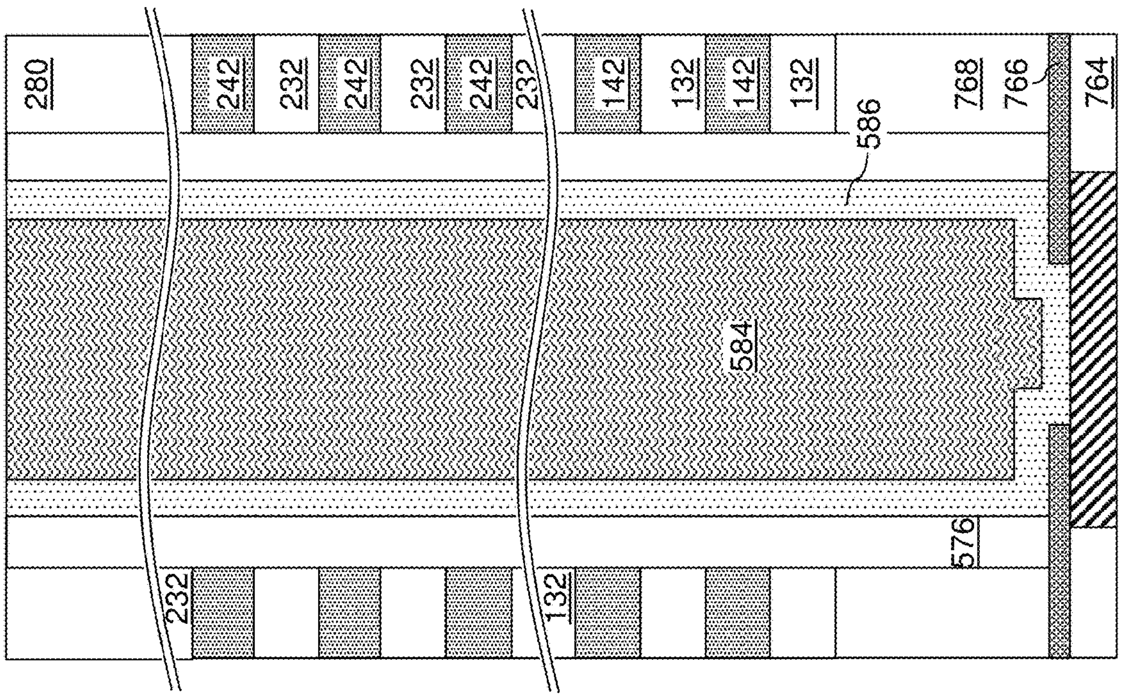
Figure 18B:
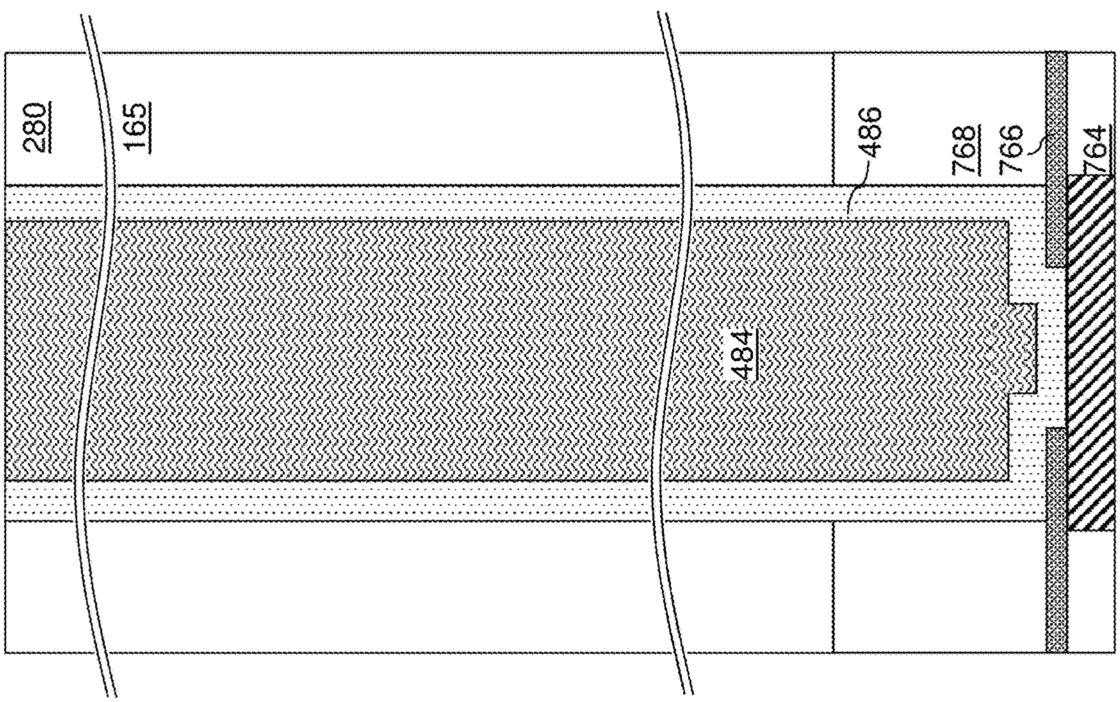
Figure 19:
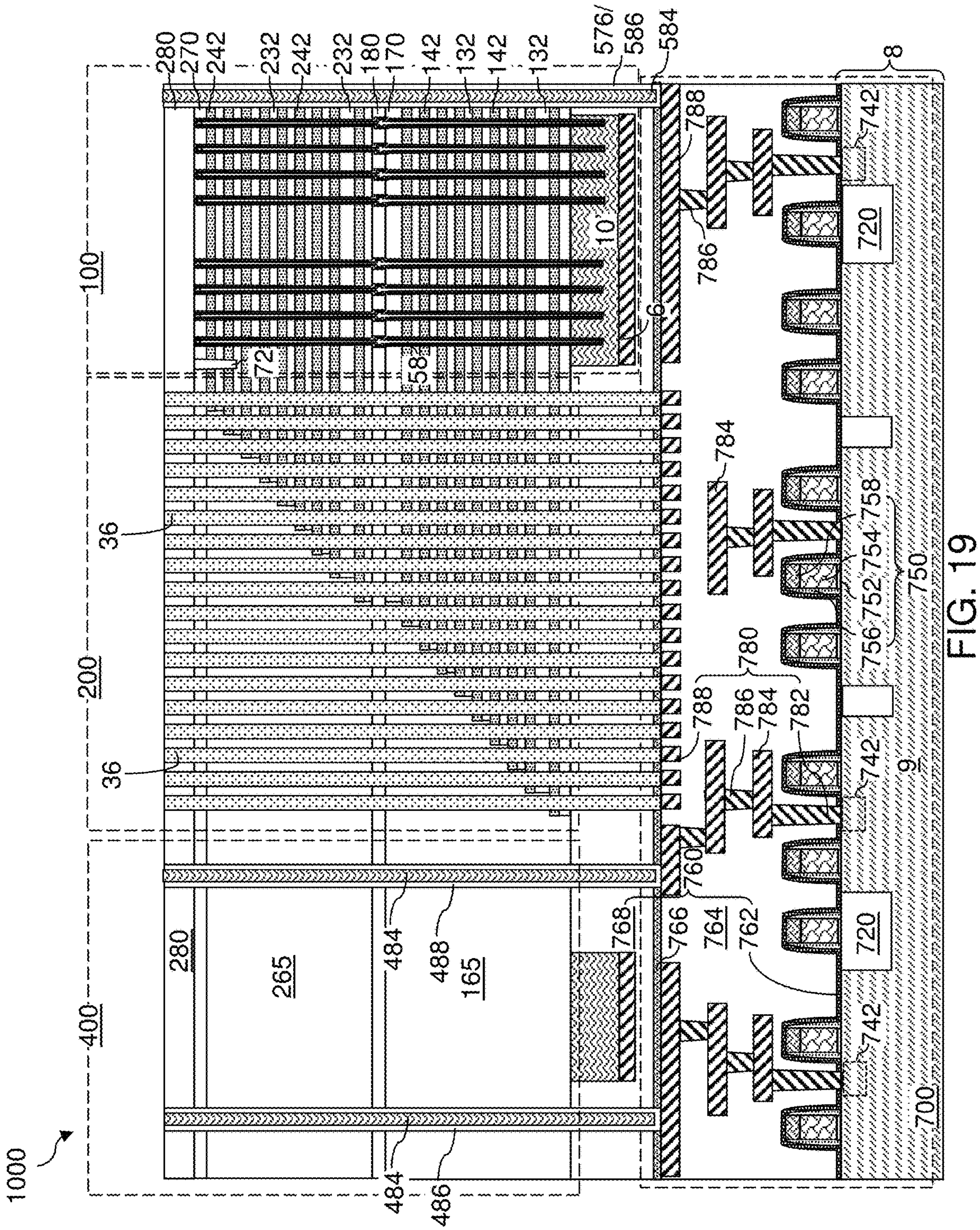
FIG. 19 is a vertical cross-sectional view of the first exemplary structure at the processing steps of FIGS. 18A, 18B, and 18C.

Referring to FIGS. 17A, 17B, and 17C, a conformal dielectric via liner 846L can be deposited at the periphery of the ribbed via cavities 183', the expanded peripheral region via cavities 483', and expanded array region via cavities 583' by a conformal deposition process. The conformal dielectric via liner 846L includes a dielectric material that is different from the material of the sacrificial material layers (142, 242). For example, the conformal dielectric via liner 846L can include silicon oxide or a dielectric metal oxide (such as aluminum oxide). In one embodiment, the conformal dielectric via liner 846L can include undoped silicate glass formed by thermal decomposition of tetraethylorthosilicate (TEOS). The thickness of the conformal dielectric via liner 846L can be greater than one half of the maximum thickness of the sacrificial material layers (142, 242). Portions 84F of the conformal dielectric via liner 846L deposited at peripheries of the ribbed via cavities 183' fill the annular recesses AR (i.e., the rib regions). A neck portion 84N of the conformal dielectric via liner 846L can be formed around each set of at least one annular portions of the conformal dielectric via liner 846L that fill the annular recess(es) of each ribbed via cavity 183'. An annular seam 84S can be present within each portion of the conformal dielectric via liner 846L that fills the annular recesses AR. The conformal dielectric via liner 846L can be formed directly on each physically exposed top surface of the lower-level metal interconnect structures 780 (such as the physically exposed top surfaces of the topmost lower-level metal line structures 788). An unfilled void 183" can be present within each ribbed via cavity 183' after deposition of the conformal dielectric via liner 846L. An unfilled void 483" can be present within each expanded peripheral region via cavity 483' after deposition of the conformal dielectric via liner 846L. An unfilled void 583" can be present within each expanded array region via cavity 583' after deposition of the conformal dielectric via liner 846L.

Referring to FIGS. 18A, 18B, 18C, and 19, a sacrificial via fill material can be deposited in each of the unfilled voids (183", 483", 583") in the staircase region via cavities, the peripheral region via cavities, and the array region via cavities by a conformal deposition process. Various sacrificial via fill material portions (16, 484, 584) can be formed in the unfilled voids (183", 483", 583") by deposition of the sacrificial via fill material and planarization of the sacrificial via fill material from above the top surface of the first contact level dielectric layer 280. The sacrificial via fill material is a material that can be removed selective to the material of the conformal dielectric via liner 846L. For example, the sacrificial via fill material can comprise a semiconductor material such as amorphous silicon or a dielectric material such as organosilicate glass. The sacrificial via fill material can be deposited by a non-conformal deposition process or a conformal deposition process. A void 16' may be present at a lower portion of each staircase region via cavity. Planarization of the sacrificial via fill material can be performed by a chemical mechanical planarization (CMP) process or by a recess etch process. Horizontal portions of the conformal dielectric via liner 846L can be removed from above the top surface of the first contact level dielectric layer 280 by the planarization process.

Each remaining portion of the sacrificial material filling the voids constitutes a sacrificial via fill material portion (16, 484, 584). The sacrificial via fill material portions (16, 484, 584) include staircase region sacrificial via fill material portions 16 formed in the staircase region via cavities, peripheral region sacrificial via fill material portions 484 formed in the peripheral region via cavities, and array region sacrificial via fill material portions 584 formed in the array region via cavities. Each remaining portion of the conformal dielectric via liner 486L in the various via cavities constitute a conformal insulating liner (84, 486, 586). The conformal insulating liners (84, 486, 586) include staircase region conformal dielectric via liners 84, peripheral region conformal insulating liners 486, and array region conformal insulating liners 586. Each staircase region conformal dielectric via liner 84 can include neck portion 84N that vertically extends through a respective subset of the layers in the alternating stacks (132, 142, 232, 242), an upper cylindrical portion 84U extending through the first contact level dielectric layer 280 and the second retro-stepped dielectric material portion 265 and optionally through the first retro-stepped dielectric material portion 165, a lower cylindrical portion 84L that extends through the bottommost first insulating layer 132 and the at least one second dielectric material layer 768, and a bottom portion that contacts a respective topmost lower-level metal line structure 788 and an annular surface of the silicon nitride layer 766. Each adjoining set of a staircase region conformal dielectric via liner 84 and a staircase region sacrificial via fill material portion 16 constitutes a staircase region sacrificial via structure 36.

Figure 20A:
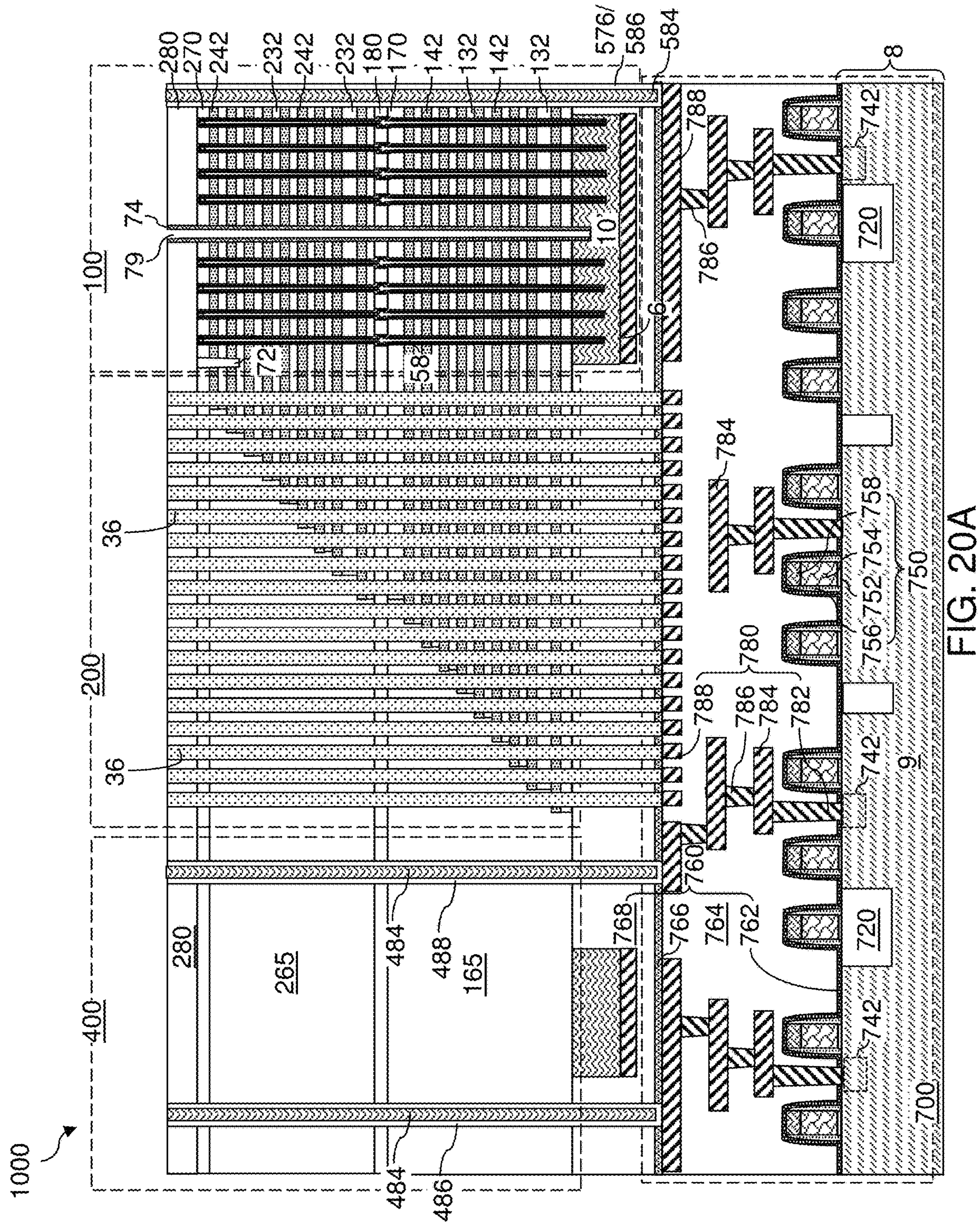
FIG. 20A is a vertical cross-sectional view of the first exemplary structure after formation of backside trenches according to the first embodiment of the present disclosure.
Figure 20B:
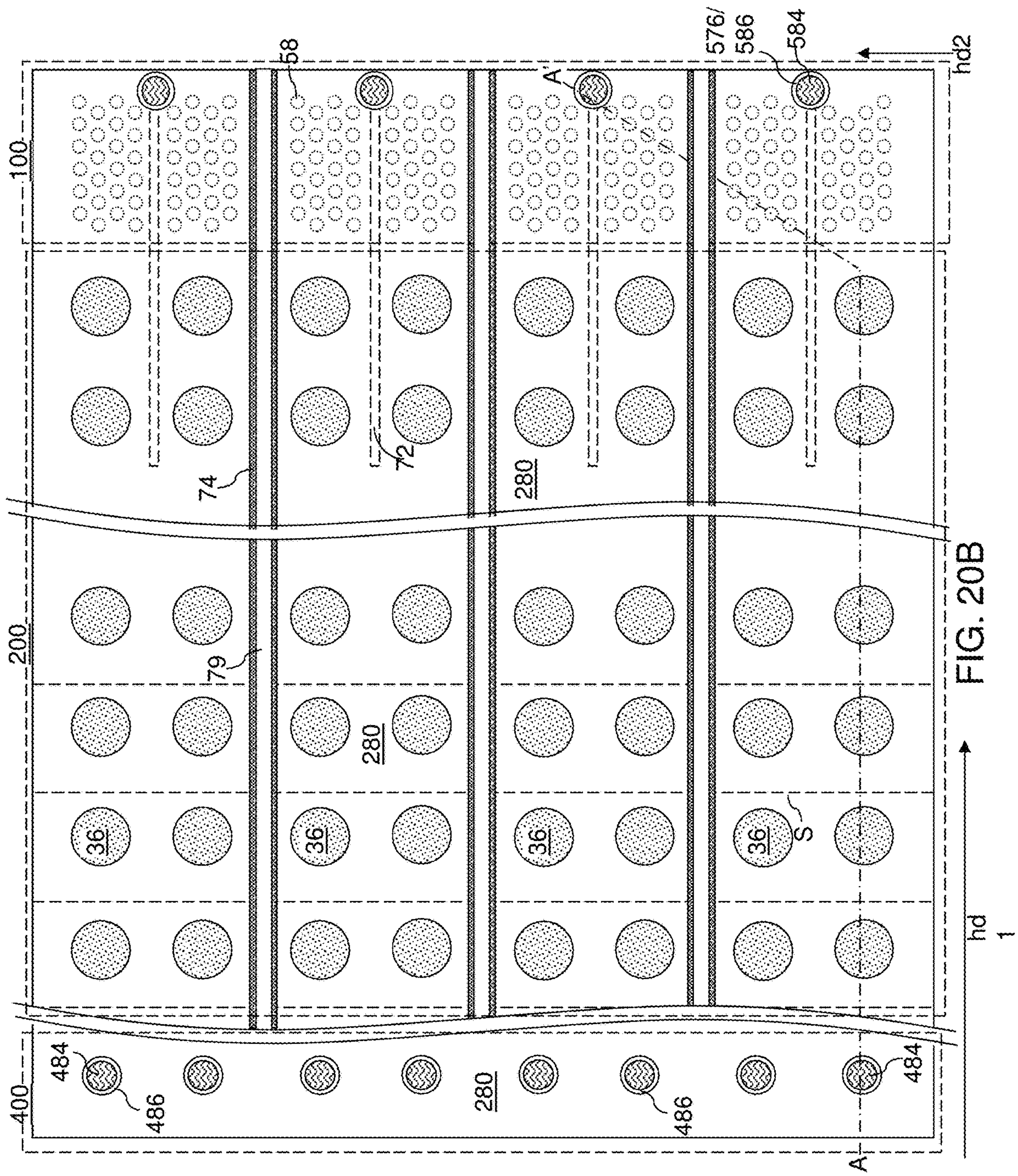
FIG. 20B is a top-down view of the first exemplary structure of FIG. 20A. The hinged vertical plane A-A' corresponds to the plane of the vertical cross-sectional view of FIG. 20A.
Figure 21A:
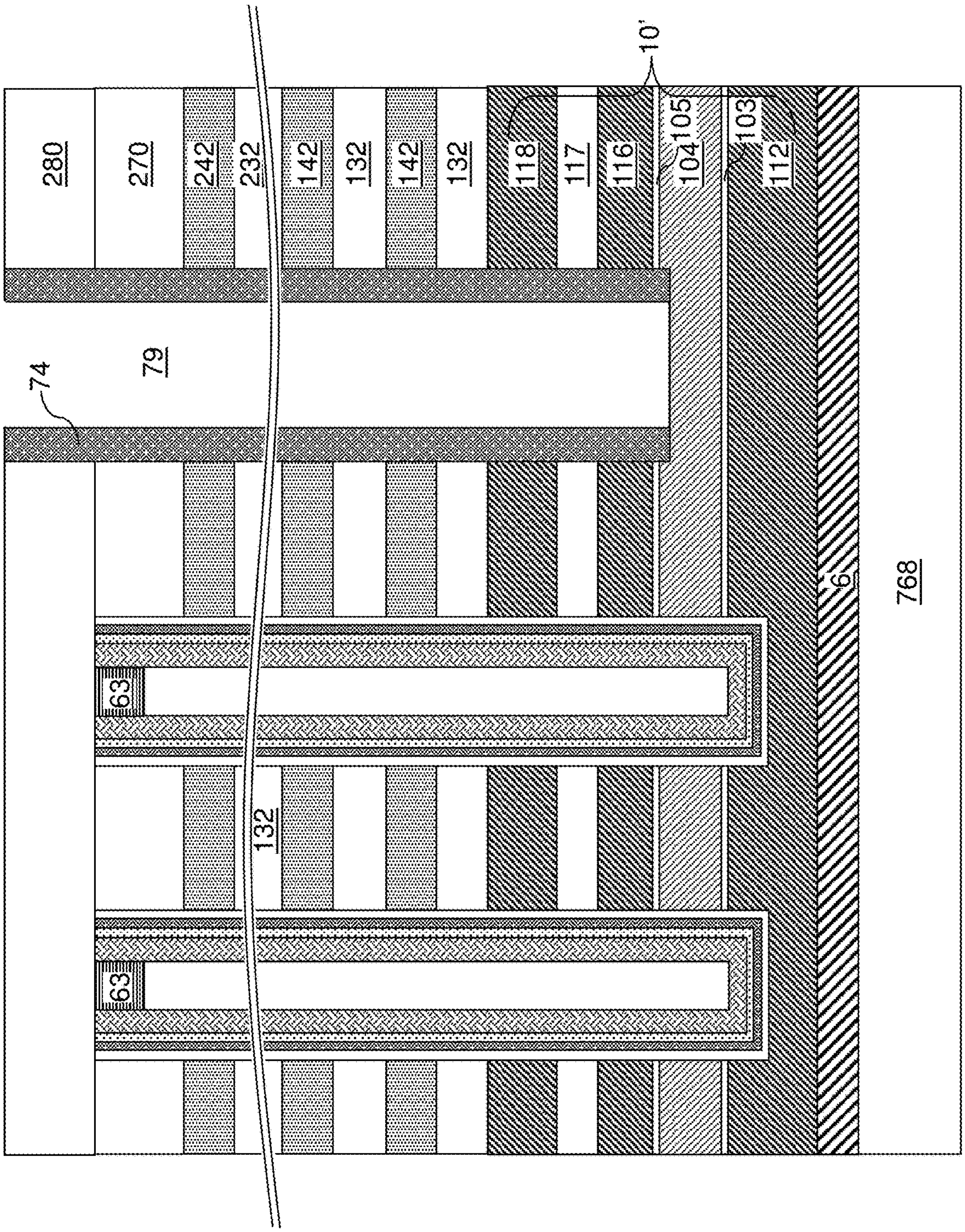
FIGS. 21A-21E are sequential vertical cross-sectional views of a region of the first exemplary structure during formation of source-level material layers by replacement of various material portions within the in-process source-level material layers of FIG. 1B with a middle buried semiconductor layer according to the first embodiment of the present disclosure.

Referring to FIGS. 20A, 20B, and 21A, backside trenches 79 are subsequently formed through the first contact level dielectric layer 280 and the memory-level assembly. For example, a photoresist layer can be applied and lithographically patterned over the first contact level dielectric layer 280 to form elongated openings that extend along the first (e.g., word line) horizontal direction hd1. An anisotropic etch is performed to transfer the pattern in the patterned photoresist layer through a predominant portion of the memory-level assembly to the in-process source-level material layers 10'. For example, the backside trenches 79 can extend through the optional source selective level conductive layer 118, the source-level insulating layer 117, the upper source layer 116, and the upper sacrificial liner 105 and into the source-level sacrificial layer 104. The optional source selective level conductive layer 118 and the source-level sacrificial layer 104 can be used as etch stop layers for the anisotropic etch process that forms the backside trenches 79. The photoresist layer can be subsequently removed, for example, by ashing.

The backside trenches 79 extend along the first horizontal direction hd1, and thus, are elongated along the first horizontal direction hd1. The backside trenches 79 can be laterally spaced among one another along a second horizontal direction hd2, which can be perpendicular to the first horizontal direction hd1. The backside trenches 79 can extend through the memory array region 100 (which may extend over a memory plane) and the staircase region 200. The backside trenches 79 can laterally divide the memory-level assembly into memory blocks.

Backside trench spacers 74 can be formed on sidewalls of the backside trenches 79 by conformal deposition of a dielectric spacer material and an anisotropic etch of the dielectric spacer material. The dielectric spacer material is a material that can be removed selective to the materials of first and second insulating layers (132, 232). For example, the dielectric spacer material can include silicon nitride. The lateral thickness of the backside trench spacers 74 can be in a range from 4 nm to 60 nm, such as from 8 nm to 30 nm, although lesser and greater thicknesses can also be used.

Figure 21B:
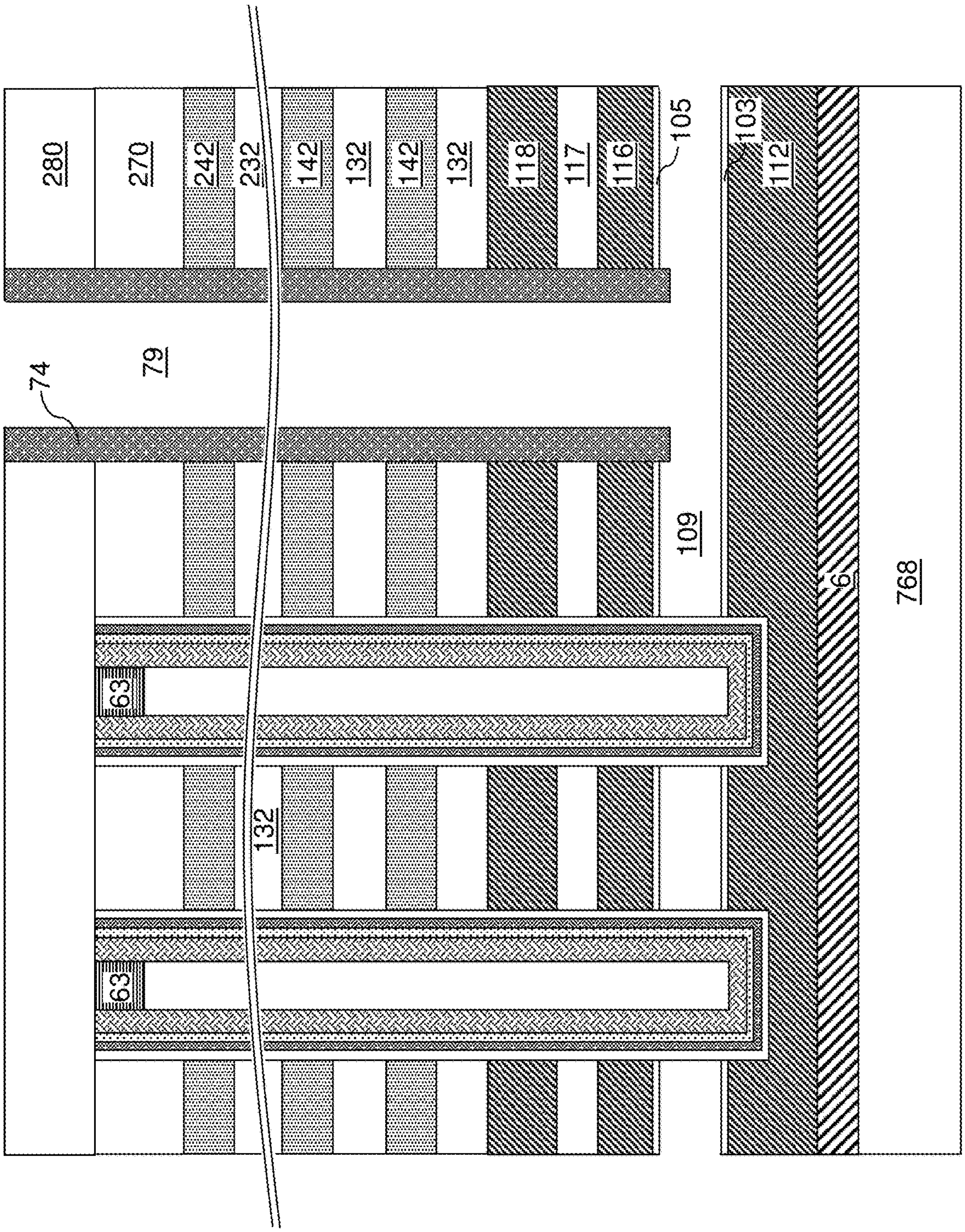

Referring to FIG. 21B, an etchant that etches the material of the source-level sacrificial layer 104 selective to the materials of the backside trench spacers 74, the upper sacrificial liner 105, and the lower sacrificial liner 103 can be introduced into the backside trenches in an isotropic etch process. For example, if the source-level sacrificial layer 104 includes undoped amorphous silicon or an undoped amorphous silicon-germanium alloy, the backside trench spacers 74 include silicon nitride, and the upper and lower sacrificial liners (105, 103) include silicon oxide, a wet etch process employing hot trimethyl-2 hydroxyethyl ammonium hydroxide ("hot TMY") can be used to remove the source-level sacrificial layer 104 selective to the backside trench spacers 74 and the upper and lower sacrificial liners (105, 103). A source cavity 109 is formed in the volume from which the source-level sacrificial layer 104 is removed.

Figure 21C:
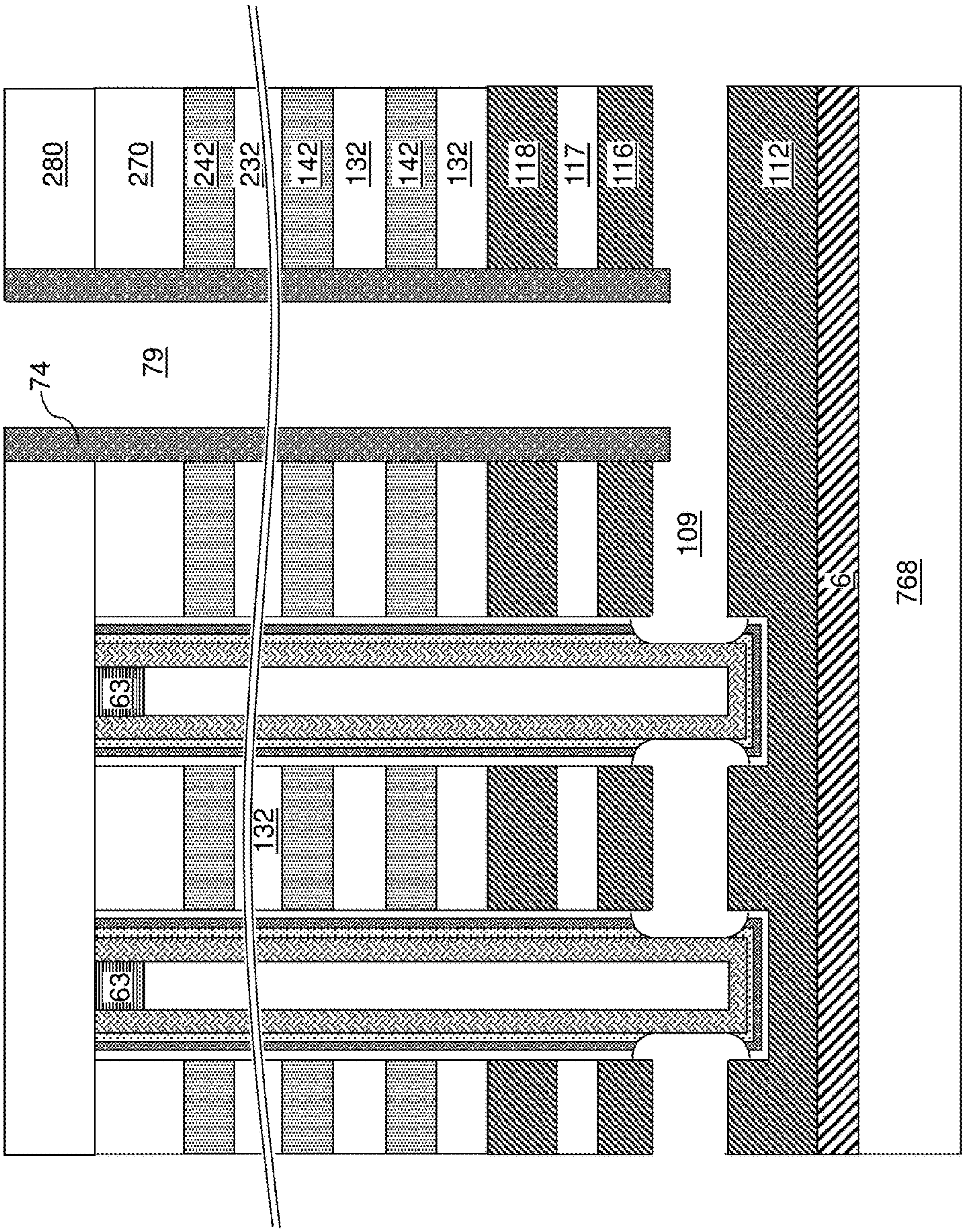

Referring to FIG. 21C, a sequence of isotropic etchants, such as wet etchants, can be applied through the backside trenches 79 and the source cavity 109 to the physically exposed portions of the memory films 50 in the source cavity 109 to sequentially etch the various component layers of the memory films 50 from outside to inside, and to physically expose cylindrical surfaces of the vertical semiconductor channels 60 at the level of the source cavity 109. The upper and lower sacrificial liners (105, 103) can be collaterally etched during removal of the portions of the memory films 50 located at the level of the source cavity 109. The source cavity 109 can be expanded in volume by removal of the portions of the memory films 50 at the level of the source cavity 109 and the upper and lower sacrificial liners (105, 103). A top surface of the lower source layer 112 and a bottom surface of the upper source layer 116 can be physically exposed to the source cavity 109.

Figure 21D:
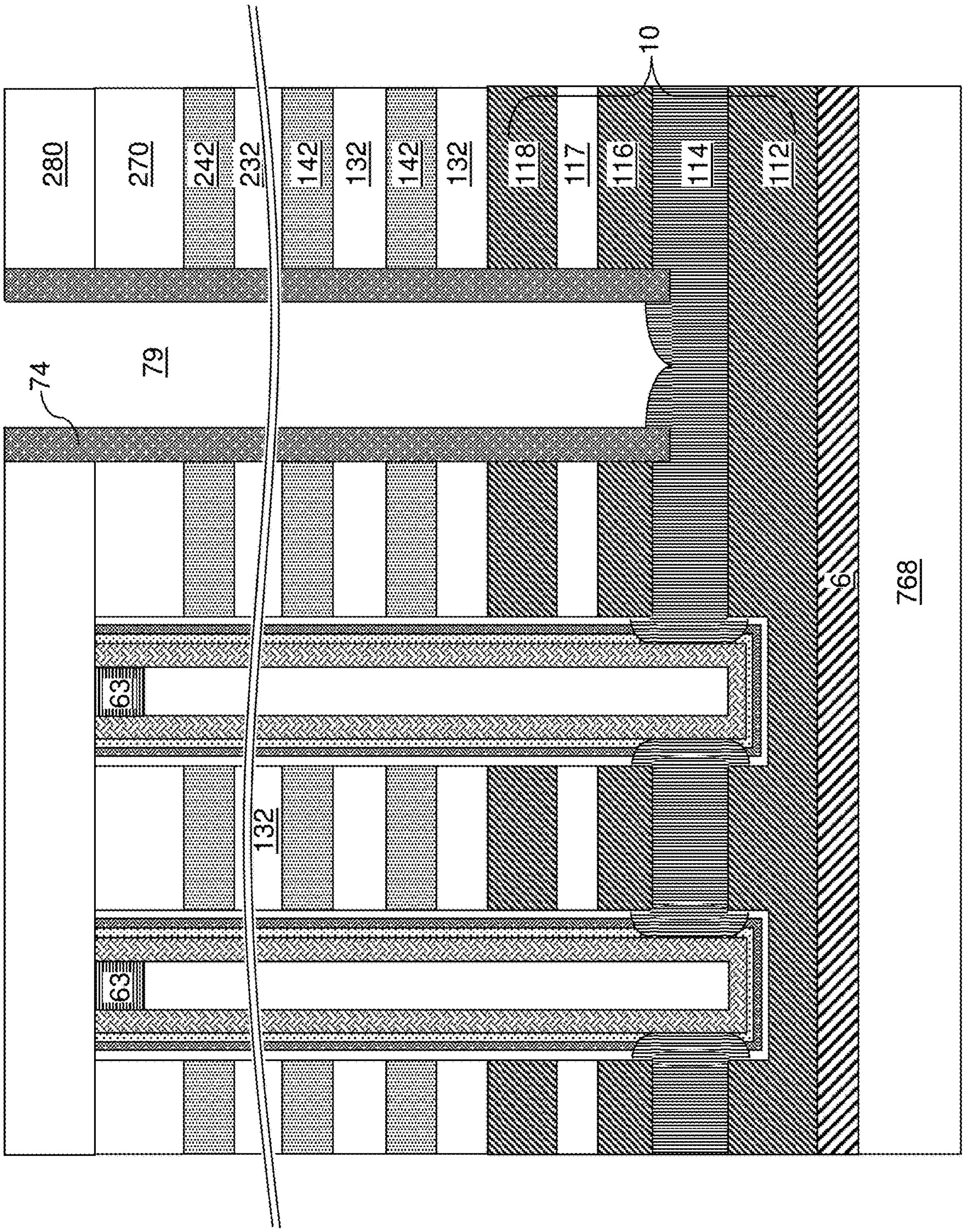

Referring to FIG. 21D, a doped semiconductor material having a doping of the second conductivity type can be deposited by a selective semiconductor deposition process. A semiconductor precursor gas, an etchant, and a dopant precursor gas can be flowed concurrently into a process chamber including the first exemplary structure during the selective semiconductor deposition process. For example, if the second conductivity type is n-type, a semiconductor precursor gas such as silane, disilane, or dichlorosilane, an etchant gas such as hydrogen chloride, and a dopant precursor gas such as phosphine, arsine, or stibine can be flowed. The deposited doped semiconductor material forms a source contact layer 114, which can contact sidewalls of the vertical semiconductor channels 60. The duration of the selective semiconductor deposition process can be selected such that the source cavity is filled with the source contact layer 114, and the source contact layer 114 contacts the exposed portions of the semiconductor channel 60 and bottom end portions of inner sidewalls of the backside trench spacers 74. In one embodiment, the doped semiconductor material can include doped polysilicon.

The layer stack including the lower source layer 112, the source contact layer 114, and the upper source layer 116 constitutes a buried source layer (112, 114, 116), which functions as a common source region that is connected each of the vertical semiconductor channels 60 and has a doping of the second conductivity type. The average dopant concentration in the buried source layer (112, 114, 116) can be in a range from $5.0\times10^{19}/cm^3$ to $2.0\times10^{21}/cm^3$, although lesser and greater dopant concentrations can also be used. The set of layers including the buried source layer (112, 114, 116), the source-level insulating layer 117, and the optional source selective level conductive layer 118 constitutes source-level material layers 10, which replaced the in-process source-level material layers 10'.

Figure 21E:
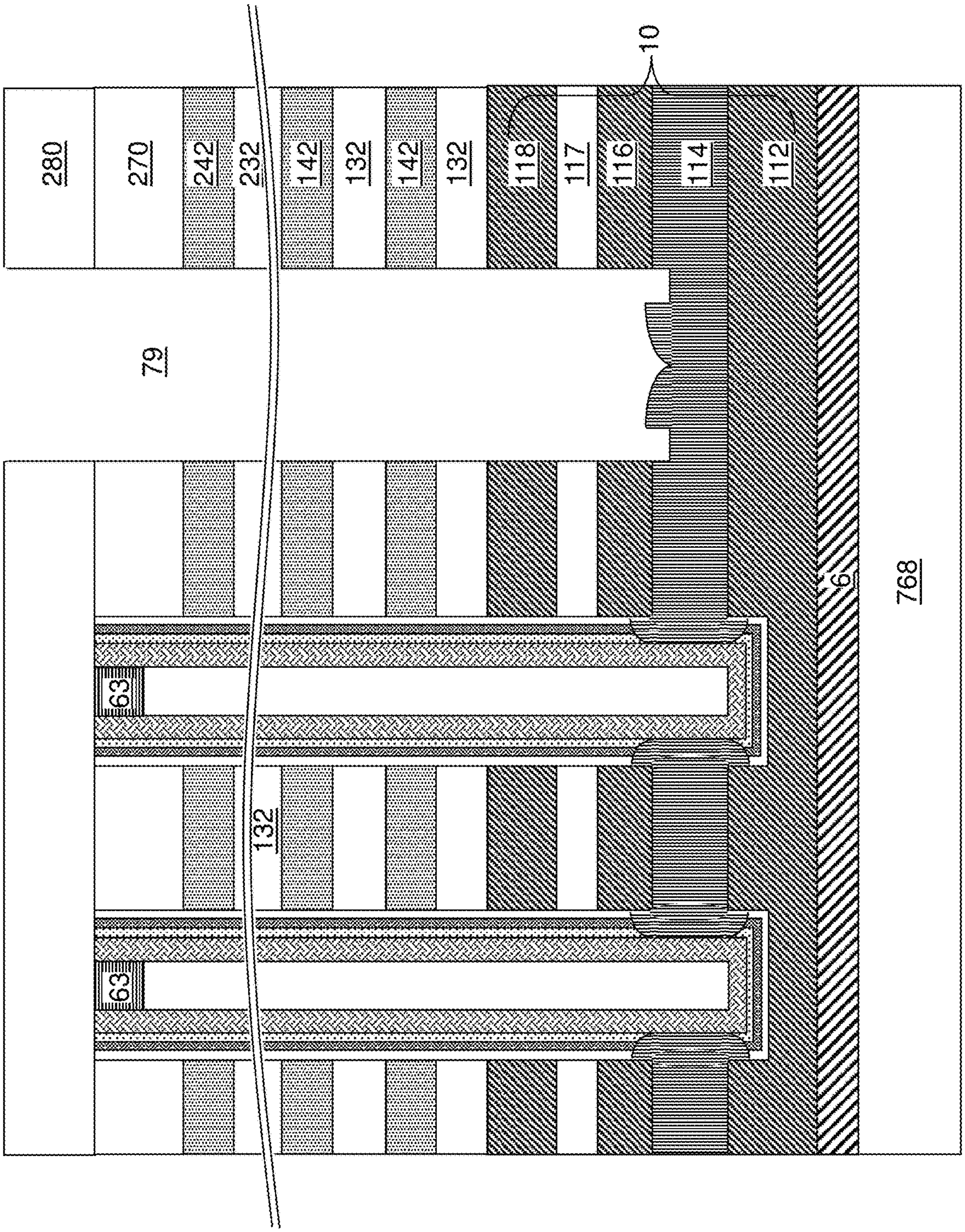
Figure 22:
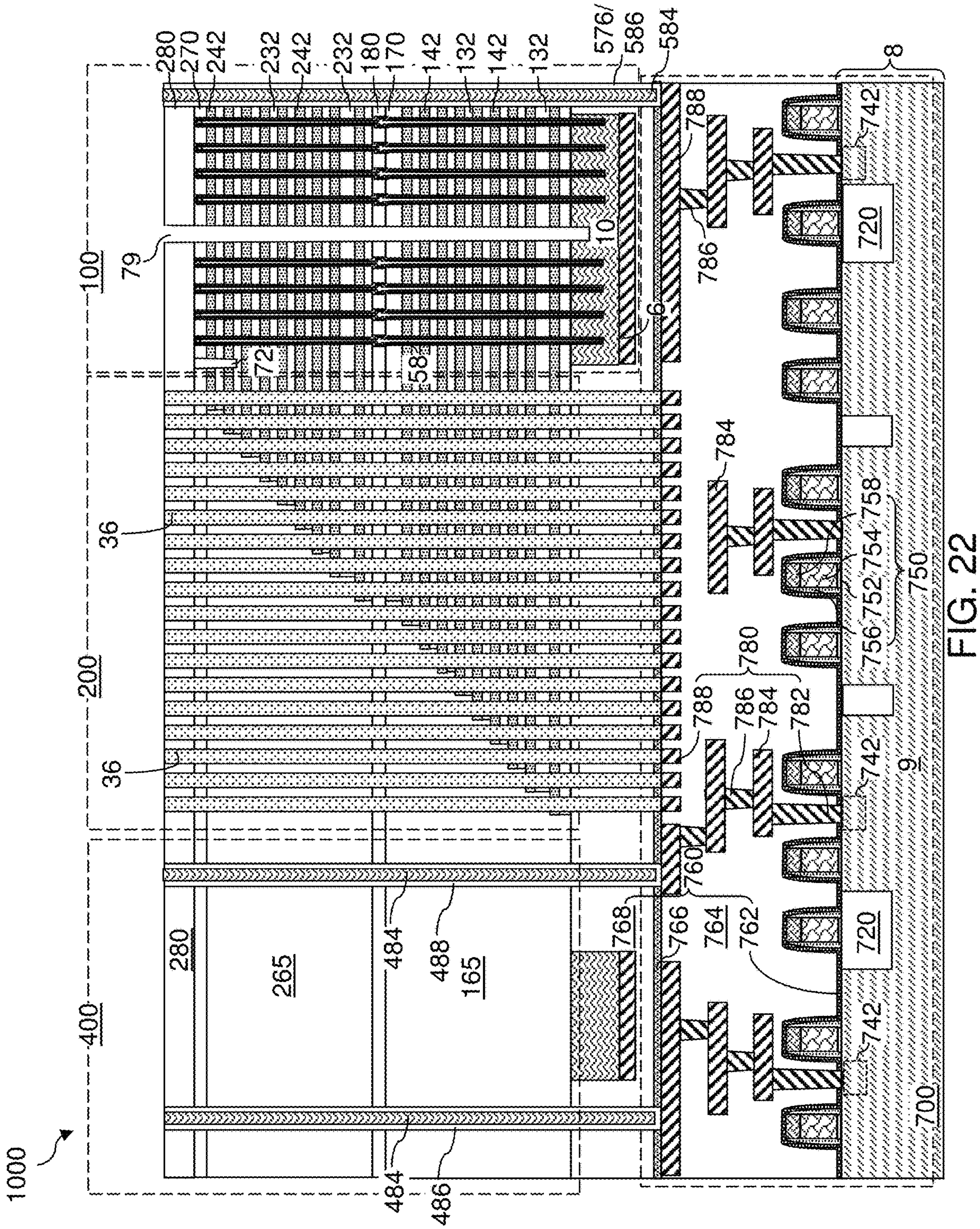
FIG. 22 is a vertical cross-sectional view of the first exemplary structure at the processing steps of FIG. 21E.

Referring to FIGS. 21E and 22, an isotropic etch process can be performed to remove the backside trench spacers 74. In an illustrative example, if the backside trench spacers 74 include silicon nitride, a wet etch employing hot phosphoric acid can be used to remove the backside trench spacers selective to the materials of the source contact layer 114, the insulating layers (132, 232), the first and second insulating cap layer (170, 270), and the first contact level dielectric layer 280.

Figure 23:
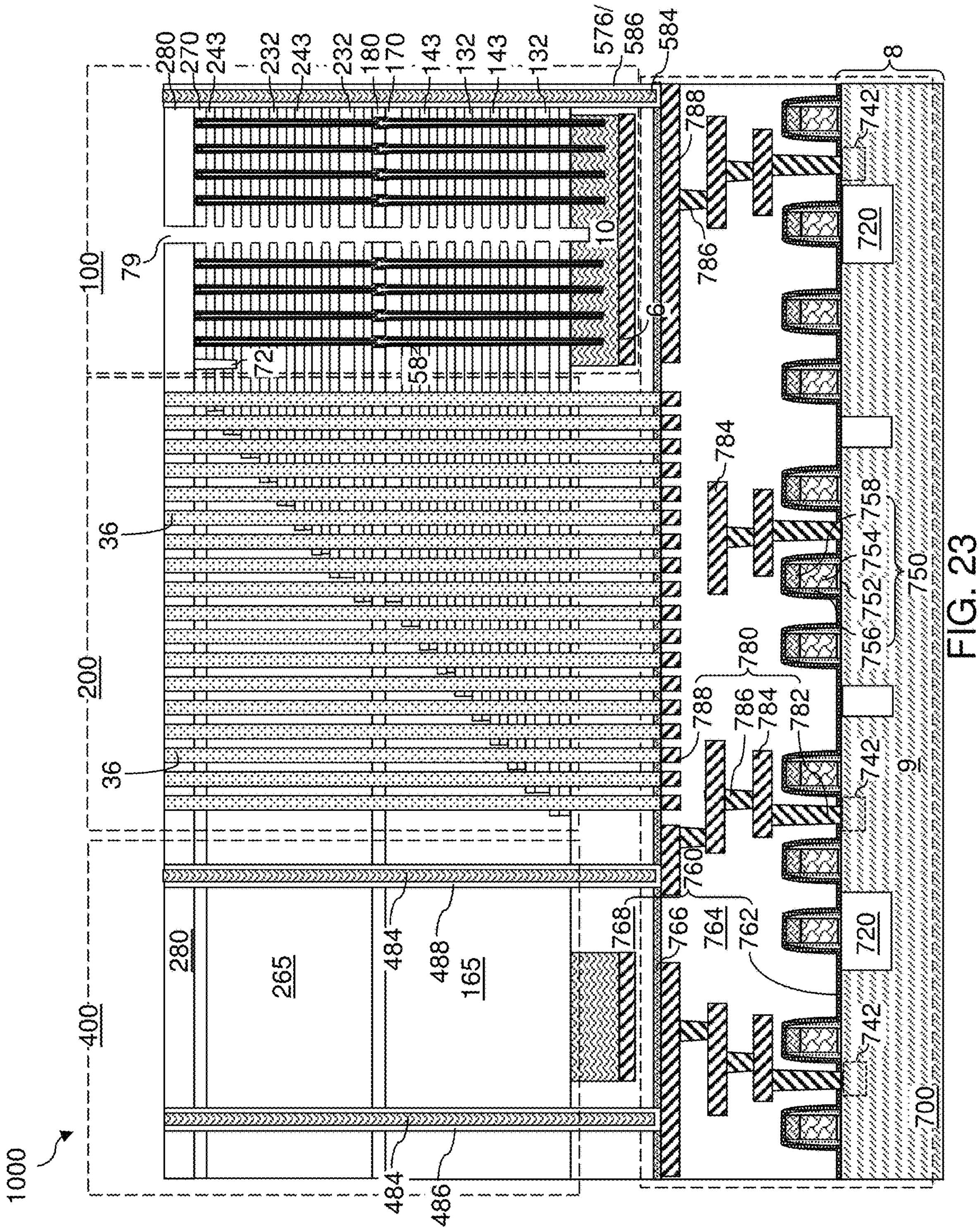
FIG. 23 is a vertical cross-sectional view of the first exemplary structure after formation of backside recesses according to the first embodiment of the present disclosure.

Referring to FIG. 23, an etchant that selectively etches the materials of the first and second sacrificial material layers (142, 242) with respect to the materials of the first and second insulating layers (132, 232), the first and second insulating cap layers (170, 270), the material of the conformal insulating liners (84, 486, 586), the material of the outermost layer of the memory films 50, and materials of the sacrificial via fill material portions (16, 484, 584) can be introduced into the backside trenches 79, for example, employing an isotropic etch process. For example, the first and second sacrificial material layers (142, 242) can include silicon nitride, the materials of the first and second insulating layers (132, 232), the first and second insulating cap layers (170, 270), the material of the conformal insulating liners (84, 486, 586), and the material of the outermost layer of the memory films 50 can include silicon oxide materials, and the materials of the sacrificial via fill material portions (16, 484, 584) can include doped polysilicon, a doped silicon-containing alloy material, or a doped silicate glass or an organosilicate glass having a greater etch rate than the silicon oxide materials of the first and second insulating layers (132, 232), the first and second insulating cap layers (170, 270), the material of the conformal insulating liners (84, 486, 586). First backside recesses 143 are formed in volumes from which the first sacrificial material layers 142 are removed. Second backside recesses 243 are formed in volumes from which the second sacrificial material layers 242 are removed.

The isotropic etch process can be a wet etch process employing a wet etch solution, or can be a gas phase (dry) etch process in which the etchant is introduced in a vapor phase into the backside trench 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials used in the art. In case the sacrificial material layers (142, 242) comprise a semiconductor material, a wet etch process (which may use a wet etchant such as a KOH solution) or a dry etch process (which may include gas phase HCl) may be used.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate 8. A backside recess (143, 243) can be vertically bounded by a top surface of an underlying insulating layer (132 or 232) and a bottom surface of an overlying insulating layer (132 or 232). In one embodiment, each of the first and second backside recesses (243, 243) can have a uniform height throughout.

Figure 24:
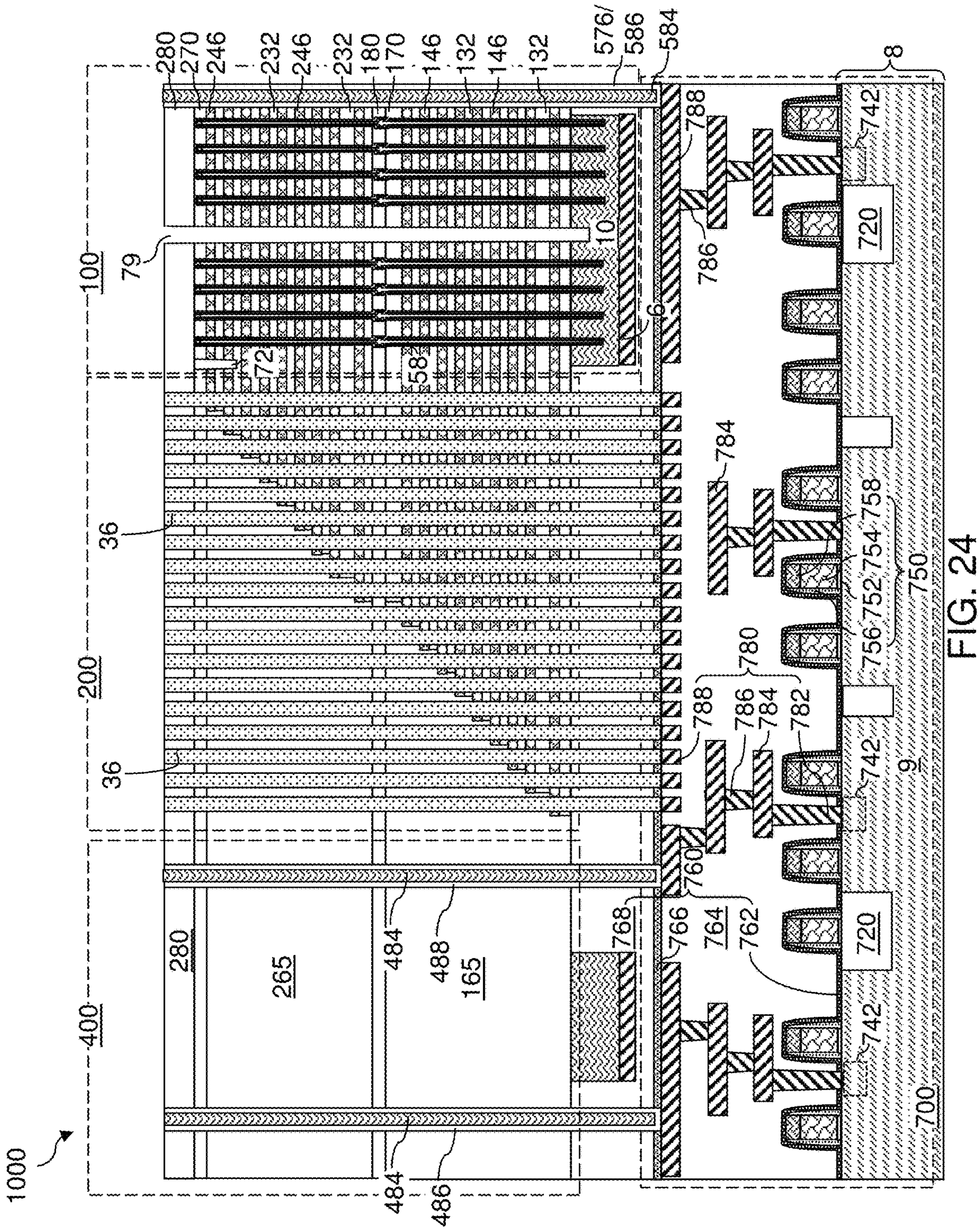
FIG. 24 is a vertical cross-sectional view of the first exemplary structure after formation of electrically conductive layers in the backside recesses according to the first embodiment of the present disclosure.

Referring to FIG. 24, a backside blocking dielectric layer (not shown) can be optionally deposited in the backside recesses and the backside trenches 79 and over the first contact level dielectric layer 280. The backside blocking dielectric layer can be deposited on the physically exposed portions of the outer surfaces of the memory stack structures 55, which are portions of the memory opening fill structures 58. The backside blocking dielectric layer includes a dielectric material such as a dielectric metal oxide, silicon oxide, or a combination thereof. If used, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be used.

At least one conductive material can be deposited in the plurality of backside recesses (243, 243), on the sidewalls of the backside trench 79, and over the first contact level dielectric layer 280. The at least one conductive material can include at least one metallic material, i.e., an electrically conductive material that includes at least one metallic element.

A plurality of first electrically conductive layers 146 can be formed in the plurality of first backside recesses 243, a plurality of second electrically conductive layers 246 can be formed in the plurality of second backside recesses 243, and a continuous metallic material layer (not shown) can be formed on the sidewalls of each backside trench 79 and over the first contact level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

Residual conductive material can be removed from inside the backside trenches 79. Specifically, the deposited metallic material of the continuous metallic material layer can be etched back from the sidewalls of each backside trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level isolation structures 72 constitutes drain select gate electrodes. A subset of the electrically conductive layer (146, 246) located underneath the drain select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Referring to FIGS. 25A-25E, an insulating material can be deposited in the backside trenches 79 by a conformal deposition process. Excess portions of the insulating material deposited over the top surface of the first contact level dielectric layer 280 can be removed by a planarization process such as a recess etch or a chemical mechanical planarization (CMP) process. Each remaining portion of the insulating material in the backside trenches 79 constitutes a dielectric wall structure 76. The dielectric wall structures 76 include an insulating material such as silicon oxide, silicon nitride, and/or a dielectric metal oxide. Each dielectric wall structure 76 can vertically extend through first alternating stacks (132, 146) of first insulating layers 132 and first electrically conductive layers 146 and second alternating stacks (232, 246) of second insulating layers 232 and second electrically conductive layers 246, and laterally extends along the first horizontal direction hd1 and are laterally spaced apart among one another along the second horizontal direction hd2. Backside blocking dielectric layers 44 are explicitly illustrated in FIGS. 25C-25E.

Figure 26:
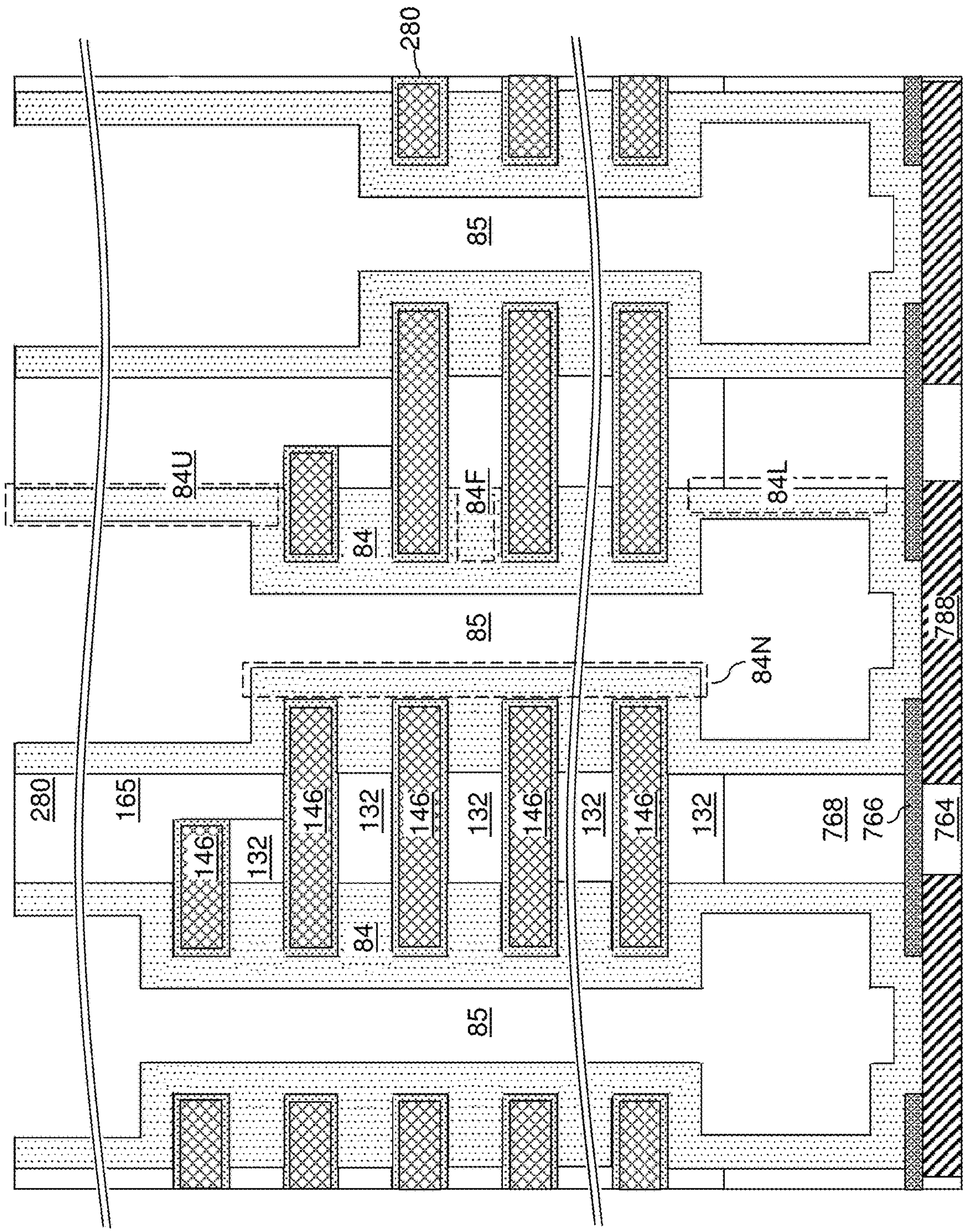
FIG. 26 is a magnified vertical cross-sectional view of a staircase region via cavity after removal of sacrificial via fill material portions according to the first embodiment of the present disclosure.

Referring to FIG. 26, the sacrificial materials of the sacrificial via fill material portions (16, 484, 584) can be removed selective to the material of the conformal insulating liners (84, 486, 586) and the first contact level dielectric layer 280. For example, if the sacrificial via fill material portions (16, 484, 584) include a doped semiconductor material such a doped amorphous silicon or polysilicon, a wet etch employing a KOH or TMY solution can be used to remove the sacrificial via fill material portions (16, 484, 584). If the sacrificial via fill material portions (16, 484, 584) include organosilicate glass or a doped silicate glass such as borosilicate glass, the sacrificial via fill material portions (16, 484, 584) can be removed by a wet etch process employing a dilute hydrofluoric acid. Each staircase via cavity can include a staircase region conformal dielectric via liner 84 and a column-shaped void 85 including a shaft-shaped void region extending through a subset of layers of the alternating stacks (132, 246, 232, 246), a capital-shaped void region overlying the shaft-shaped void region, and a base-shaped void region underlying the shaft-shaped void region.

As used herein, a "column-shaped" element refers to an element that has a general shape of a Doric column, i.e., an element that has a shaft portion that extends with a straight sidewall or a tapered sidewall, a capital (i.e., cap) portion having a greater lateral dimension than the shaft portion and overlying the shaft portion, and a base portion having a greater lateral dimension than the shaft portion and underlying the shaft portion. Each staircase region conformal dielectric via liner 84 can include neck portion 84N that surrounds the shaft portion and vertically extends through a respective subset of the layers in the alternating stacks (132, 142, 232, 242), an upper cylindrical portion 84U that surrounds the capital portion and extends through the first contact level dielectric layer 280 and the second retro-stepped dielectric material portion 265 and optionally through the first retro-stepped dielectric material portion 165, a lower cylindrical portion 84L that surrounds the base portion and extends through the bottommost first insulating layer 132 and the at least one second dielectric material layer 768, and a bottom portion that contacts a respective topmost lower-level metal line structure 788 and an annular surface of the silicon nitride layer 766.

Figure 27A:
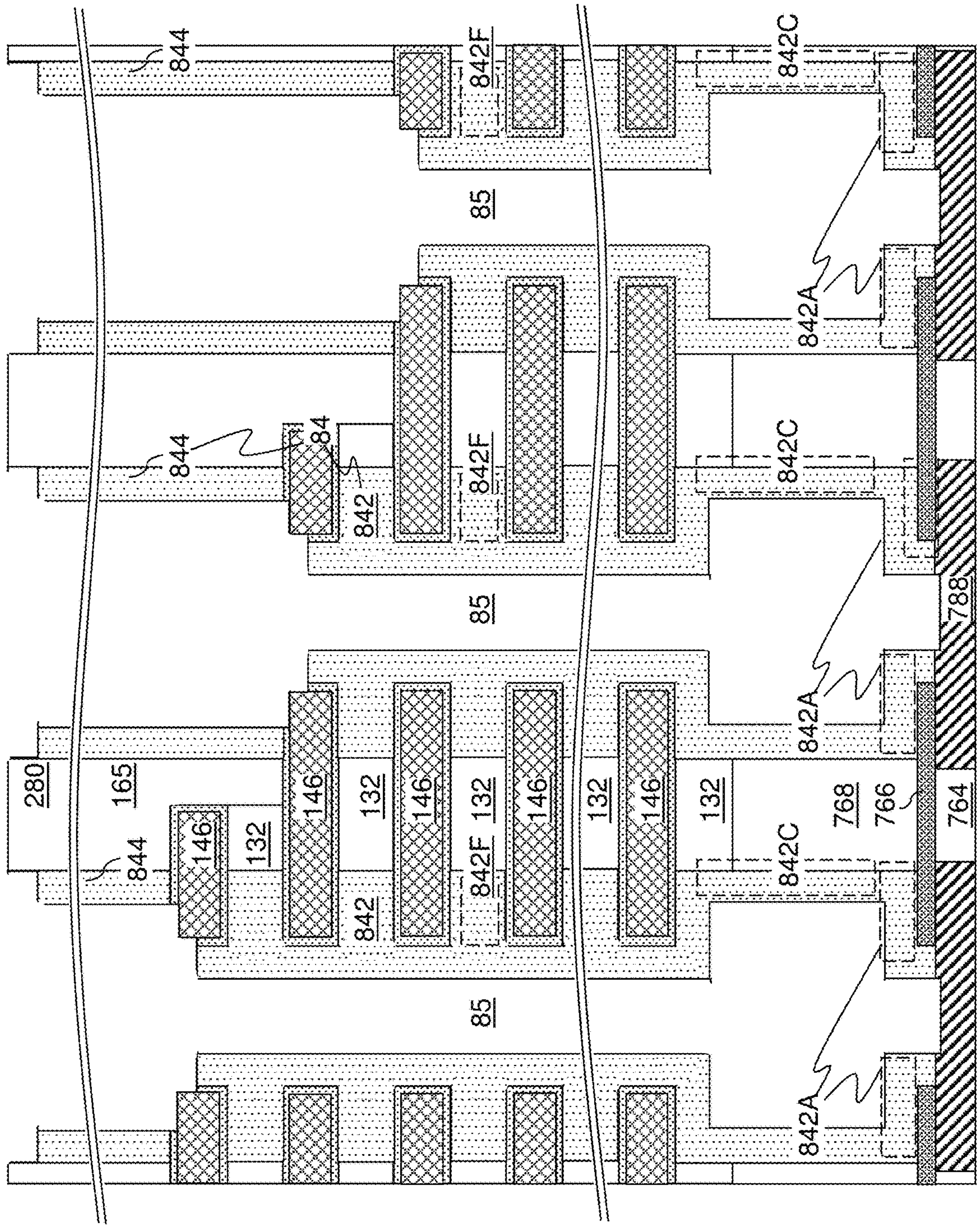
FIGS. 27A, 27B, and 27C are magnified vertical cross-sectional views of a staircase region via cavity, a peripheral region via cavity, and an array region via cavity, respectively, after an anisotropic etch process that physically exposes annular surfaces of the electrically conductive layers and surfaces of underlying lower-level metal interconnect structures according to the first embodiment of the present disclosure.
Figure 27C:
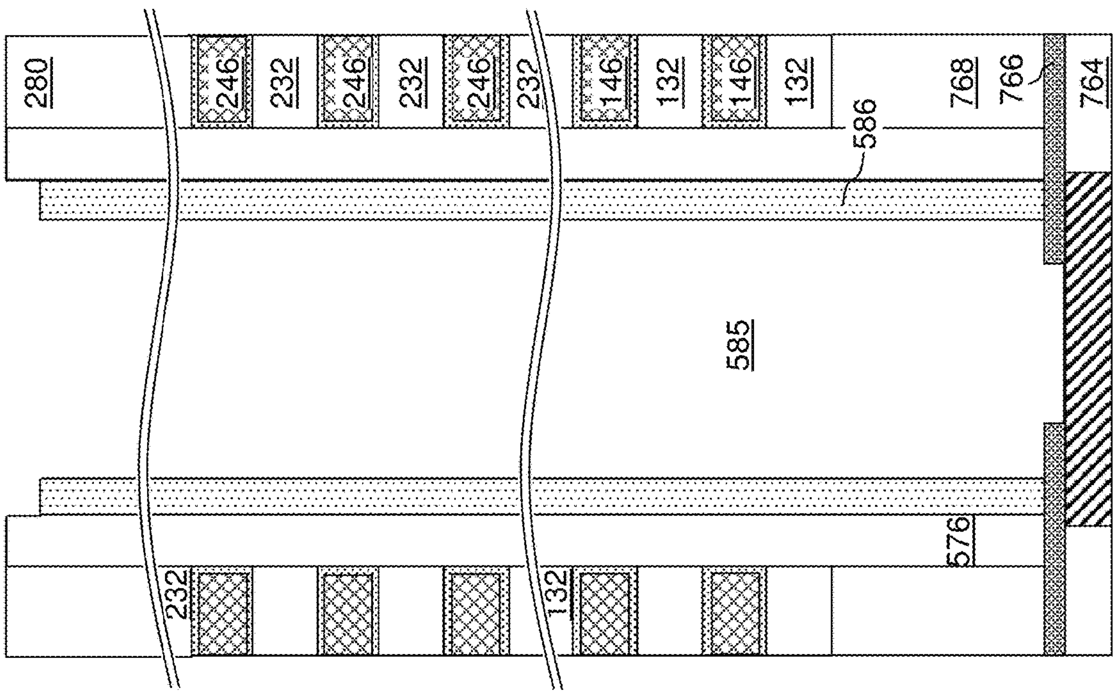
Figure 27B:
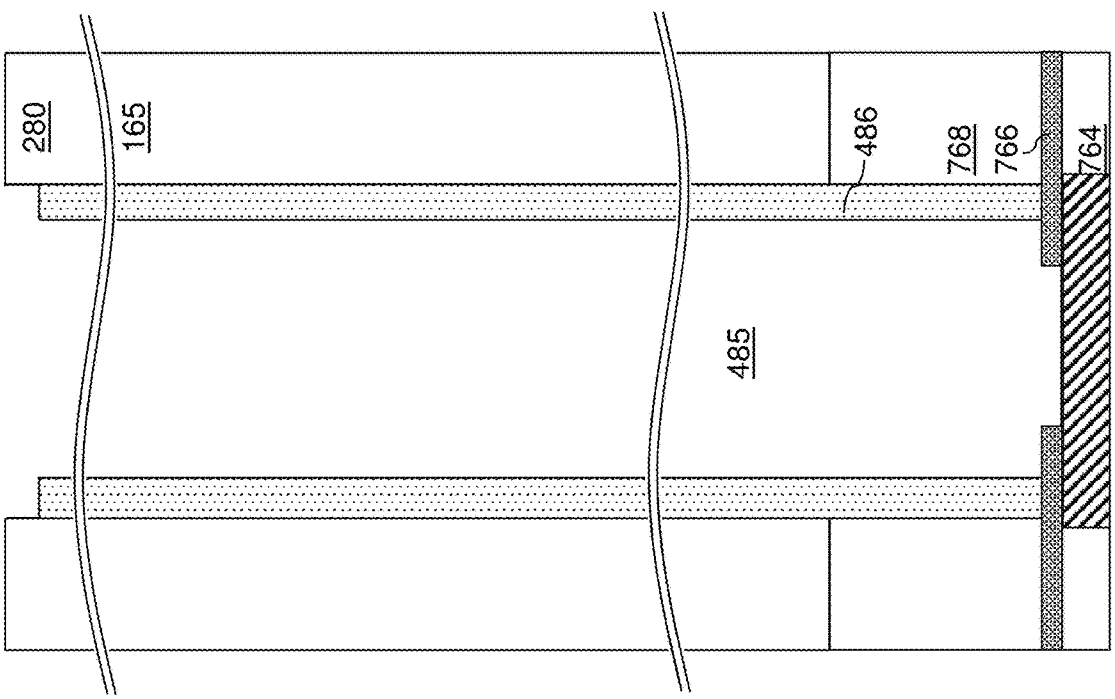

Referring to FIGS. 27A, 27B, and 27C, an anisotropic etch process can be performed to remove horizontal portions of the staircase region conformal dielectric via liner 84 that are not masked by an overlying structure. The anisotropic etch process can include a terminal etch step that etches physically exposed portions of the backside blocking dielectric layers 44. Thus, an annular top surface of a respective topmost electrically conductive layer (146 or 246) and a cylindrical surface of the topmost electrically conductive layer (146 or 246) among the set of electrically conductive layers (146, 246) through which each respective column-shaped void 85 extends can be physically exposed within each staircase region via cavity. Different electrically conductive layers comprise the topmost electrically conductive layer in various column-shaped voids 85 because different voids extend through different parts of the staircase region 200. Further, an opening can be formed at the bottommost portion of each staircase region conformal dielectric via liner 84.

Each staircase region conformal dielectric via liner 84 can be divided into a ribbed insulating liner 842 and a cylindrical insulating liner 844. Each ribbed insulating liner 842 includes a neck portion 84N that continuously extends from a topmost electrically conductive layer (146 and/or 246) within a subset of the electrically conductive layers (146 and/or 246) to a bottommost electrically conductive layer (146 and/or 246) within the subset of the electrically conductive layers (146 and/or 246), laterally-protruding annular rib regions 842F having annular shapes, a cylindrical portion 842C having a cylindrical shape and underlying the alternating stack (132, 146, 232, 246), and an annular region 842A adjoining a bottom portion of the cylindrical portion 842C and having an annular shape. Outer sidewalls of the laterally-protruding annular rib regions 842 can be cylindrical. Each cylindrical insulating spacer 844 can be embedded within the second retro-stepped dielectric material portion 265, and may be embedded within the first retro-stepped dielectric material portion 165. A top surface of a lower-level metal interconnect structure 780 (such as a topmost lower-level metal line structure 788) can be physically exposed by the anisotropic etch process underneath each column-shaped void 85.

The anisotropic etch removes horizontal portions of the peripheral region conformal insulating liners 486 and array region conformal insulating liners 586. A peripheral region cylindrical void 485 can be formed within each peripheral region via cavity, and an array region cylindrical void 585 can be formed within each array region via cavity. An annular top surface of the silicon nitride layer 766 can be physically exposed at the bottom of each peripheral region cylindrical void 485 and at the bottom of each array region cylindrical void 585. Further, a top surface of the lower-level metal interconnect structure 780 (such as the topmost lower-level metal line structures 788) can be physically exposed by the anisotropic etch process underneath the peripheral region cylindrical voids 485 and the array region cylindrical voids 585.

Referring to FIGS. 28A-28F, at least one conductive material can be deposited in the column-shaped voids 85, the peripheral region cylindrical voids 485, and the array region cylindrical voids 585. The at least one conductive material can include a metallic liner material that is conformally deposited to form a metallic liner 86A within each void, and a metal fill material that is conformally deposited to form a metal fill portion 86B. In one embodiment, the metallic liner 86A can include a conductive metal nitride such as TiN, and the metal fill portion 86B can include a metal such as tungsten, cobalt, molybdenum, or copper.

Each combination of a metallic liner 86A and a metal fill portion 86B filling a column-shaped void 85 constitutes a column-shaped conductive via structure 86C. Each column-shaped conductive via structure 86C can include a conductive shaft portion 86S extending through a set of electrically conductive layers (146, 246), a conductive capital portion 86P overlying the conductive shaft portion 86S and contacting a respective topmost electrically conductive layer (146 or 246) whose top surface is exposed in each column-shaped void 85, a conductive base portion 86B underlying the bottommost electrically conductive layer 146 within the set of electrically conductive layers (146, 246), and a downward-protruding portion 86R that protrudes downward from the conductive base portion 86B. An encapsulated void 86V may be present within each conductive base portion 86B due to the conformal nature of the deposition process used to deposit the conductive material(s) of the column-shaped conductive via structures 86C. The conductive capital portion 86P and the conductive base portion 86B have greater lateral extents than the conductive shaft portion 86S within each column-shaped conductive via structure 86C.

Each column-shaped conductive via structure 86C is formed directly on the top surface of the topmost electrically conductive layer (146 or 246) among the set of electrically conductive layers (146, 246) through which the respective column-shaped conductive via structure 86C extends. Each electrically conductive layer (146, 246) within the subset of the electrically conductive layers (146, 246) other than the topmost electrically conductive layer (146 or 246) is electrically isolated from the column-shaped conductive via structure 86C by a ribbed insulating liner 842. Each column-shaped conductive via structure 86C is formed on inner sidewalls of a ribbed insulating liner 842 and a cylindrical insulating liner 844. At least one of the column-shaped conductive via structures 86C can be formed directly on a top surface of a lower-level metal interconnect structure 780.

Each combination of a metallic liner 86A and a metal fill portion 86B filling a peripheral region cylindrical void 485 constitutes a peripheral region contact via structure 488. Each combination of a metallic liner 86A and a metal fill portion 86B filling an array region cylindrical void 585 constitutes an array region contact via structure 588. Each of the peripheral region contact via structures 488 and the array region contact via structures 588 can contact a respective one of the lower-level metal interconnect structures 780 (such as the topmost lower-level metal line structures 788). Each of the peripheral region contact via structures 488 and the array region contact via structures 588 can include a downward-protruding portion that protrudes through the silicon nitride layer 766 to contact a respective one of the lower-level metal interconnect structures 780. Each electrically conductive layer (146, 246) can include a conductive metallic liner 146A and a conductive fill material portion 146B.

Each combination of a column-shaped conductive via structure 86C, a ribbed insulating liner 842, and a cylindrical insulating liner 844 located within a staircase region via cavity constitutes a laterally-insulated via structure 86. Each laterally-insulated via structure 86 includes a respective column-shaped conductive via structure 86 as a conductive via structure, and include a respective ribbed insulating liner 842 and a respective cylindrical insulating liner 844 as a laterally insulating structure. The gap between the ribbed insulating liner 842 and the cylindrical insulating liner 844 provides an annular electrically conductive path at which the column-shaped conductive via structure 86C and an electrically conductive layer (146 or 246) makes a surface-to-surface contact.

Figure 29A:
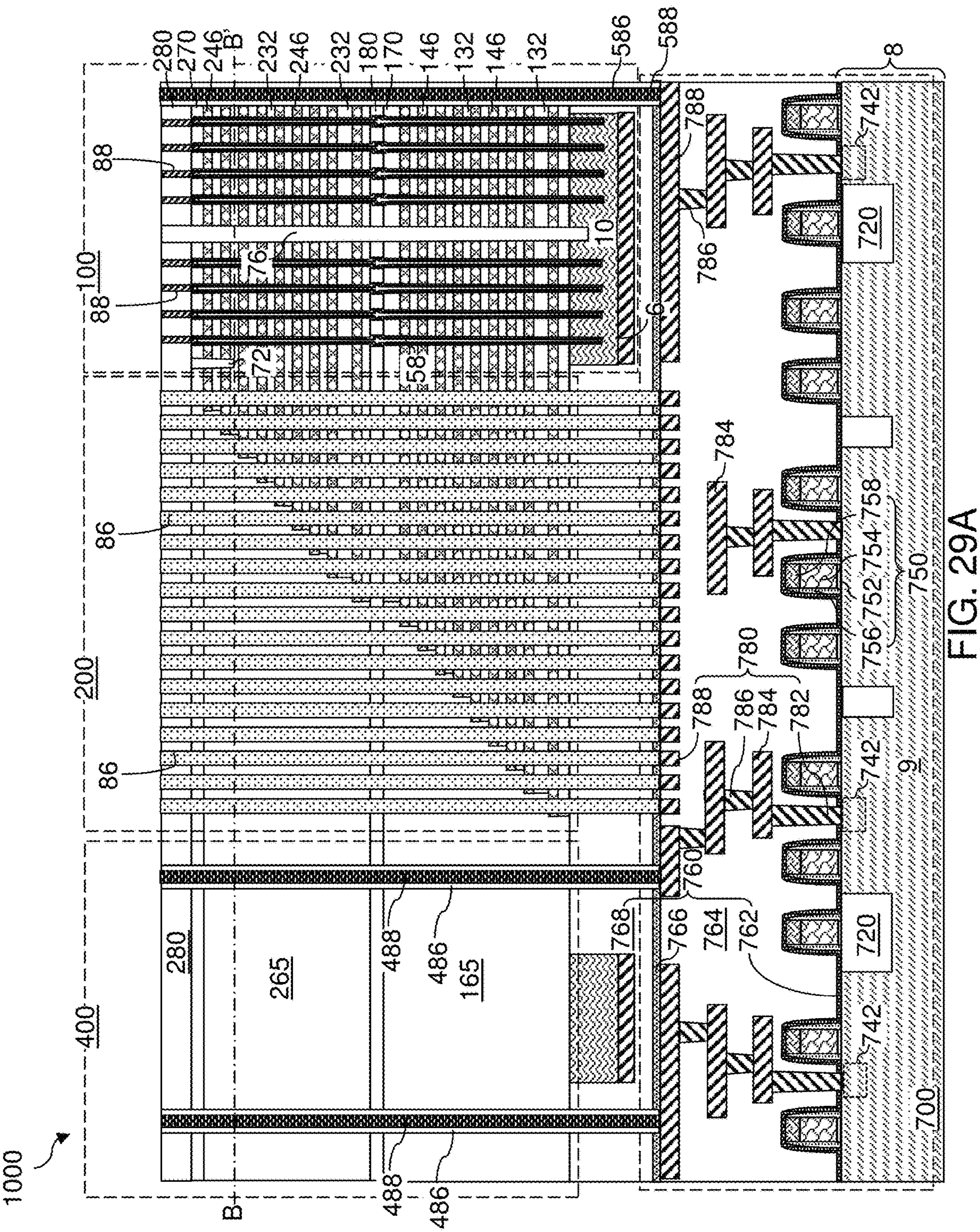
FIG. 29A is a vertical cross-sectional view of the first exemplary structure after formation of drain contact via structures according to the first embodiment of the present disclosure.
Figure 29B:
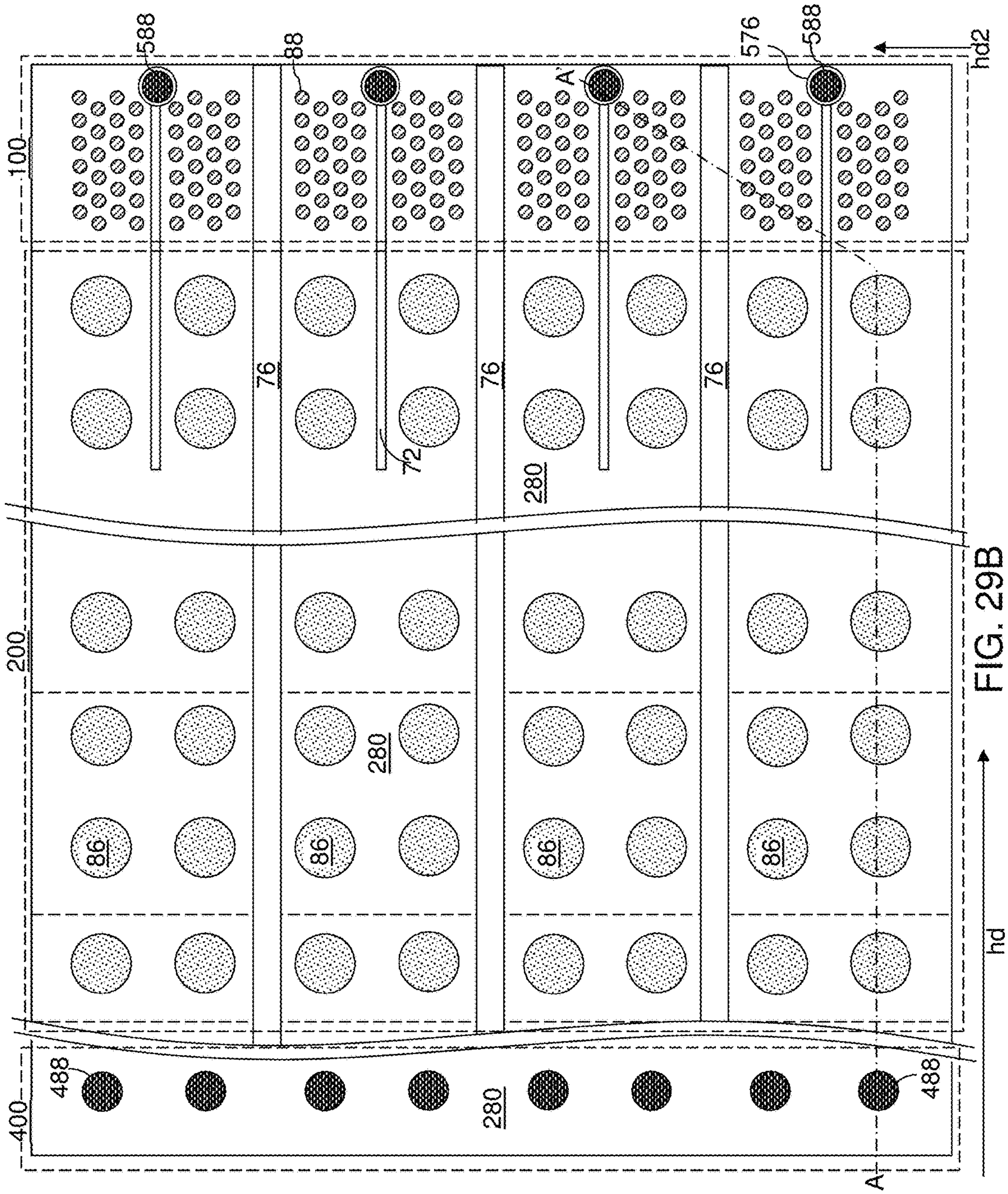
FIG. 29B is a horizontal cross-sectional view of the first exemplary structure along the horizontal plane B-B' of FIG. 28A. The hinged vertical plane A-A' corresponds to the plane of the vertical cross-sectional view of FIG. 28A.

Referring to FIGS. 29A and 29B, drain contact via structures 88 can be formed through the first contact level dielectric layer 280 directly on top surfaces of the drain regions 63.

Figure 30:
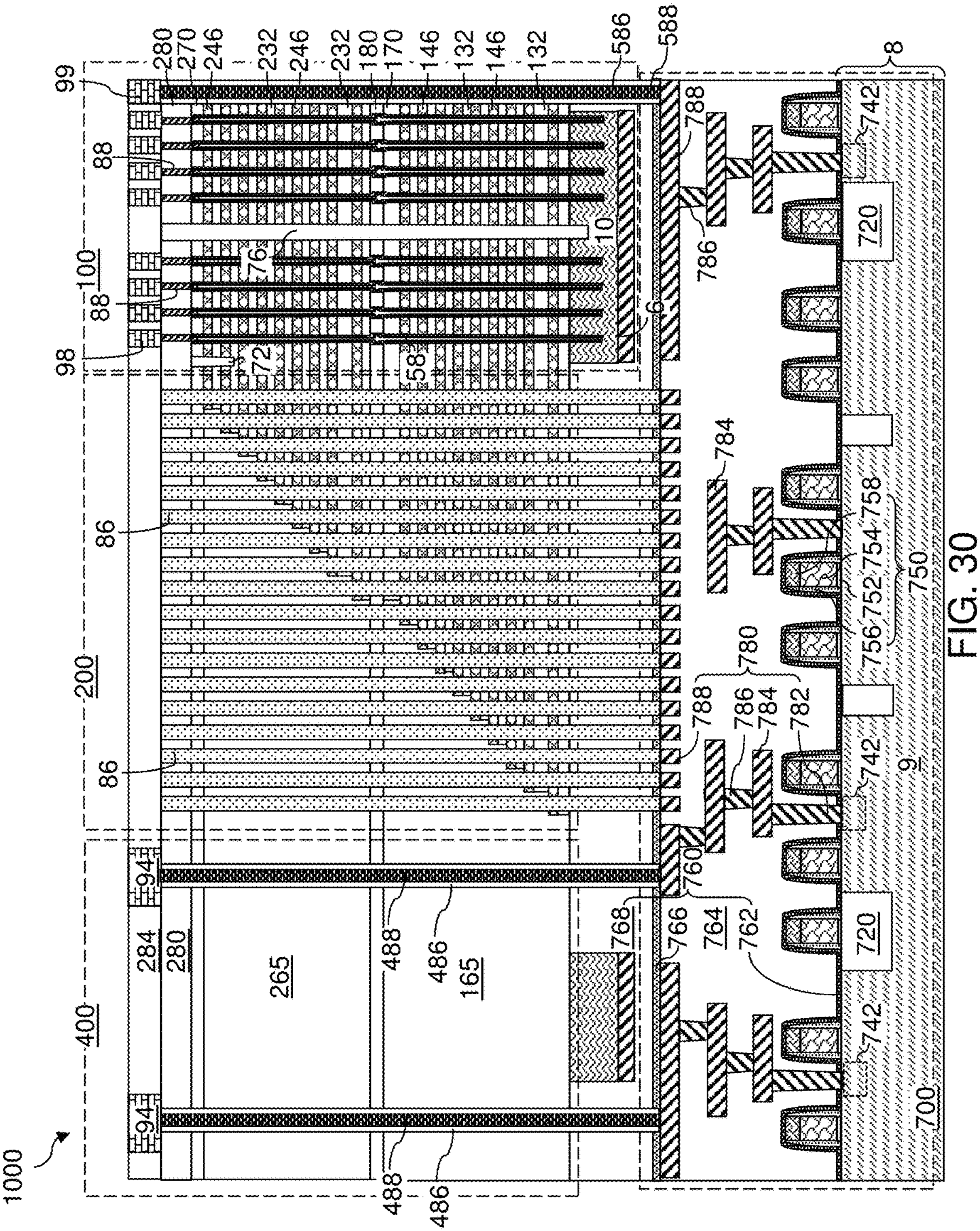
FIG. 30 is a vertical cross-sectional view of the first exemplary structure after formation of upper-level metal line structures according to the first embodiment of the present disclosure.

Referring to FIG. 30, the memory device 1000 includes at least one additional dielectric layer can be formed over the first contact level dielectric layer 280, and additional metal interconnect structures (herein referred to as upper-level metal interconnect structures) can be formed in the at least one additional dielectric layer. For example, the at least one additional dielectric layer can include a line-level dielectric layer 284 that is formed over the first contact level dielectric layer 280. The upper-level metal interconnect structures can include bit lines 98 contacting, or electrically connected to, a respective one of the drain contact via structures 88, peripheral region line structures 94 contacting, and/or electrically connected to, a respective one of the peripheral region contact via structures 488, and array region line structures 99 contacting, and/or electrically connected to, a respective one of the array region contact via structures 588. In one embodiment, no word line connection line structures contact a top surface the column-shaped conductive via structures 86C and the top surfaces of the structures 86C are covered with an insulating layer 284, since the structures 86C directly connect the word lines (146, 246) to the lower-level metal interconnect structures 780 of the peripheral devices 700 located below the word lines without using overlying connection line structures.

Referring to the various drawings, such as FIGS. 29A and 30, and according to various embodiments of the present disclosure, a device structure 1000 is provided, which comprises: an alternating stack {(132, 146) and/or (232, 246)} of insulating layers (132 and/or 232) and electrically conductive layers (146 and/or 246) located over a substrate 8 and including stepped surfaces in a staircase region 200; a retro-stepped dielectric material portion (265 and/or 165) overlying the stepped surfaces of the alternating stack {(132, 146) and/or (232, 246)}; and a laterally-insulated via structure 86 vertically extending through the alternating stack {(132, 146) and/or (232, 246)} and the retro-stepped dielectric material portion (265 and/or 165). The laterally-insulated via structure 86 comprises a ribbed insulating spacer 842 including a neck portion 84N that extends through the alternating stack and laterally-protruding annular rib regions 842F extending from the neck portion at each level of insulating layers (132, 232), and a conductive via structure 86C extending through the neck portion 84N of the ribbed insulating spacer 842 and contacting one of the electrically conductive layers (146 or 246).

In one embodiment, the neck portion 84N continuously extends from a topmost electrically conductive layer (146 and/or 246) within a subset of the electrically conductive layers (146 and/or 246) in the respective column-shaped void 85 to a bottommost electrically conductive layer 146 within the subset of the electrically conductive layers (146 and/or 246) in the respective column-shaped void 85. The neck portion 84N includes laterally-protruding annular rib regions 842F located at each level of insulating layers (132, 232).

In one embodiment, the conductive via structure 86C is a column-shaped conductive via structure 86C that comprises: a conductive shaft portion 86S extending through the neck portion 84N of the ribbed insulating spacer 842; a conductive capital portion 86P overlying the conductive shaft portion 86S, and contacting the topmost electrically conductive layer (146 or 246) within the subset of electrically conductive layers through which it the conductive via structure 86C extends; and a conductive base portion 86B underlying the bottommost electrically conductive layer 146 within the subset. In one embodiment, the conductive capital portion 86P and the conductive base portion 86B have greater lateral extents than the conductive shaft portion 86S.

In one embodiment, outer sidewalls of the laterally-protruding annular rib regions 842F are laterally offset outward from a vertical sidewall (i.e., the inner sidewall) of the neck portion 84N by a same lateral offset distance (which can be the sum of the lateral etch distance during the recess etch process and the thickness of a staircase region conformal dielectric via liner 84). In one embodiment, the ribbed insulating spacer 842 includes a cylindrical portion 84C underlying the subset of the electrically conductive layers (146 and/or 246) and laterally surrounding the conductive base portion 86B.

In one embodiment, lower-level metal interconnect structures 780 can be embedded in lower-level dielectric material layers 760 and can be located between the substrate 8 and the alternating stack {(132, 146) and/or (232, 246)}. The column-shaped conductive via structure 86C comprises a downward protruding conductive portion 86R that protrudes downward from the conductive base portion 86B and having a lesser lateral extent than the conductive base portion 86B and contacting a top surface of one of the lower-level metal interconnect structures 780. The ribbed insulating spacer 842 includes an annular bottom opening through which the downward protruding conductive portion 86R vertically extends.

In one embodiment, a contact area between the conductive capital portion 86P and a top surface of the topmost electrically conductive layer (146 or 246) is located between an outer periphery of a bottom surface of the conductive capital portion 86P and an inner periphery of the bottom surface of the conductive capital portion 86P, and the outer periphery of the bottom surface of the conductive capital portion 86P is laterally offset from the inner periphery of the bottom surface of the conductive capital portion 86P by a uniform lateral offset distance, which is the uniform width of the annular contact area. In one embodiment, a sidewall of the conductive capital portion 86P contacts an upper portion of a sidewall of the topmost electrically conductive layer (146 or 246), and a bottommost surface of the conductive capital portion 86P contacts a top surface of the ribbed insulating spacer 842. A cylindrical insulating spacer 844 can laterally surround the conductive capital portion 86P, overlie the topmost electrically conductive layer (146 or 246), and comprise a same dielectric material as the ribbed insulating spacer 842.

In one embodiment, memory stack structures 55 can extend through the alternating stack {(132, 146) and/or (232, 246)}. Each of the memory stack structures 55 comprises a vertical stack of charge storage elements (as embodied as sections of a charge storage layer located at levels of the electrically conductive layers (146, 246)), a tunneling dielectric layer 56 laterally surrounded by the vertical stack of charge storage elements, and a vertical semiconductor channel 60 laterally surrounded by the tunneling dielectric layer 56. Driver circuitry 710 containing a metal interconnect structure 780 is located below the alternating stack (132, 146, 232, 246). The conductive via structure 86C (e.g., portion 86R of structure 86C) physically contacts the metal interconnect structure 780 located below the alternating stack.

In one embodiment, the device structure comprises a monolithic three-dimensional NAND memory device, the electrically conductive layers (246, 246) comprise, or are electrically connected to, a respective word line of the monolithic three-dimensional NAND memory device, and the substrate 8 comprises a silicon substrate. In one embodiment, the monolithic three-dimensional NAND memory device comprises an array of monolithic three-dimensional NAND strings over the silicon substrate, at least one memory cell in a first device level of the array of monolithic three-dimensional NAND strings is located over another memory cell in a second device level of the array of monolithic three-dimensional NAND strings, and the silicon substrate contains an integrated circuit comprising a driver circuit for the memory device located thereon. In one embodiment, the electrically conductive layers (146, 246) comprise a plurality of control gate electrodes having a strip shape extending substantially parallel to the top surface of the substrate, and he plurality of control gate electrodes comprise at least a first control gate electrode located in the first device level and a second control gate electrode located in the second device level. In one embodiment, the array of monolithic three-dimensional NAND strings comprises: a plurality of semiconductor channels 60, wherein at least one end portion of each of the plurality of semiconductor channels extends substantially perpendicular to a top surface of the substrate 8, and one of the plurality of semiconductor channels 60 including the vertical semiconductor channel 60, and a plurality of charge storage elements, each charge storage element located adjacent to a respective one of the plurality of semiconductor channels 60.

Figure 31:
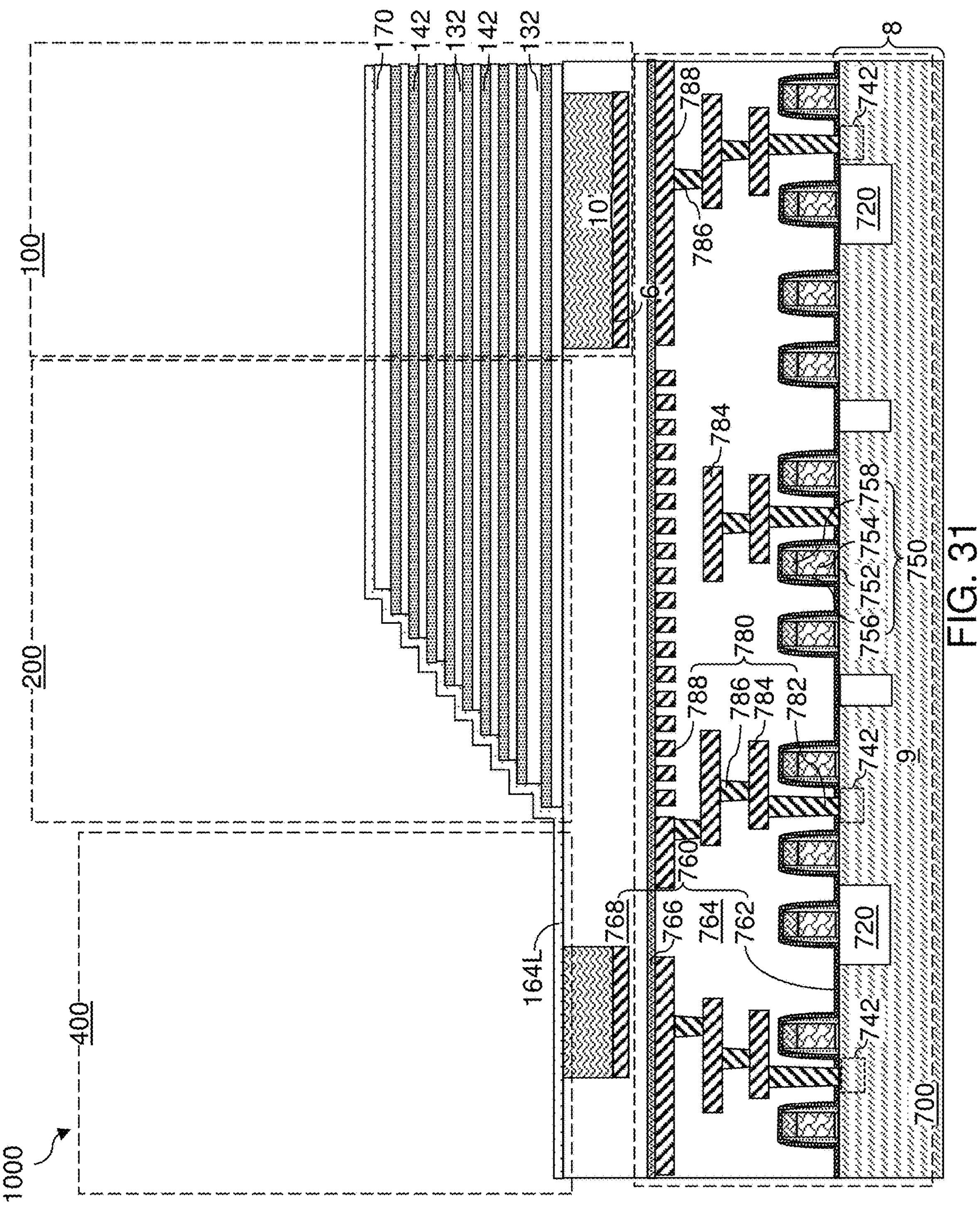
FIG. 31 is a vertical cross-sectional view of a second exemplary structure after formation of first stepped surfaces and a first dielectric liner layer according to a second embodiment of the present disclosure.

Referring to FIG. 31, a second exemplary structure according to a second embodiment of the present disclosure can be derived from the first exemplary structure of FIG. 3 by depositing a first dielectric liner layer 164L by a conformal deposition process. The first dielectric liner layer 164L includes a silicate glass material that provides a higher etch rate than undoped silicate glass. In one embodiment, the first insulating layers 132 can include a first silicon oxide material, and the first dielectric liner layer 164L can include a second silicon oxide material. The etch rate of the second silicon oxide material in a 100:1 dilute HF solution is greater than the etch rate of the first silicon oxide material in the 100:1 dilute HF solution by a factor of at least 3. As used herein, all etch rates are measured at room temperature (20 degrees Celsius). For example, the first dielectric liner layer 164L can include a borosilicate glass (BSG) including boron at an atomic concentration in a range from 1% to 10%, borophosphosilicate glass (BPSG) including boron and arsenic at an atomic concentration in a range from 1% to 10%, or an organosilicate glass including carbon at an atomic concentration in a range from 1% to 10% and hydrogen at an atomic concentration in a range from 0.5% to 10%. One non-limiting example of organosilicate glass comprises silicon oxide formed from coating a polysilazane (PSZ) inorganic polymer followed by thermally curing the polymer to form silicon oxide. The etch rate of the material of the first dielectric liner layer 164L in a 100:1 dilute hydrofluoric acid at room temperature can be at least 5 times, and preferably at least 10 times and/or at least 20 times, the etch rate of thermal silicon oxide in a 100:1 dilute hydrofluoric acid at room temperature. The first dielectric liner layer 164L can be deposited by a conformal deposition process such as low pressure chemical vapor deposition or a non-conformal deposition process such as plasma enhanced chemical vapor deposition. The thickness of the horizontal portions of the first dielectric liner layer 164L can be in a range from 10 nm to 100 nm, such as from 20 nm to 50 nm, although lesser and greater thicknesses can also be used.

Figure 32:
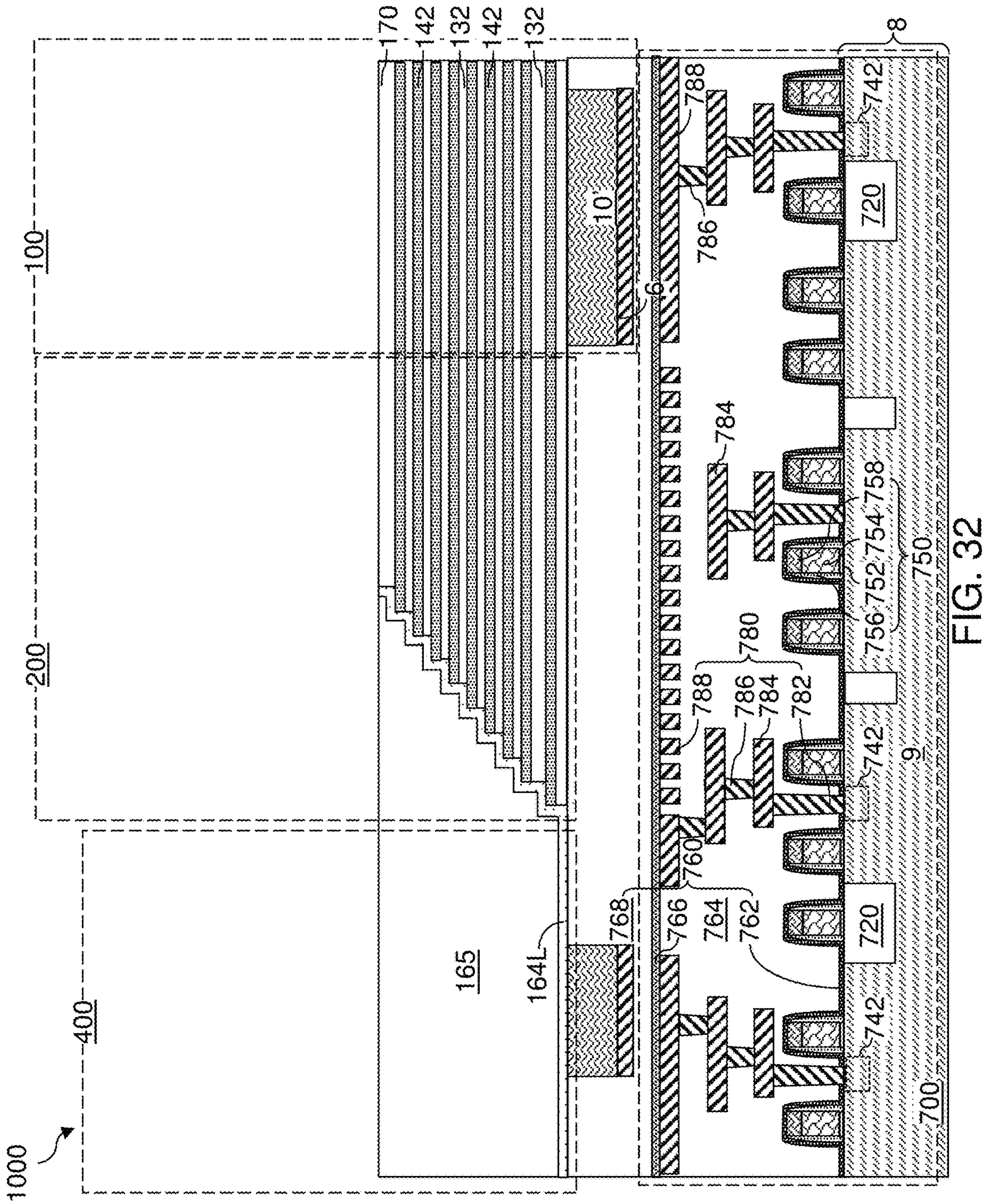
FIG. 32 is a vertical cross-sectional view of the second exemplary structure after formation of a first dielectric liner and a first retro-stepped dielectric material portion according to the second embodiment of the present disclosure.

Referring to FIG. 32, a dielectric fill material can be deposited over the first dielectric liner layer 164L. Portions of the deposited dielectric fill material and the dielectric material of the silicate glass material of the first dielectric liner layer 164L can be removed from above the horizontal plane including the top surface of the first insulating cap layer 170 by a planarization process such as chemical mechanical planarization (CMP). The remaining portion of the first dielectric liner layer 164L constitutes a first dielectric liner 164, and covers the entire stepped surfaces of the first alternating stack (132, 142). The remaining portion of deposited dielectric fill material constitutes a first retro-stepped dielectric material portion 165. The topmost surface of the first dielectric liner 164 and a top surface of the first retro-stepped dielectric material portion 165 can be formed within the same horizontal plane, which is the horizontal plane including the top surface of the first insulating cap layer 170.

The first retro-stepped dielectric material portion 165 includes a silicate glass having a lower etch rate than the silicate glass material of the first dielectric liner 164. For example, the first retro-stepped dielectric material portion 165 can include undoped silicate glass formed by thermal decomposition or plasma decomposition of tetraethylorthosilicate (TEOS), or a lightly doped silicate glass (such as phosphosilicate glass) that is substantially free of boron and formed by thermal decomposition of TEOS. The silicon oxide material of the first retro-stepped dielectric material portion 165 is herein referred to as a third silicon oxide material. The etch rate of the second silicon oxide material in the 100:1 dilute HF solution is greater than an etch rate of the third silicon oxide material in the 100:1 dilute HF solution by a factor of at least 3.

Figure 33A:
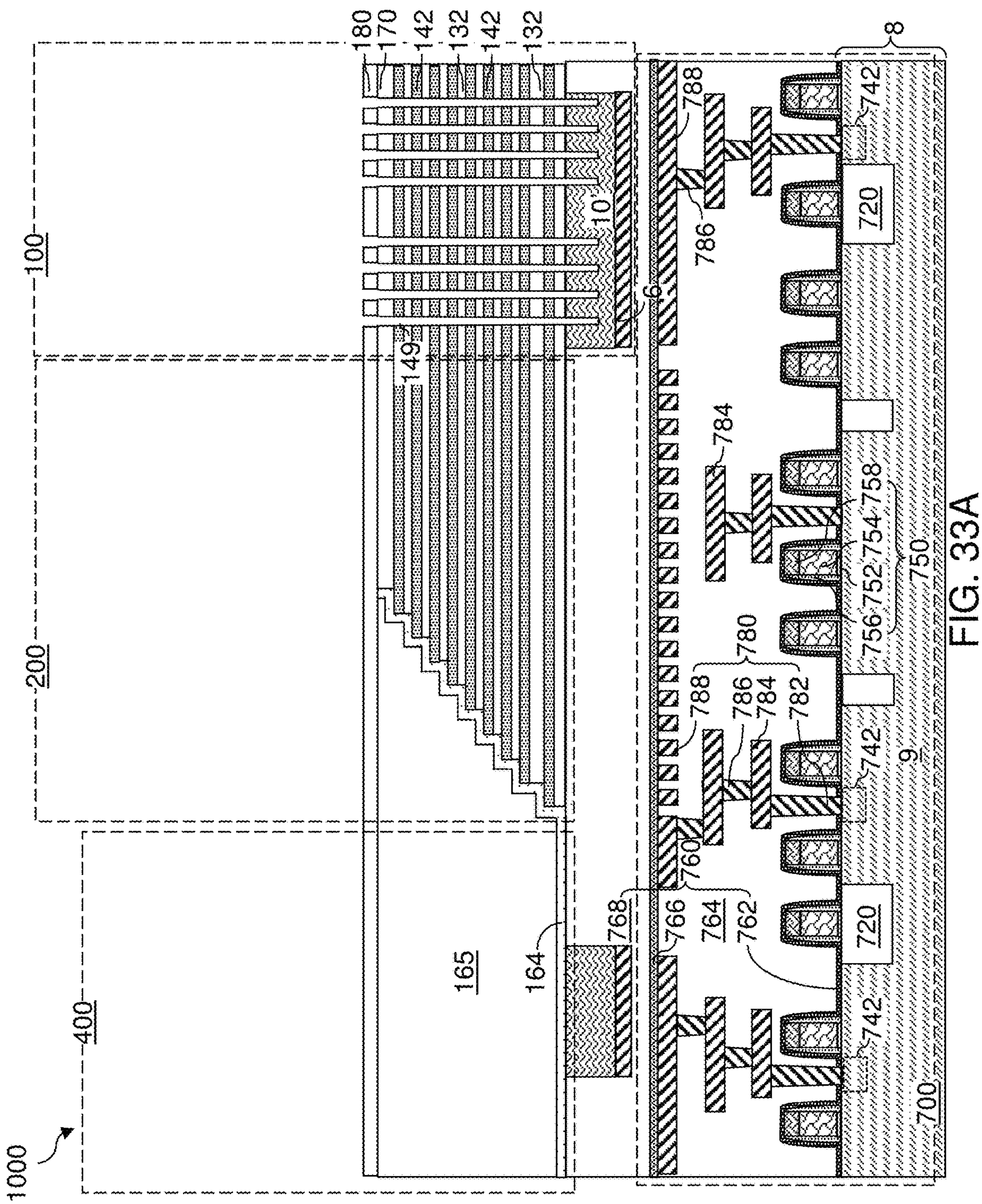
FIG. 33A is a vertical cross-sectional view of the second exemplary structure after formation of first-tier memory openings according to the second embodiment of the present disclosure.
Figure 33B:
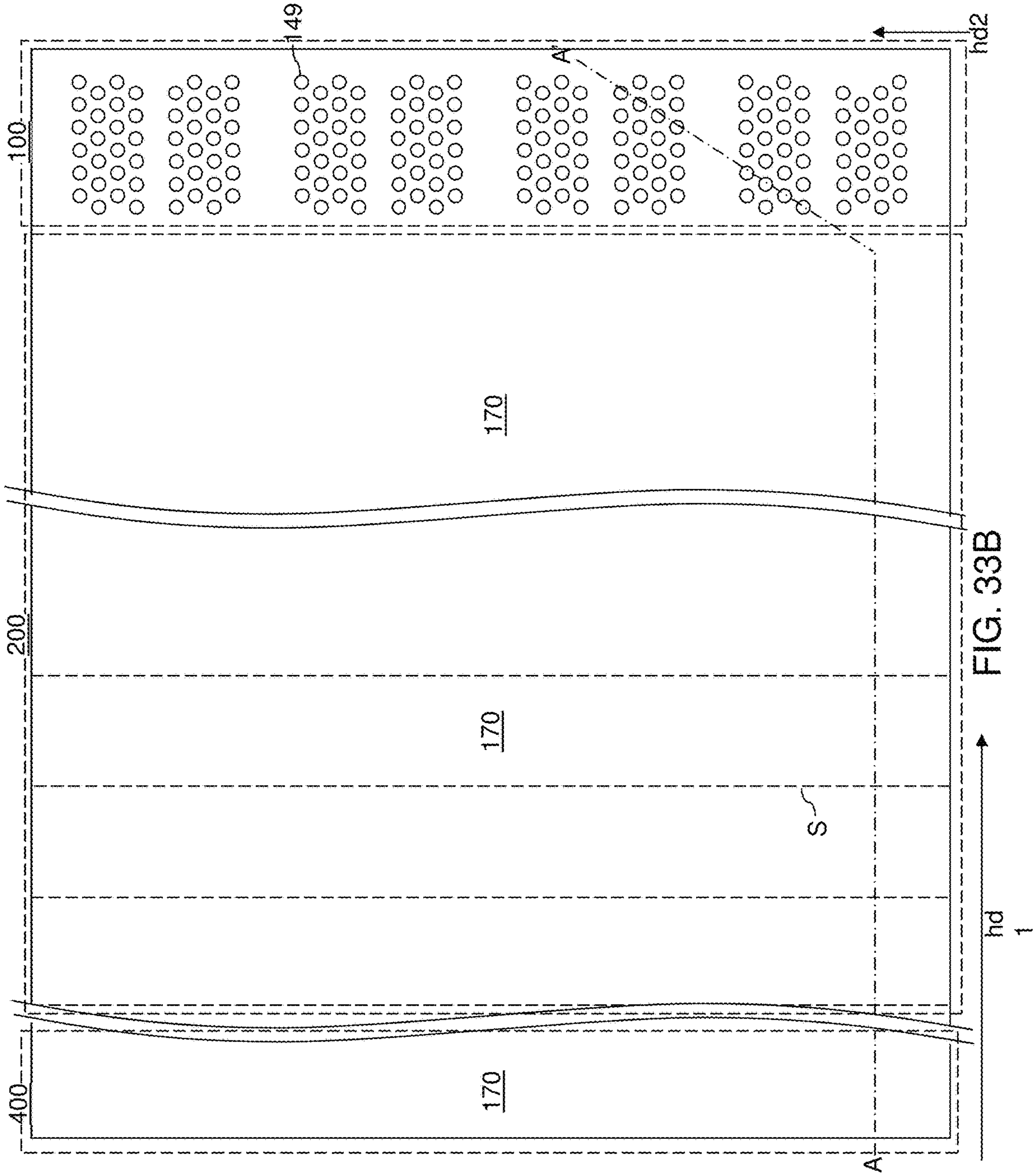
FIG. 33B is a top-down view of the second exemplary structure of FIG. 33A. The hinged vertical plane A-A' corresponds to the plane of the vertical cross-sectional view of FIG. 33A.

Referring to FIGS. 33A and 33B, an inter-tier dielectric layer 180 may be optionally deposited over the first-tier structure (132, 142, 164, 165, 170). The inter-tier dielectric layer 180 includes a dielectric material such as silicon oxide. In one embodiment, the inter-tier dielectric layer 180 can include a doped silicate glass having a greater etch rate than the material of the first insulating layers 132 (which can include an undoped silicate glass). For example, the inter-tier dielectric layer 180 can include phospho silicate glass. The thickness of the inter-tier dielectric layer 180 can be in a range from 30 nm to 300 nm, although lesser and greater thicknesses can also be used.

Subsequently, the processing steps of FIGS. 5A and 5B can be performed to form first-tier memory openings 149 in the memory array region 100 at locations at which memory stack structures including vertical stacks of memory elements are to be subsequently formed. Optionally, the processing steps of FIGS. 6A and 6B can be performed to laterally expand the portions of the first-tier memory openings 149 at the level of the inter-tier dielectric layer 180 can be laterally expanded by an isotropic etch.

Figure 34:
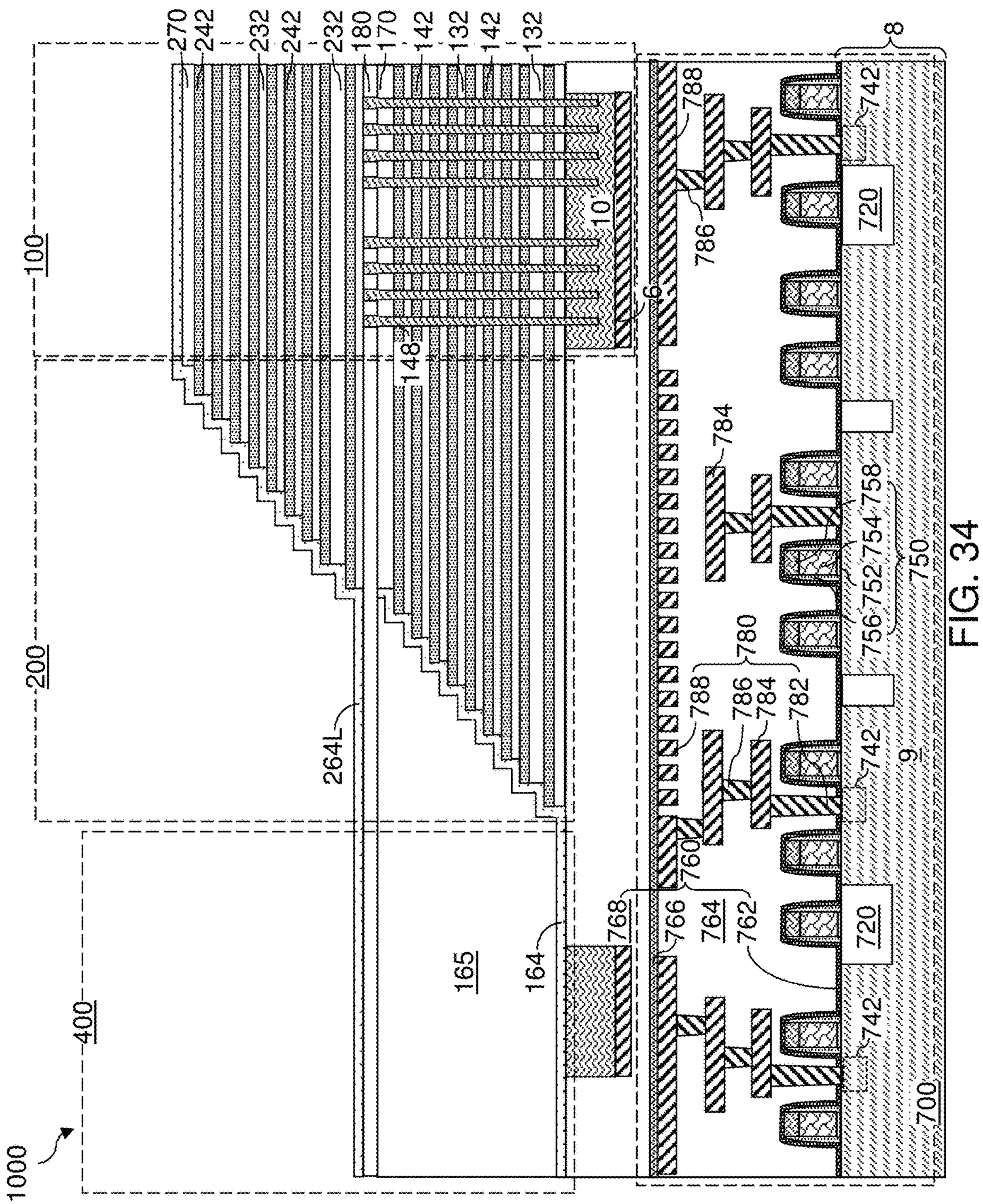
FIG. 34 is a vertical cross-sectional view of the second exemplary structure after formation of sacrificial memory opening fill portions, a second-tier alternating stack of second insulating layers and second spacer material layers, second stepped surfaces, and a second dielectric liner layer according to the second embodiment of the present disclosure.

Referring to FIG. 34, sacrificial memory opening fill portions 148 can be formed in the first-tier memory openings 149. For example, a sacrificial fill material layer is deposited in the first-tier memory openings 149. The sacrificial fill material layer includes a sacrificial material which can be subsequently removed selective to the materials of the first insulator layers 132 and the first sacrificial material layers 142. In one embodiment, the sacrificial fill material layer can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer having a thickness in a range from 1 nm to 3 nm) may be used prior to depositing the sacrificial fill material layer. The sacrificial fill material layer may be formed by a non-conformal deposition or a conformal deposition method. In another embodiment, the sacrificial fill material layer can include amorphous silicon or a carbon-containing material (such as amorphous carbon or diamond-like carbon) that can be subsequently removed by ashing.

Portions of the deposited sacrificial material can be removed from above the first insulating cap layer 170 (and the optional inter-tier dielectric layer 180, if present). For example, the sacrificial fill material layer can be recessed to a top surface of the first insulating cap layer 170 (and the optional inter-tier dielectric layer 180) employing a planarization process. The planarization process can include a recess etch, chemical mechanical planarization (CMP), or a combination thereof. The top surface of the first insulating layer 170 (and optionally layer 180 if present) can be used as an etch stop layer or a planarization stop layer. Each remaining portion of the sacrificial material in a first-tier memory opening 149 constitutes a sacrificial memory opening fill portion 148. The top surfaces of the sacrificial memory opening fill portions 148 can be coplanar with the top surface of the inter-tier dielectric layer 180 (or the first insulating cap layer 170 if the inter-tier dielectric layer 180 is not present). The sacrificial memory opening fill portion 148 may, or may not, include cavities therein.

An additional alternating stack of insulating layers and spacer material layers, which can be sacrificial material layers, is formed over the first-tier structure (132, 142, 170, 154, 165, 148). For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include the first insulating material, and each second sacrificial material layer 242 can include a sacrificial material. In this case, the second stack (232, 242) can include an alternating plurality of second insulating layers 232 and second sacrificial material layers 242. The first insulating material of the second insulating layers 232 can be deposited, for example, by chemical vapor deposition (CVD). The material of the second sacrificial material layers 242 can be formed, for example, CVD or atomic layer deposition (ALD).

Insulating materials that can be used for the second insulating layers 232 can be any material that can be used for the first insulating layers 132. The material of the second sacrificial material layers 242 is a sacrificial material that can be removed selective to the third material of the second insulating layers 232. Sacrificial materials that can be used for the second sacrificial material layers 242 can be any material that can be used for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be used for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be used. In one embodiment, each second sacrificial material layer 242 in the second stack (232, 242) can have a uniform thickness that is substantially invariant within each respective second sacrificial material layer 242.

A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Second stepped surfaces in the second stepped area can be formed in the staircase region 200 employing a same set of processing steps as the processing steps used to form the first stepped surfaces in the first stepped area with suitable adjustment to the pattern of at least one masking layer. The second stepped surfaces of the second alternating stack (232, 242) can be laterally offset toward the memory array region 100 from the first stepped surfaces of the first alternating stack (132, 142).

A second dielectric liner layer 264L can be formed by a conformal deposition process. The second dielectric liner layer 264L includes a silicate glass material that provides a higher etch rate than undoped silicate glass. In one embodiment, the first and second insulating layers (132, 232) can include the first silicon oxide material, and the first dielectric liner 164 and the second dielectric liner layer 264L can include the second silicon oxide material. As discussed above, the etch rate of the second silicon oxide material in a 100:1 dilute HF solution is greater than the etch rate of the first silicon oxide material in the 100:1 dilute HF solution by a factor of at least 3. For example, the first dielectric liner 164 and the second dielectric liner layer 264L can include a borosilicate glass (BSG) including boron at an atomic concentration in a range from 1% to 10%, borophosphosilicate glass (BPSG) including boron and arsenic at an atomic concentration in a range from 1% to 10%, or an organosilicate glass (e.g., silicon oxide formed using a PSZ source) including carbon at an atomic concentration in a range from 1% to 10% and hydrogen at an atomic concentration in a range from 0.5% to 10%. The etch rate of the material of the first dielectric liner 164 and the second dielectric liner layer 264L in a 100:1 dilute hydrofluoric acid at room temperature can be at least 5 times, and preferably at least 10 times and/or at least 20 times, the etch rate of thermal silicon oxide in a 100:1 dilute hydrofluoric acid at room temperature. The second dielectric liner layer 264L can be deposited by a conformal deposition process such as low pressure chemical vapor deposition or a non-conformal deposition process such as plasma enhanced chemical vapor deposition. The thickness of the horizontal portions of the second dielectric liner layer 264L can be in a range from 10 nm to 100 nm, such as from 20 nm to 50 nm, although lesser and greater thicknesses can also be used.

Figure 35:
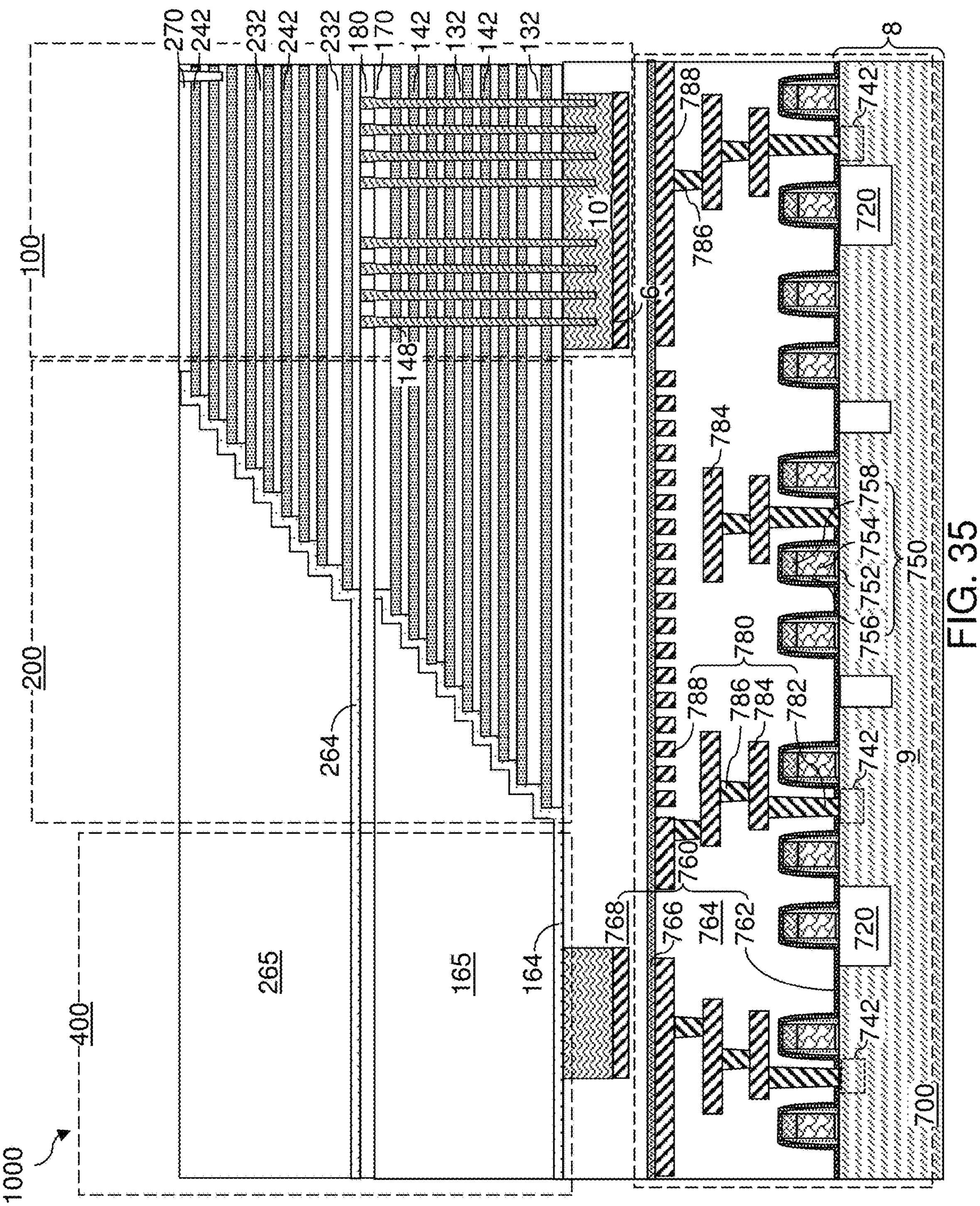
FIG. 35 is a vertical cross-sectional vie of the second exemplary structure after formation of a second dielectric liner and a second retro-stepped dielectric material portion according to the second embodiment of the present disclosure.

Referring to FIG. 35, a dielectric fill material can be deposited over the second dielectric liner layer 264L. Portions of the deposited dielectric fill material and the dielectric material of the silicate glass material of the second dielectric liner layer 264L can be removed from above the horizontal plane including the top surface of the second insulating cap layer 270 by a planarization process such as chemical mechanical planarization (CMP). The remaining portion of the second dielectric liner layer 264L constitutes a second dielectric liner 264, and covers the entire stepped surfaces of the second alternating stack (232, 242). The remaining portion of deposited dielectric fill material constitutes a second retro-stepped dielectric material portion 265. The topmost surface of the second dielectric liner 264 and a top surface of the second retro-stepped dielectric material portion 265 can be formed within the same horizontal plane, which is the horizontal plane including the top surface of the second insulating cap layer 270.

The second retro-stepped dielectric material portion 265 includes a silicate glass having a lower etch rate than the silicate glass material of the second dielectric liner 264. For example, the second retro-stepped dielectric material portion 265 can include undoped silicate glass formed by thermal decomposition or plasma decomposition of tetraethylorthosilicate (TEOS), or a lightly doped silicate glass (such as phosphosilicate glass) that is substantially free of boron and formed by thermal decomposition of TEOS. In one embodiment, the second retro-stepped dielectric material portion 265 can include the third silicon oxide material, which is the silicon oxide material of the first retro-stepped dielectric material portion 165.

Generally speaking, at least one alternating stack of insulating layers (132, 232) and spacer material layers (such as sacrificial material layers (142, 242)) can be formed over the in-process source-level material layers 10', and at least one retro-stepped dielectric material portion (165, 265) can be formed over the staircase regions on the at least one alternating stack (132, 142, 232, 242).

Optionally, drain-select-level isolation structures 72 can be formed through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level isolation structures 72 include a dielectric material such as silicon oxide. The drain-select-level isolation structures 72 can laterally extend along a first horizontal direction hd1, and can be laterally spaced apart along a second horizontal direction hd2 that is perpendicular to the first horizontal direction hd1.

Figure 36A:
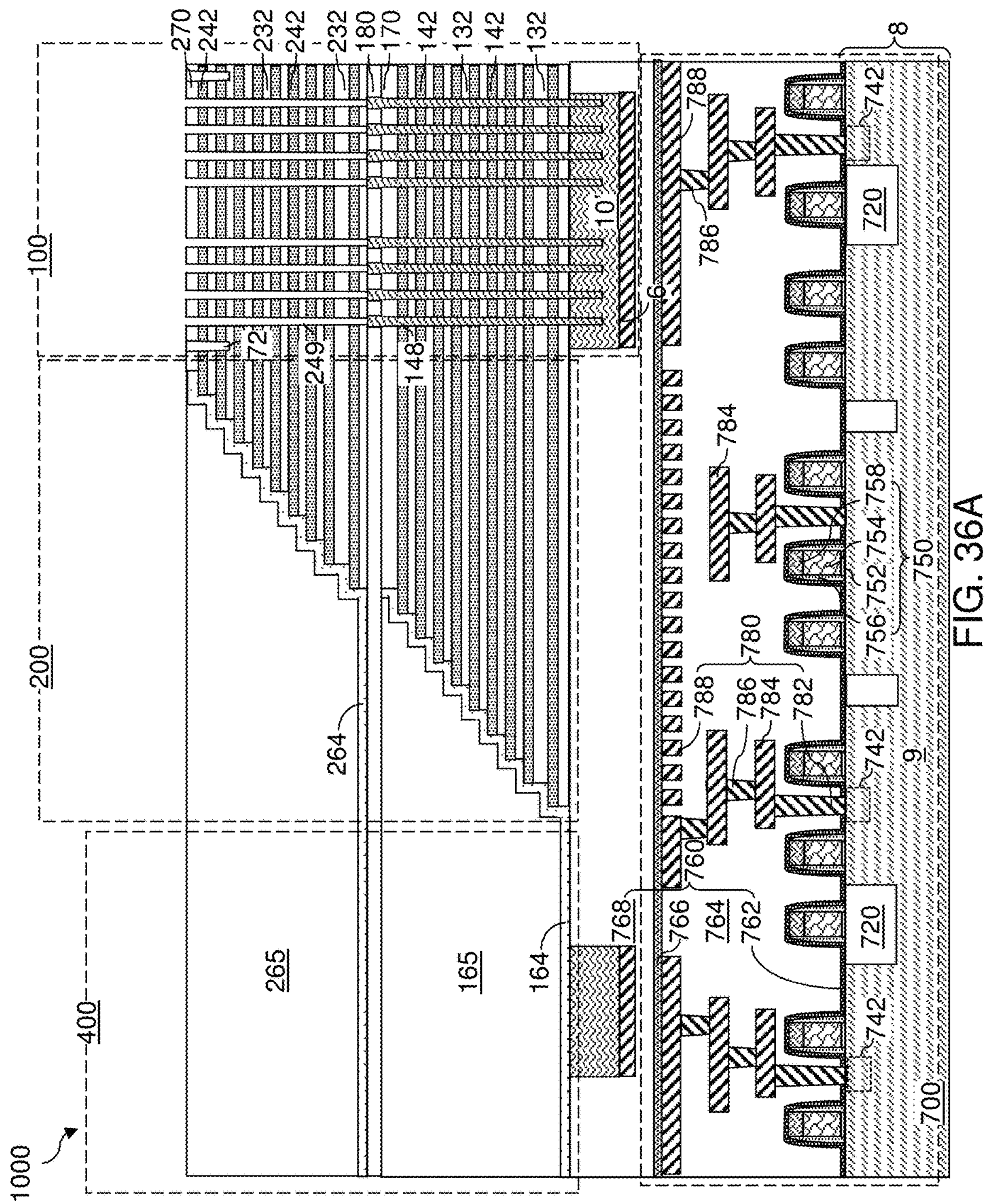
FIG. 36A is a vertical cross-sectional view of the second exemplary structure after formation of second-tier memory openings according to the second embodiment of the present disclosure.
Figure 36B:
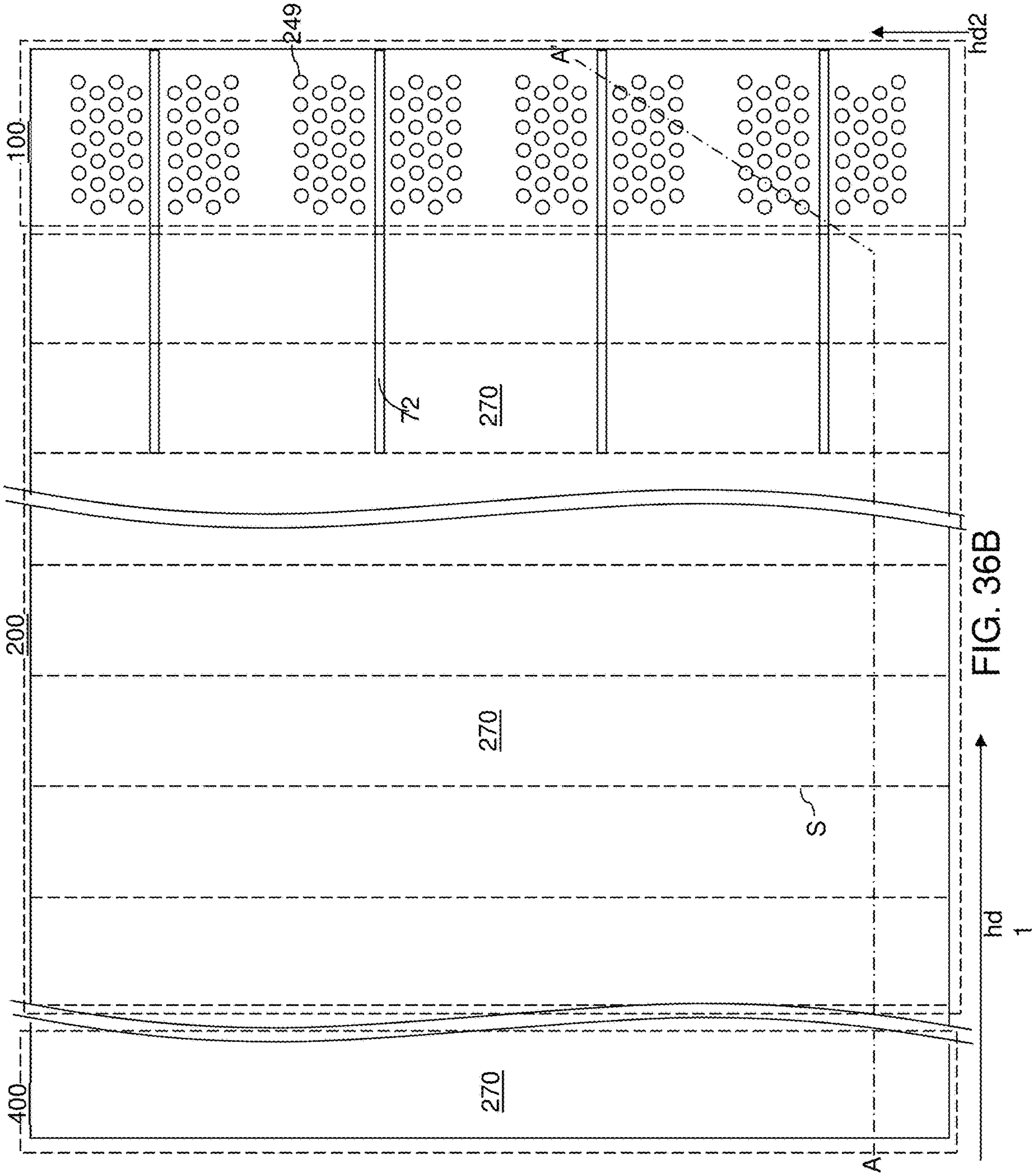
FIG. 36B is a top-down view of the second exemplary structure of FIG. 36A. The hinged vertical plane A-A' corresponds to the plane of the vertical cross-sectional view of FIG. 36A.

Referring to FIGS. 36A and 36B, second-tier memory openings 249 extending through the second-tier structure (232, 242, 270, 264, 265) are formed in areas overlying the sacrificial memory opening fill portions 148. For example, a photoresist layer can be applied over the second-tier structure (232, 242, 270, 264, 265), and can be lithographically patterned to form a same pattern as the pattern of the sacrificial memory opening fill portions 148, i.e., the pattern of the first-tier memory openings 149. Thus, the lithographic mask used to pattern the first-tier memory openings 149 can be used to pattern the second-tier memory openings 249. An anisotropic etch can be performed to transfer the pattern of the lithographically patterned photoresist layer through the second-tier structure (232, 242, 270, 264, 265). In one embodiment, the chemistry of the anisotropic etch process used to etch through the materials of the second-tier alternating stack (232, 242) can alternate to optimize etching of the alternating material layers in the second-tier alternating stack (232, 242). The anisotropic etch can be, for example, a series of reactive ion etches. The patterned lithographic material stack can be removed, for example, by ashing after the anisotropic etch process. A top surface of an underlying sacrificial memory opening fill portion 148 can be physically exposed at the bottom of each second-tier memory opening 249.

Figure 37A:
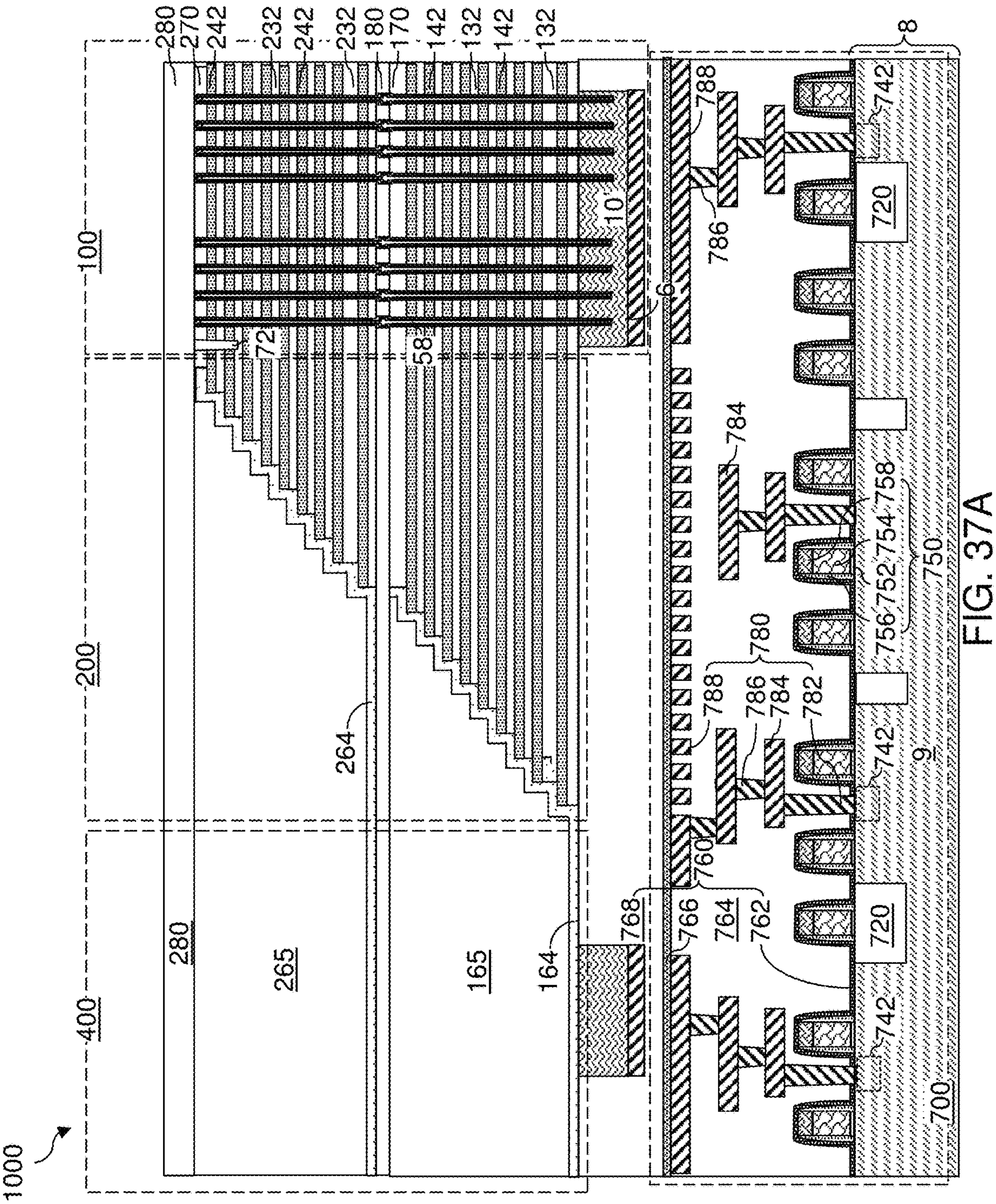
FIG. 37A is a vertical cross-sectional view of the second exemplary structure after formation of memory opening fill structures according to the second embodiment of the present disclosure.
Figure 37B:
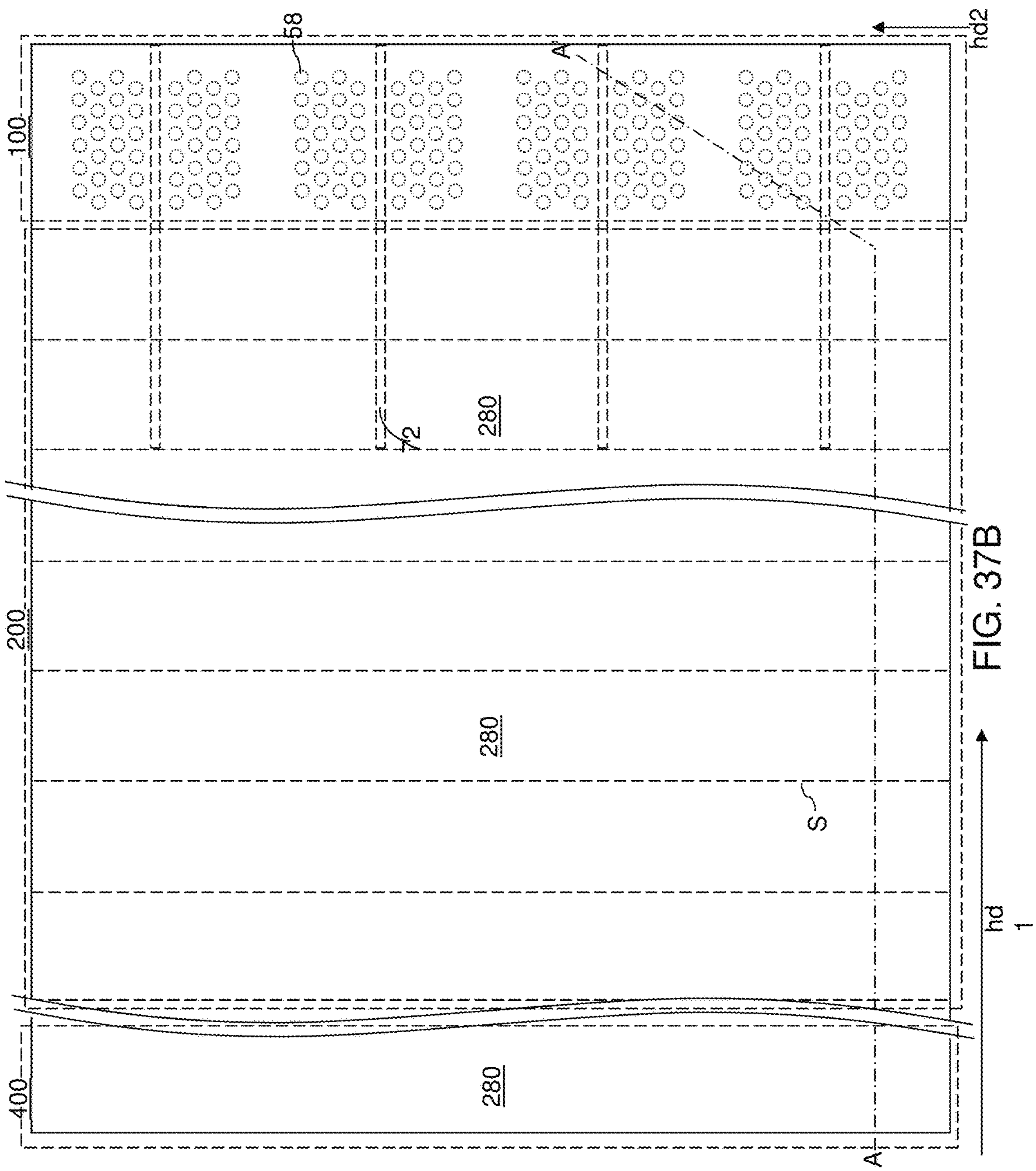
FIG. 37B is a top-down view of the second exemplary structure of FIG. 37A. The hinged vertical plane A-A' corresponds to the plane of the vertical cross-sectional view of FIG. 37A.
Figure 38A:
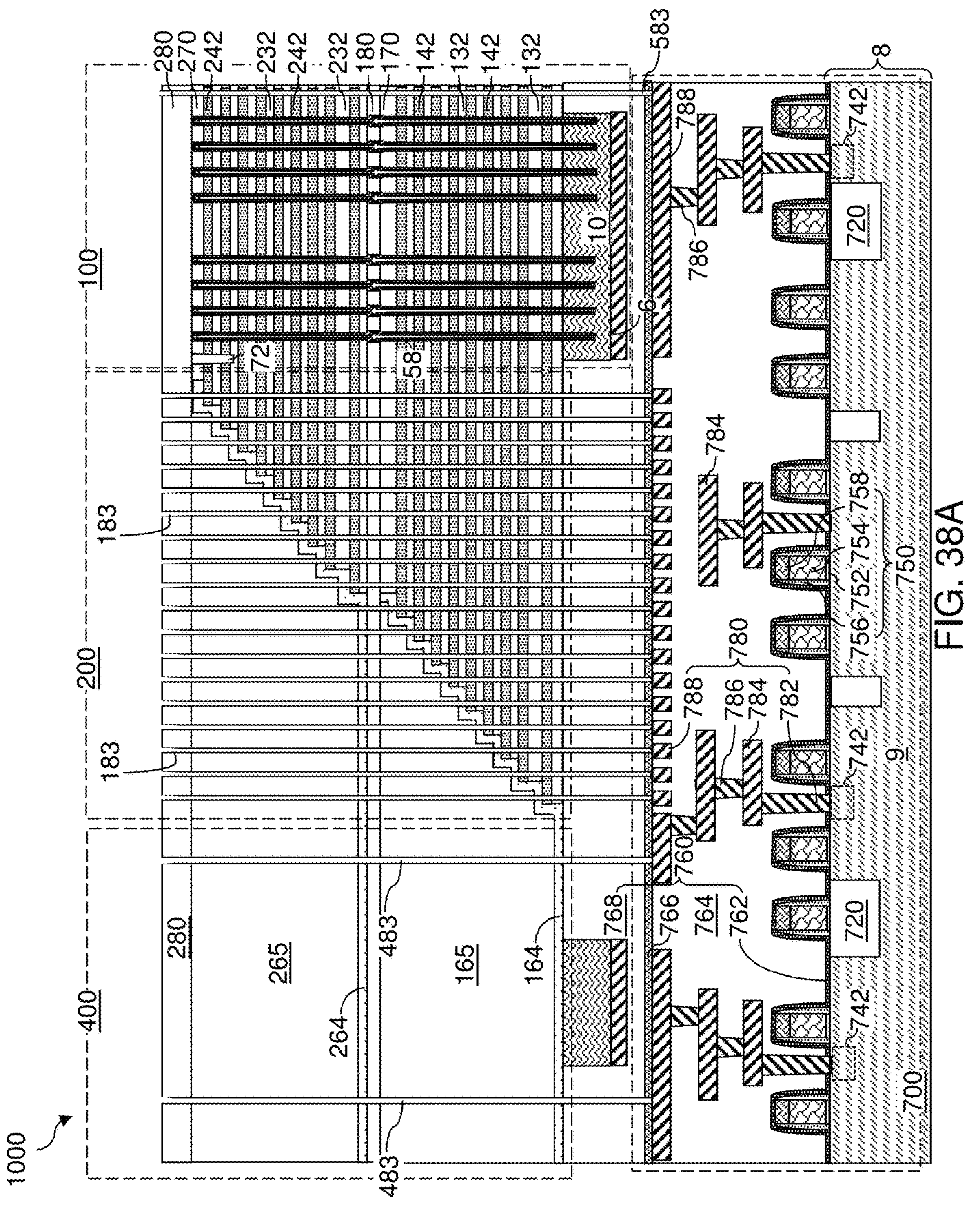
FIG. 38A is a vertical cross-sectional view of the second exemplary structure after formation of staircase region via cavities, peripheral region via cavities, and array region via cavities according to the second embodiment of the present disclosure.
Figure 38B:
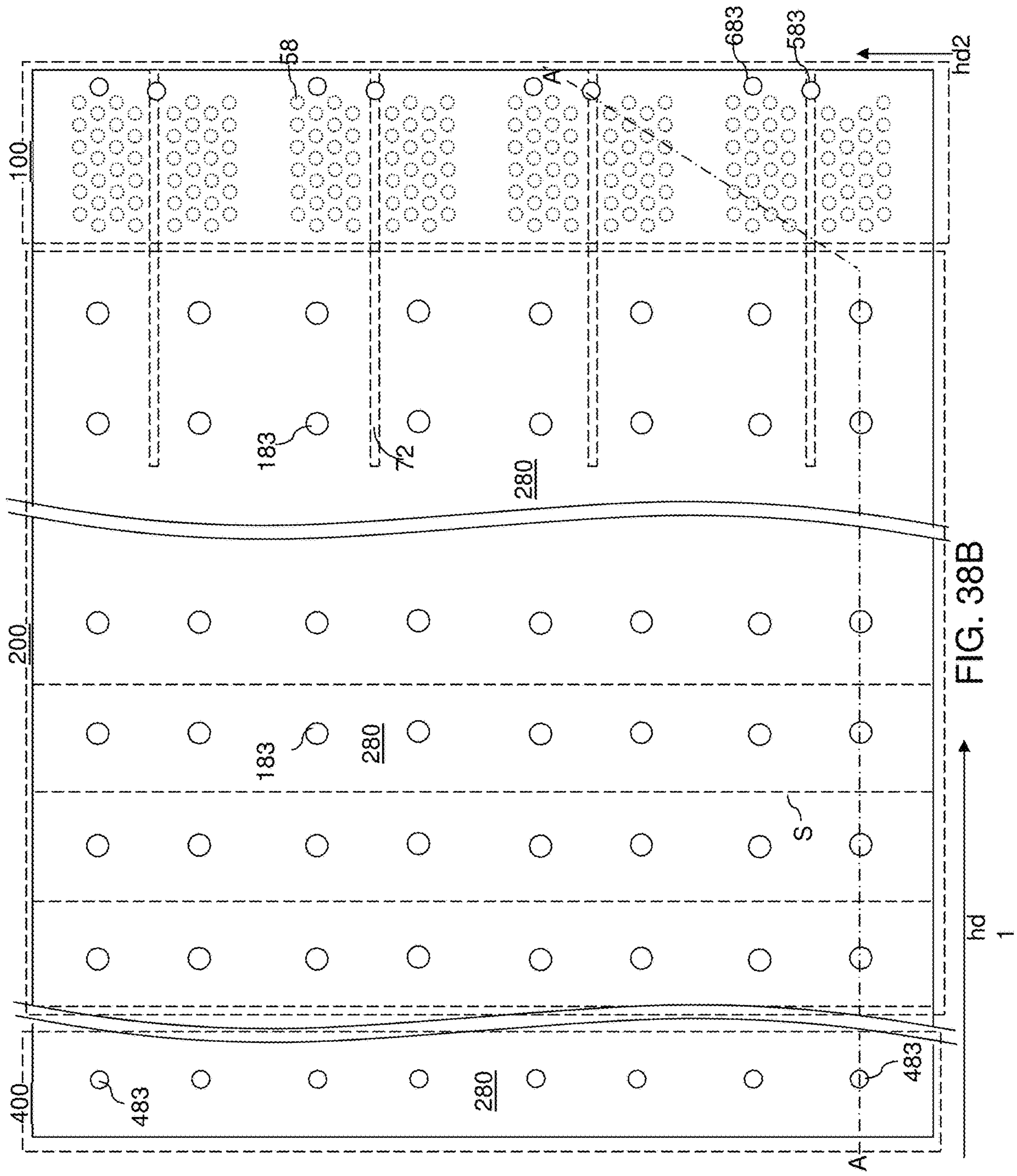
FIG. 38B is a top-down view of the second exemplary structure of FIG. 38A. The hinged vertical plane A-A' corresponds to the plane of the vertical cross-sectional view of FIG. 38A.
Figure 39A:
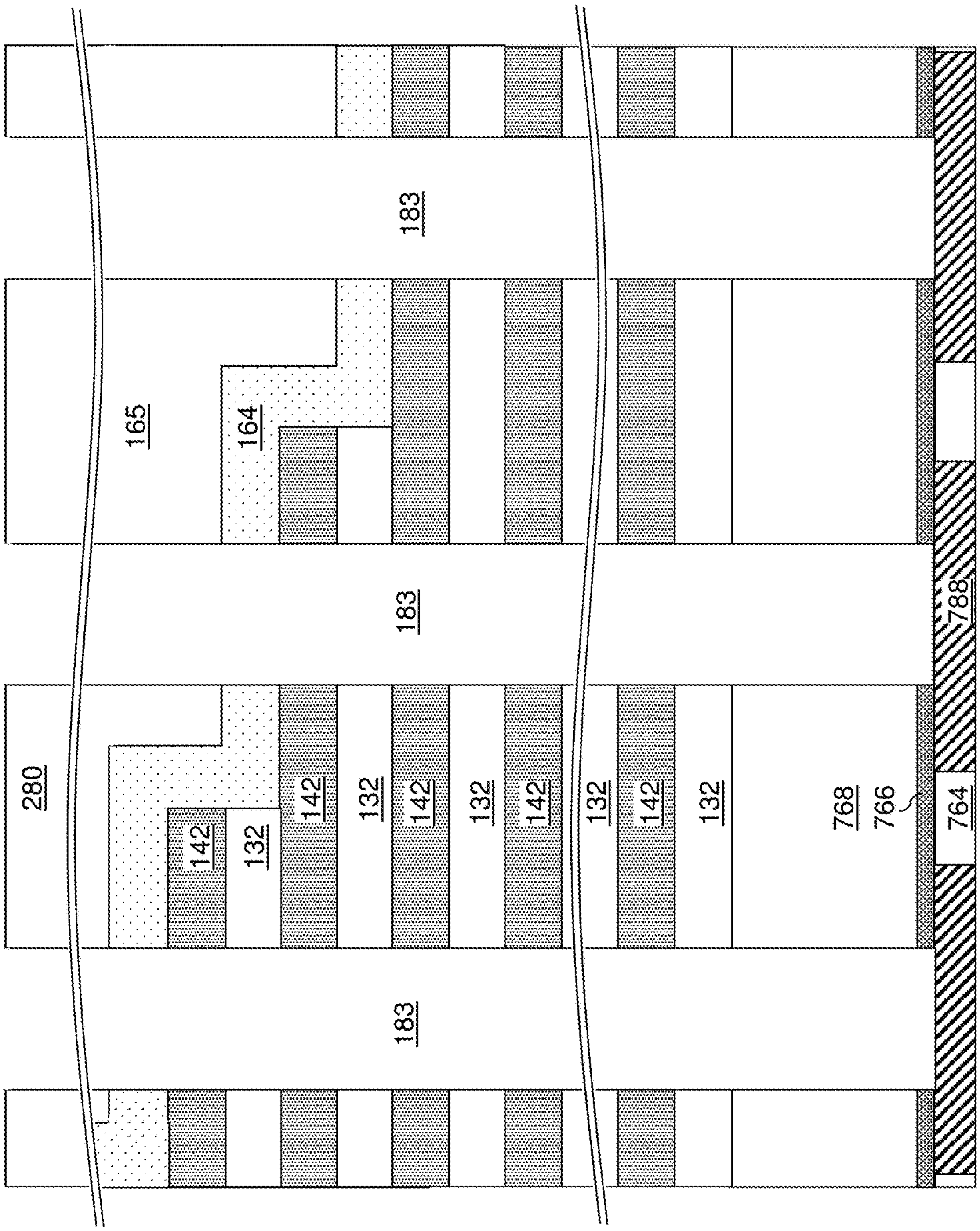
FIGS. 39A, 39B, 39C, and 39D are magnified vertical cross-sectional views of a staircase region via cavity, a peripheral region via cavity, an array region via cavity, and a source contact via cavity, respectively, at the processing steps of FIGS. 38A and 38B.
Figure 39C:
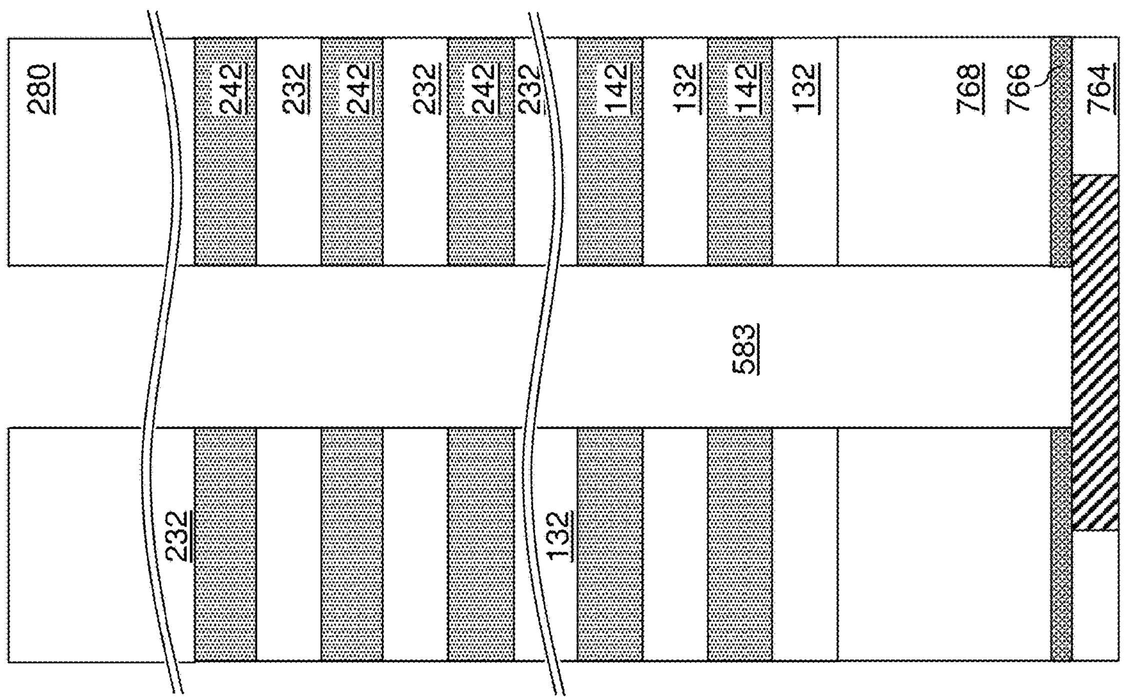
Figure 39B:
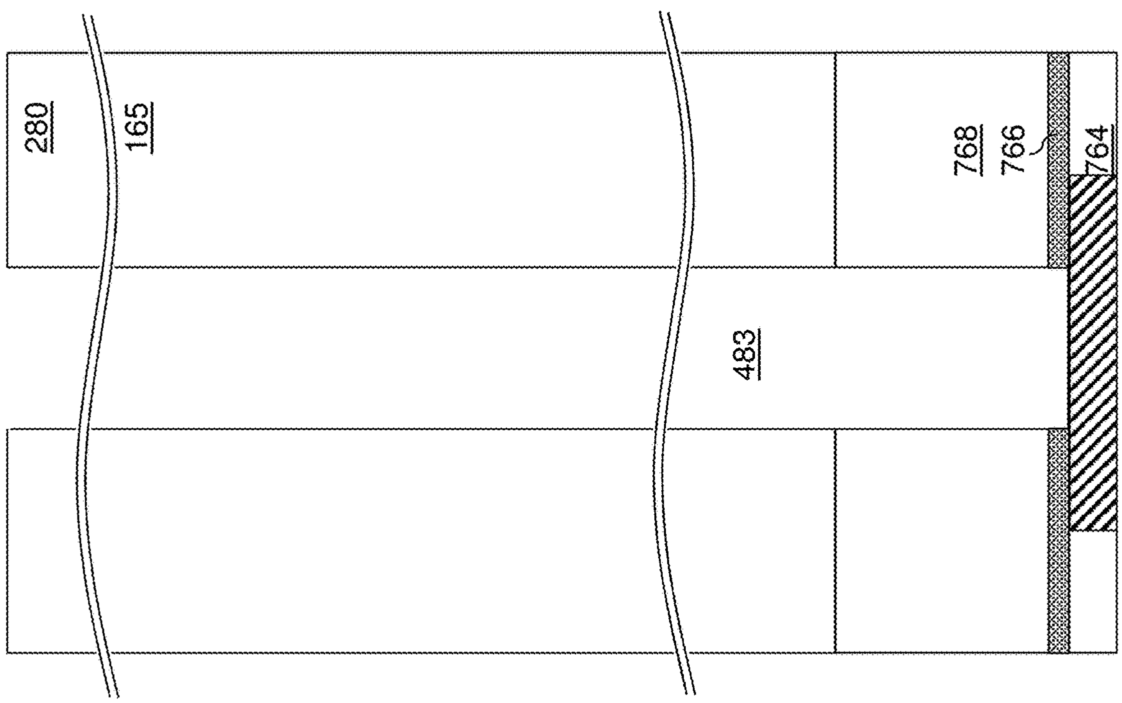
Figure 39D:
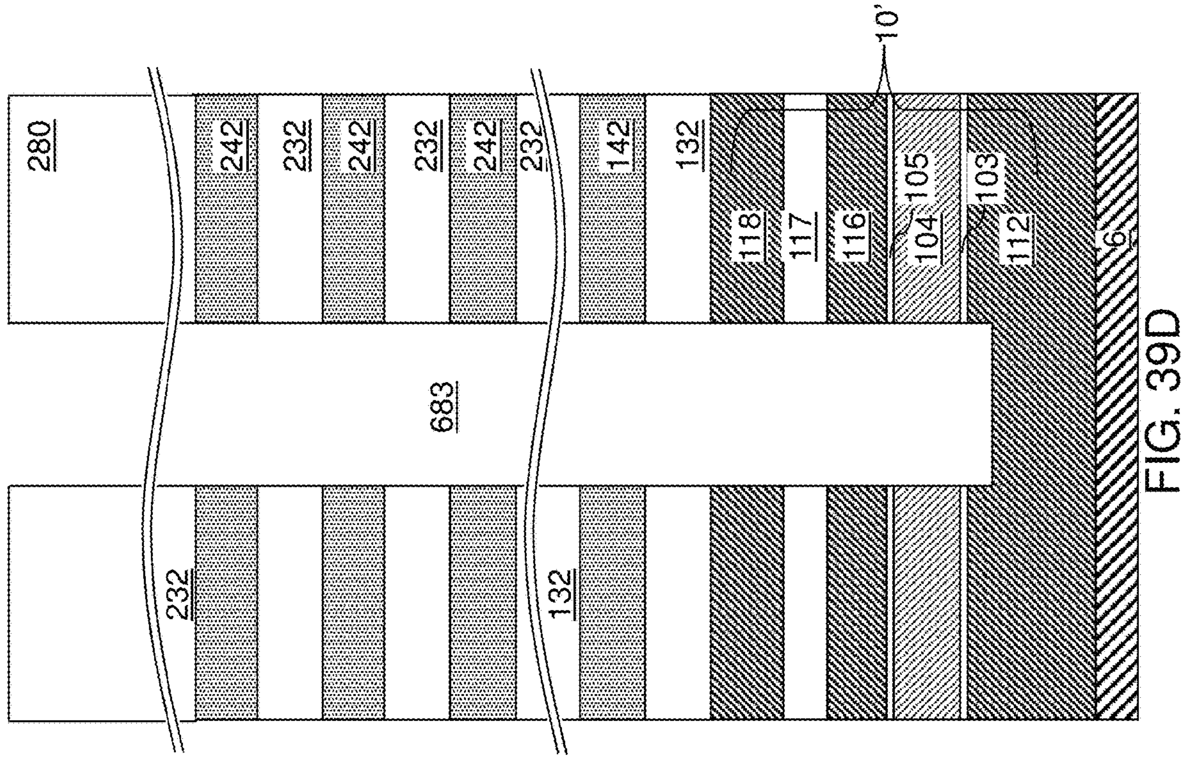
Figure 40A:
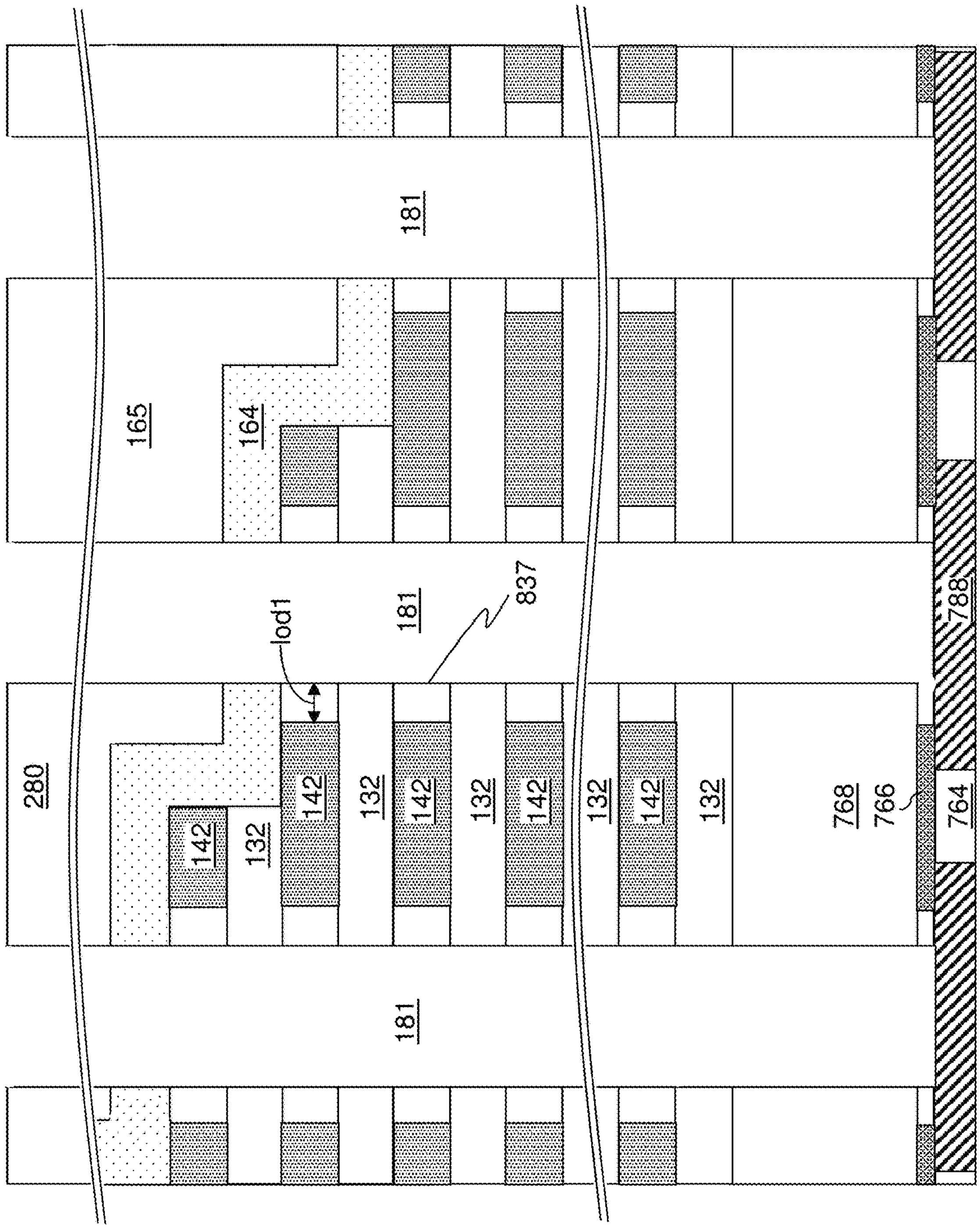
FIGS. 40A, 40B, 40C, and 40D are magnified vertical cross-sectional views of a staircase region via cavity, a peripheral region via cavity, an array region via cavity, and a source contact via cavity, respectively, after a first isotropic etch process that laterally recesses sacrificial material layers according to the second embodiment of the present disclosure.
Figure 40C:
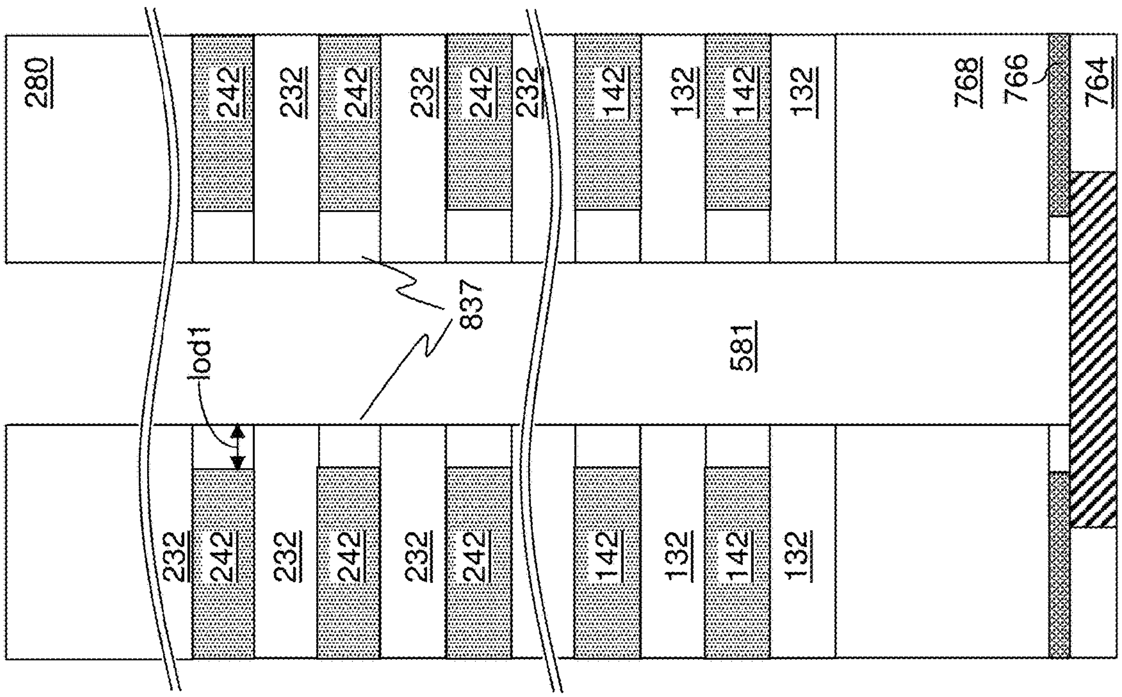
Figure 40B:
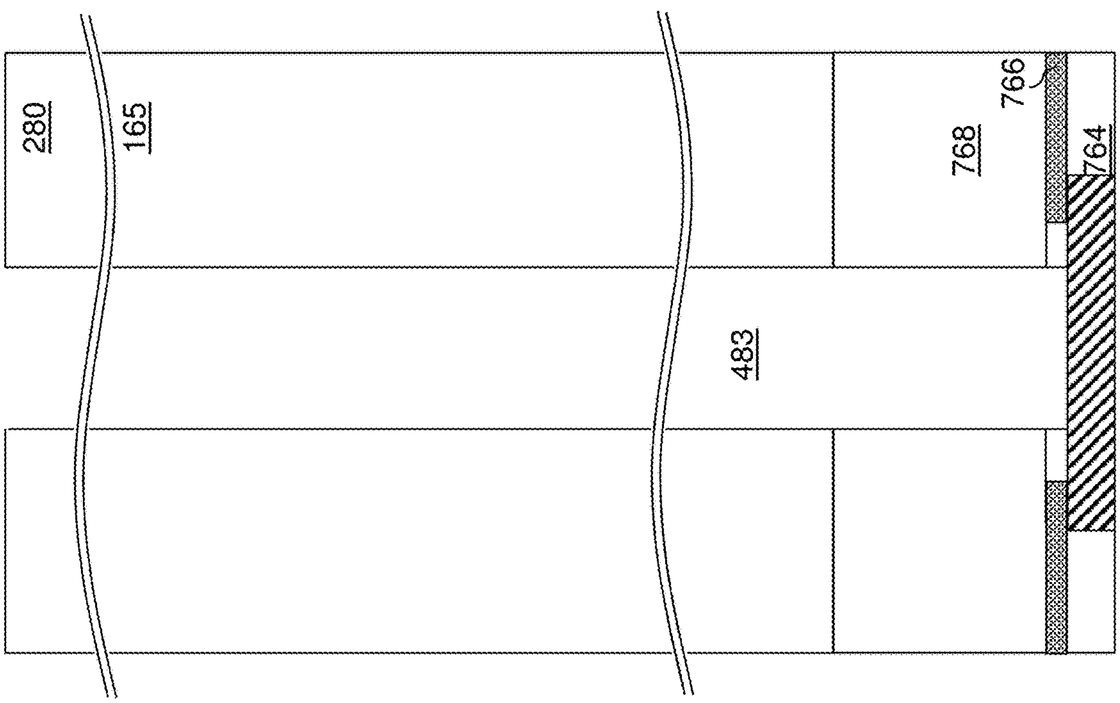
Figure 40D:
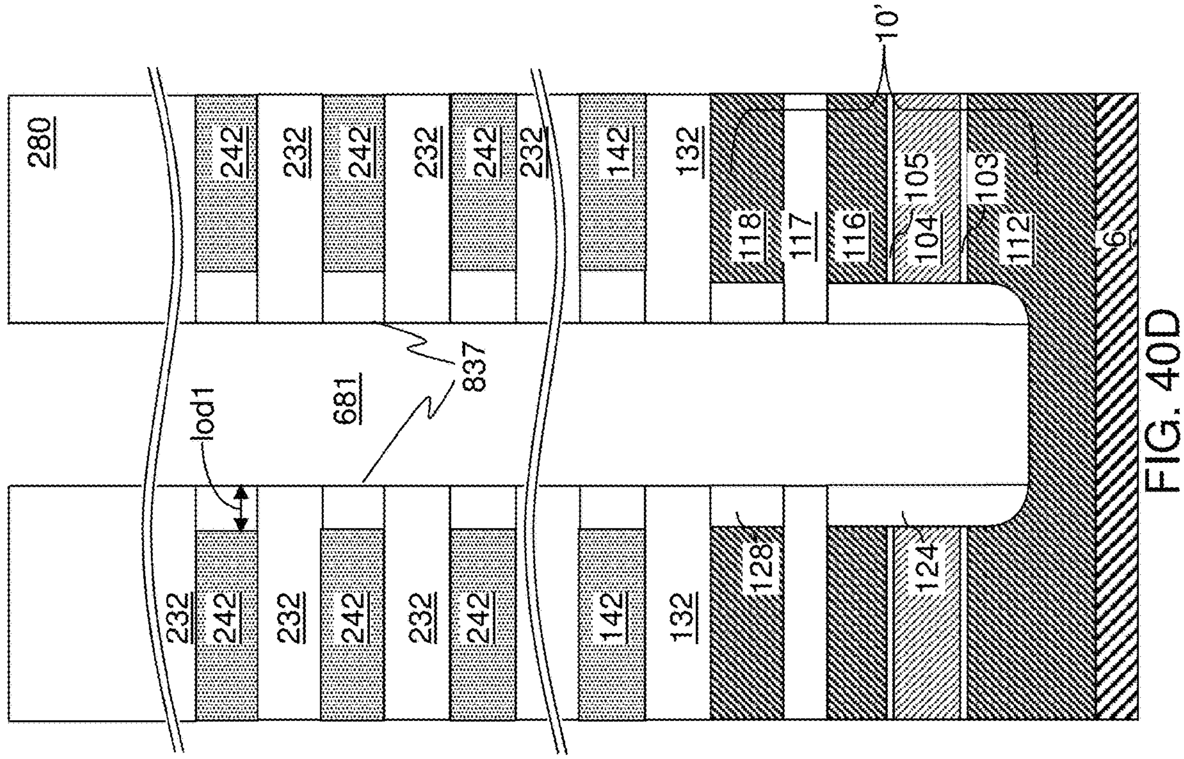
Figure 41A:
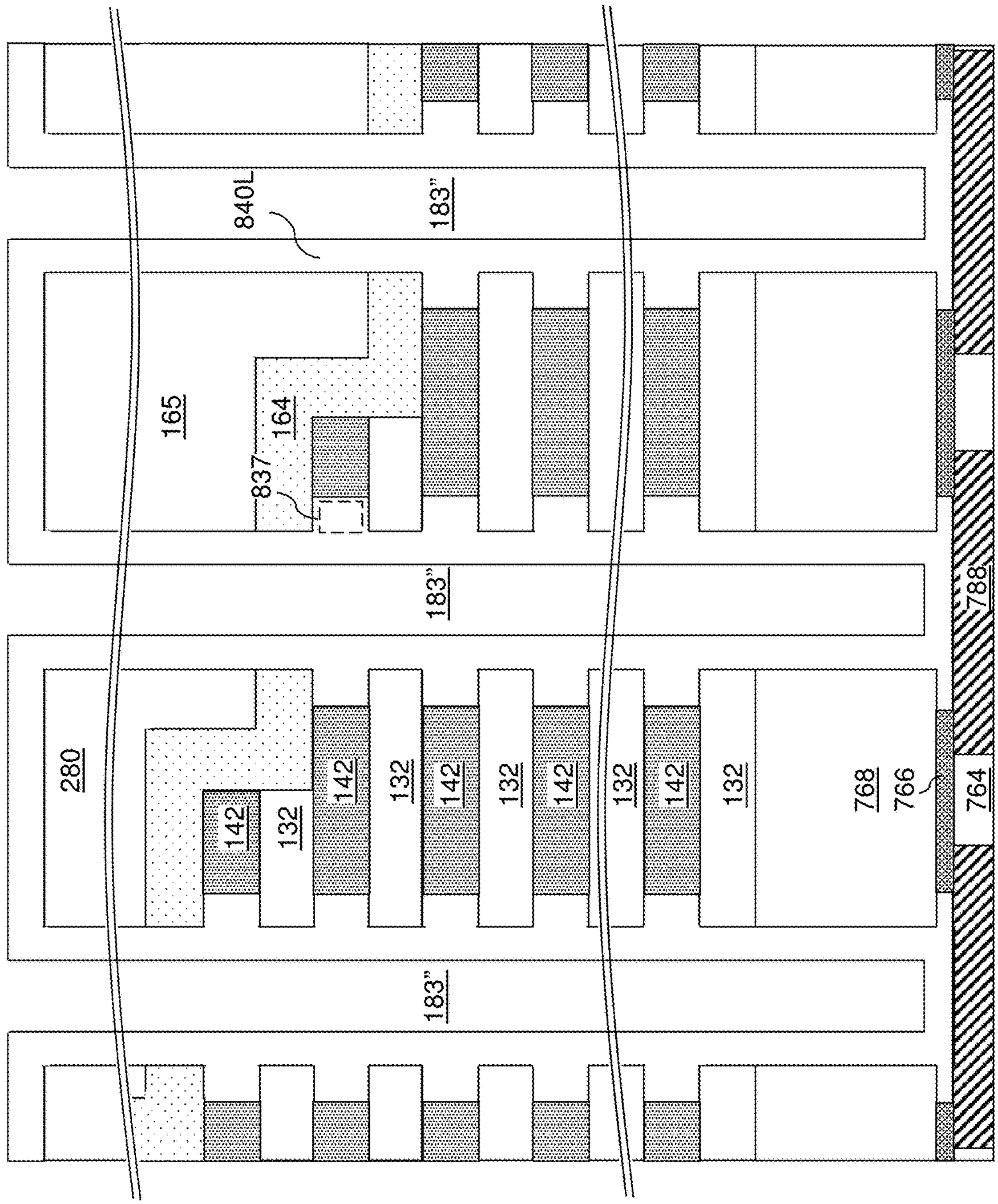
FIGS. 41A, 41B, 41C, and 41D are magnified vertical cross-sectional views of a staircase region via cavity, a peripheral region via cavity, an array region via cavity, and a source contact via cavity, respectively, after deposition of a conformal dielectric via liner according to the second embodiment of the present disclosure.
Figure 41C:
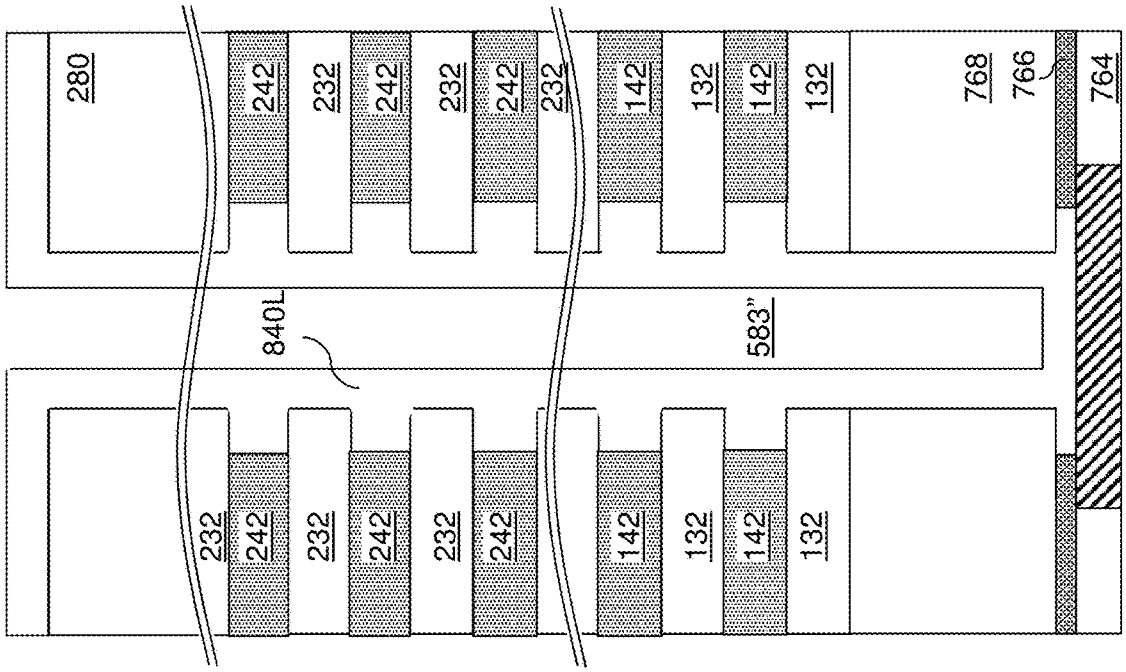
Figure 41B:
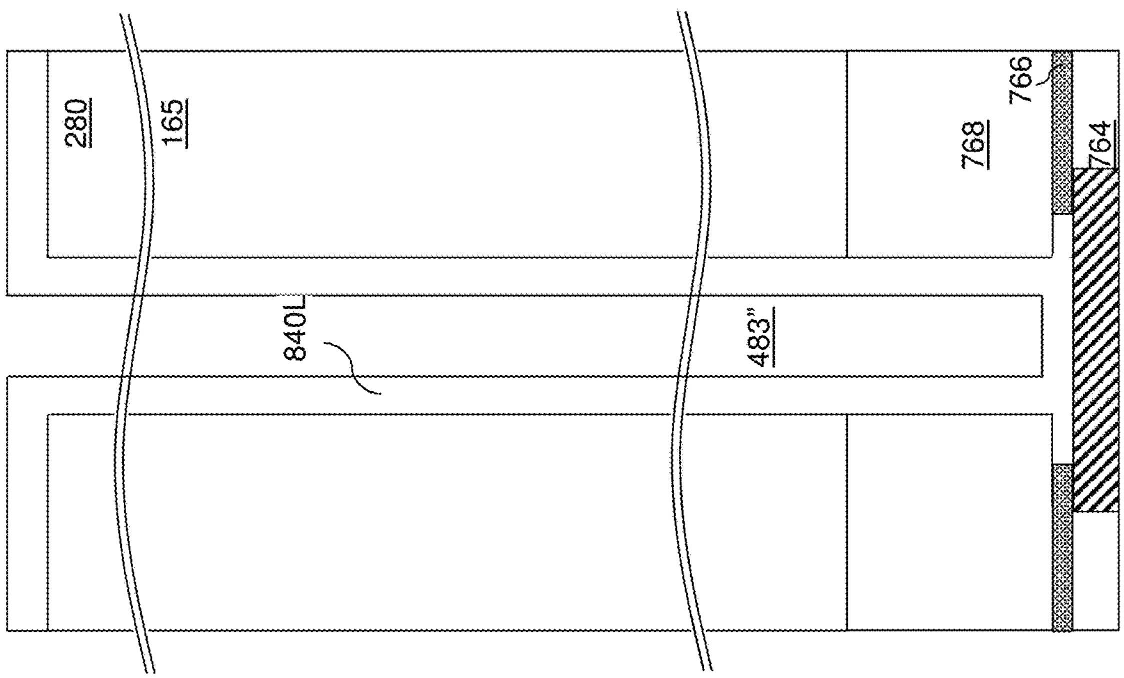
Figure 41D:
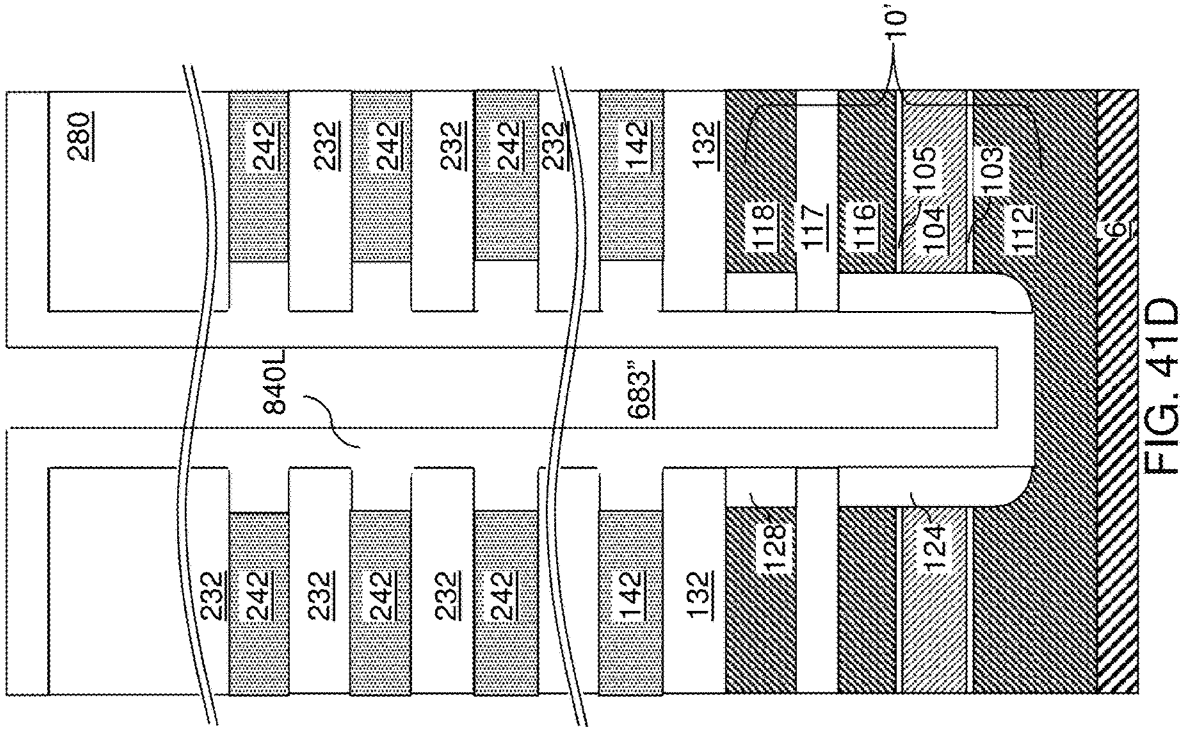
Figure 42A:
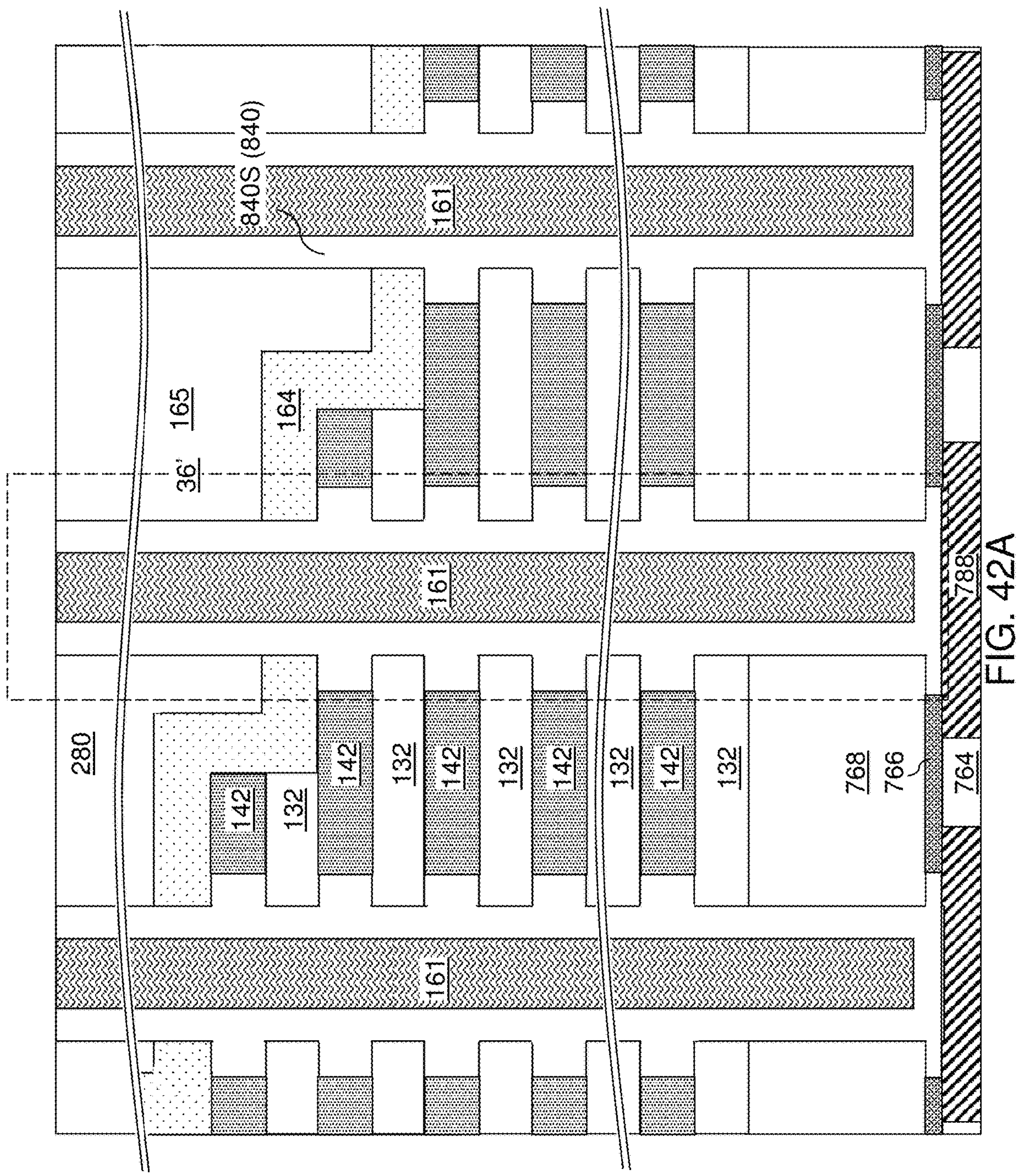
FIGS. 42A, 42B, 42C, and 42D are magnified vertical cross-sectional views of a staircase region via cavity, a peripheral region via cavity, an array region via cavity, and a source contact via cavity, respectively, after formation of various sacrificial via fill material portions therein according to the second embodiment of the present disclosure.
Figure 42C:
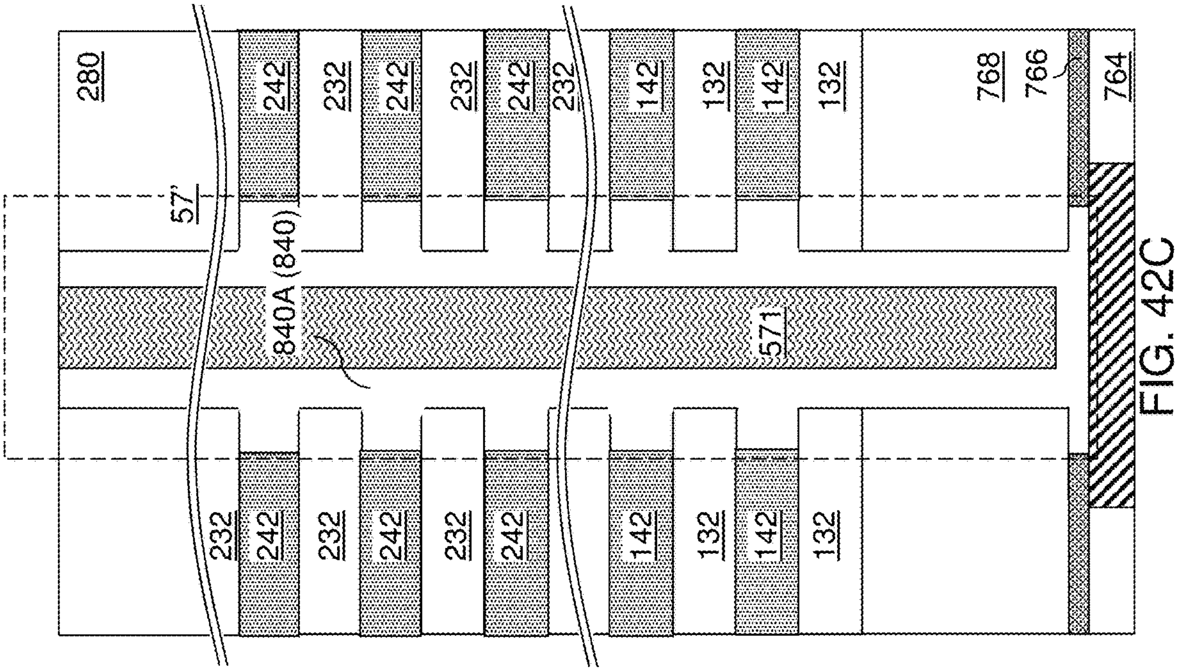
Figure 42B:
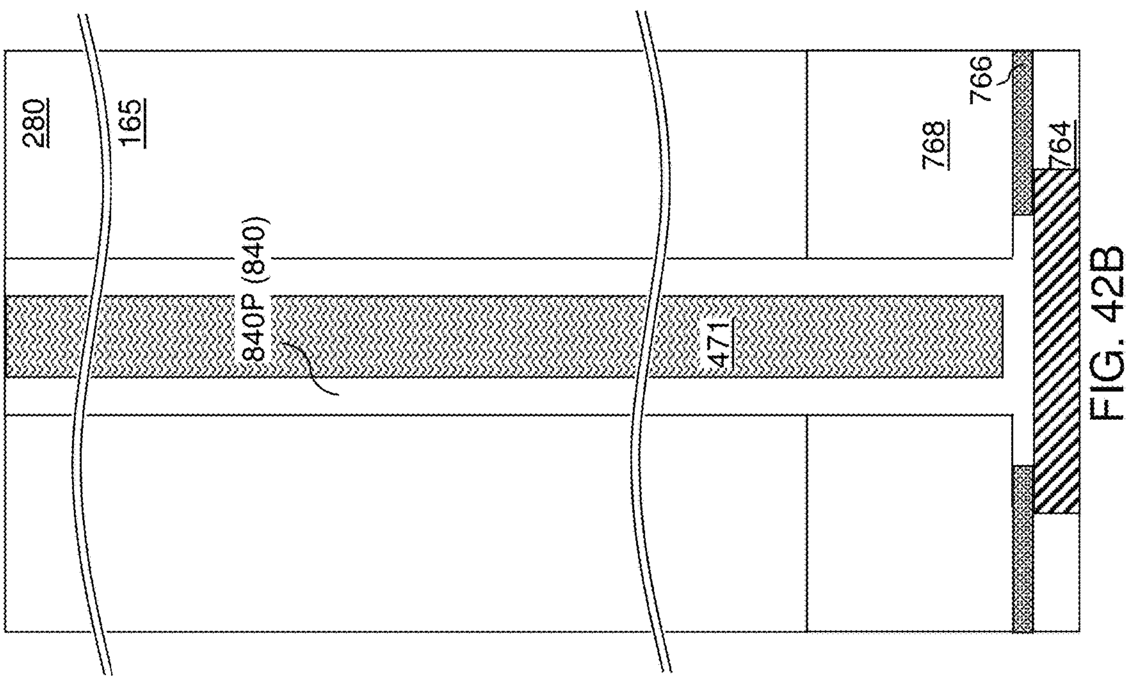
Figure 42D:
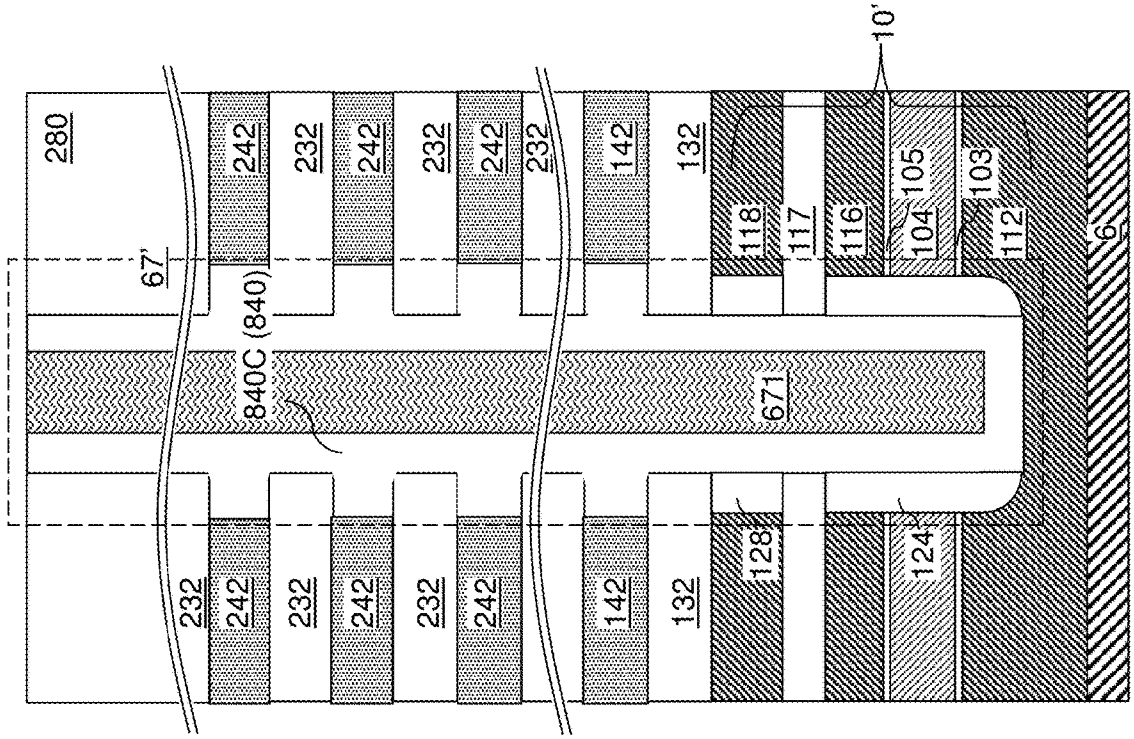

Referring to FIGS. 37A and 37B, an etch process can be performed to remove the sacrificial material of the sacrificial memory opening fill portions 148 selective to the materials of the second-tier alternating stack (232, 242) and the first-tier alternating stack (132, 142) (e.g., $C_4F_8/O_2/Ar$ etch). Upon removal of the sacrificial memory opening fill portions 148, each vertically adjoining pair of a second-tier memory opening 249 and a first-tier memory opening 149 forms a continuous cavity that extends through the first-tier alternating stack (132, 142) and the second-tier alternating stack (232, 242). The continuous cavities are herein referred to as memory openings (or inter-tier memory openings). Surfaces of the in-process source-level material layers 10' can be physically exposed at the bottom of each memory opening 49. Locations of steps S in the first-tier alternating stack (132, 142) and the second-tier alternating stack (232, 242) are illustrated as dotted lines.

A memory opening fill structure 58 can be formed in each of the memory openings. For example, the processing steps of FIGS. 11A-11D can be used to form memory opening fill structures 58 in the memory openings. Each of the memory stack structures 58 comprises a vertical stack of charge storage elements (as embodied as a charge storage layer 54), a tunneling dielectric layer 56 laterally surrounded by the vertical stack of charge storage elements, and a vertical semiconductor channel 60 laterally surrounded by the tunneling dielectric layer 56 as illustrated in FIG. 11D. The in-process source-level material layers 10', the first-tier structure (132, 142, 170, 165), the second-tier structure (232, 242, 270, 265), the inter-tier dielectric layer 180, and the memory opening fill structures 58 collectively constitute a memory-level assembly.

A first contact level dielectric layer 280 can be formed over the memory-level assembly. The first contact level dielectric layer 280 is formed at a contact level through which various contact via structures are subsequently formed to the drain regions 63 and the various electrically conductive layers that replaces the sacrificial material layers (142, 242) in subsequent processing steps.

Referring to FIGS. 38A, 38B, and 39A-39D, a photoresist layer (not shown) can be applied over the first contact level dielectric layer 280, and can be lithographically patterned to form various openings in areas in which via cavities are to be subsequently formed. The openings can be formed adjacent to the memory stack structures 58 in the memory array region 100, over horizontal surfaces of the stepped surfaces in the staircase region 200, and in the peripheral device region 400. An anisotropic etch process can be performed to transfer the pattern of the openings in the photoresist layer through the various material portions in the memory-level assembly. Various contact via cavities (183, 483, 583, 683) can be formed through the memory-level assembly. Specifically, a first subset (183, 483, 583) of the various contact via cavities (183, 483, 583, 683) can vertically extend to the top surfaces of the topmost lower-level metal line structures 788. A second subset 683 of the various contact via cavities (183, 483, 583, 683) can vertically extend through the alternating stacks (132, 142, 232, 246) to the lower source layer 112. In one embodiment, the lower-level metal interconnect structures 780 and the source-level sacrificial layer 104 can function as an etch stop layer, and a terminal steps of the anisotropic etch process can include processing steps for etching the source-level sacrificial layer 104 and the lower sacrificial liner 103.

The various contact via cavities (183, 483, 583, 683) that are formed through the memory-level assembly include staircase region via cavities 183 that extend through a respective one of the horizontal surfaces of the stepped surfaces in the staircase region 200, peripheral region via cavities 483 that extend through the retro-stepped dielectric material portions (265, 165) in the peripheral device region 400, optional array region via cavities 583 that are formed through the alternating stacks (132, 142, 232, 242) in the memory array region 100 and extend to a respective one of the lower-level metal interconnect structures 780, and source contact via cavities 683 that extend through the alternating stacks (132, 142, 232, 242) and stop on the source-level sacrificial layer 104. In one embodiment, each of the various contact via cavities (183, 483, 583, 683) can be a cylindrical via cavity. Each staircase region via cavity 183 can be a cylindrical via cavity that extends through a second retro-stepped dielectric material portion 265 and a subset of layers within the second alternating stack (232, 242) and the first alternating stack (132, 142) over the lower-level metal interconnect structures 780. A top surface of a respective one of the lower-level metal interconnect structures 780 (such as the topmost lower-level metal line structures 788) can be physically exposed at the bottom of each of the various contact via cavities (183, 483, 583).

Referring to FIGS. 40A, 40B, 40C, and 40D, an oxidation process can be performed to convert physically exposed surface portions of the source selective level conductive layer 118, the upper source layer 116, the source-level sacrificial layer 104, the lower source layer 112 and the sacrificial material layers (142, 242). A thermal oxidation process or a plasma oxidation process may be used. Semiconductor oxide material portions (such as silicon oxide portions) can be formed at the level of the in-process source-level material layers 10' around each source contact via cavity 683. Silicon oxide or silicon oxynitride rib portions 837 can be formed by oxidation of the exposed edges of the silicon nitride sacrificial material layers (142, 242). An anisotropic etch process can be performed to remove a horizontal portion of each semiconductor oxide material portion located on top surfaces of the lower source layer. Remaining vertical portions of the semiconductor oxide material portions can include annular source-select-level semiconductor oxide spacers 128 contacting the source-select-level conductive layer 118, and annular buried-source-level semiconductor oxide spacers 124 contacting the upper source layer 116, the source-level sacrificial layer 104, and the lower source layer 112.

The oxidation of the silicon nitride sacrificial material layers (142, 242) provides a first lateral offset distance lod1 between sidewalls of the insulating layers (132, 232) and sidewalls of the remaining sacrificial material layers (142, 242). The first lateral offset distance lod1 can be in a range from 5 nm to 40 nm, such as from 10 nm to 20 nm, although lesser and greater thicknesses can also be used. The first lateral offset distance lod1 (i.e., the width of the rib portions 837) can be the same as or different from the width of the semiconductor oxide portions (124, 128). Each staircase region via cavity 183 can be converted from a cylindrical via cavity to a staircase region via cavity 181. Each array region via cavity 583 can be converted to an array region via cavity 581. Each source contact via cavity 683 can be converted to a source contact via cavity 681.

Referring to FIGS. 41A-41D, an optional conformal dielectric via liner 840L can be deposited at the periphery of the staircase region via cavities 181, the peripheral region via cavities 483, the array region via cavities 581, and the source contact via cavities 681 by a conformal deposition process. The conformal dielectric via liner 840L includes a dielectric material that is different from the material of the sacrificial material layers (142, 242). Further, the dielectric material of the conformal dielectric via liner 840L has a lower etch rate in 100:1 dilute hydrofluoric acid than the materials of the first dielectric liner 164 and the second dielectric liner 264. For example, the conformal dielectric via liner 840L can include silicon oxide or a dielectric metal oxide (such as aluminum oxide). In one embodiment, the conformal dielectric via liner 840L can include undoped silicate glass formed by atomic layer deposition. The thickness of the conformal dielectric via liner 840L can be less than one half of the width of the respective via cavity. Alternatively, the conformal dielectric via liner 840L can be omitted.

The conformal dielectric via liner 840L can be formed directly on each physically exposed top surface of the lower-level metal interconnect structures 780 (such as the physically exposed top surfaces of the topmost lower-level metal line structures 788). An unfilled void 183" can be present within each staircase region via cavity 181 after deposition of the conformal dielectric via liner 840L. An unfilled void 483" can be present within each peripheral region via cavity 483 after deposition of the conformal dielectric via liner 840L. An unfilled void 583" can be present within each array region via cavity 581 after deposition of the conformal dielectric via liner 840L. An unfilled void 683" can be present within each source contact via cavity 681 after deposition of the conformal dielectric via liner 840L.

Referring to FIGS. 42A-42D, a sacrificial via fill material can be deposited in each of the unfilled voids (183", 483", 583", 683") in the staircase region via cavities, the peripheral region via cavities, the array region via cavities, and the source contact via cavities by a conformal deposition process. Various sacrificial via fill material portions (161, 471, 571, 671) can be formed in the unfilled voids (183", 483", 583", 683") by deposition of the sacrificial via fill material and planarization of the sacrificial via fill material from above the top surface of the first contact level dielectric layer 280. The sacrificial via fill material is a material that can be removed selective to the material of the conformal dielectric via liner 840L. For example, the sacrificial via fill material can comprise a semiconductor material such as amorphous silicon. The sacrificial via fill material can be deposited by a non-conformal deposition process or a conformal deposition process. Planarization of the sacrificial via fill material can be performed by a chemical mechanical planarization (CMP) process or by a recess etch process. Horizontal portions of the conformal dielectric via liner 840L can be removed from above the top surface of the first contact level dielectric layer 280 by the planarization process.

Each remaining portion of the sacrificial material filling the voids constitutes a sacrificial via fill material portion (161, 471, 571, 671). The sacrificial via fill material portions (161, 471, 571, 671) include staircase region sacrificial via fill material portions 161 formed in the staircase region via cavities, peripheral region sacrificial via fill material portions 471 formed in the peripheral region via cavities, array region sacrificial via fill material portions 571 formed in the array region via cavities, and source contact sacrificial via fill material portions 671 formed in the source contact via cavities. Each remaining portion of the conformal dielectric via liner 840L in the various via cavities constitute an optional dielectric via liner 840. The insulating liners 840 include staircase region ribbed dielectric via liners 840S (which include the rib portions 837 described above), peripheral region dielectric via liners 840P, array region ribbed dielectric via liners 840A (which include the rib portions 837 described above), and source contact ribbed dielectric via liners 840C. Each adjoining set of a staircase region ribbed dielectric via liner 840S and a staircase region sacrificial via fill material portion 161 constitutes a staircase region sacrificial via structure 36'. Each adjoining set of an array region ribbed dielectric via liner 840A and an array region sacrificial via fill material portion 571 constitutes an array region sacrificial via structure 57'. Each adjoining set of a source contact ribbed dielectric via liner 840C and a source contact sacrificial via fill material portion 671 constitutes a source contact sacrificial via structure 67'.

Figure 43:
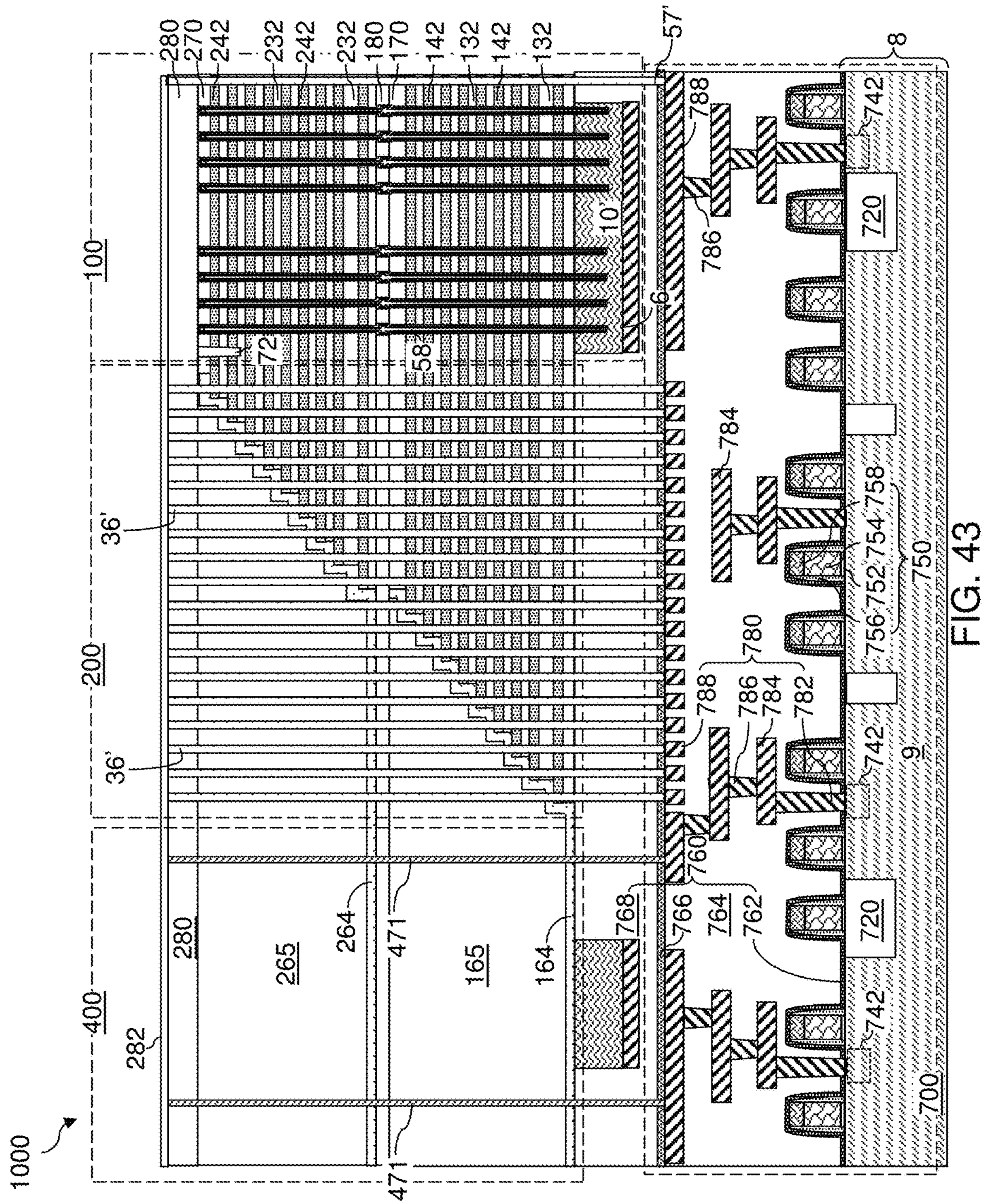
FIG. 43 is a vertical cross-sectional view of the second exemplary structure after formation of a sacrificial cover dielectric layer according to the second embodiment of the present disclosure.

Referring to FIG. 43, a sacrificial cover dielectric layer 282 can be deposited over the first contact level dielectric layer 280. The sacrificial cover dielectric layer 282 includes a dielectric material that protects the various sacrificial via fill material portions (161, 471, 571, 671) during subsequent etch processes. For example, the sacrificial cover dielectric layer 282 can include silicon oxide such as undoped silicate glass formed by decomposition of TEOS. The thickness of the sacrificial cover dielectric layer 282 can be in a range from 10 nm to 100 nm, although lesser and greater thicknesses can also be used.

Figure 44A:
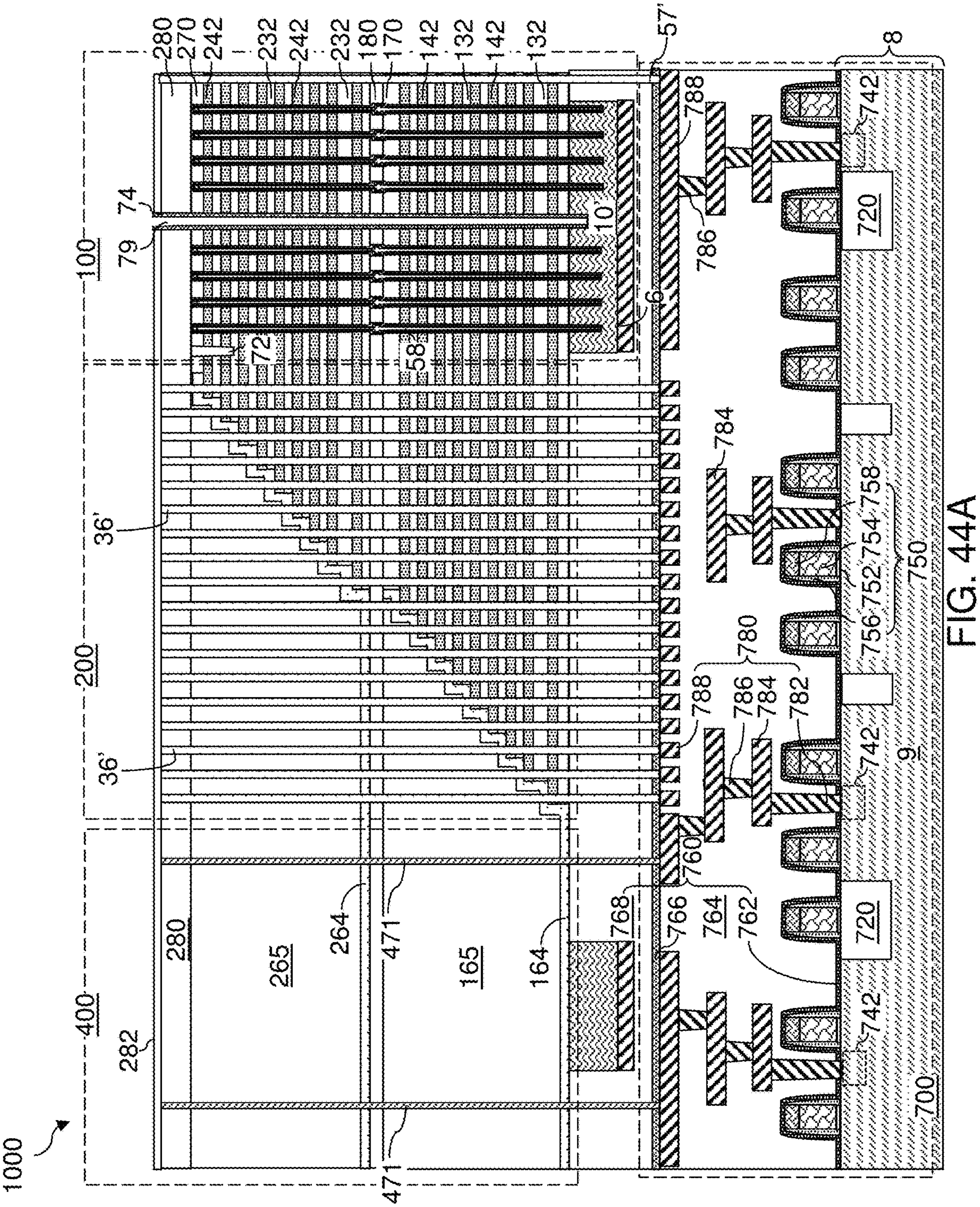
FIG. 44A is a vertical cross-sectional view of the second exemplary structure after formation of backside trenches according to the second embodiment of the present disclosure.
Figure 44B:
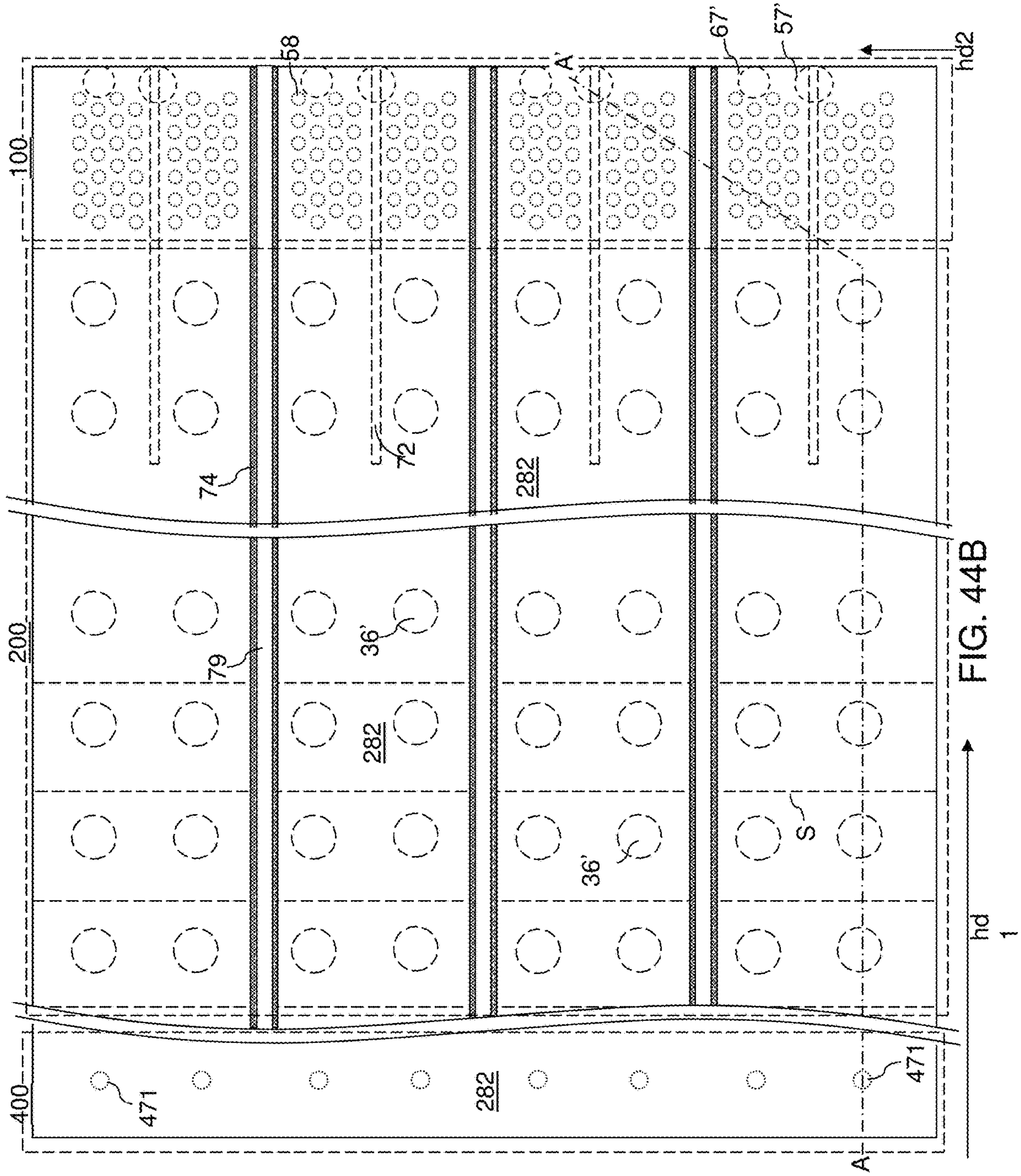
FIG. 44B is a top-down view of the second exemplary structure of FIG. 44A. The hinged vertical plane A-A' corresponds to the plane of the vertical cross-sectional view of FIG. 44A.

Referring to FIGS. 44A and 44B, backside trenches 79 are subsequently formed through the sacrificial cover dielectric layer 282 and the first contact level dielectric layer 280 and the memory-level assembly. For example, a photoresist layer can be applied and lithographically patterned over the sacrificial cover dielectric layer 282 to form elongated openings that extend along the first horizontal direction hd1. An anisotropic etch is performed to transfer the pattern in the patterned photoresist layer through a predominant portion of the memory-level assembly to the in-process source-level material layers 10'. For example, the backside trenches 79 can extend through the optional source selective level conductive layer 118, the source-level insulating layer 117, the upper source layer 116, and the upper sacrificial liner 105 and into the source-level sacrificial layer 104. The optional source selective level conductive layer 118 and the source-level sacrificial layer 104 can be used as etch stop layers for the anisotropic etch process that forms the backside trenches 79. The photoresist layer can be subsequently removed, for example, by ashing.

The backside trenches 79 extend along the first horizontal direction hd1, and thus, are elongated along the first horizontal direction hd1. The backside trenches 79 can be laterally spaced among one another along a second horizontal direction hd2, which can be perpendicular to the first horizontal direction hd1. The backside trenches 79 can extend through the memory array region 100 (which may extend over a memory plane) and the staircase region 200. The backside trenches 79 can laterally divide the memory-level assembly into memory blocks.

Backside trench spacers 74 can be formed on sidewalls of the backside trenches 79 by conformal deposition of a dielectric spacer material and an anisotropic etch of the dielectric spacer material. The dielectric spacer material is a material that can be removed selective to the materials of first and second insulating layers (132, 232). For example, the dielectric spacer material can include silicon nitride. The lateral thickness of the backside trench spacers 74 can be in a range from 4 nm to 60 nm, such as from 8 nm to 30 nm, although lesser and greater thicknesses can also be used.

Figure 45:
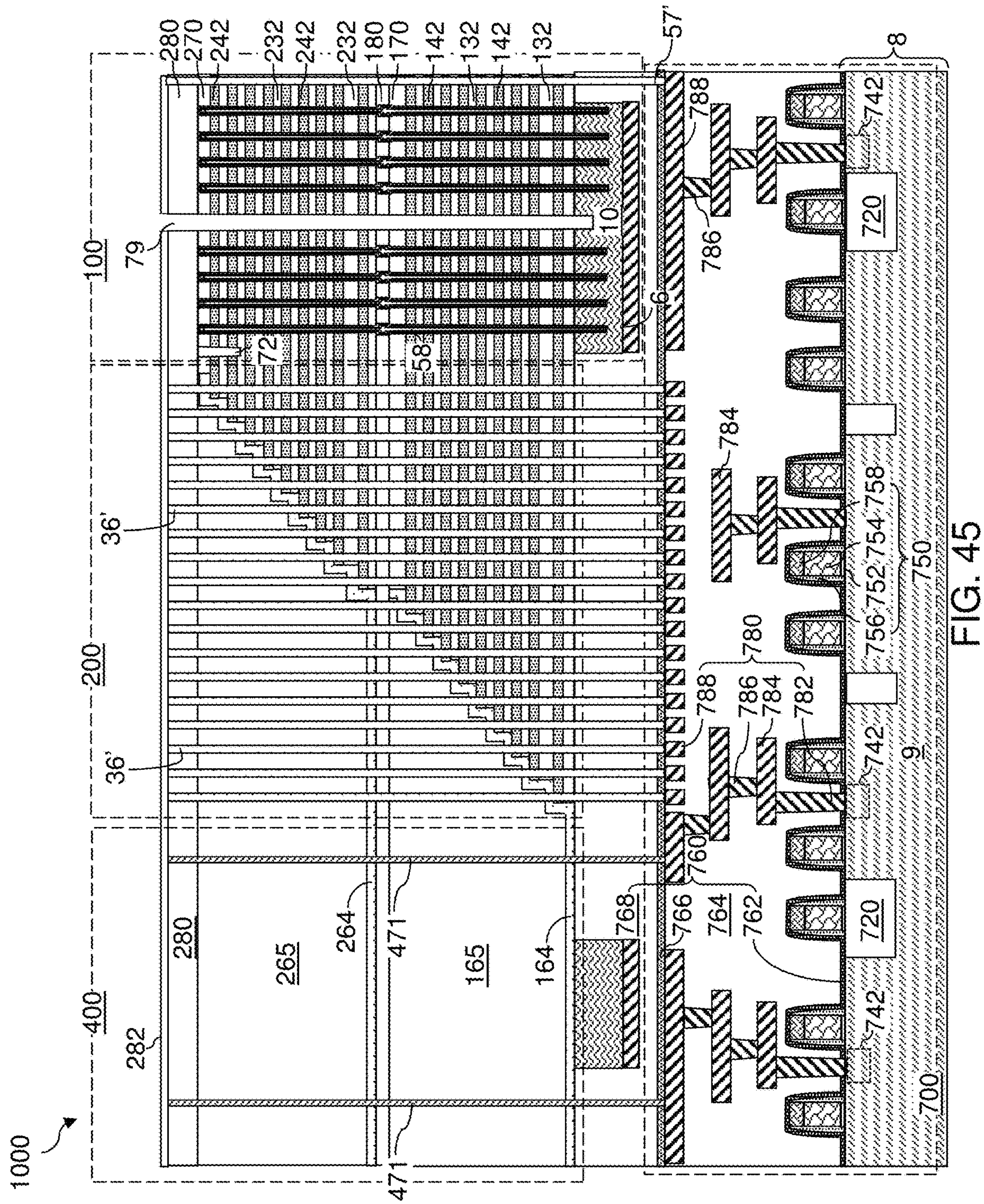
FIG. 45 is a vertical cross-sectional view of the second exemplary structure after formation of source-level material layers according to the second embodiment of the present disclosure.

Subsequently, the processing steps of FIGS. 21B-21E can be performed to replace the in-process source-level material layers 10' with source-level material layers 10. FIG. 45 illustrates the second exemplary structure after replacement of the in-process source-level material layers 10' with the source-level material layers 10.

Figure 46:
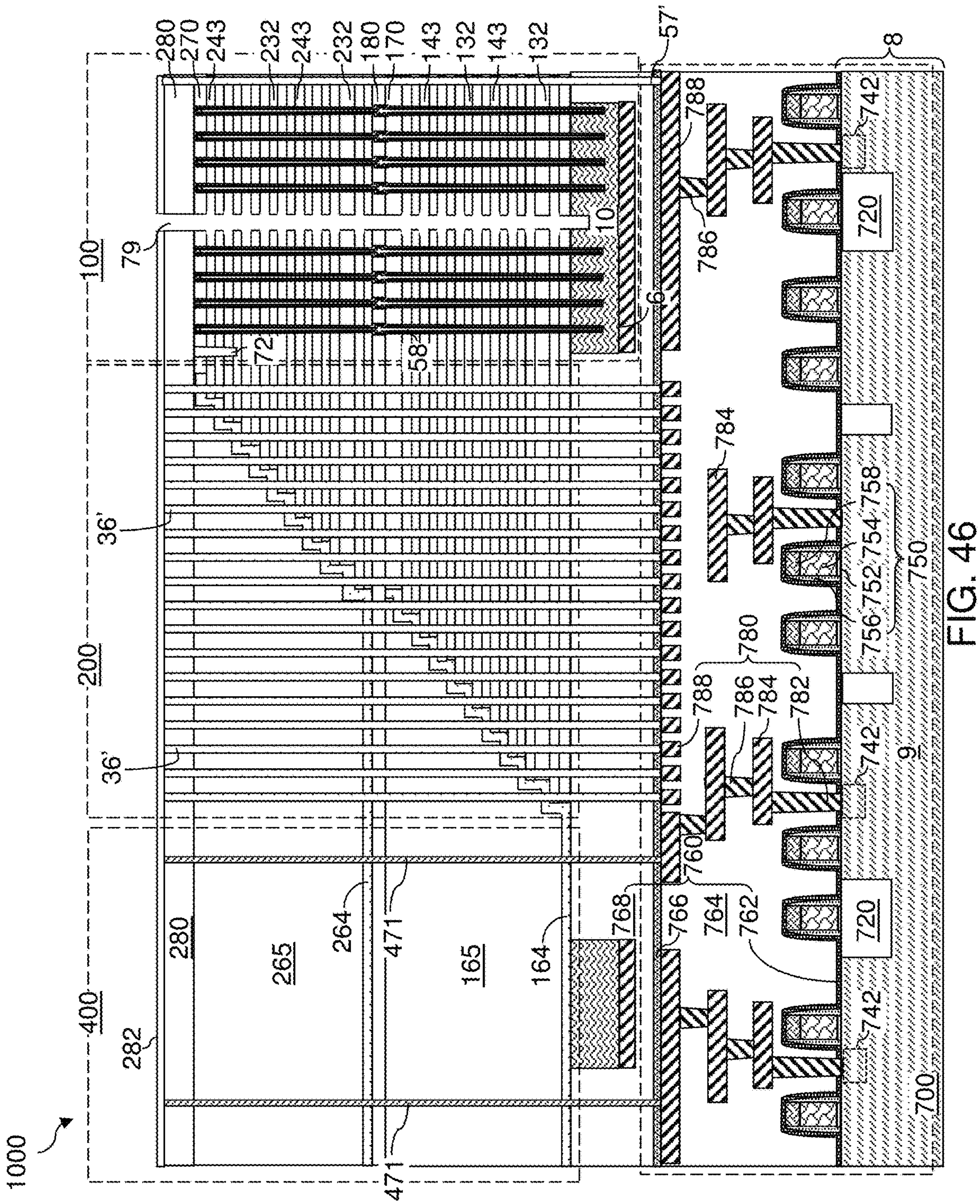
FIG. 46 is a vertical cross-sectional view of the second exemplary structure after formation of backside recesses according to the second embodiment of the present disclosure.

Referring to FIG. 46, the processing steps of FIG. 23 can be performed to remove the first and second sacrificial material layers (142, 242) and to form the first and second backside recesses (243, 243).

Figure 47:
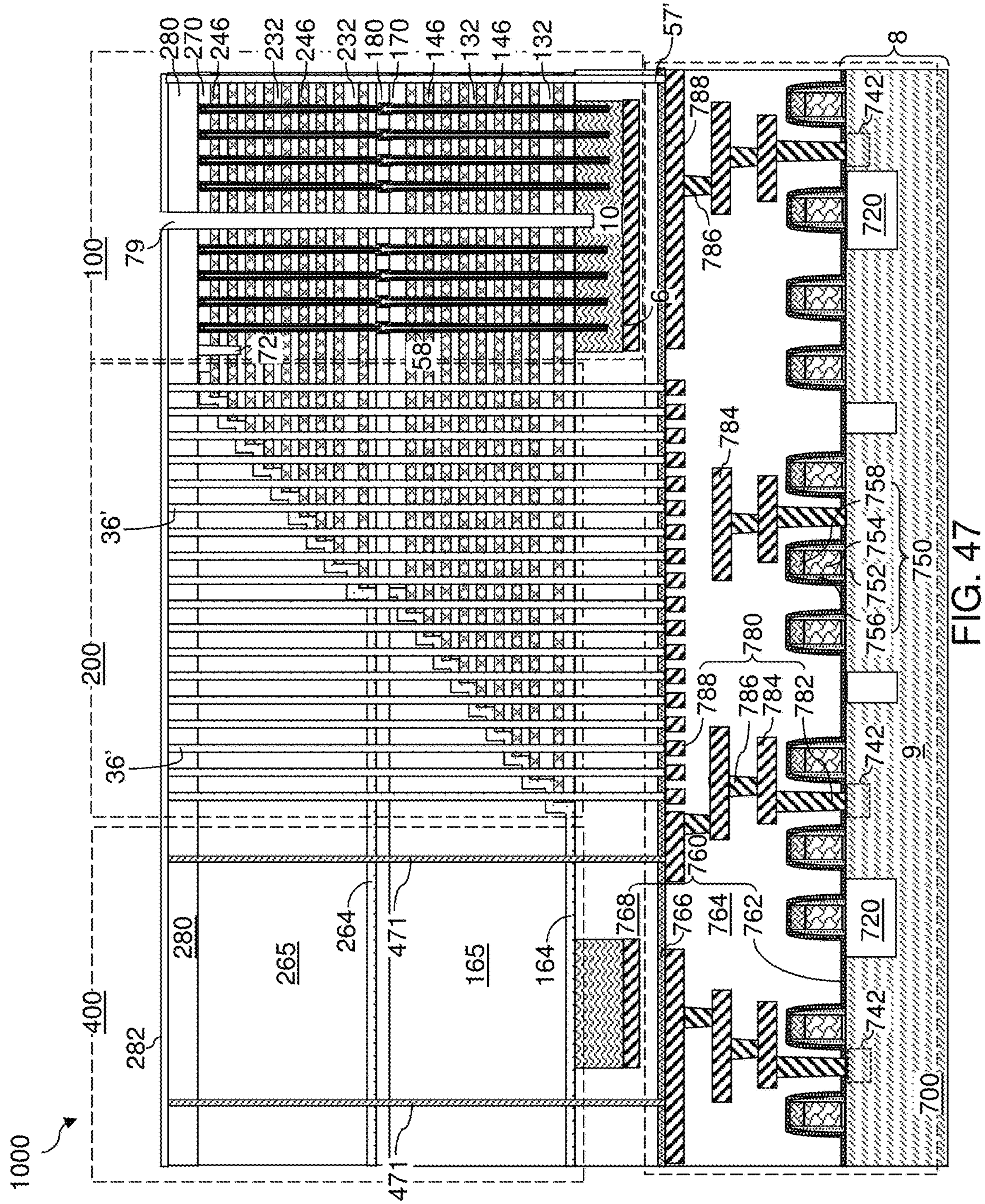
FIG. 47 is a vertical cross-sectional view of the second exemplary structure after formation of electrically conductive layers in the backside recesses according to the second embodiment of the present disclosure.
Figure 48A:
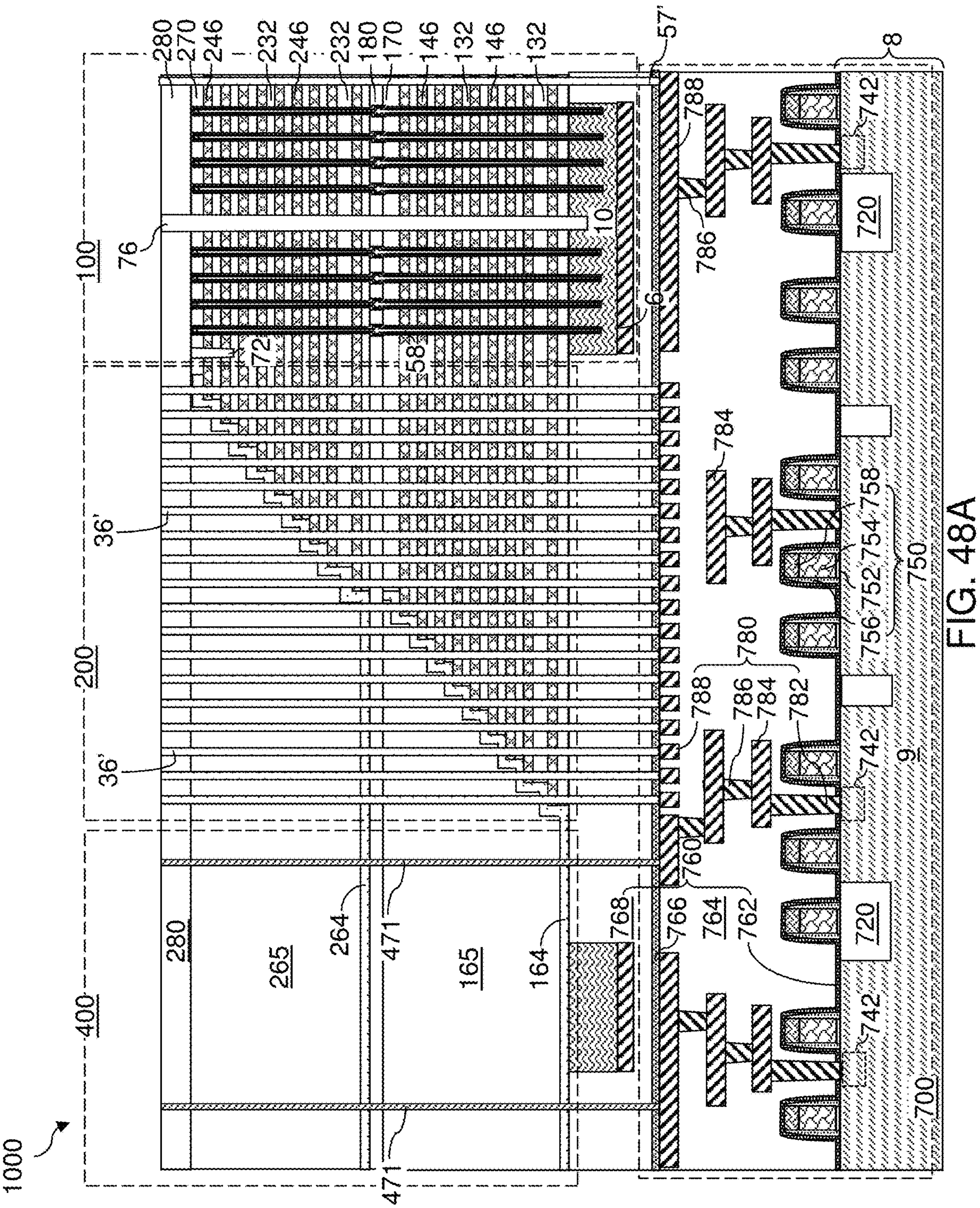
FIG. 48A is a vertical cross-sectional view of the second exemplary structure after formation of dielectric wall structures in the backside trenches according to the second embodiment of the present disclosure.
Figure 48B:
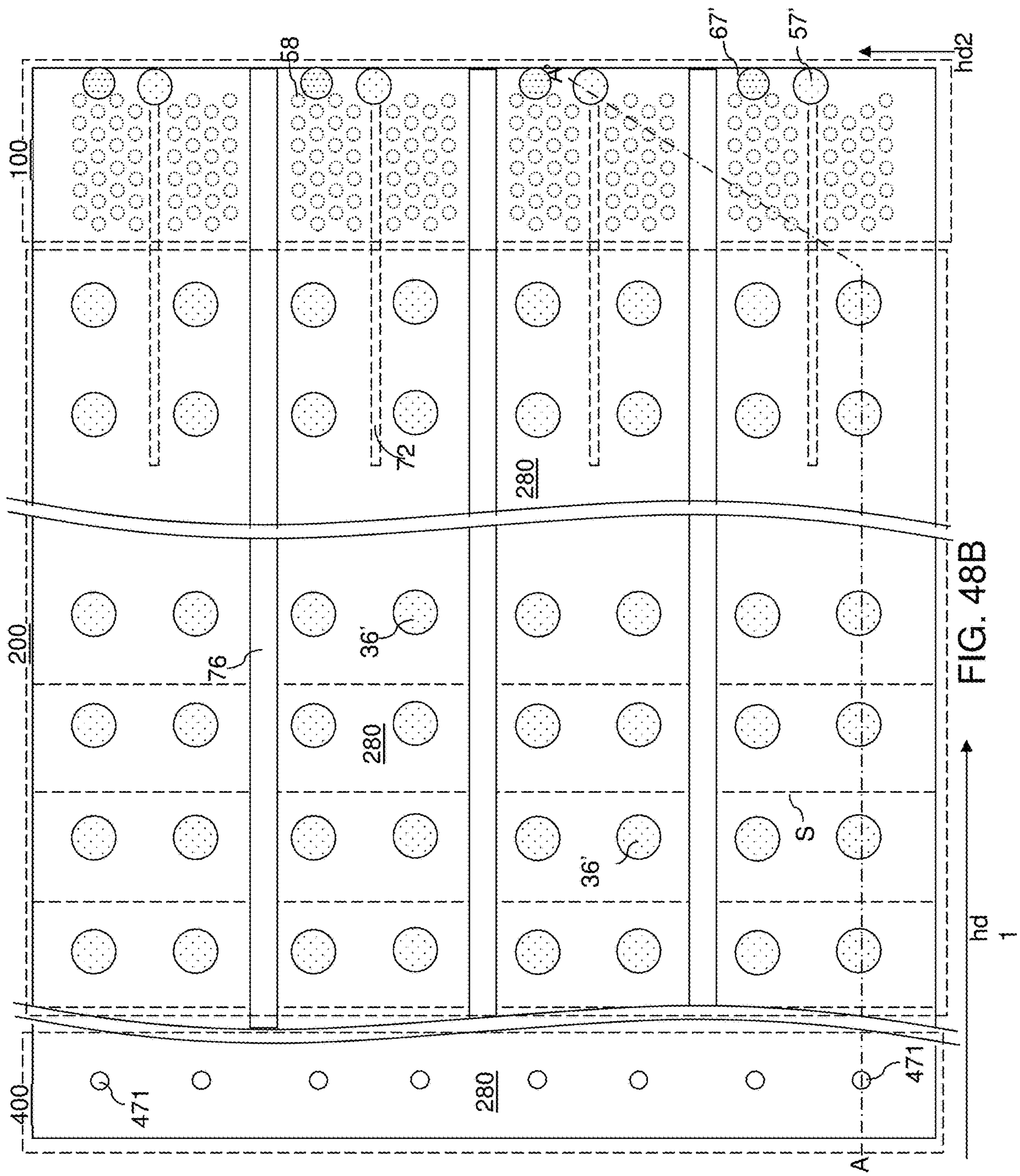
FIG. 48B is a top-down view of the second exemplary structure of FIG. 48A. The hinged vertical plane A-A' corresponds to the plane of the vertical cross-sectional view of FIG. 48A.
Figure 48C:
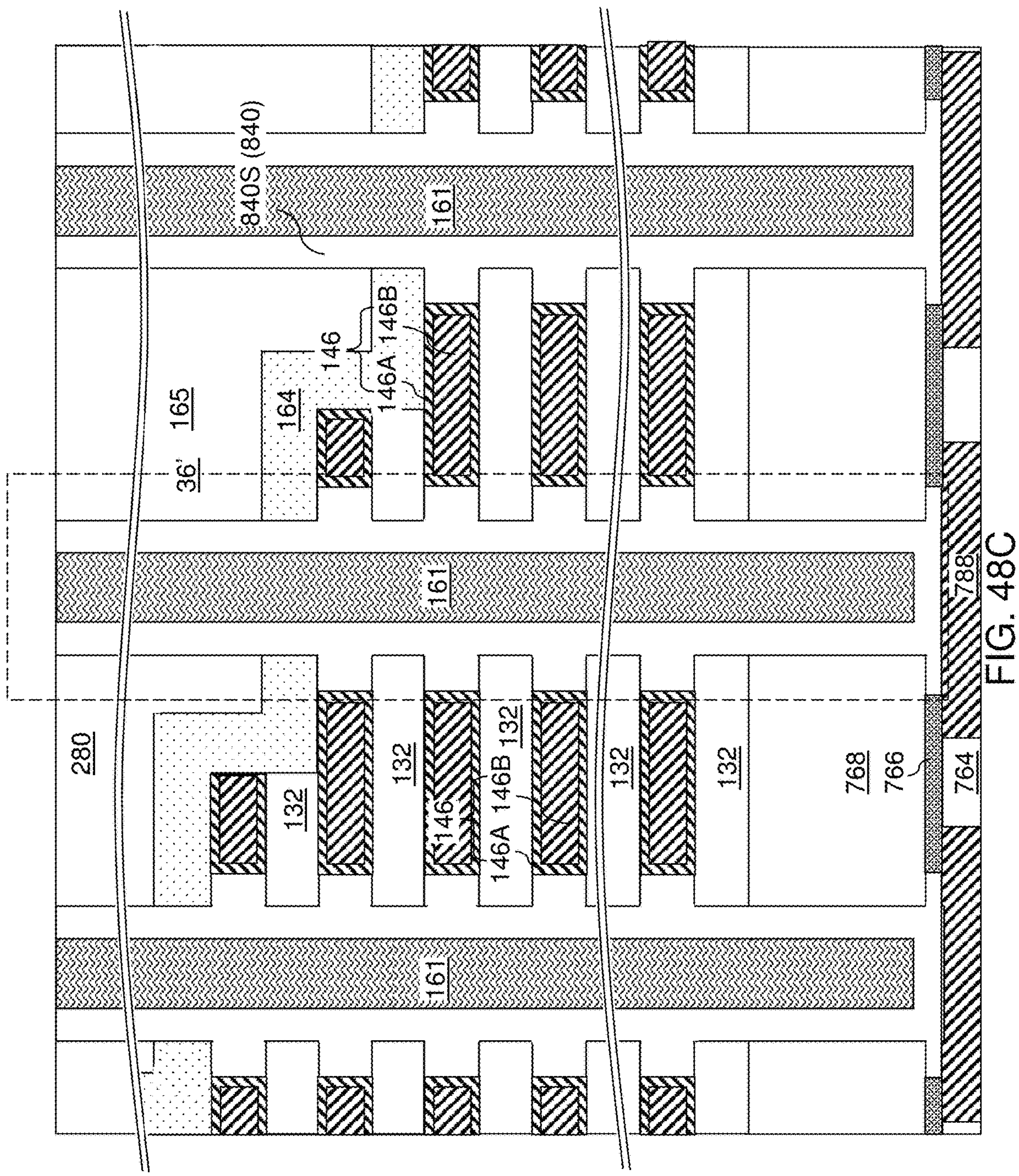
FIGS. 48C, 48D, 48E, and 48F are magnified vertical cross-sectional views of a staircase region via cavity, a peripheral region via cavity, an array region via cavity, and a source contact via cavity, respectively, at the processing steps of FIGS. 48A and 48B.
Figure 48E:
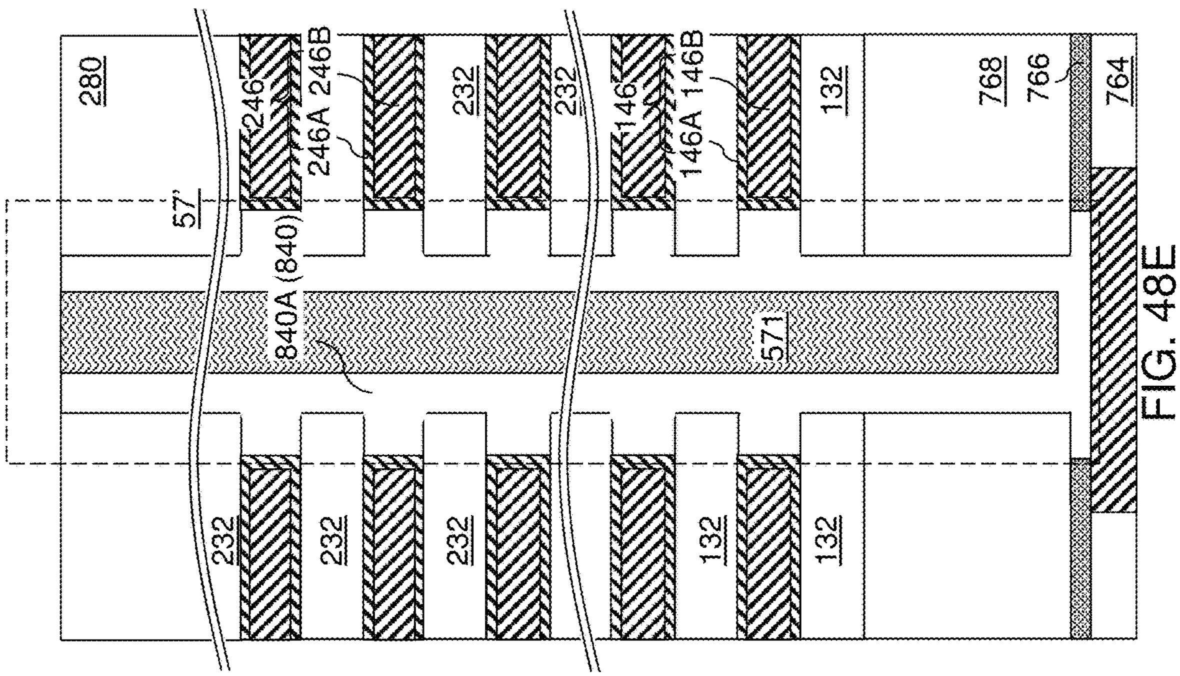
Figure 48D:
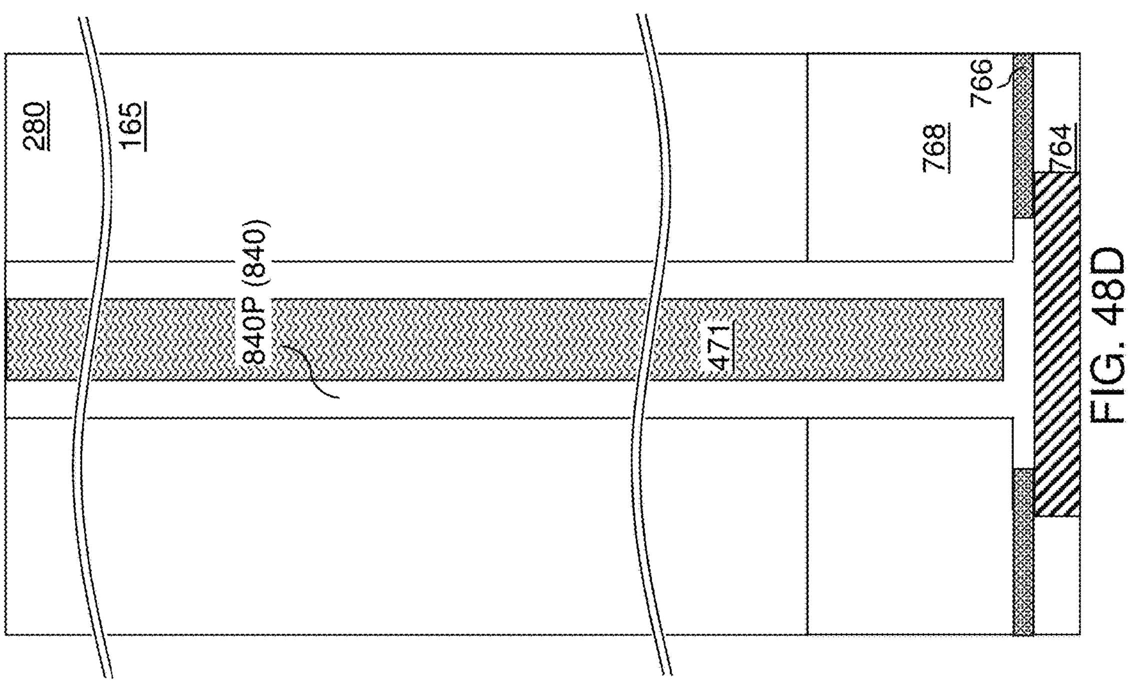
Figure 48F:
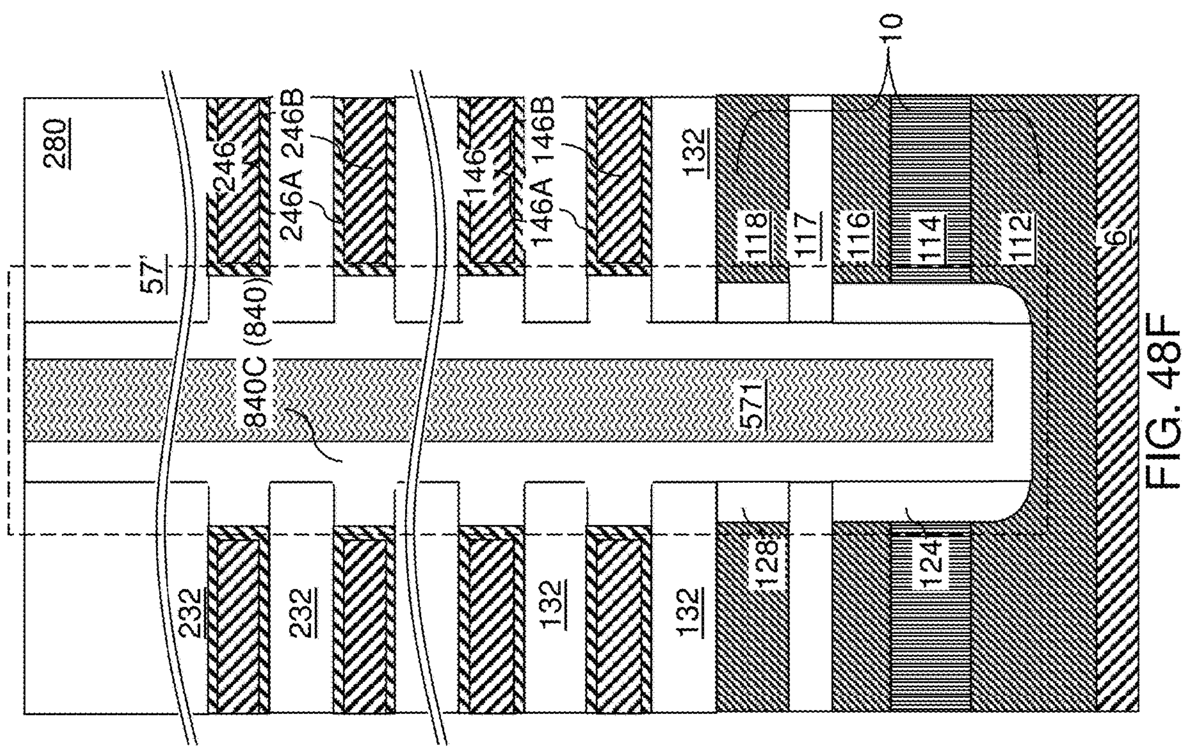
Figure 49A:
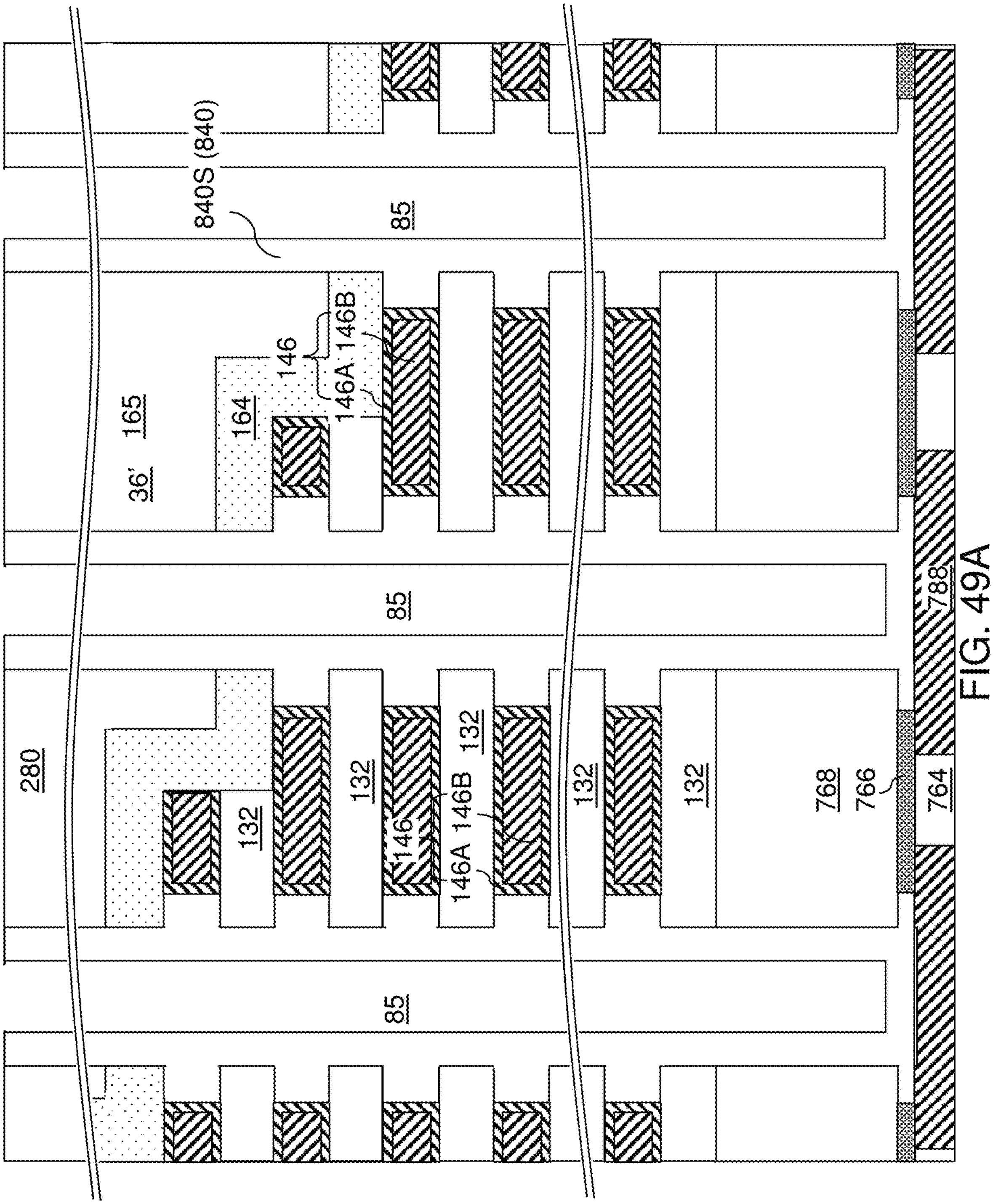
FIGS. 49A, 49B, 49C, and 49D are magnified vertical cross-sectional views of a staircase region via cavity, a peripheral region via cavity, an array region via cavity, and a source contact via cavity, respectively, after removal of sacrificial via fill material portions according to the second embodiment of the present disclosure.
Figure 49C:
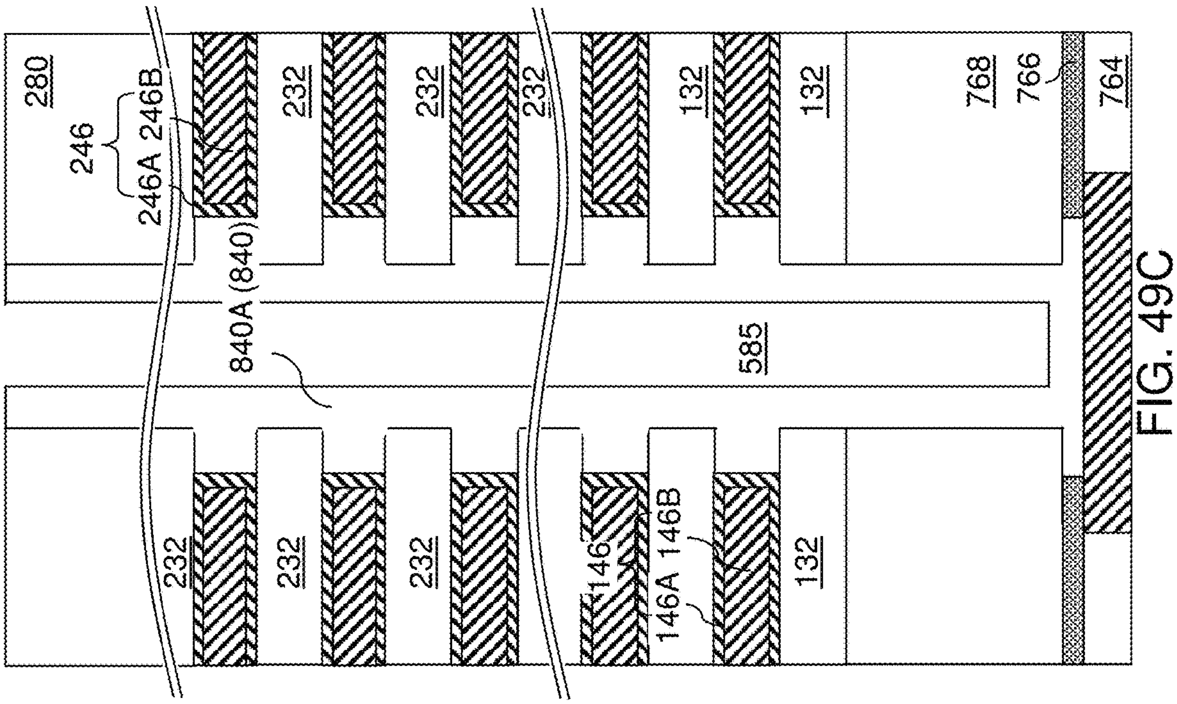
Figure 49B:
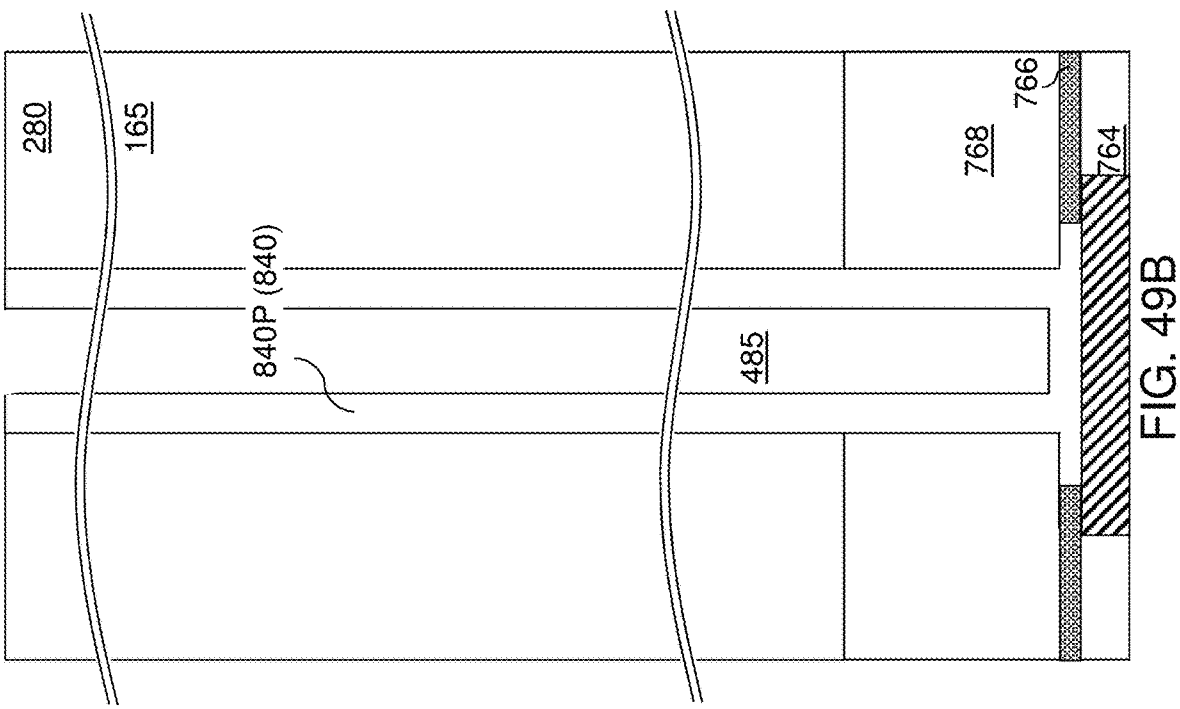
Figure 49D:
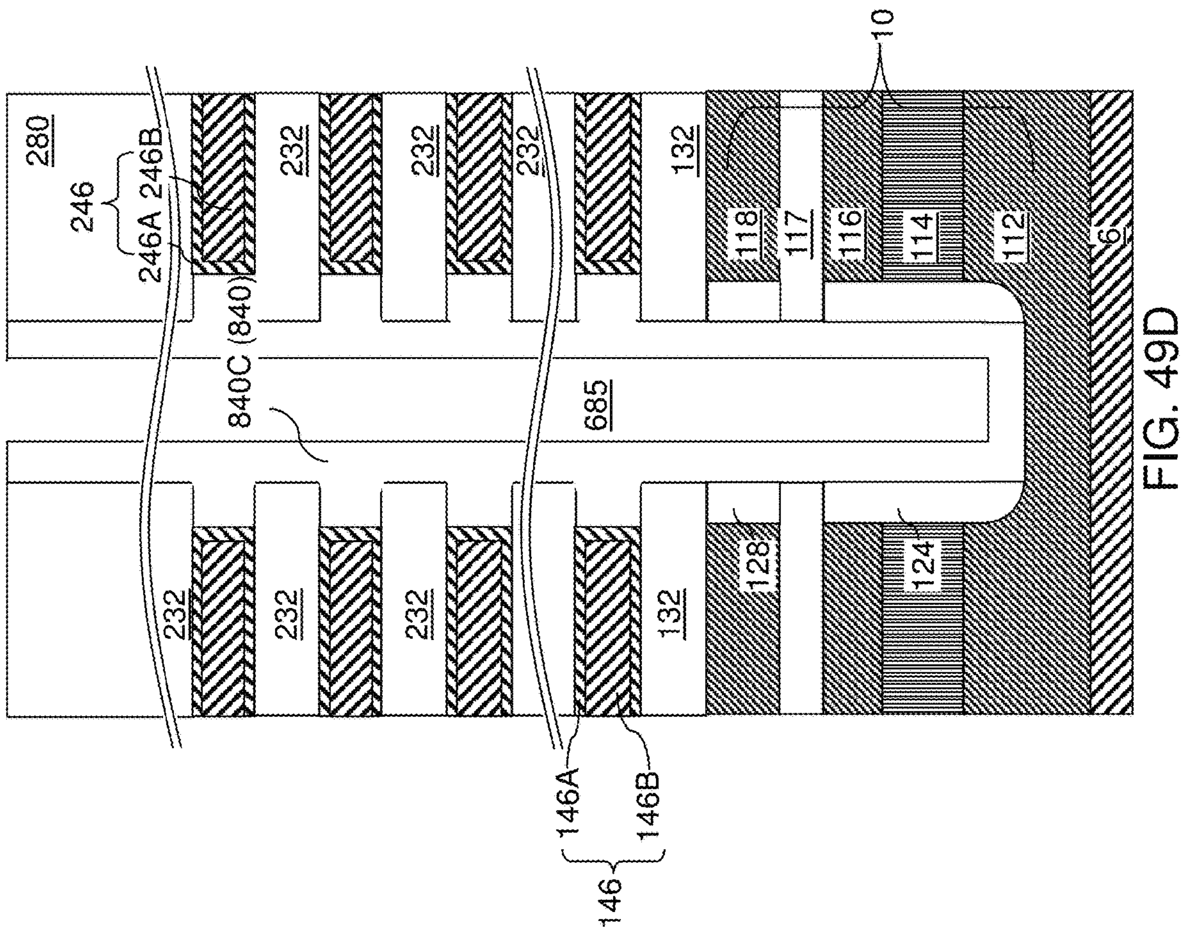
Figure 50A:
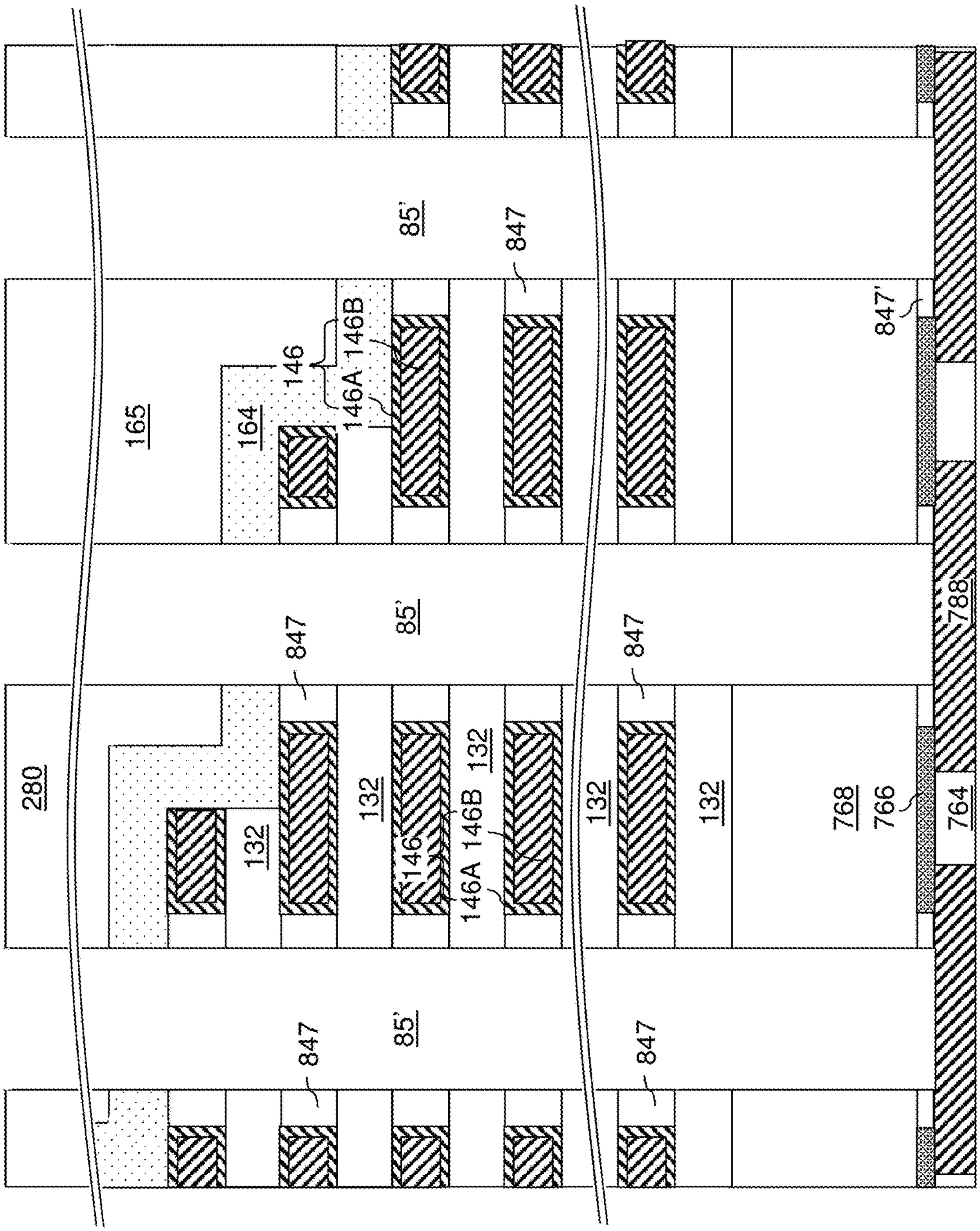
FIGS. 50A, 50B, 50C, and 50D are magnified vertical cross-sectional views of a staircase region via cavity, a peripheral region via cavity, an array region via cavity, and a source contact via cavity, respectively, after an isotropic etch process that partially etches the conformal dielectric via liner according to the second embodiment of the present disclosure.
Figure 50B:
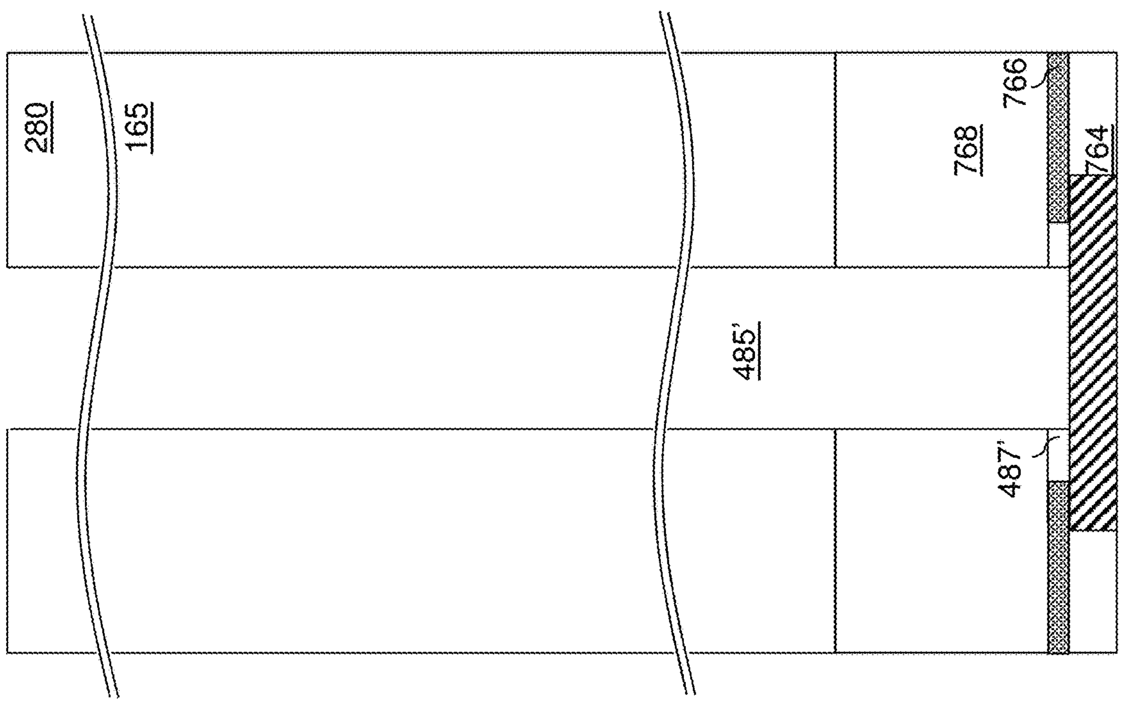
Figure 50C:
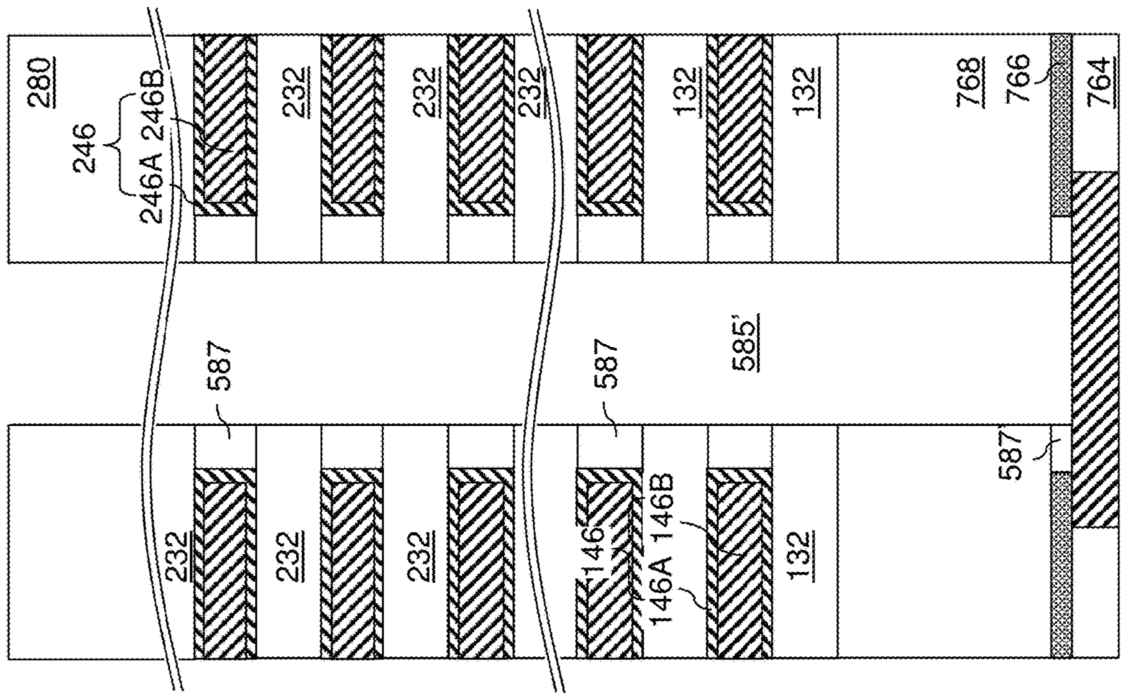
Figure 50D:
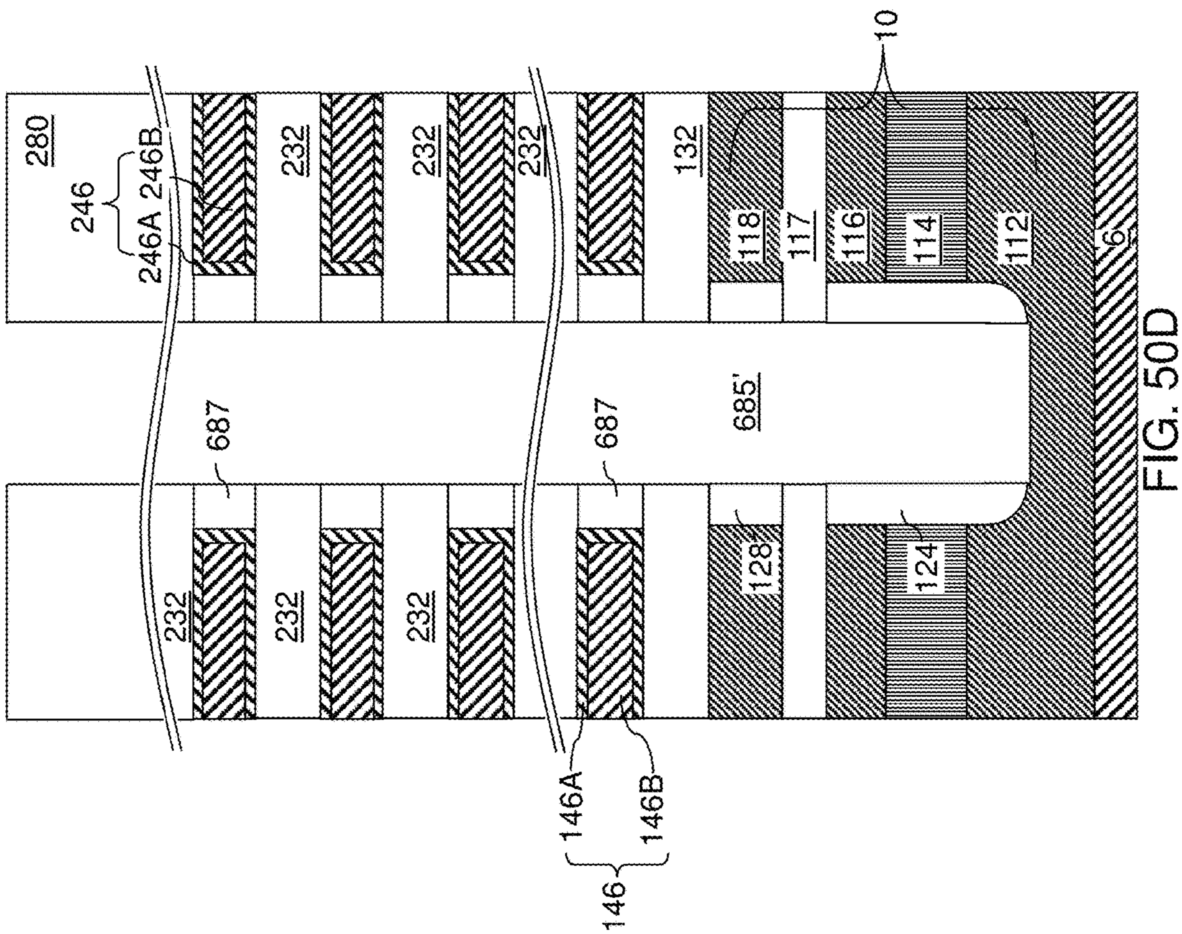
Figure 51A:
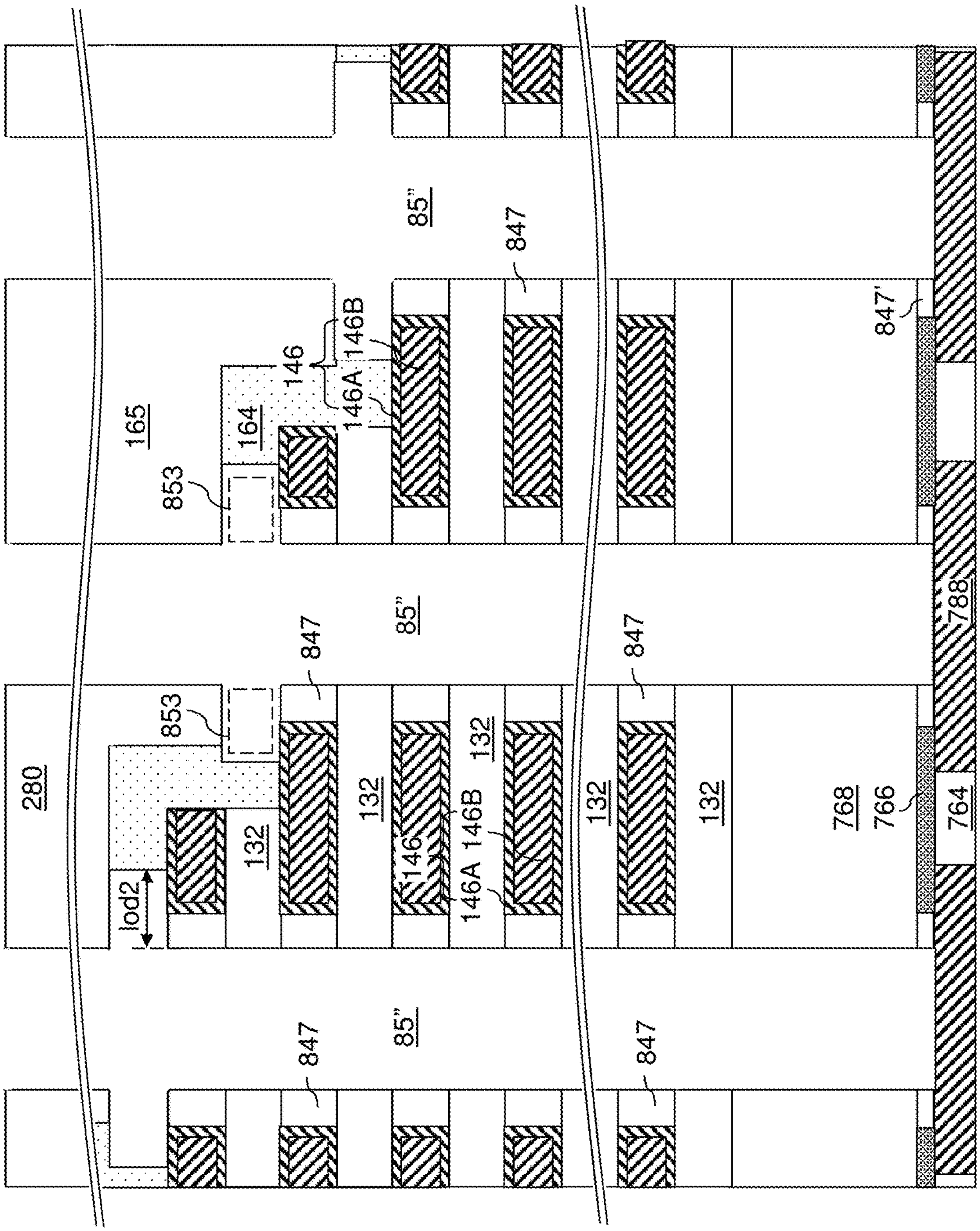
FIGS. 51A, 51B, 51C, and 51D are magnified vertical cross-sectional views of a staircase region via cavity, a peripheral region via cavity, an array region via cavity, and a source contact via cavity, respectively, after a second isotropic etch process that laterally recesses the first and second dielectric liners according to the second embodiment of the present disclosure.
Figure 51C:
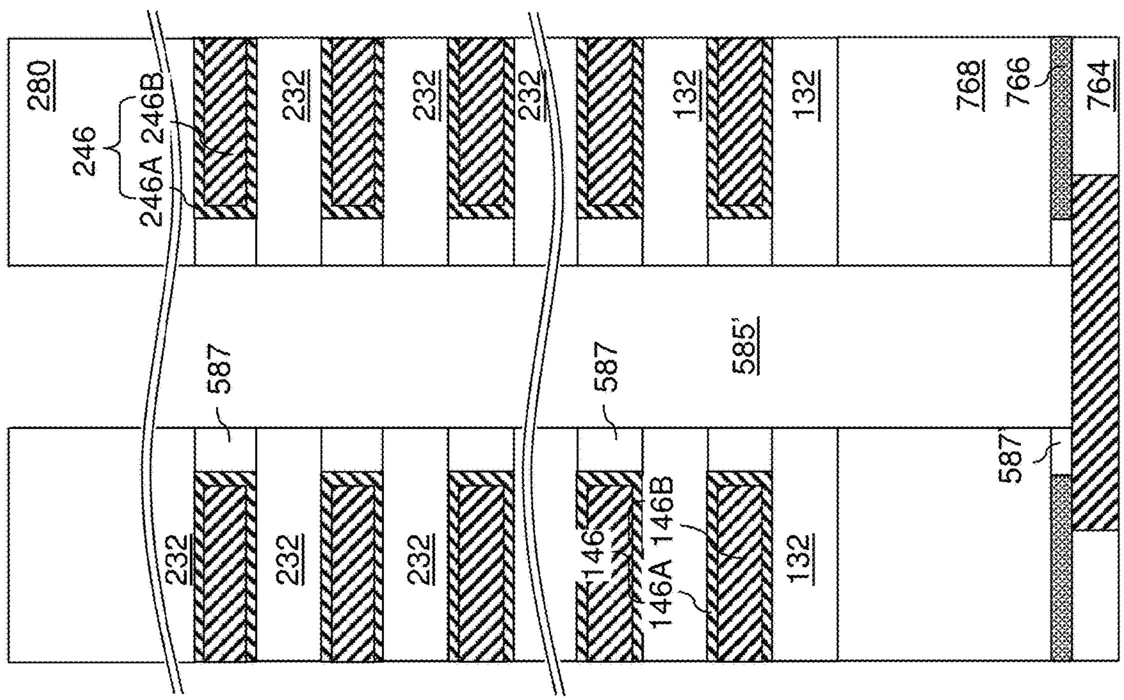
Figure 51B:
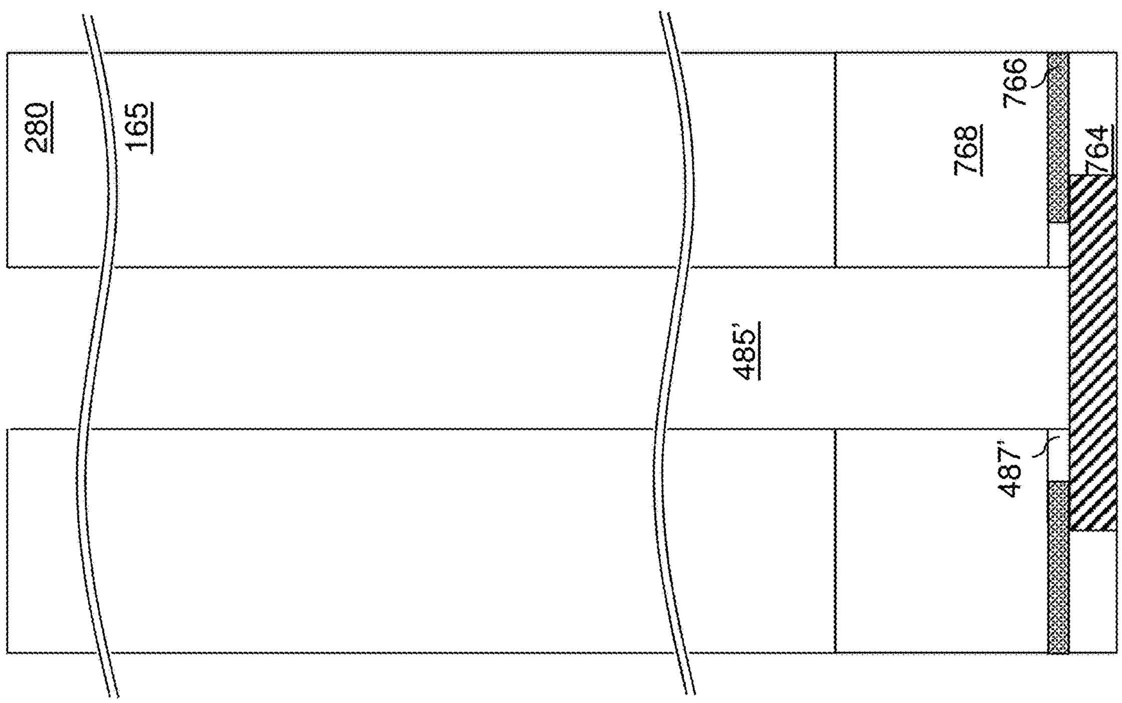
Figure 51D:
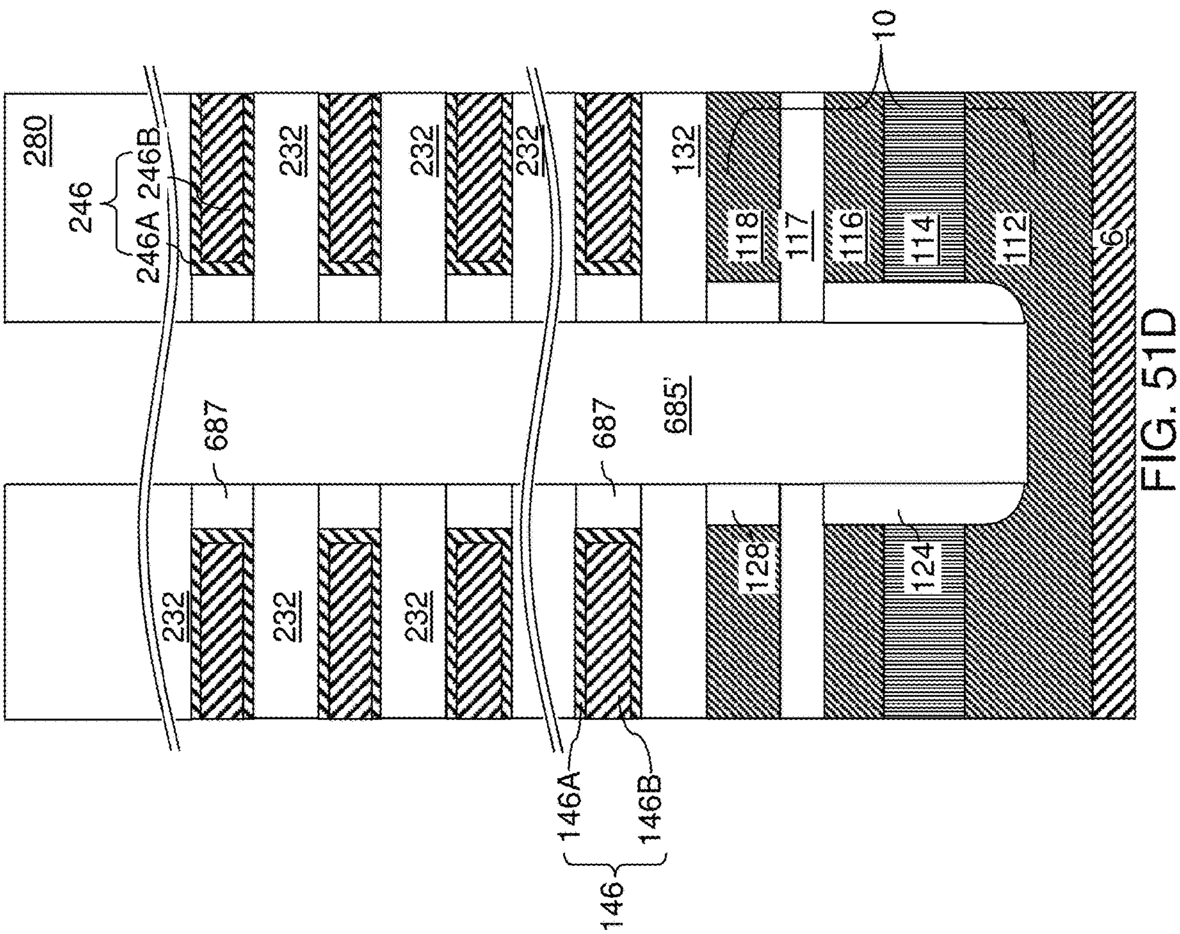

Referring to FIG. 47, the processing steps of FIG. 24 can be performed to form an optional backside blocking dielectric layer and electrically conductive layers (146, 246) in the backside recesses (143, 243). The electrically conductive layers (146, 246) can include first electrically conductive layers 146 formed in the first backside recesses 143 and second electrically conductive layers 246 formed in the second backside recesses 243.

Figure 25A:
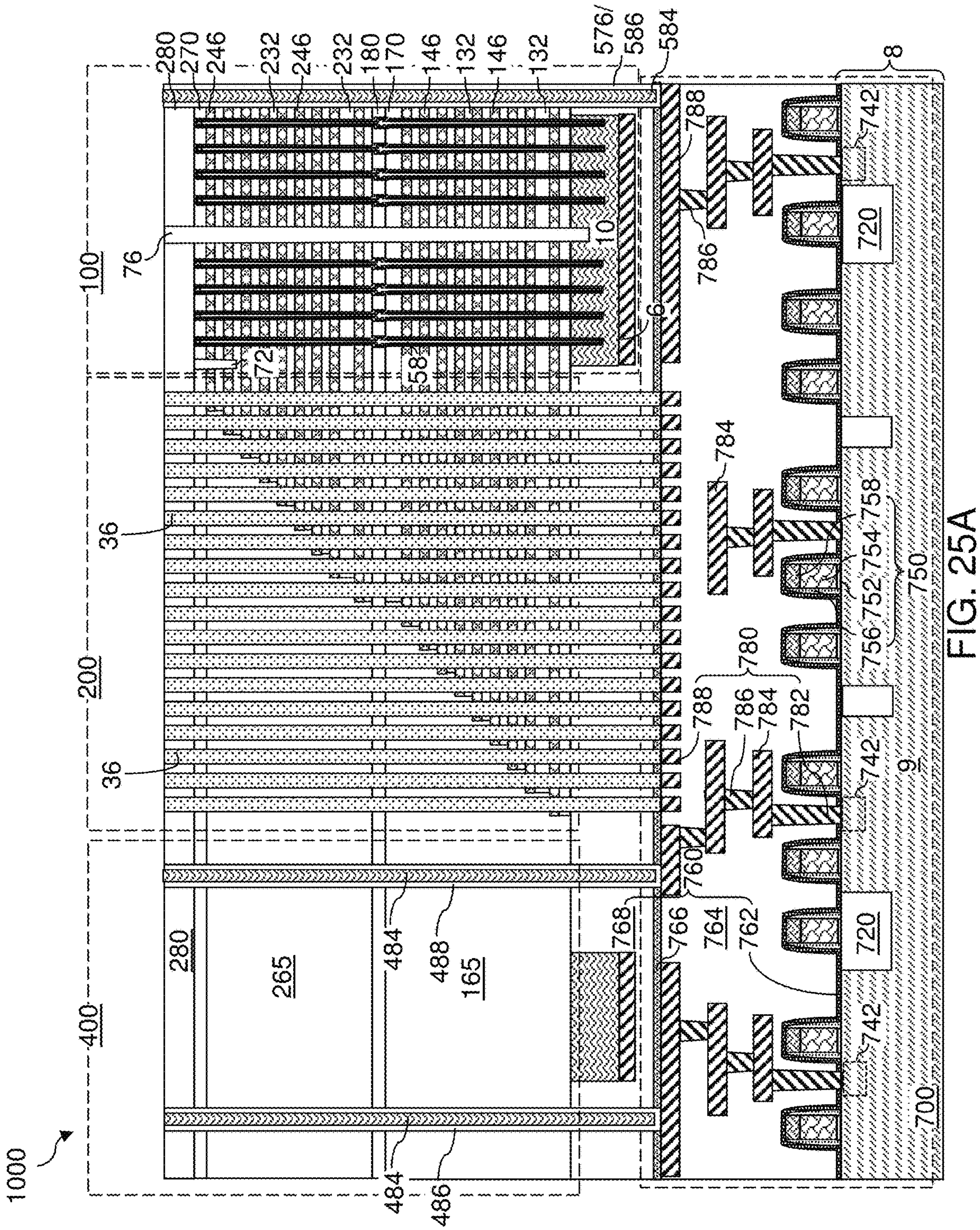
FIG. 25A is a vertical cross-sectional view of the first exemplary structure after formation of dielectric wall structures in the backside trenches according to the first embodiment of the present disclosure.
Figure 25B:
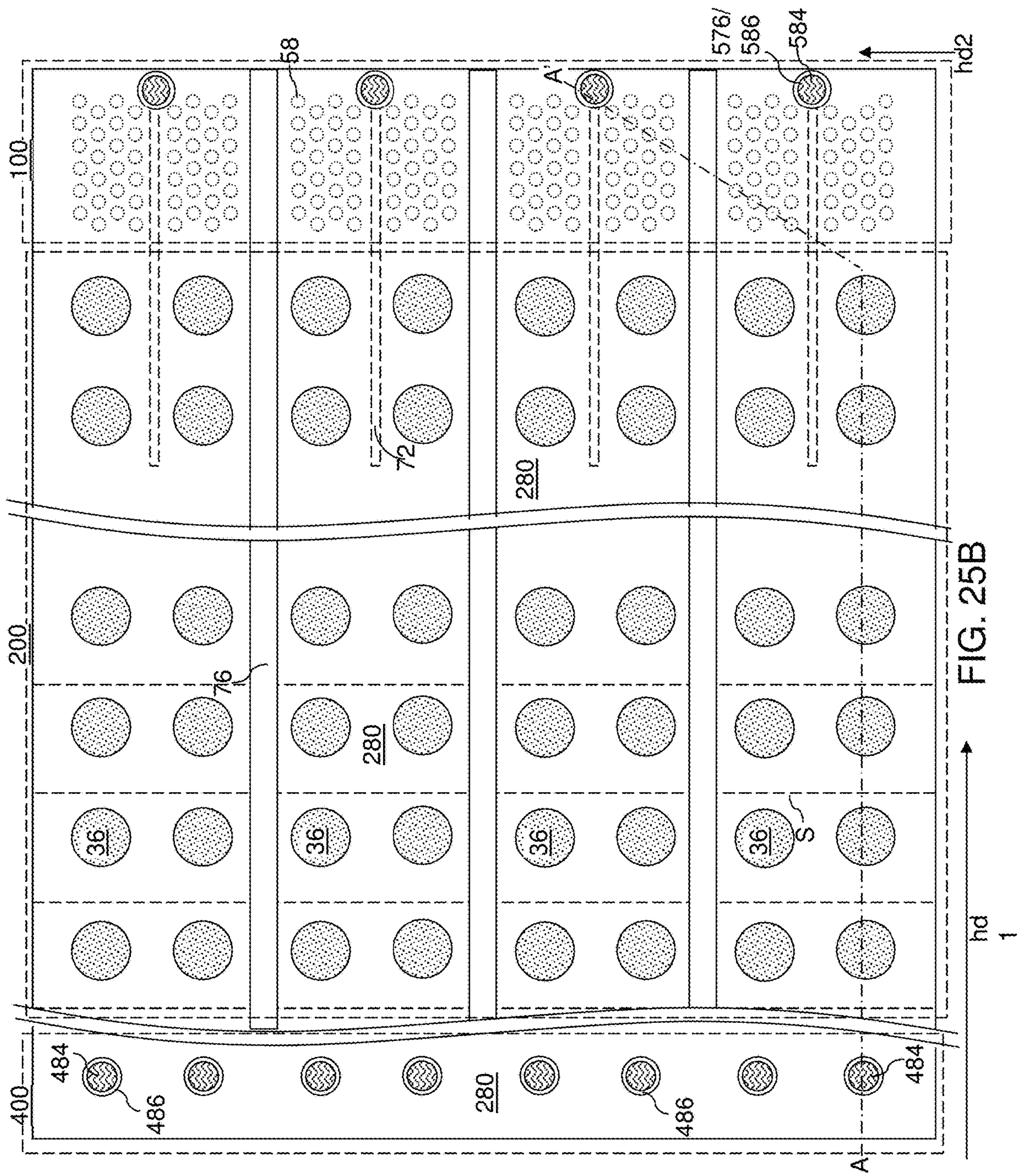
FIG. 25B is a top-down view of the first exemplary structure of FIG. 25A. The hinged vertical plane A-A' corresponds to the plane of the vertical cross-sectional view of FIG. 25A.
Figure 25C:
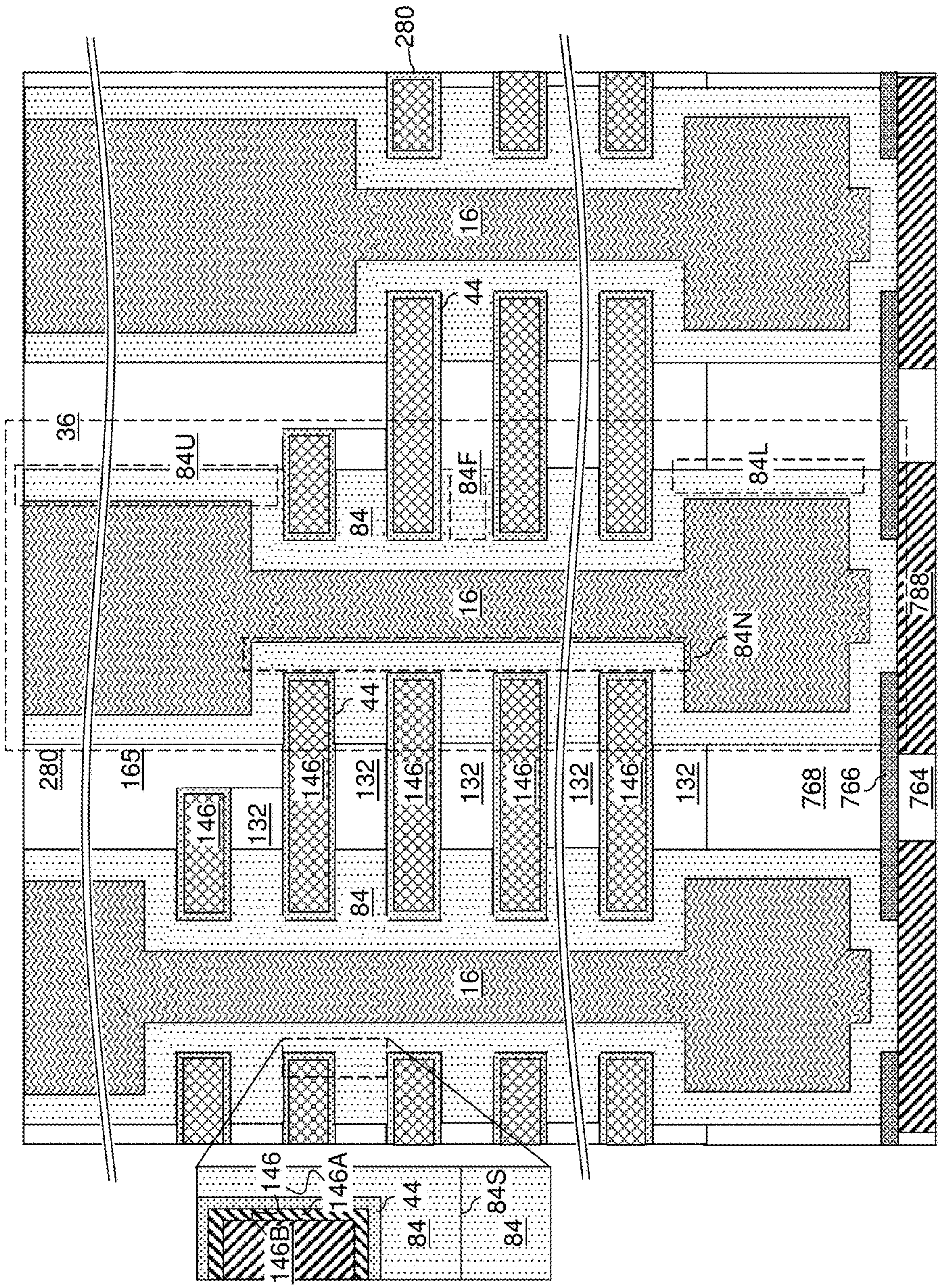
FIGS. 25C, 25D, and 25E are magnified vertical cross-sectional views of a staircase region via cavity, a peripheral region via cavity, and an array region via cavity, respectively, at the processing steps of FIGS. 25A and 25B.
Figure 25E:
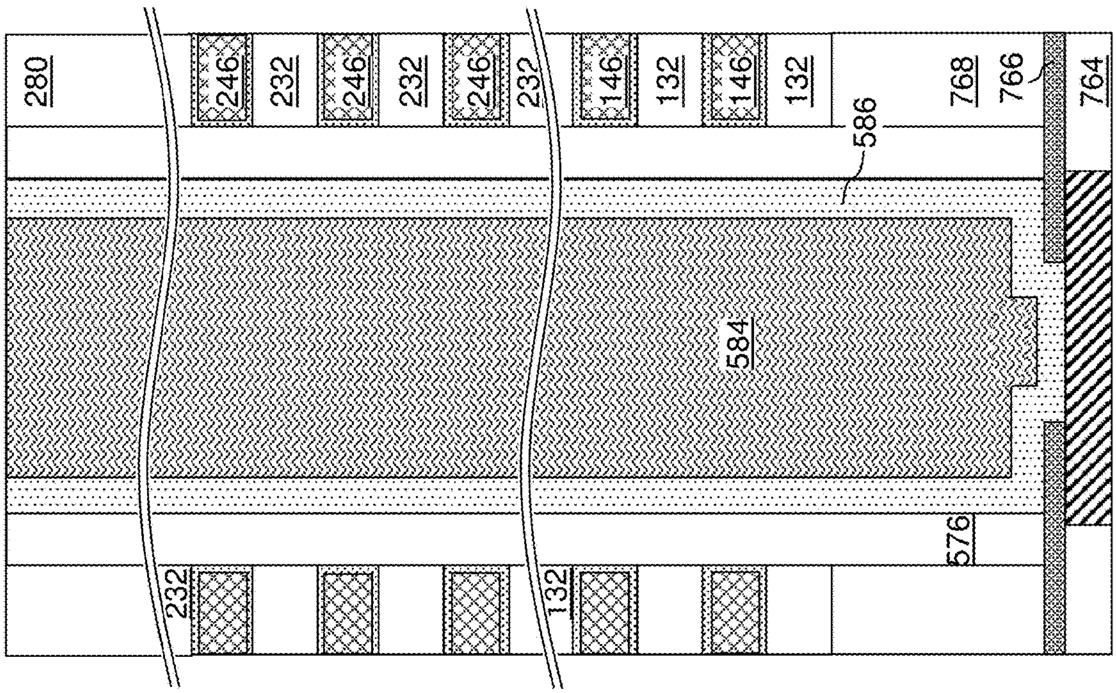
Figure 25D:
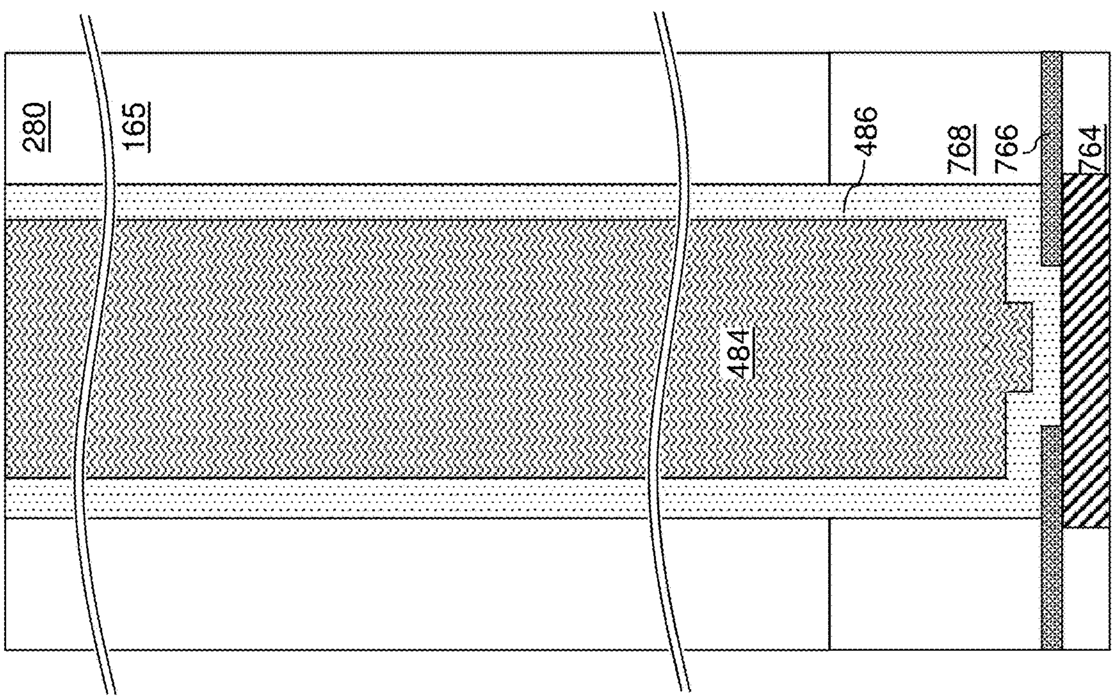

Referring to FIGS. 48A-48F, the processing steps of FIGS. 25A and 25B can be performed to form dielectric wall structures 76 in the backside trenches 79. Subsequently, the sacrificial cover dielectric layer 282 can be removed, for example, by a recess etch. Top surfaces of the various sacrificial via fill material portions (161, 471, 571, 671) can be physically exposed after removal of the sacrificial cover dielectric layer 282. FIGS. 48C-48F illustrate components of electrically conductive layers (146, 246). For example, each first electrically conductive layer 146 includes a first metal nitride liner 146A and a first metal fill portion 146B, and each second electrically conductive layer 246 includes a second metal nitride liner 246A and a second metal fill portion 246B. The first metal nitride liners 146A and the second metal nitride liners 246A can include a same metal nitride material such as TiN, TaN, and/or WN. The first metal fill portions 146B and the second metal fill portions 246B can include a same metal fill material such as W, Co, Mo, and/or Cu.

Referring to FIGS. 49A-49D, the material of the various sacrificial via fill material portions (161, 471, 571, 671) can be removed selective to the material of the insulating liners 840. For example, if the sacrificial via fill material portions (161, 471, 571, 671) include a doped semiconductor material such a doped polysilicon or amorphous silicon, a wet etch employing a TMY or KOH solution can be used to remove the sacrificial via fill material portions (161, 471, 571, 671). Cylindrical voids (85, 485, 585, 685) can be formed in volumes from which the sacrificial via fill material portions (161, 471, 571, 671) are removed. The cylindrical voids (85, 485, 585, 685) can have straight vertical sidewalls. The cylindrical voids (85, 485, 585, 685) include staircase region cylindrical voids 85 formed within the staircase region via cavities, peripheral region cylindrical voids 485 formed in the peripheral region via cavities, array region cylindrical voids 585 formed in the array region via cavities, and source contact cylindrical voids 685 formed in the source contact via cavities.

Referring to FIGS. 50A-50D, an isotropic etch process is performed to partially etch the insulating liners 840. For example, if the insulating liners 840 include silicon oxide, the isotropic etch process can be a wet etch process employing dilute hydrofluoric acid. The isotropic etch process removes portions of the insulating liners 840 located on sidewalls of the first and second insulating layers (132, 232), the first and second insulating cap layers (170, 270), and the first contact level dielectric layer 280. Remaining portions of the insulating liners 840 form annular insulating spacers (847, 847', 487', 587, 587', 687). Thus, each of the annular insulating spacers (847, 847', 487', 587, 587', 687) is formed by oxidizing the sacrificial material layers (142, 242). The remaining portions of the conformal dielectric via liner 840L constitute the annular insulating spacers (847, 847', 487', 587, 587', 687), which can comprise silicon oxide or silicon oxynitride (i.e., the remaining parts of the rib portions 837).

The annular insulating spacers (847, 847', 487', 587, 587', 687) can include staircase region insulating spacers 847, silicon-nitride-level insulating spacers (847', 487', 587'), array region insulating spacers 587, and source contact insulating spacers 687. A set of at least one staircase region insulating spacer 847 and a silicon-nitride-level insulating spacer 847' laterally surrounds each staircase region cylindrical void 85'. A silicon-nitride-level insulating spacer 487' laterally surrounds each peripheral region cylindrical void 485'. A vertical stack of array region insulating spacers 587 and a silicon-nitride-level insulating spacer 587' laterally surrounds each array region cylindrical void 585'. A vertical stack of source contact insulating spacers 687, an annular source-select-level semiconductor oxide spacer 128, and an annular buried-source-level semiconductor oxide spacer 124 laterally surrounds each source contact cylindrical void 685'. Top surfaces of the lower-level metal interconnect structures 780 can be physically exposed by etching through bottom portions of the conformal dielectric via liner 840L, i.e., the bottom portions of the various insulating liners 840.

Referring to FIGS. 51A, 51B, 51C, and 51D, a second isotropic etch process to laterally recess the first and second dielectric liners (164, 264) selective to the materials of the first and second insulating layers (132, 232), the first and second retro-stepped dielectric material portions (165, 265), the first and second insulating cap layers (170, 270), the first contact level dielectric layer 280, and the annular insulating spacers (847, 847', 487', 587, 587', 687). The second isotropic etch process forms an annular lateral cavity region 853 around each staircase region cylindrical void 85' by laterally recessing a respective horizontal portion of a dielectric liner (164, 264), which may be the first dielectric liner 164 or the second dielectric liner 264. The second isotropic etch process provides a second lateral offset distance lod2 between each laterally recessed sidewall of the horizontal portions of the dielectric liners (164, 264) and inner sidewalls of a most proximate one of the annular insulating spacers (847, 847', 487', 587, 587', 687). The second lateral offset distance lod2 is greater than the first lateral offset distance lod1 at the processing steps of FIGS. 40A-40D. Each staircase region cylindrical void 85' is converted into a staircase region flanged void 85", which includes the entire volume of the staircase region cylindrical void 85' and additionally includes the volume of an annular lateral cavity region 853. As used herein, a "flanged" element refers to an element that includes a projecting flat annular region that is attached to an axially extending element that extends perpendicular to a major surface of the projecting flat annular region.

Figure 52A:
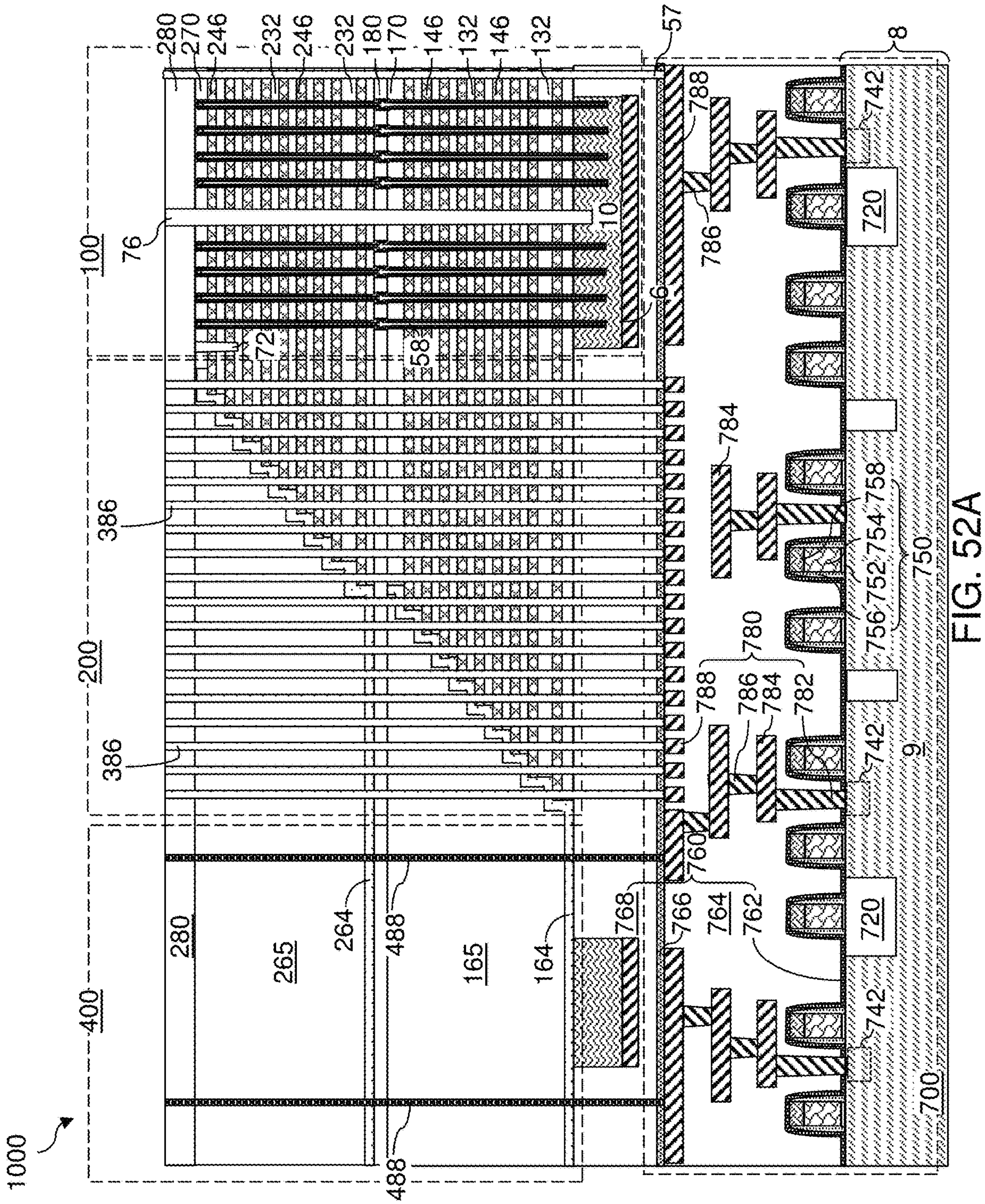
FIG. 52A is a vertical cross-sectional view of the second exemplary structure after formation of various contact via structures according to the second embodiment of the present disclosure.
Figure 52B:
FIG. 52B is a top-down view of the second exemplary structure of FIG. 52A. The hinged vertical plane A-A' corresponds to the plane of the vertical cross-sectional view of FIG. 52A.
Figure 52C:
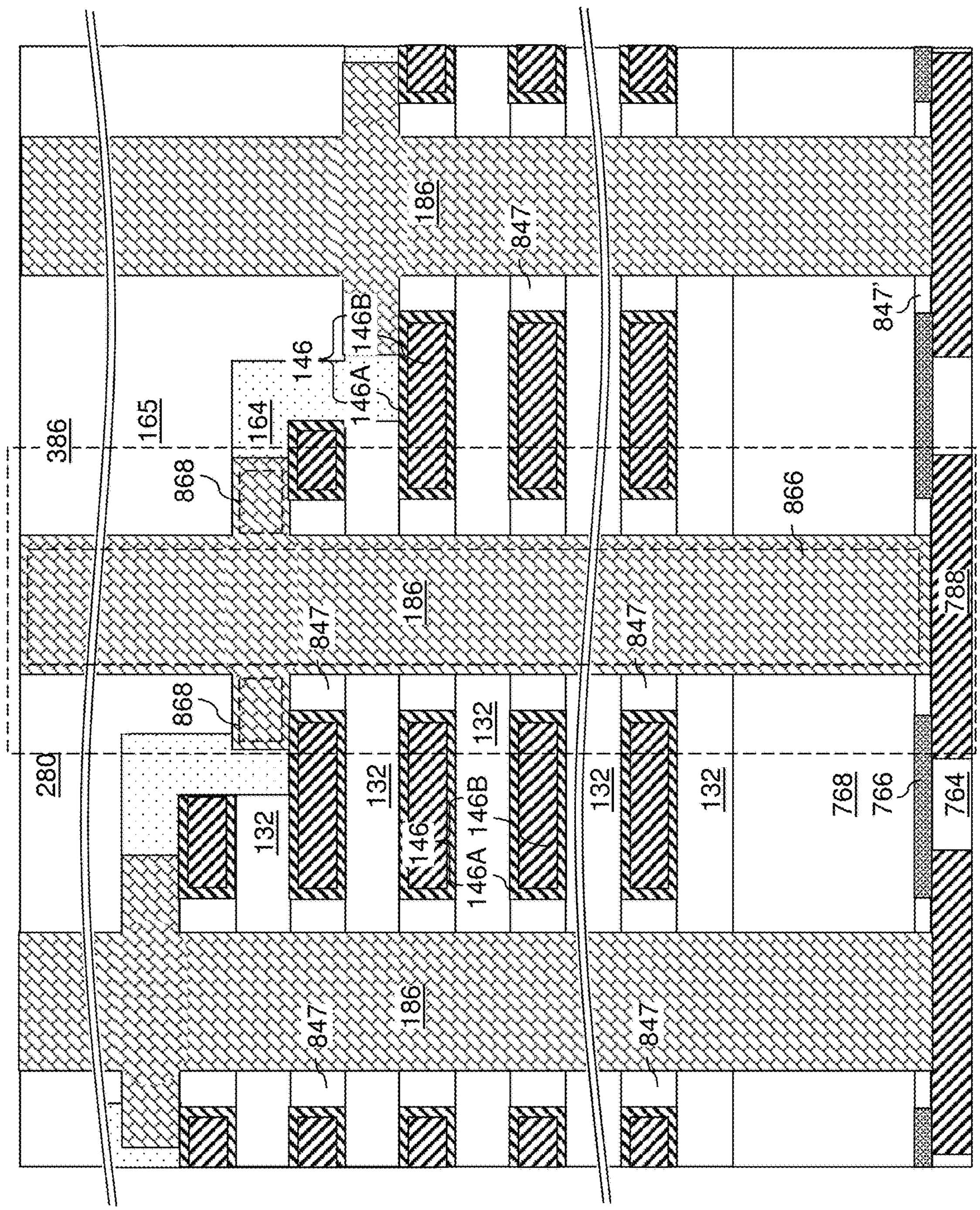
FIGS. 52C, 52D, 52E, and 52F are magnified vertical cross-sectional views of a staircase region via cavity, a peripheral region via cavity, an array region via cavity, and a source contact via cavity, respectively, at the processing steps of FIGS. 52A and 52B.
Figure 52E:
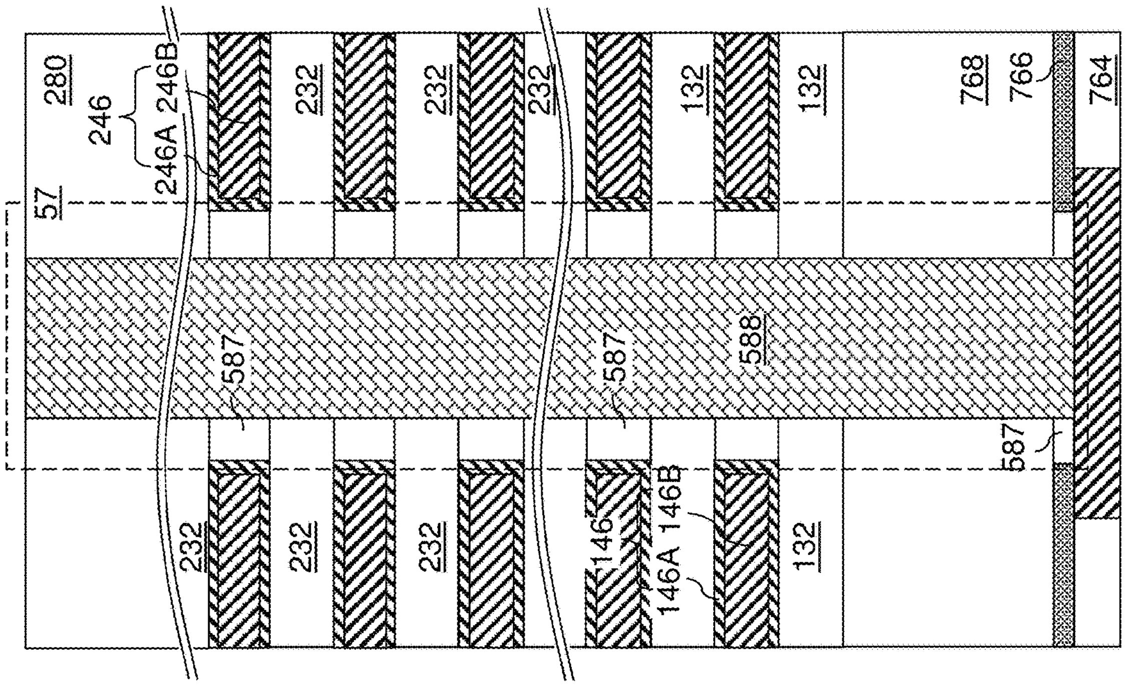
Figure 52D:
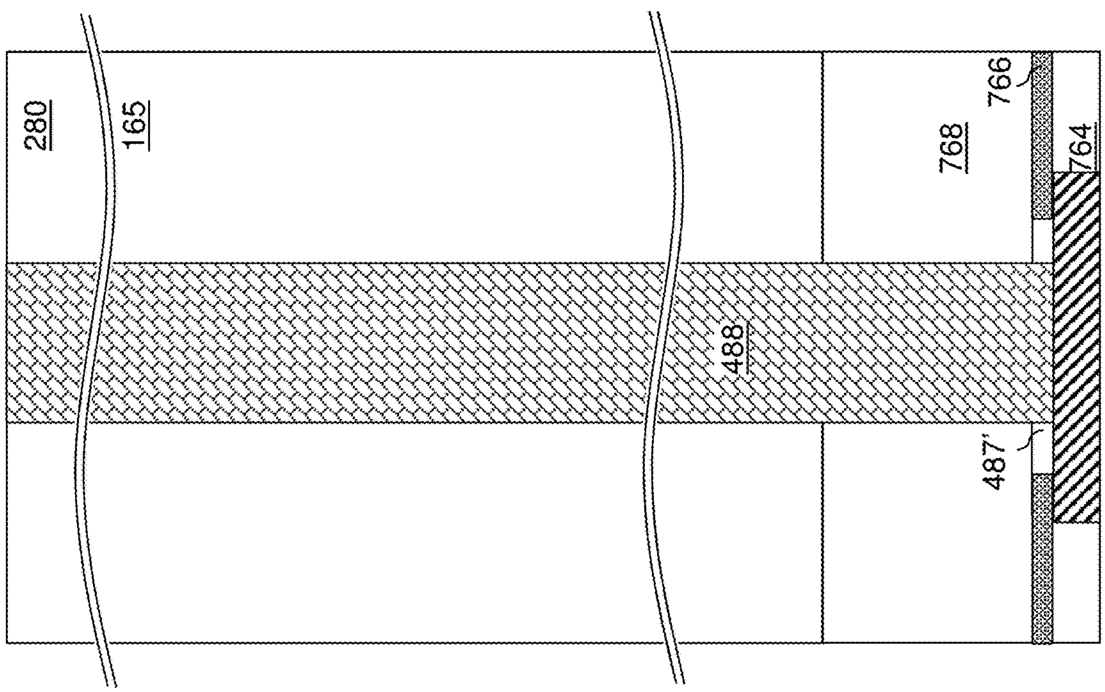
Figure 52F:
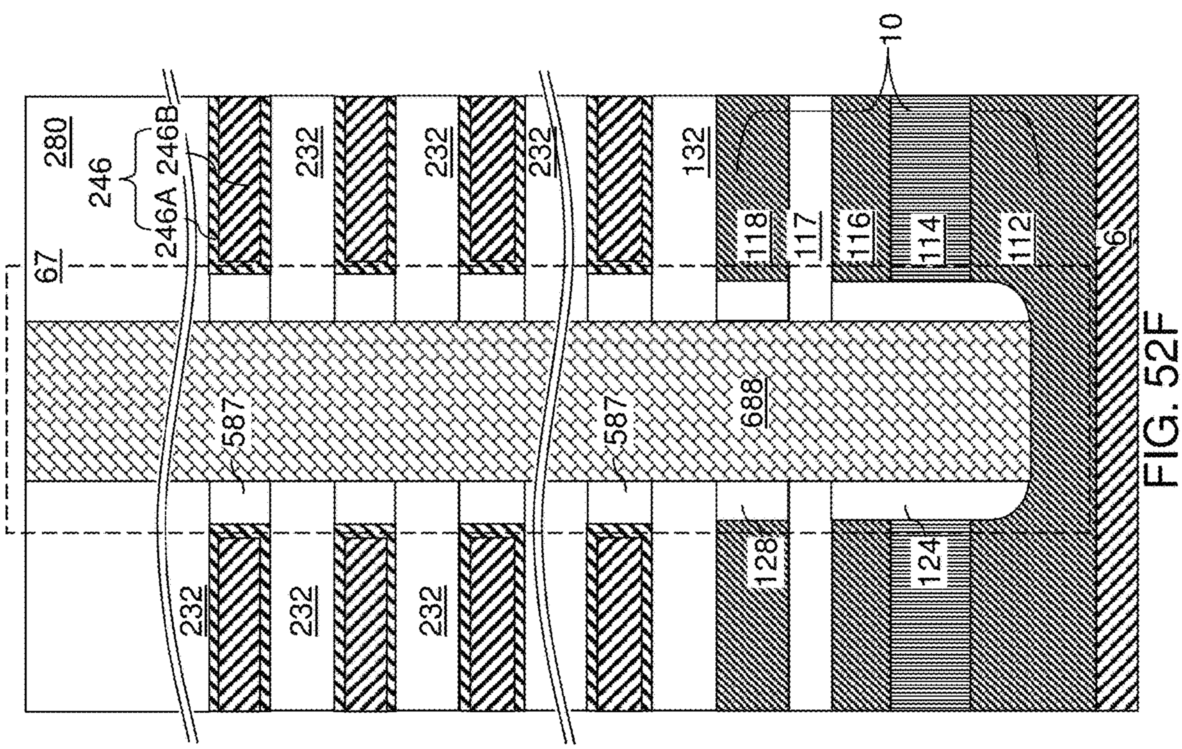
Figure 52G:
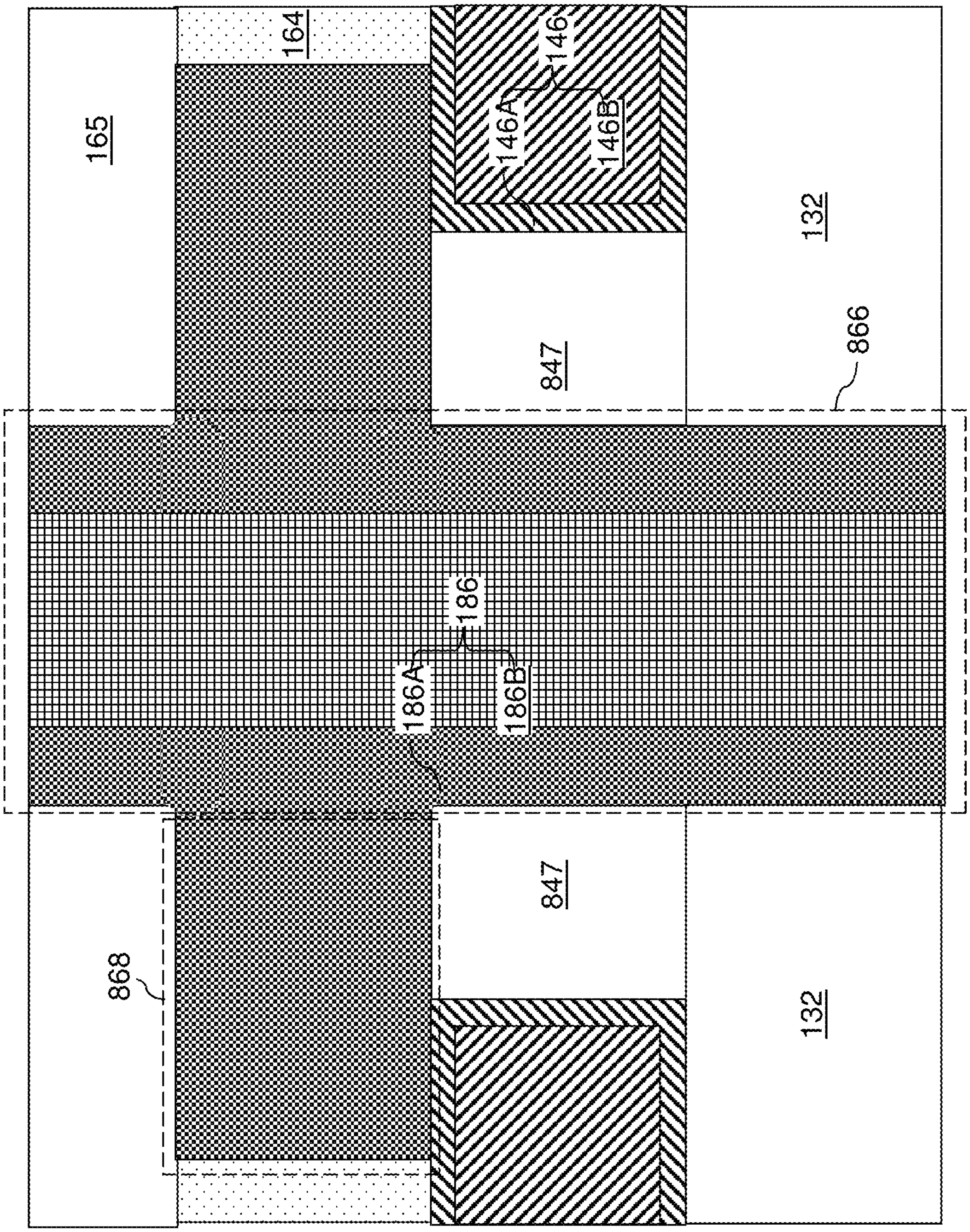
FIG. 52G is a magnified vertical cross-sectional view of a region of a flanged conducive via structure in the staircase region via cavity of FIG. 52C.

Referring to FIGS. 52A-52G, at least one conductive material can be deposited in the staircase region flanged voids 85", the peripheral region cylindrical voids 485', the array region cylindrical voids 585', and the source contact cylindrical voids 685'. As shown in FIG. 52G, the at least one conductive material can include a metallic liner material that is conformally deposited to form a metallic liner 186A within each void, and a metal fill material that is conformally deposited to form a metal fill portion 186B. In one embodiment, the metallic liner 186A can include a conductive metal nitride such as TiN, and the metal fill portion 186B can include a metal such as tungsten, cobalt, molybdenum, or copper. Excess portion of the at least one conductive material can be removed from above the top surface of the first contact level dielectric layer 280 by a planarization process such as chemical mechanical planarization.

Each combination of a metallic liner 186A and a metal fill portion 186B filling a staircase region flanged void 85"

constitutes a flanged conductive via structure 186, such as a hook, cross or anchor shaped structure. Each flanged conductive via structure 186 can include a conductive pillar portion 866 having a cylindrical shape and a conductive flange portion 868 projecting from the conductive pillar portion 866 and having an annular shape. Depending on the thickness of the metallic liner 186A, the entire conductive flange portion 868 may consist of only the metallic nitride liner 186A or a combination of the metallic nitride liner 186A and the metal fill portion 186B. Each combination of the metallic liner 186A and the metal fill portion 186B filling a peripheral region cylindrical void 485' constitutes a peripheral region contact via structure 488. Each combination of the metallic liner 186A and the metal fill portion 186B filling an array region cylindrical void 585' constitutes an array region contact via structure 588. Each combination of the metallic liner 186A and the metal fill portion 186B filling a source contact cylindrical void 685' constitutes a source contact via structure 688.

Each flanged conductive via structure 186 contacts an annular top surface of a topmost electrically conductive layer (146 or 246) among electrically conductive layers (146, 246) through which the flanged conductive via structure 186 vertically extends. Further, each flanged conductive via structure 186 can be formed directly on the top surface of a lower-level metal interconnect structure 780 (such as a topmost lower-level metal interconnect structure 788). Each peripheral region contact via structure 488 can contact a respective lower-level metal interconnect structure 780 (such as a topmost lower-level metal interconnect structure 788) located in the peripheral region 400. Each array region contact via structure 588 can contact a respective lower-level metal interconnect structure 780 (such as a topmost lower-level metal interconnect structure 788) located in the memory array region 100. Each source contact via structure 688 contacts the lower source layer 112.

Each combination of a flanged conductive via structure 186 and annular insulating spacers (847, 847') laterally surrounding the flanged conductive via structure 186 collectively constitutes a staircase region laterally-insulated via structure 386. Each combination of an array region contact via structure 588 and annular insulating spacers (587, 587') laterally surrounding the array region contact via structure 588 collectively constitutes an array region laterally-insulated via structure 57. Each combination of a source contact via structure 688 and annular insulating spacers 687 laterally surrounding the source contact via structure 688 collectively constitutes a source region laterally-insulated via structure 67.

Figure 53:
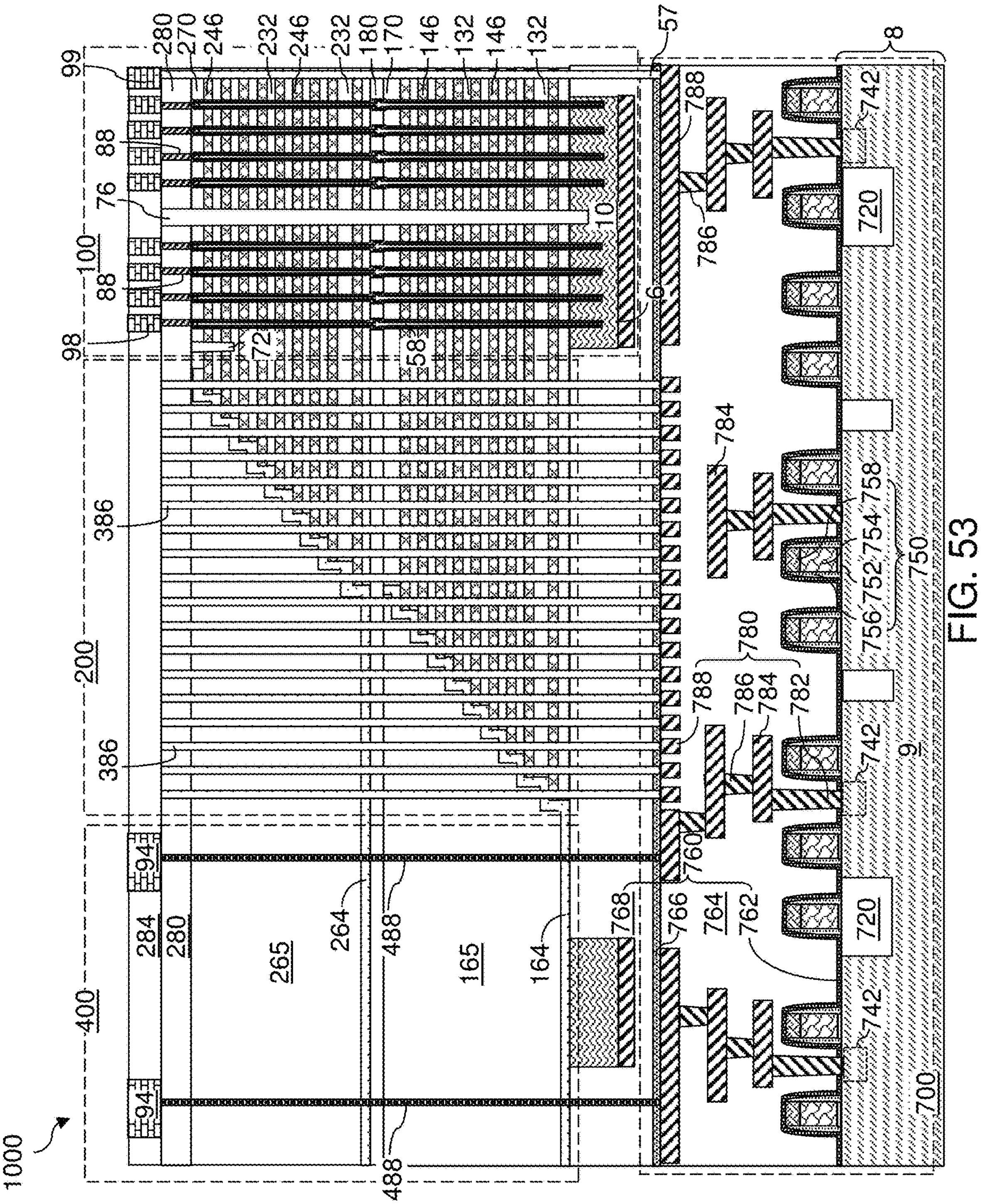
FIG. 53 is a vertical cross-sectional view of the second exemplary structure after formation of drain contact via structures and upper-level metal line structures according to the second embodiment of the present disclosure.

Referring to FIG. 53, the processing steps of FIGS. 29A and 29B can be performed to form drain contact via structures 88 and bit lines 98 through the first contact level dielectric layer 280 directly on top surfaces of the drain regions 63. Upper-level metal line structures and upper-level dielectric material layers can be formed in the same manner as in the first embodiment. If some of the peripheral devices (e.g., transistors) 710 are located laterally past the end of the staircase, then they can be connected to the top instead of the bottom of the flanged conductive via structure 186 using the peripheral region line structures 94 contacting, and/or electrically connected to, a respective one of the peripheral region contact via structures 488 and one or more respective flanged conductive via structures 186.

Referring to various drawings of the present disclosure and according to various embodiments of the present disclosure, a device structure is provided, which comprises: an alternating stack {(132, 146) and/or (232, 246)} of insulating layers (132 and/or 232) and electrically conductive layers (146 and/or 246) and including stepped surfaces in a staircase region 200; a dielectric liner (264 or 164) located on the stepped surfaces; a retro-stepped dielectric material portion (265 and/or 165) overlying the dielectric liner (264 or 164) and having a top surface located at, or above, a topmost surface of the alternating stack {(132, 146) and/or (232, 246)}; a flanged conductive via structure 186 including a conductive pillar portion 866 extending through the retro-stepped dielectric material portion (265 and/or 165), the dielectric liner (264 and/or 164), a horizontal surface among the stepped surfaces, and a subset of layers within the alternating stack {(132, 146) and/or (232, 246)}, and a conductive flange portion 868 laterally protruding from the conductive pillar portion 866 and contacting a top surface of a topmost electrically conductive layer (146 or 246) in the subset of layers within the alternating stack {(132, 146) and/or (232, 246)}; and annular insulating spacers 847 located at each level of electrically conductive layers (146 and optionally 246) in the subset of layers within the alternating stack {(132, 146) and/or (232, 246)} and laterally surrounding the conductive pillar portion 866.

In one embodiment, the insulating layers (132, 232) comprise a first silicon oxide material, the dielectric liner (264 and/or 164) comprises a second silicon oxide material, and the retro-stepped dielectric material portion (265 and/or 165) comprises a third silicon oxide material. An etch rate of the second silicon oxide material in a 100:1 dilute HF solution is greater than an etch rate of the first silicon oxide material in the 100:1 dilute HF solution by a factor of at least 3, and the etch rate of the second silicon oxide material in the 100:1 dilute HF solution is greater than an etch rate of the third silicon oxide material in the 100:1 dilute HF solution by a factor of at least 3. In one embodiment, the first silicon oxide material and the third silicon oxide material are undoped silicate glass materials, and the second silicon oxide material includes a material selected from borosilicate glass, phosphosilicate glass, borophosphosilicate glass, and organosilicate glass.

In one embodiment, the annular insulating spacers 847 comprise a material selected from silicon oxide and a dielectric metal oxide. In one embodiment, a contact area between the conductive flange portion 868 and the topmost electrically conductive layer (146 or 246) in the subset of layers within the alternating stack {(132, 146) and/or (232, 246)} is an annular area located between an outer periphery of the contact area and an inner periphery of the contact area, and the outer periphery of the contact area is laterally offset outward from the inner periphery of the contact area by a uniform lateral distance, which can be the difference between the second lateral offset distance lod2 and the first lateral offset distance lod1. In one embodiment, each of the annular insulating spacers 847 is located within an opening (i.e., a hole) in a respective one of the electrically conductive layers (146 or 246), and contacts a sidewall of the conductive pillar portion 866, and a topmost one of the annular insulating spacers 847 contacts a bottom surface of the conductive flange portion 868.

In one embodiment, the dielectric liner (264 or 164) continuously extends from a bottommost layer within the alternating stack {(132, 146) or (232, 246)} to a topmost layer within the alternating stack {(132, 146) or (232, 246)} and includes a plurality of openings therein, and each of the plurality of openings is located within a respective horizontal portion of the dielectric liner (264, 164) that overlies horizontal surfaces of the stepped surfaces.

In one embodiment, an annular top surface of the conductive flange portion 868 is located within a same horizontal plane as top surface of a horizontal portion of the dielectric liner (264 or 164), and an annular bottom surface of the conductive flange portion 868 is located within a same horizontal plane as a bottom surface of the horizontal portion of the dielectric liner (264 or 164).

In one embodiment, the conductive pillar portion 866 has an upper straight sidewall that extends from a topmost surface of the conductive pillar portion 866 to a periphery at which a top surface of the conductive flange portion 868 adjoins the conductive pillar portion 866, and the conductive pillar portion 866 has a lower straight sidewall that extends from a periphery at which a bottom surface of the conductive flange portion 868 adjoins the conductive pillar portion 866 to a bottommost surface of the conductive pillar portion 866.

In one embodiment, the device structure can comprise lower-level metal interconnect structures 780 embedded in lower-level dielectric material layers 760 and located between the substrate 8 and the alternating stack {(132, 146) and/or (232, 246)}, wherein the bottommost surface of the conductive pillar portion 866 contacts a top surface of one of the lower-level metal interconnect structures 780.

In one embodiment, memory stack structures 55 can extend through the alternating stack {(132, 146) and/or (232, 246)}. Each of the memory stack structures 55 comprises a vertical stack of charge storage elements (as embodied as sections of a charge storage layer located at levels of the electrically conductive layers (146, 246)), a tunneling dielectric layer 56 laterally surrounded by the vertical stack of charge storage elements, and a vertical semiconductor channel 60 laterally surrounded by the tunneling dielectric layer 56. Driver circuitry 710 containing a metal interconnect structure 780 is located below the alternating stack. The conductive pillar portion 866 physically contacts the metal interconnect structure 780 located below the alternating stack.

Figure 54:
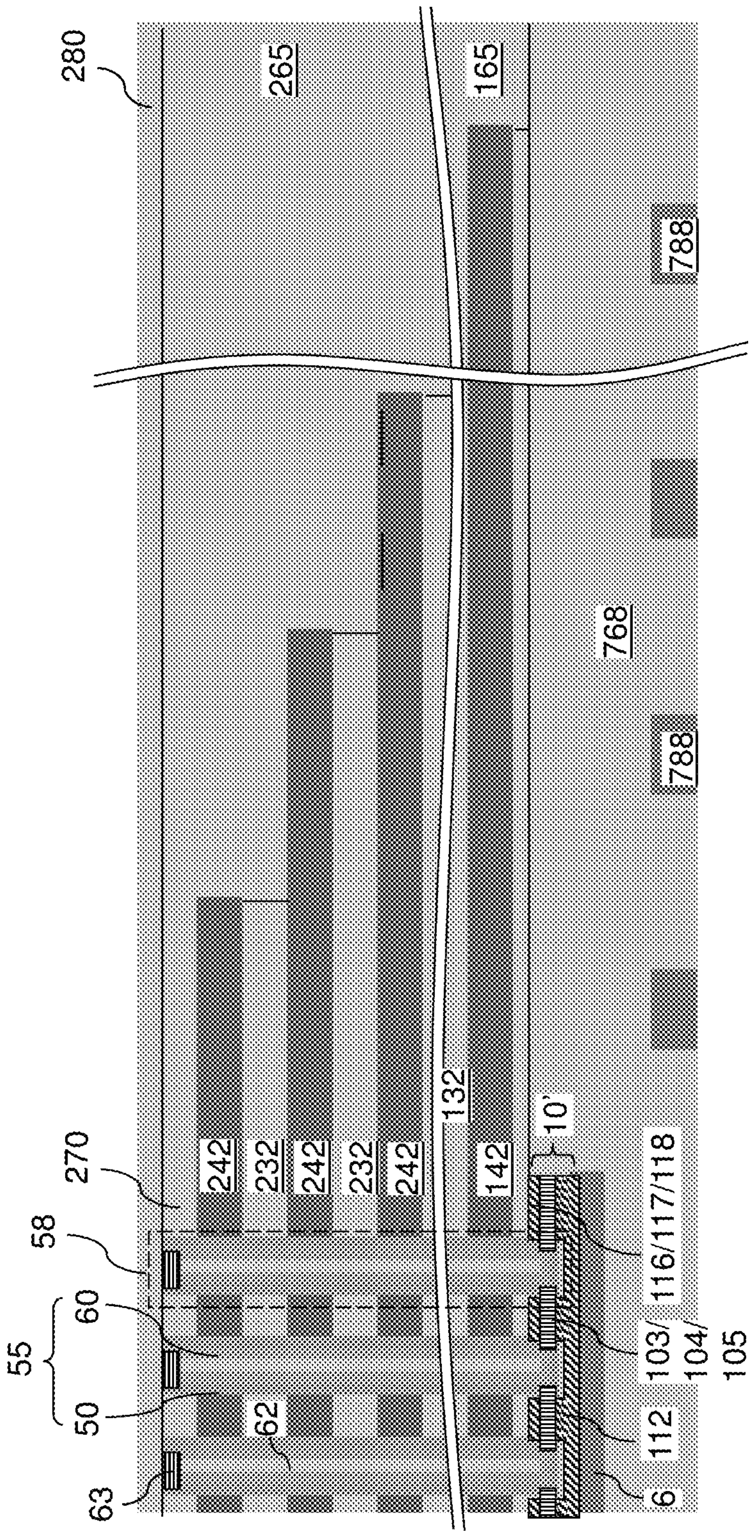
FIG. 54 is a vertical cross-sectional view of a third exemplary structure after formation of memory stack structures and a first contact level dielectric layer according to a third embodiment of the present disclosure.

Referring to FIG. 54, a third exemplary structure according to a third embodiment of the present disclosure can be derived from the first exemplary structure of FIGS. 13A and 13B. In one embodiment, the third exemplary structure illustrated in FIG. 54 can be the same as the first exemplary structure illustrated in FIGS. 13A and 13B.

The third exemplary structure of FIG. 54 can include lower-level metal interconnect structures 780 embedded in lower-level dielectric material layers 760 and located over a substrate 8 such as shown in FIGS. 1A, 2-5A, etc. An alternating stack of insulating layers (132 and/or 232) and spacer material layers (142 and/or 242) is formed over the lower-level metal interconnect structures 780. The alternating stack of insulating layers (132 and/or 232) and sacrificial material layers (142 and/or 242) include stepped surfaces located in a staircase region 200. A retro-stepped dielectric material portion (165 and/or 265) is located over the stepped surfaces of the alternating stack {(132, 142), (232, 242)}. Memory stack structures 55 extend through the alternating stack {(132, 142), (232, 242)}. A first contact level dielectric layer 280 is formed over the memory stack structures 55.

Figure 55:
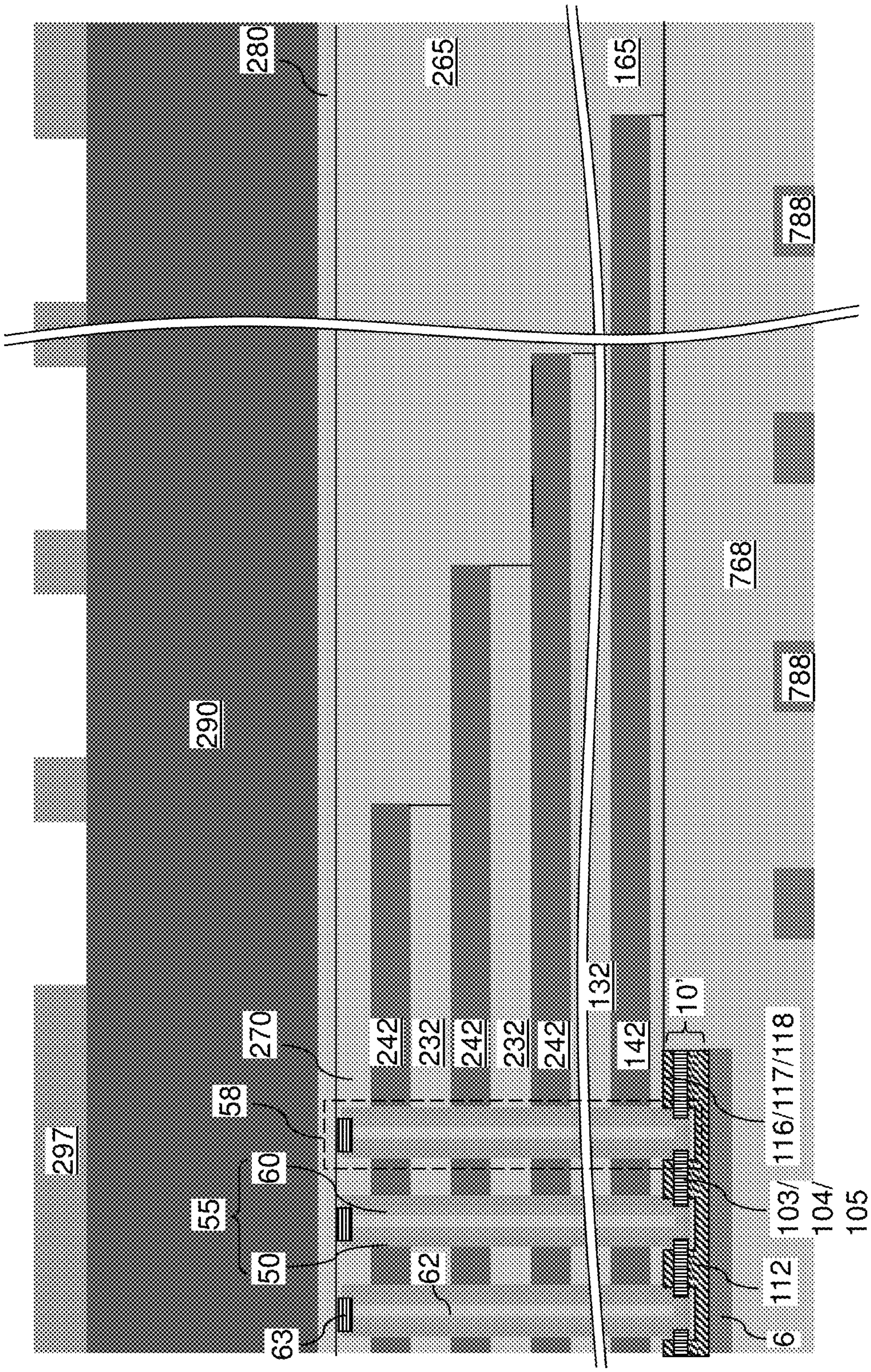
FIG. 55 is a vertical cross-sectional view of the third exemplary structure after formation of a patterning film and a patterned photoresist layer having a pattern of contact via structures according to the third embodiment of the present disclosure.

Referring to FIG. 55, a patterning film 290 can be applied over the top surface of the first contact level dielectric layer 280. The patterning film 290 can be an amorphous carbon-based film that can be subsequently used as an etch mask material. For example, Advanced Patterning Film™ by Applied Materials, Inc. can be used for the patterning film 290. The patterning film 290 can be deposited by chemical vapor deposition, and can have a thickness in a range from 200 nm to 1,000 nm, although lesser and greater thicknesses can also be used.

A photoresist layer 297 can be applied over the patterning film 290, and can be lithographically patterned to form openings therethrough. The openings through the photoresist layer 297 can be formed in the staircase region 200 such that each opening through the photoresist layer overlies a respective portion of a sacrificial material layer (142, 242) that does not underlie any other sacrificial material layer (142, 242). Thus, each opening through the photoresist layer can be formed within the area of a horizontal surface among the stepped surfaces which are the interfaces between the alternating stack {(132, 142). (232, 242)} and the retro-stepped dielectric material portions (165, 265). Further, each area of the openings can be centered on a respective one of the underlying topmost lower-level metal line structures 788 located in the staircase region 200. The pattern in the patterned photoresist layer is the same as the pattern of contact via structures to be subsequently formed.

Figure 56:
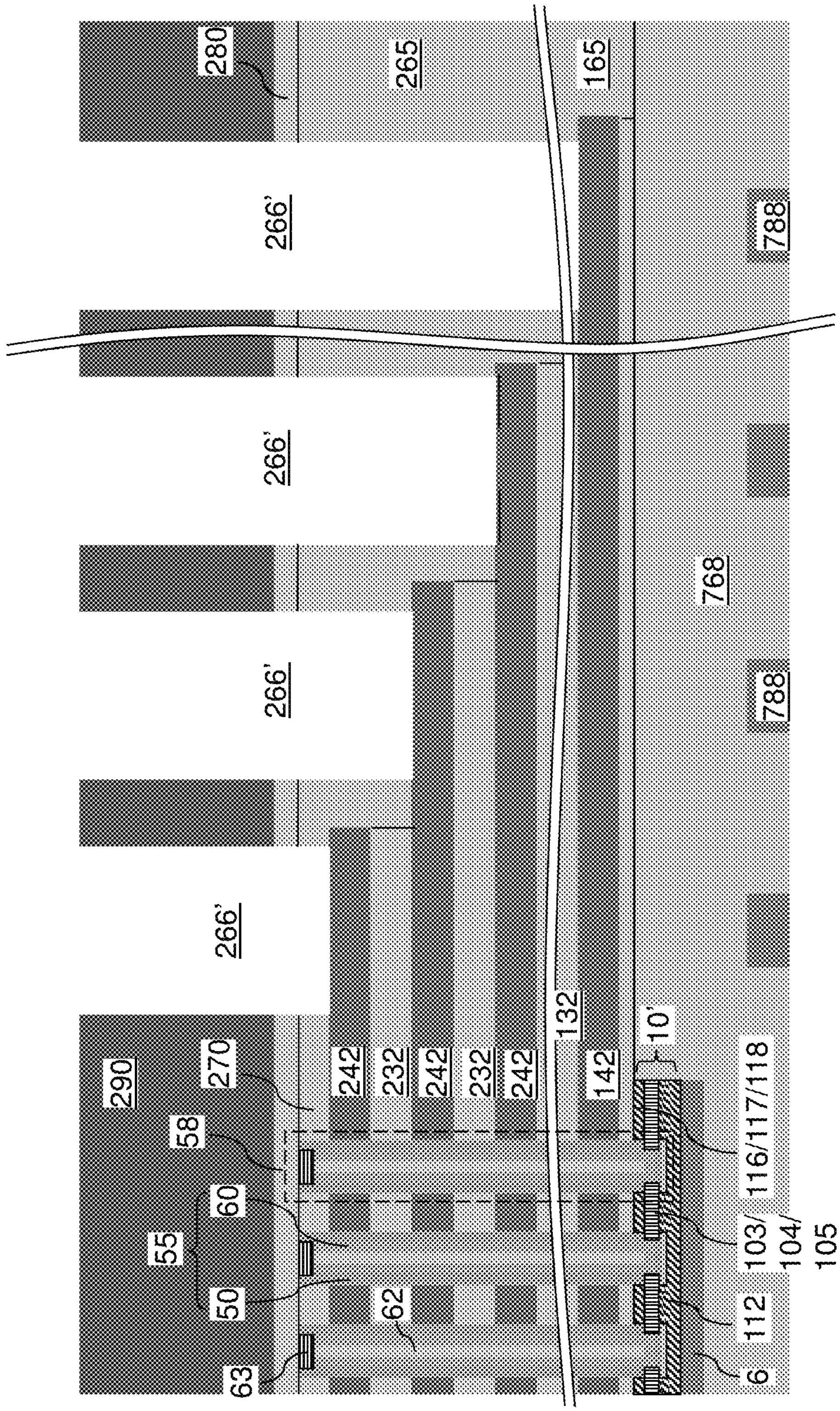
FIG. 56 is a vertical cross-sectional view of the third exemplary structure after formation of contact via openings according to the third embodiment of the present disclosure.

Referring to FIG. 56, an anisotropic etch is performed to transfer the pattern in the photoresist layer through the first contact level dielectric layer 280 and the retro-stepped dielectric material portions (165, 265). The chemistry of the anisotropic etch process can be selective to the material of the sacrificial material layers (142, 242). For example, if the insulating layers (132, 232) include silicon oxide and if the sacrificial material layers (142, 242) include silicon nitride, an anisotropic etch process that etches silicon oxide selective to silicon nitride can be used. In one embodiment, the anisotropic etch process can use an etch chemistry including $CF_4$, $O_2$, $H_2$ and $N_2$.

Contact via openings 266' are formed through the patterning film 290, the first contact level dielectric layer 280, the second retro-stepped dielectric material portion 265, and optionally the first retro-stepped dielectric material portion 165. Top surfaces of the sacrificial material layers (142, 242) are physically exposed at a bottom of each of the contact via openings 266'. The photoresist layer may be entirely consumed during the anisotropic etch process. Each contact via opening 266' can have a respective vertical sidewall that extends from a top surface of the patterning film 290 to a top surface of a respective one of the sacrificial material layers (142, 242).

Figure 57:
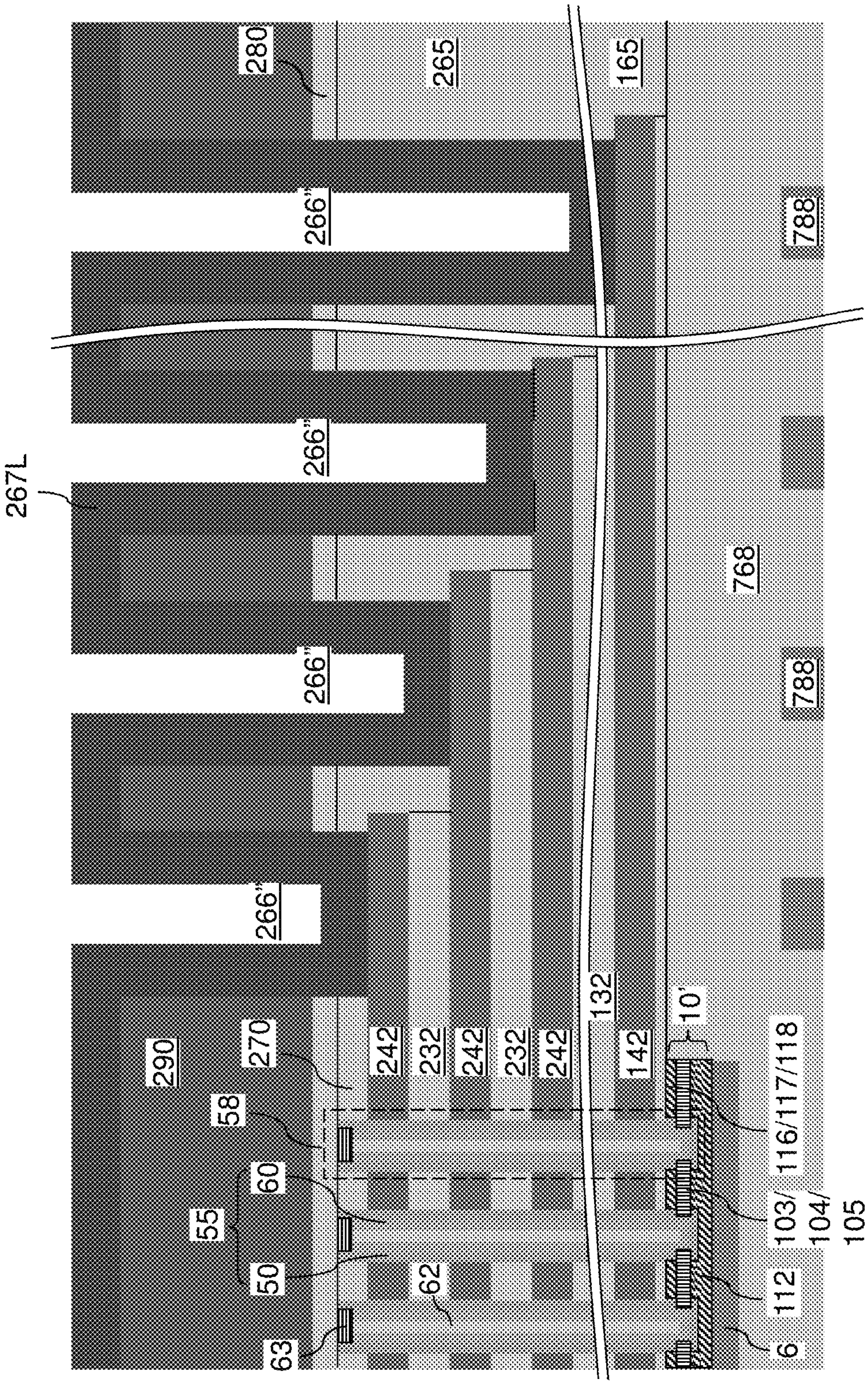
FIG. 57 is a vertical cross-sectional view of the third exemplary structure after deposition of a continuous sacrificial liner material layer according to the third embodiment of the present disclosure.

Referring to FIG. 57, a continuous sacrificial liner material layer 267L can be deposited by a conformal deposition process. The continuous sacrificial liner material layer 267L includes a material that can be removed selective to the materials of the sacrificial material layers (142, 242), the retro-stepped dielectric material portions (165, 265), and the first contact level dielectric layer 280. In one embodiment, the continuous sacrificial liner material layer 267L can include an amorphous or polycrystalline semiconductor material. For example, the continuous sacrificial liner material layer 267L can include amorphous silicon or polysilicon. The continuous sacrificial liner material layer 267L is deposited as a continuous material layer by a conformal deposition process (such as low pressure chemical vapor deposition) within the contact via openings 266' and over the patterning film 280. The thickness of the continuous sacrificial liner material layer 267L can be in a range from 30 nm to 300 nm, although lesser and greater thicknesses can also be used. An in-process cylindrical via cavity 266" is provided within each unfilled volume of a contact via opening 266'. Each in-process cylindrical via cavity 266" is a cavity having a generally cylindrical volume and extending along a vertical direction, and is modified in volume in a subsequent process.

The lateral dimension of each in-process cylindrical via cavity 266" may be in a range from 20 nm to 400 nm, although lesser and greater lateral dimensions can also be used.

Figure 58:
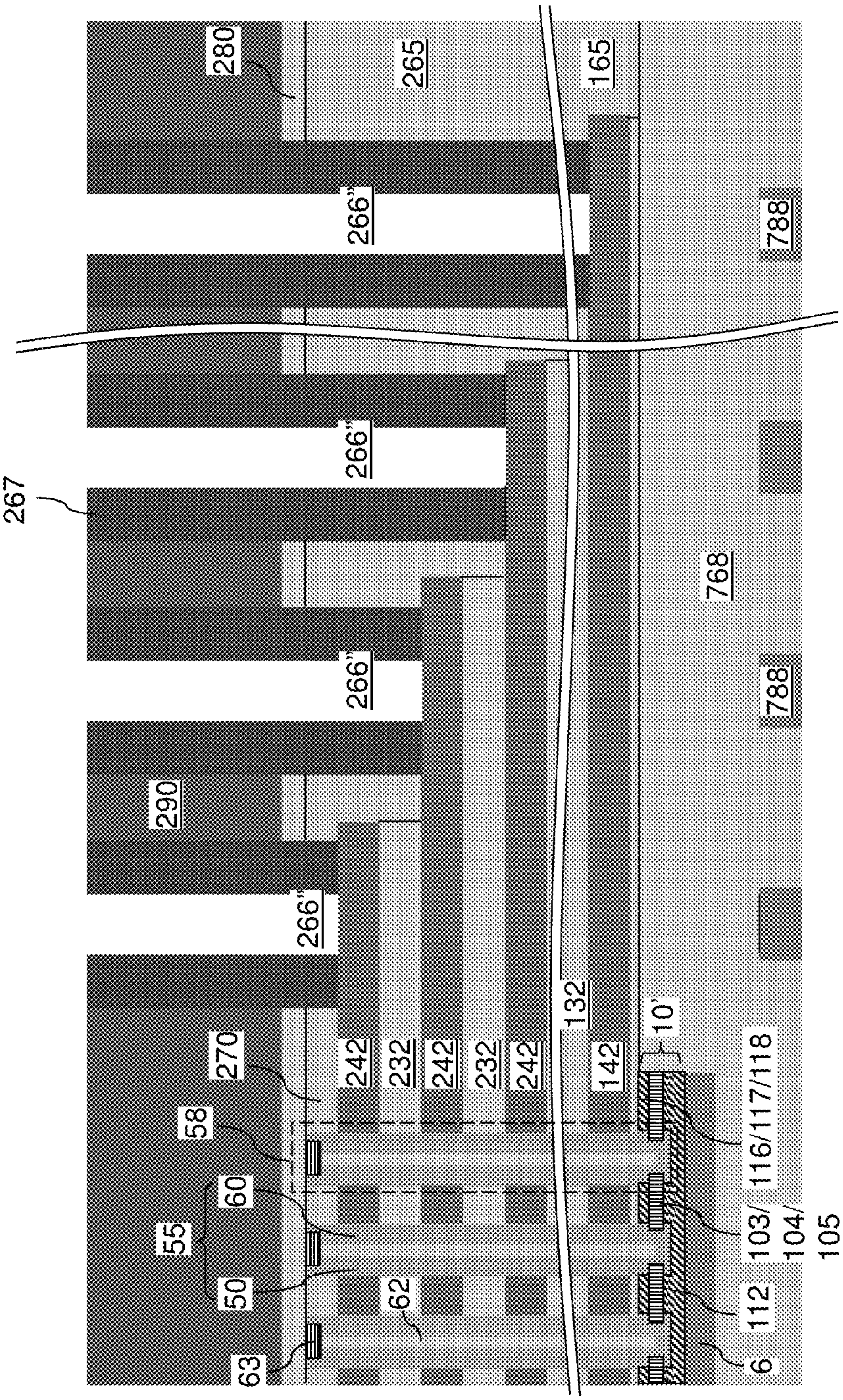
FIG. 58 is a vertical cross-sectional view of the third exemplary structure after formation of sacrificial tubular liners according to the third embodiment of the present disclosure.

Referring to FIG. 58, an anisotropic etch process is performed, which etches the horizontal portions of the continuous sacrificial liner material layer 267L. The anisotropic etch process removes the horizontal portion of the continuous sacrificial liner material layer 267L overlying patterning film 290 and the horizontal portions of the continuous sacrificial liner material layer 267L underneath the in-process cylindrical via cavities 266". The remaining vertical portions of the continuous sacrificial liner material layer 267L constitute sacrificial tubular liners 267. Each sacrificial tubular liner 267 can be topologically homeomorphic to a torus (i.e., can be continuously stretched into a torus without forming or destroying a hole). In one embodiment, each sacrificial tubular liner 267 can have a generally tubular shape with a horizontal cross-sectional shape that is invariant with the distance from the substrate 8.

Figure 59:
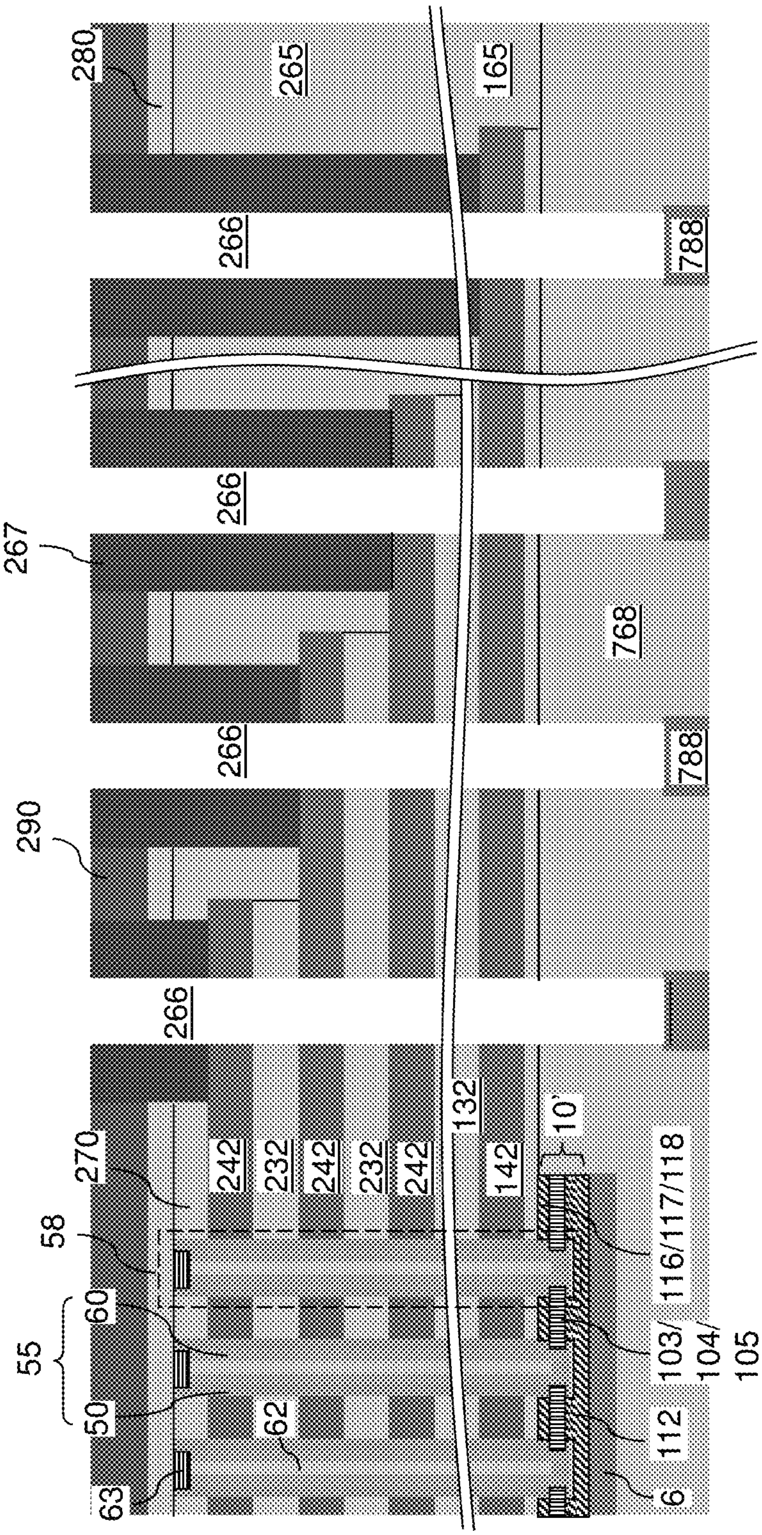
FIG. 59 is a vertical cross-sectional view of the third exemplary structure after formation of cylindrical via cavities according to the third embodiment of the present disclosure.

Referring to FIG. 59, an anisotropic etch process is performed to etch through the materials of the alternating stack {(132, 142), (232, 242)} and the at least one second dielectric material layer 768 selective to the metallic material(s) of the topmost lower-level metal line structures 788. The combination of the patterning film 290 and the sacrificial tubular liners 267 can be used as an etch mask for the anisotropic etch process. In other words, only areas of the alternating stack {(132, 142), (232, 242)} and the at least one second dielectric material layer 768 that are not masked by the combination of the patterning film 290 and the sacrificial tubular liners 267 are etched during the anisotropic etch process. Each in-process cylindrical via cavities 266" is vertically extended down to a top surface of a respective one of the topmost lower-level metal line structures 788, and becomes a respective cylindrical via cavity 266. The cylindrical via cavities 266 can be formed by vertically extending the in-process cylindrical via cavities 266" down to a depth of the horizontal plane including the top surfaces of the topmost lower-level metal line structures 788.

Figure 60:
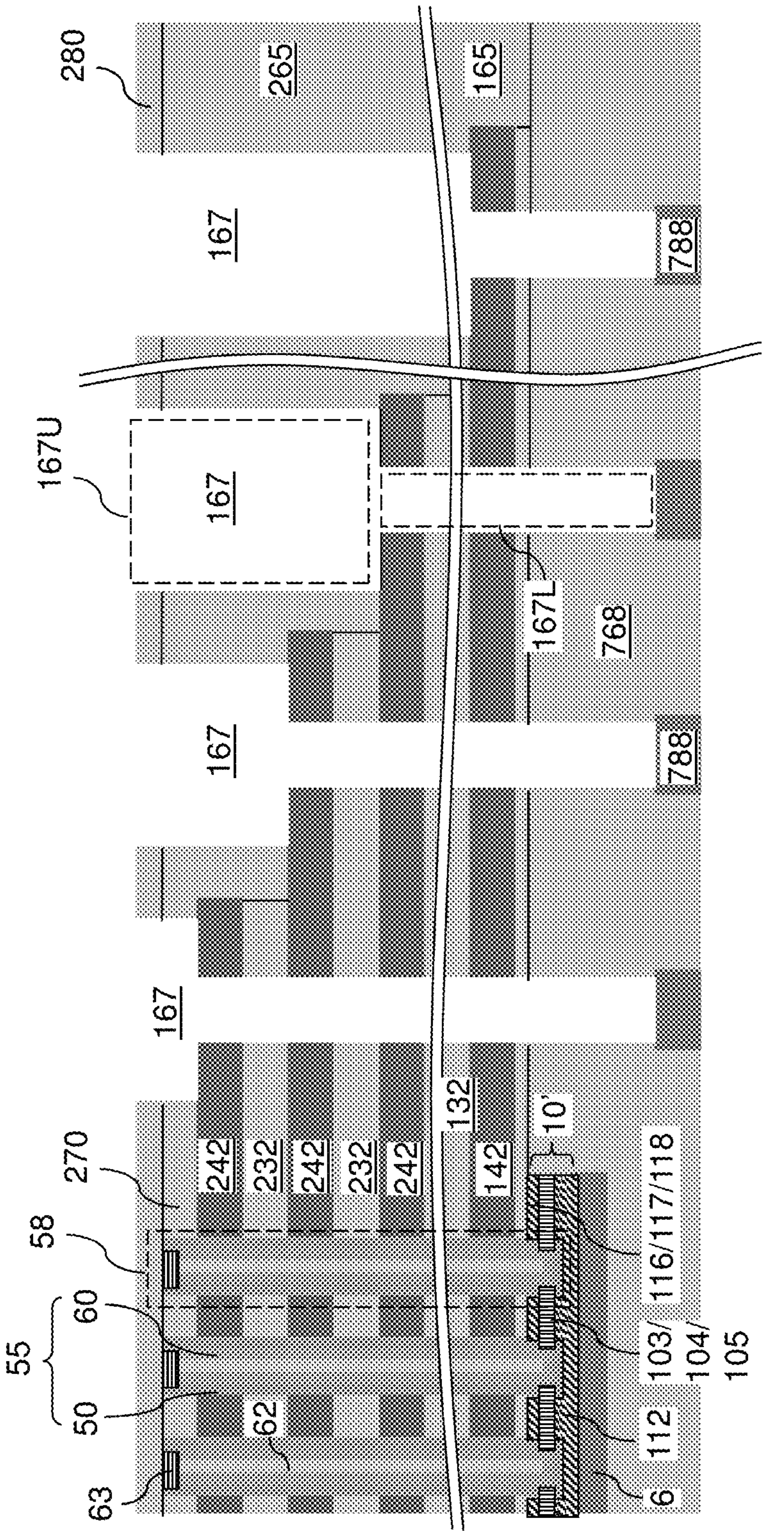
FIG. 60 is a vertical cross-sectional view of the third exemplary structure after formation of two-tier via cavities by removal of the sacrificial tubular liners according to the third embodiment of the present disclosure.

Referring to FIG. 60, the sacrificial tubular liners 267 and the patterning film 290 can be removed selective to the materials of the first contact level dielectric layer 280, the retro-stepped dielectric material portions (165, 265), the alternating stack {(132, 142), (232, 242)}, and the at least one second dielectric material layer 768. In one embodiment, if the sacrificial tubular liners 267 include a semiconductor material, the sacrificial tubular liners 267 can be removed by an isotropic etch that etches the semiconductor material. For example, if the sacrificial tubular liners 267 include amorphous silicon or polysilicon, the sacrificial tubular liners 267 can be removed by a wet etch process employing hot trimethyl-2 hydroxyethyl ammonium hydroxide ("hot TMY") or tetramethyl ammonium hydroxide (TMAH). The patterning film 290 can be removed, for example, by ashing.

Two-tier via cavities 167 are formed by removal of the sacrificial tubular liners 267 and the patterning film 290. The volumes formed by removal of the sacrificial tubular liners 267 and the volumes of the cylindrical via cavities 266 collectively constitute the two-tier via cavities 167. Each two-tier via cavity 167 includes a volume of a cylindrical via cavity 266 and a cylindrical volume adjoining the volume of the cylindrical via cavity 266 and formed by removal of a sacrificial tubular liner 267. Each of the two-tier via cavities 167 comprises an upper-tier volume 167U extending through the second resto-stepped dielectric material portion 265 and optionally through the first retro-stepped dielectric material portion 165, and a lower-tier volume 167L extending through a sacrificial material layer (142, 242) located at a bottom of the upper-tier volume and any underlying sacrificial material layer (142, 242). The lower-tier volume 167L has a lesser lateral extent than the upper-tier volume 167U. The sidewall of the upper-tier volume 167U can be laterally offset outward from the sidewall of the lower-tier volume 167L by a uniform lateral offset distance, which can be the same as the thickness of the sacrificial tubular liners 267 at the processing steps of FIG. 58. The upper-tier volume 167U overlies a physically exposed portion of a top surface of a respective one of the sacrificial material layers (142, 242) that defines a bottom surface of the upper-tier volume 167U. A respective sidewall of the bottommost one of the sacrificial material layers 142 is physically exposed to the lower-tier volume 167L. A top surface of a respective one of the lower-level metal interconnect structures 780 (such as a topmost lower-level metal line structure 788) is physically exposed at a bottom of each of the two-tier via cavities 167.

Figure 61:
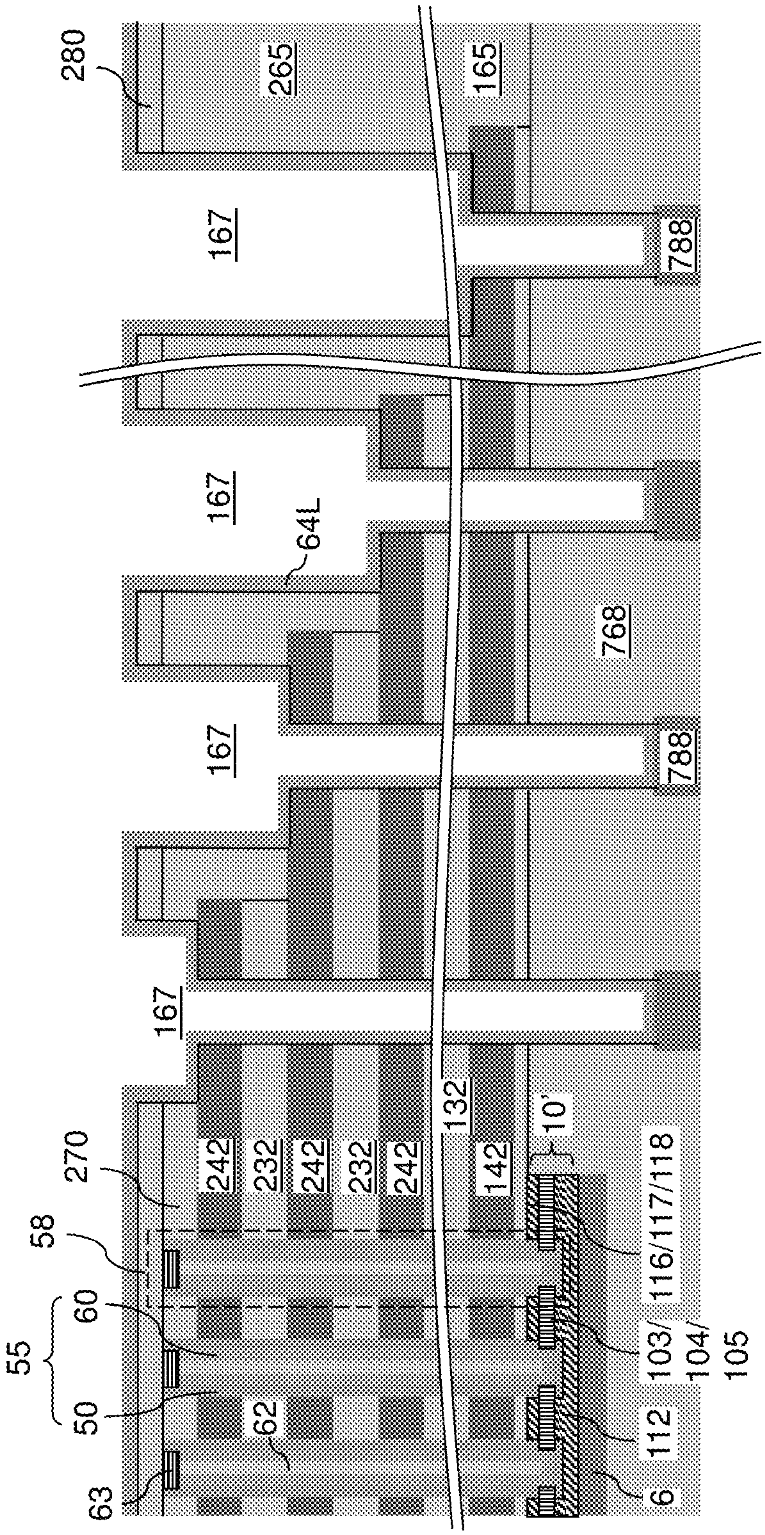
FIG. 61 is a vertical cross-sectional view of the third exemplary structure after deposition of an insulating liner layer according to the third embodiment of the present disclosure.

Referring to FIG. 61, an insulating liner layer 64L can be deposited by a conformal deposition process on the physically exposed surfaces of the two-tier via cavities 167 and over the first contact level dielectric layer 280. The insulating liner layer 64L includes a dielectric material that is different from the material of the sacrificial material layers (142, 242). For example, the insulating liner layer 64L can include silicon oxide or a dielectric metal oxide (such as aluminum oxide). In one embodiment, the insulating liner layer 64L can include undoped silicate glass formed by low pressure chemical vapor deposition. The insulating liner layer 64L can be formed directly on each physically exposed top surface of the lower-level metal interconnect structures 780 (such as the physically exposed top surfaces of the topmost lower-level metal line structures 788). The thickness of the insulating liner layer 64L can be in a range from 4 nm to 100 nm, although lesser and greater thicknesses can also be used.

Figure 62:
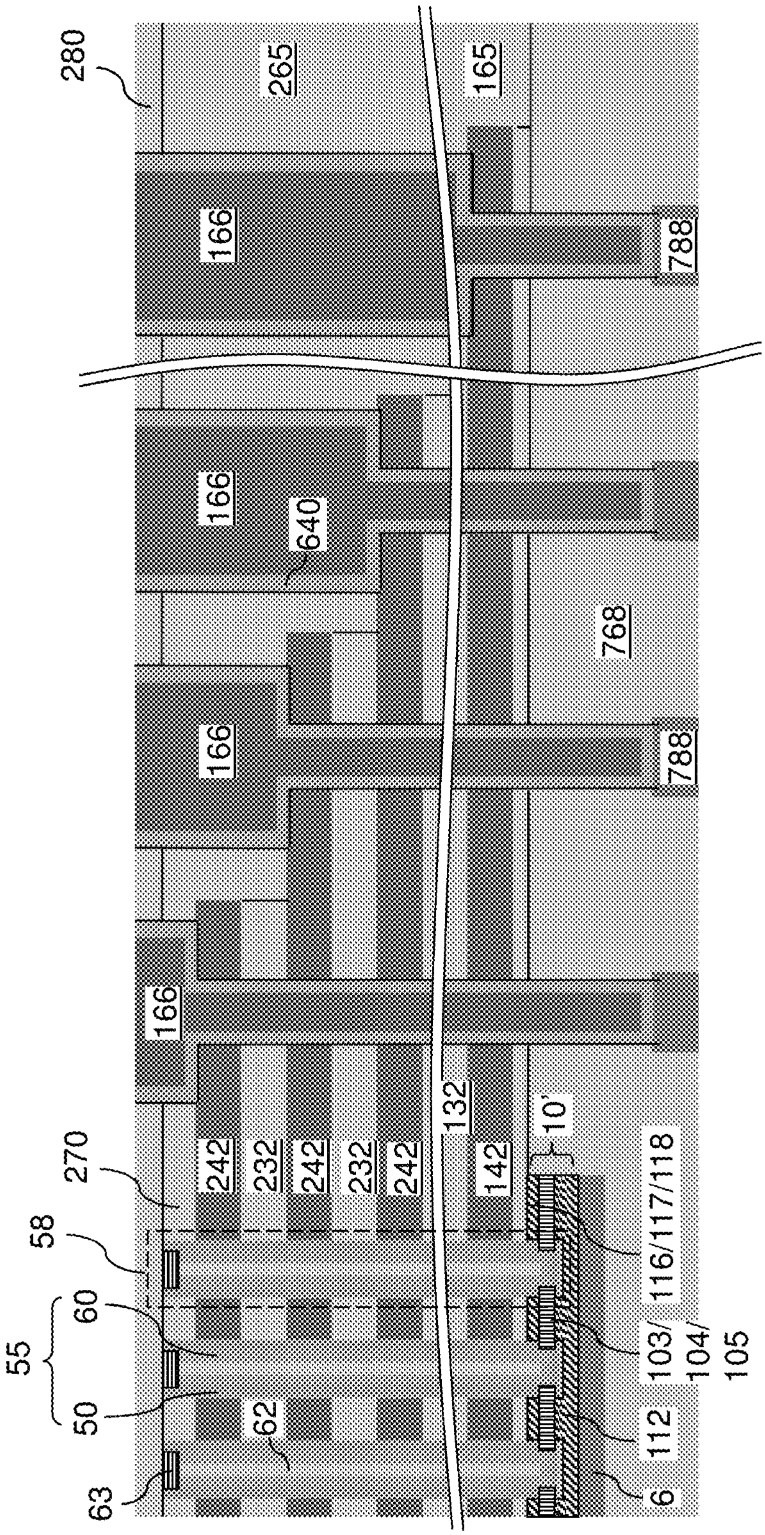
FIG. 62 is a vertical cross-sectional view of the third exemplary structure after formation of sacrificial via fill material portions according to the third embodiment of the present disclosure.

Referring to FIG. 62, a sacrificial via fill material can be deposited on the insulating liner layer 64L by a conformal deposition or a self-planarizing process. The sacrificial via fill material includes a material that is different from the material of the insulating liner layer 64L. The sacrificial via fill material can include a semiconductor material (such as polysilicon or amorphous silicon) or a dielectric material (such as silicon nitride). In one embodiment, the insulating layers (132, 232) comprise silicon oxide, the sacrificial material layers (142, 242) comprise silicon nitride, the insulating liner layer 64L comprises silicon oxide, and the sacrificial via fill material comprises a material selected from silicon nitride and a semiconductor material. In one embodiment, the sacrificial via fill material comprises, and/or consists essentially of, silicon nitride. In one embodiment, the sacrificial via fill material can be deposited by a conformal deposition process such as low pressure chemical vapor deposition.

The sacrificial via fill material, and optionally a horizontal portion of the insulating liner layer 64L overlying a top surface of the first contact level dielectric layer 280, can be removed from above the horizontal plane including the top surface of the first contact level dielectric layer 280 by a planarization process. The planarization process can use chemical mechanical planarization (CMP) and/or a recess etch. Each remaining portion of the sacrificial via fill material constitutes a sacrificial via fill material portion 166. Each remaining portion of the insulating liner layer 64L constitutes an insulating liner 640. Each combination of an insulating liner 640 and a sacrificial via fill material portion 166 constitutes a sacrificial via fill structure (166, 640) that fills the volume of a respective two-tier via cavity 167. The sacrificial via fill structures (166, 640) are formed through the second retro-stepped dielectric material portion 265, optionally through the first retro-stepped dielectric material portion 165, and through a respective portion of the alternating stack {(132, 142), (232, 242)}. Each of the sacrificial fill structures (166, 640) contacts a top surface of a respective one of the sacrificial material layers (142, 242), a sidewall of a bottommost one of the sacrificial material layers 142, and sidewalls of any additional sacrificial material layer (142, 242) that overlie the bottommost one of the sacrificial material layers 142, if any.

Thus, volumes of the contact via openings 266' are subsequently filled with portions of the sacrificial via fill structures (166, 640). The sacrificial via fill structures (166, 640) are formed within volumes formed by removal of the sacrificial tubular liners 267 and the cylindrical via cavities 266. The sacrificial via fill material portions 166 are formed within remaining volumes of the two-tier cavities 167 that are not filled with the insulating liners 640.

Figure 63:
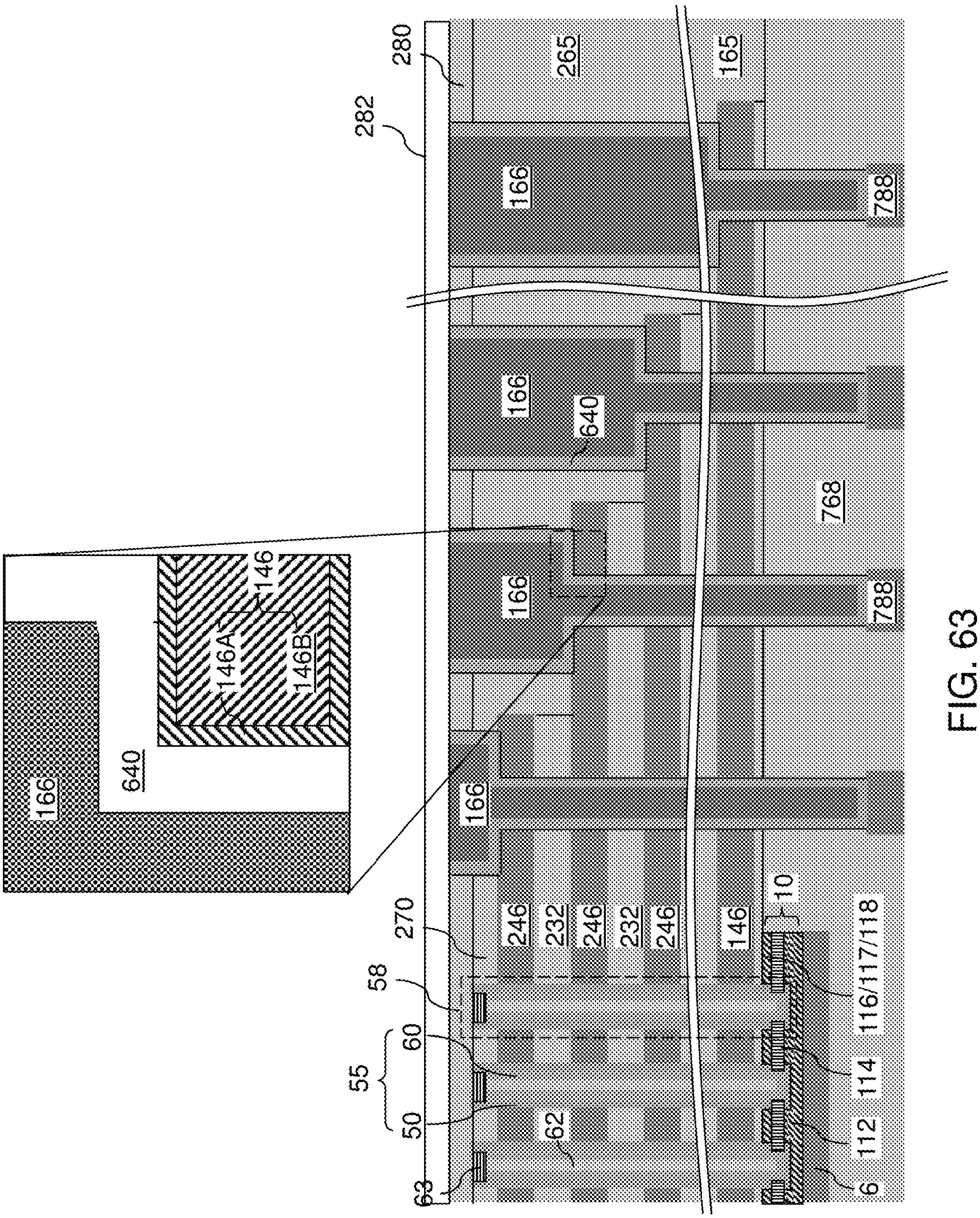
FIG. 63 is a vertical cross-sectional view of the third exemplary structure after replacement of the sacrificial material layers with electrically conductive layers according to the third embodiment of the present disclosure.

Referring to FIG. 63, a sacrificial cover dielectric layer 282 can be deposited over the first contact level dielectric layer 280. The sacrificial cover dielectric layer 282 includes a dielectric material that protects the sacrificial via fill material portions 166 during subsequent etch processes. For example, the sacrificial cover dielectric layer 282 can include silicon oxide such as undoped silicate glass formed by decomposition of TEOS. The thickness of the sacrificial cover dielectric layer 282 can be in a range from 10 nm to 100 nm, although lesser and greater thicknesses can also be used.

Referring to FIG. 63, the processing steps of FIGS. 44A and 44B can be performed to form backside trenches and backside trench spacers. Subsequently, the processing steps of FIGS. 21A-21E can be performed to replace the in-process source-level material layers 10' within source-level material layers 10 that can include, from bottom to top, a lower source layer 112, a source contact layer 114, an upper source layer 116, a source-level insulating layer 117, and an optional source selective level conductive layer 118. The processing steps of FIGS. 23, 24, and 25A-25E can be performed to replace the sacrificial material layers (142, 242) with electrically conductive layers (146, 246). Each of the electrically conductive layers (146, 246) can include a combination of a conductive metallic liner 146A and a conductive fill material portion 146B as in the first and second embodiments. Dielectric wall structures 76 can be formed in the backside trenches. The sacrificial cover dielectric layer 282 can protect the sacrificial via fill material portions 166 during replacement of the sacrificial material layers (142, 242) with the electrically conductive layers (146, 246).

Figure 64:
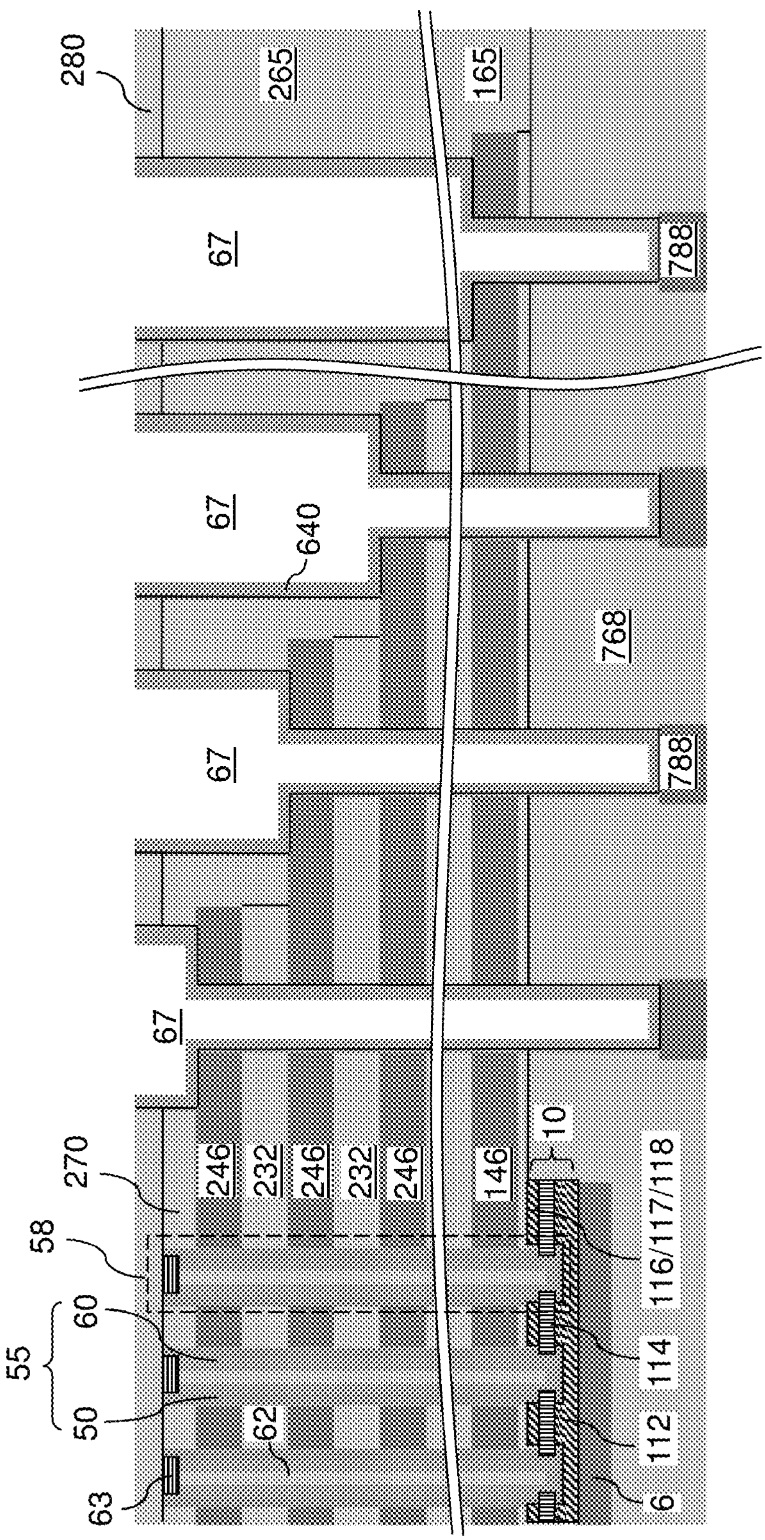
FIG. 64 is a vertical cross-sectional view of the third exemplary structure after removal of the sacrificial via fill material portions according to the third embodiment of the present disclosure.

Referring to FIG. 64, the sacrificial cover dielectric layer 282 can be removed to physically expose top surfaces of the sacrificial via fill material portions 166. The material of the sacrificial cover dielectric layer 282 can be removed by chemical mechanical planarization (CMP) (i.e., chemical mechanical polishing), an isotropic etch process or an anisotropic etch process. For example, CMP can be used to remove the sacrificial cover dielectric layer 282.

The sacrificial via fill material portions 166 can be subsequently removed selective to the materials of the insulating liners 640 and the first contact level dielectric layer 280 by an isotropic etch process. For example, if the sacrificial via fill material portions 166 include silicon nitride and if the insulating liners 640 and the first contact level dielectric layer 280 include silicon oxide, a wet etch employing hot phosphoric acid can be used to remove the sacrificial via fill material portions 166 selective to the insulating liners 640 and the first contact level dielectric layer 280. A stepped via cavity 67 can be formed within each volume from which a sacrificial via fill material portion 166 is removed. Each stepped via cavity 67 can be laterally bounded by an upper cylindrical sidewall, an annular horizontal surface adjoining a bottom periphery of the upper cylindrical sidewall, a lower cylindrical sidewall adjoining an inner periphery of the annular horizontal surface, and a planar bottom surface adjoining a bottom periphery of the lower cylindrical sidewall.

Figure 65:
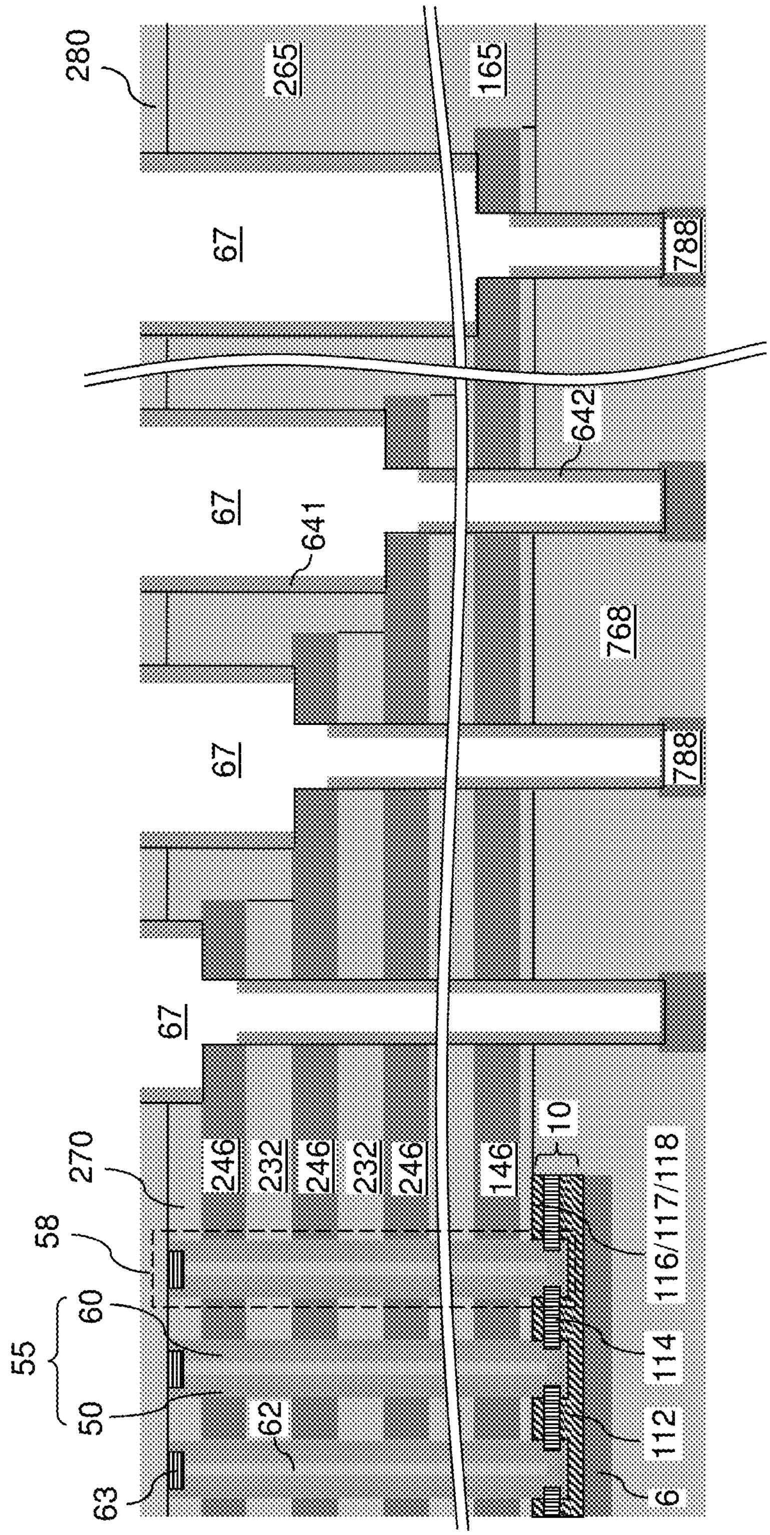
FIG. 65 is a vertical cross-sectional view of the third exemplary structure after formation of upper insulating liners and lower insulating liners according to the third embodiment of the present disclosure.

Referring to FIG. 65, an anisotropic etch process is performed to anisotropically etch horizontal portions of the insulating liners 640. Annular horizontal portions of the insulating liners 640 that overlie a respective one of the electrically conductive layers (146, 246) and disc-shaped horizontal portions of the insulating liners 640 that overlie a respective top surface of the lower-level metal interconnect structures 780 (such as the topmost lower-level metal line structures 788) are removed by the anisotropic etch process. For example, if the insulating liners 640 include silicon oxide, the anisotropic etch process can use an etch chemistry including $CF_4$, $O_2$, $H_2$ and $N_2$.

Each of the insulating liners 640 is divided into an upper insulating spacer 641 contacting a top surface of a respective one of the electrically conductive layers (146, 246) and a lower insulating spacer 642 laterally surrounded by a bottommost one of the electrically conductive layers 146 and any additional electrically conductive layer (146, 246), if any, located between the upper insulating spacer 641 and the bottommost one of the electrically conductive layers 146. The annular top surface of each lower insulating spacer 642 can be vertically recessed below a horizontal plane including a horizontal surface among the stepped surfaces, which form the interface between the alternating stack {(132, 146), (232, 246)} and the retro-stepped dielectric material portions (165, 265). In this case, an annular top surface of an electrically conductive layer (146, 246) that directly underlies a horizontal surface among the stepped surfaces, a cylindrical sidewall of the electrically conductive layer (146, 246), and a top surface of an underlying lower-level metal interconnect structures 780 within each of the stepped via cavities 67.

Figure 66:
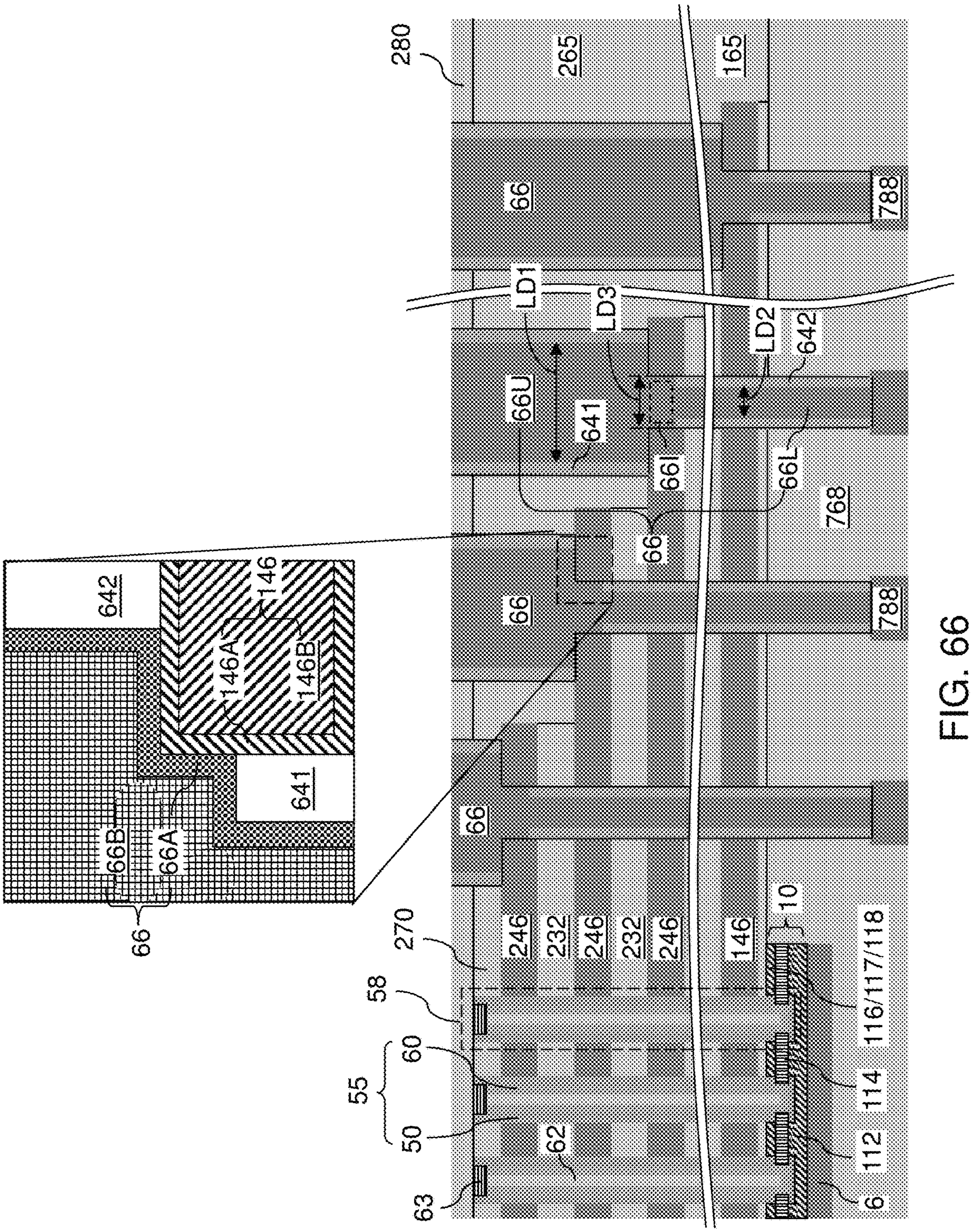
FIG. 66 is a vertical cross-sectional view of the third exemplary structure after formation of conductive via structures according to the third embodiment of the present disclosure.

Referring to FIG. 66, at least one conductive material can be deposited in the stepped via cavities 67. The at least one conductive material can include a metallic liner material that is conformally deposited to form a metallic liner 66A within each stepped via cavity 67, and a metal fill material that is conformally deposited to form a metal fill portion 66B. In one embodiment, the metallic liner 66A can include a conductive metal nitride such as TiN, and the metal fill portion 66B can include a metal such as tungsten, cobalt, molybdenum, or copper. Excess portions of the at least one conductive material can be removed from above the horizontal plane including the top surface of the first contact level dielectric layer 280 by a planarization process such as chemical mechanical planarization. Each combination of a metallic liner 66A and a metal fill portion 66B filling a stepped via cavity 67 after the planarization process constitutes a conductive via structure 66, which is also referred to as layer contact via structure, i.e., a via structure that provides electrical contact to a layer. A plurality of conductive via structures 66 among the set of all conductive via structures 66 can function as word lines for the memory stack structures 55.

Each conductive via structure 66 is formed directly on the top surface of the topmost electrically conductive layer (146 or 246) among the set of at least one electrically conductive layer (146, 246) through which the respective conductive via structure 66 extends. Each electrically conductive layer (146, 246), if any, within the set of the electrically conductive layers (146, 246) other than the topmost electrically conductive layer (146 or 246) is electrically isolated from the conductive via structure 66 by a lower insulating spacer 642. Each conductive via structure 66 is formed on inner sidewalls of an upper insulating spacer 641 and a lower insulating spacer 642. The conductive via structures 66 can be formed directly on a top surface of a respective one of the lower-level metal interconnect structures 780.

Each combination of a conductive via structure 66, an upper insulating spacer 641, and a lower insulating spacer 642 located within a two-tier via cavity constitutes a laterally-insulated via structure (66, 641, 642). The gap between the upper insulating spacer 641 and the lower insulating spacer 642 provides an annular electrically conductive path at which the conductive via structure 66 and an electrically conductive layer (146 or 246) make a surface-to-surface contact. Thus, the sacrificial via fill structures (166, 640) are replaced with laterally-insulated via structures (66, 641, 642). Each of the laterally-insulated via structures (66, 641, 642) comprises a conductive via structure 66 contacting an annular area of a top surface of a respective one of the electrically conductive layers (146, 246).

Subsequently, the processing steps of FIGS. 29A and 29B can be performed to form drain contact via structures 88 through the first contact level dielectric layer 280 directly on top surfaces of the drain regions 63. The processing steps of FIG. 30 can be performed to form at least one additional dielectric layer over the first contact level dielectric layer 280. Additional metal interconnect structures (herein referred to as upper-level metal interconnect structures) can be formed in the at least one additional dielectric layer. For example, the at least one additional dielectric layer can include a line-level dielectric layer 284 that is formed over the first contact level dielectric layer 280 as illustrated in FIG. 30. The upper-level metal interconnect structures can include bit lines 98 contacting, or electrically connected to, a respective one of the drain contact via structures 88, peripheral region line structures 94 contacting, and/or electrically connected to, a respective one of the peripheral region contact via structures 488, and array region line structures 99 contacting, and/or electrically connected to, a respective one of the array region contact via structures 588.

Referring to all drawings and according to various embodiments of the present disclosure, a device structure is provided, which comprises: an alternating stack of insulating layers (132, 232) and electrically conductive layers (146, 246) located over a substrate 8 and including stepped surfaces in a staircase region 200; a retro-stepped dielectric material portion (265 and/or 165) overlying the stepped surfaces of the alternating stack {(132, 146), (232, 246)}; and a laterally-insulated via structure {(66, 641, 642) or 86} vertically extending through the alternating stack {(132, 146), (232, 246)} and the retro-stepped dielectric material portion (265 and/or 165), wherein the laterally-insulated via structure {(66, 641, 642) or 86} comprises a conductive via structure (66 or 86C) having an upper conductive via portion (66U in FIG. 66 or an upper region of 86P in FIG. 28C) overlying and contacting an annular area of a top surface of one of the electrically conductive layers (146 or 246), a lower conductive via portion (66L in FIG. 66 or 86S in FIG. 28C) having a lesser lateral dimension than the upper conductive via portion (66U or the upper region of 86P) and extending through at least a bottommost one of the electrically conductive layers (146, 246), and an interconnection conductive via portion (661 in FIG. 66 or a bottom section of 86S in FIG. 28C) located between the upper conductive via portion (66U or the upper region of 86P) and the lower conductive via portion (66L or 86S) and contacting a cylindrical sidewall of the one of the electrically conductive layers (146 or 246).

In some embodiments, the upper conductive via portion (66U or the upper region of 86P) has a first lateral dimension (D1 in FIG. 66) between a facing pair of sidewalls thereof, and the lower conductive via portion (66L or 86S) has a second lateral dimension (D2 in FIG. 66) that is less than the first lateral dimension D1 between a facing pair of sidewalls thereof.

In some embodiments, the interconnection conductive via portion (66L in FIG. 66 or 86S in FIG. 28C) has a third lateral dimension (D3 in FIG. 66) between a facing pair of sidewalls thereof, and the third lateral dimension D3 is greater than the second lateral dimension D2 and is less than the first lateral dimension D1.

In one embodiment, lower-level metal interconnect structures 780 can be embedded in lower-level dielectric material layers 760 between the substrate 8 and the alternating stack {(132, 146), (232, 246)}. A bottom surface of the lower conductive via portion 66L contacts an area of a top surface of one of the lower-level metal interconnect structures 780.

In some embodiments, the laterally-insulated via structure {(66, 641, 642) or 86} comprises an upper insulating spacer (641 or 844). The upper insulating spacer (641 or 844) laterally surrounds the upper conductive via portion (66U or 86P) and overlies an additional annular area of the top surface of the one of the electrically conductive layers (146, 246). In one embodiment, the upper insulating spacer 641 may directly contact the additional annular area of the top surface of the one of the electrically conductive layers (146, 246).

In some embodiment, the laterally-insulated via structure {(66, 641, 642) or 86} comprises a lower insulating spacer (642 or 842) that laterally surrounds the lower conductive via portion (66L or 86S) and having a same material composition as, the upper insulating spacer (641 or 844). In some embodiments, the lower insulating spacer (642 or 842) contacts an annular area of the top surface of one of the lower-level metal interconnect structures 780.

In some embodiments, each of the electrically conductive layers (146, 246) comprises a respective metal nitride liner 146A and a respective metal fill portion 146B that is embedded in the respective metal nitride liner 146A. The annular area of the top surface of the one of the electrically conductive layers (146, 246) comprises an annular area of a top surface of a metal nitride liner 146A of the one of the electrically conductive layers (146, 246).

Figure 28A:
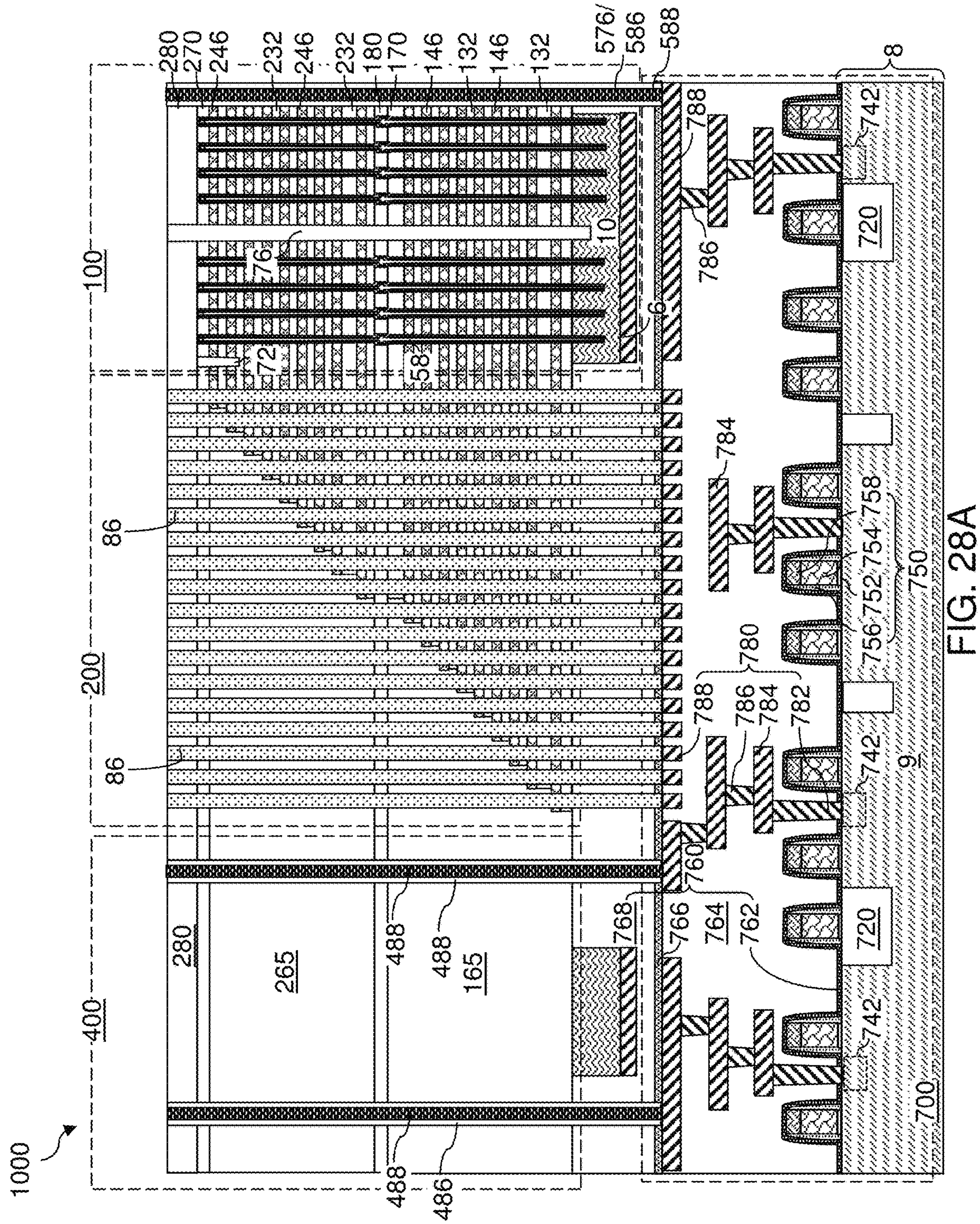
FIG. 28A is a vertical cross-sectional view of the first exemplary structure after formation of various contact via structures in the various via cavities according to the first embodiment of the present disclosure.
Figure 28B:
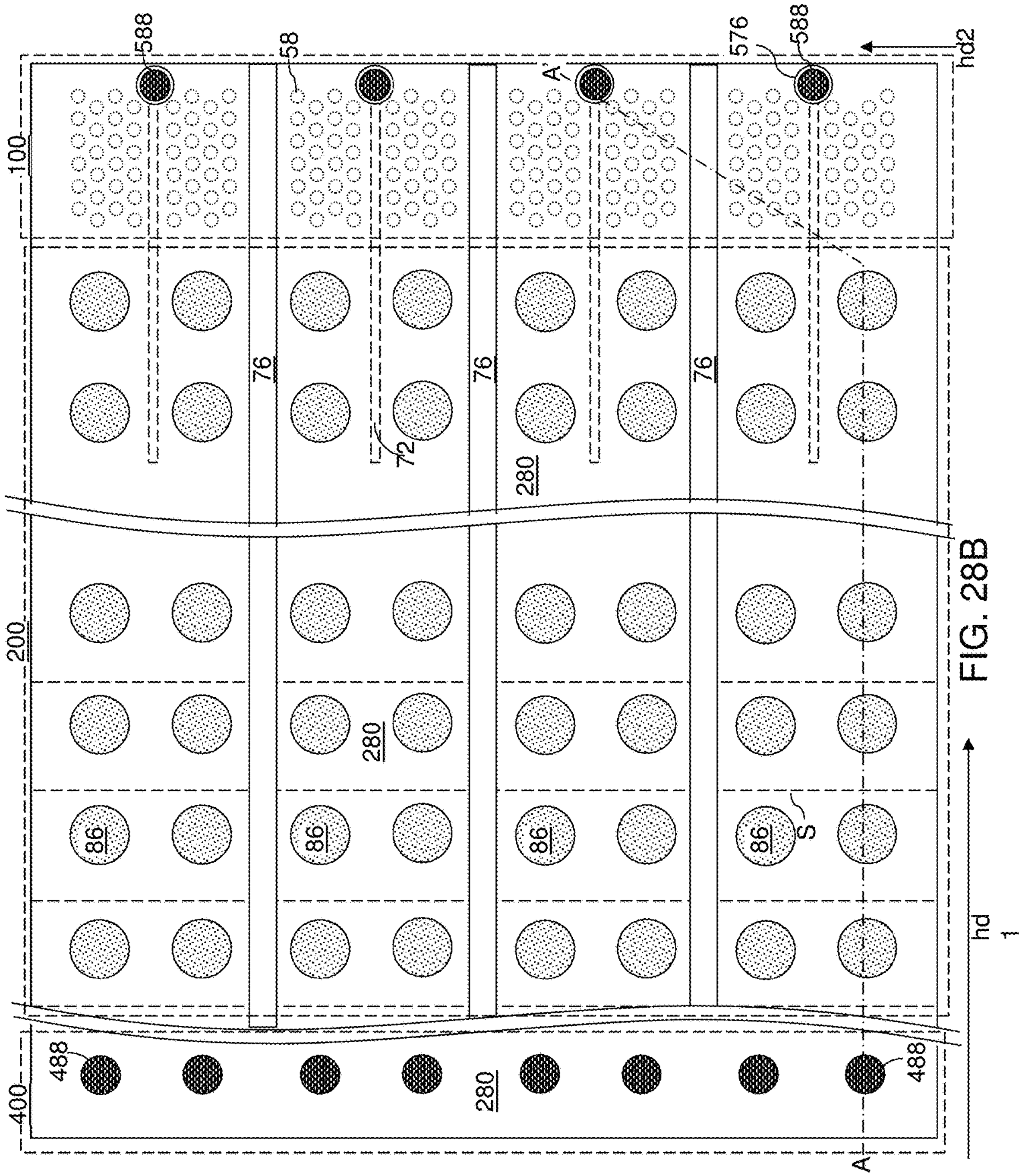
FIG. 28B is a top-down view of the first exemplary structure of FIG. 28A. The hinged vertical plane A-A' corresponds to the plane of the vertical cross-sectional view of FIG. 28A.
Figure 28C:
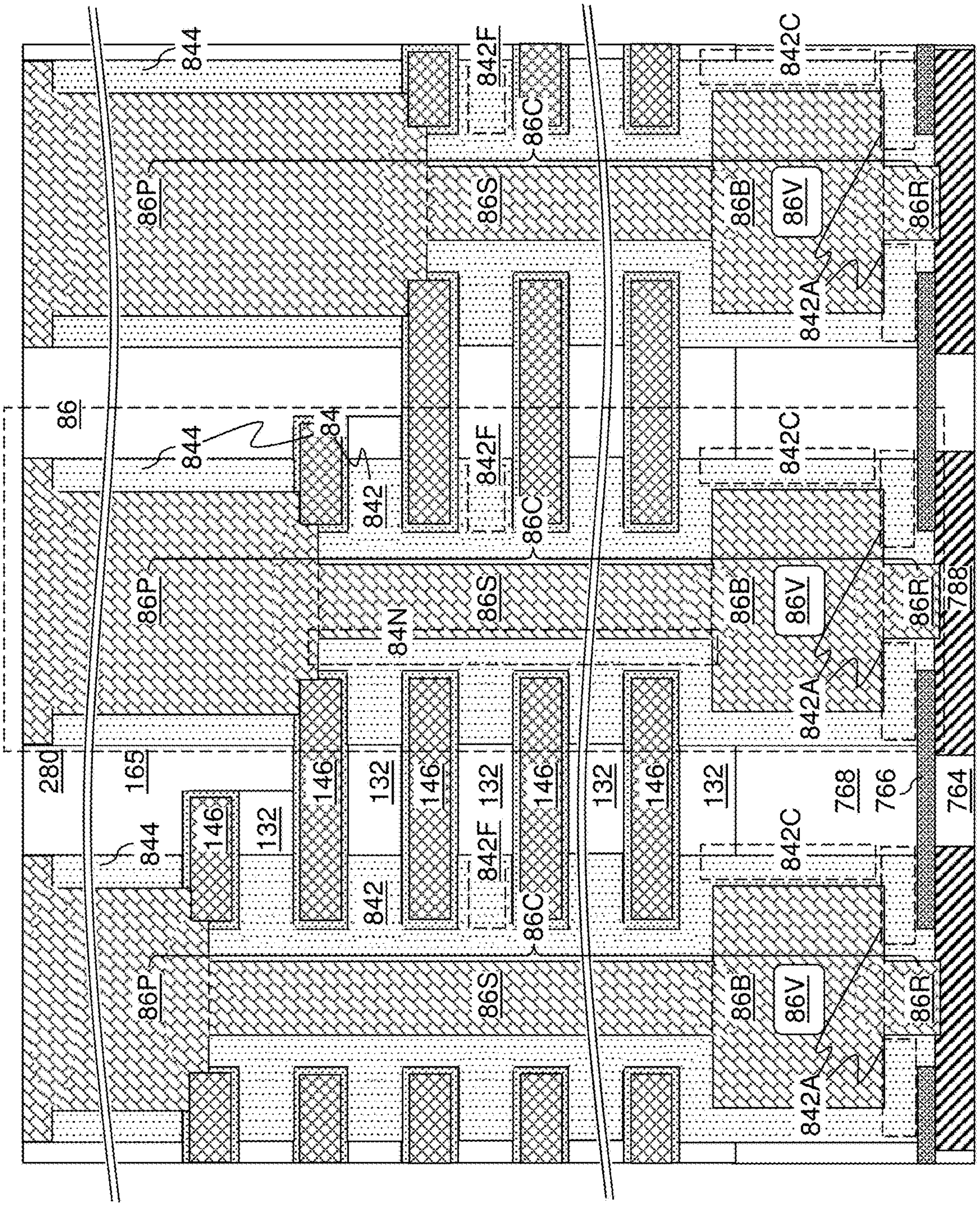
FIGS. 28C, 28D, and 28E are magnified vertical cross-sectional views of a staircase region via cavity, a peripheral region via cavity, and an array region via cavity, respectively, at the processing steps of FIGS. 28A and 28B.
Figure 28E:
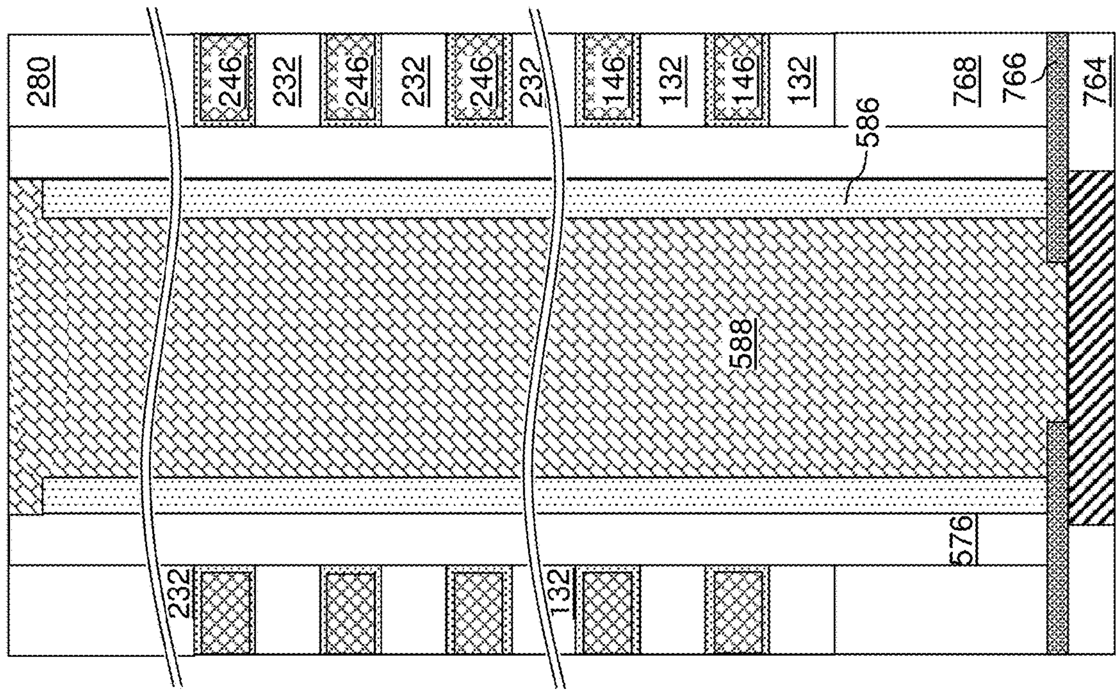
Figure 28D:
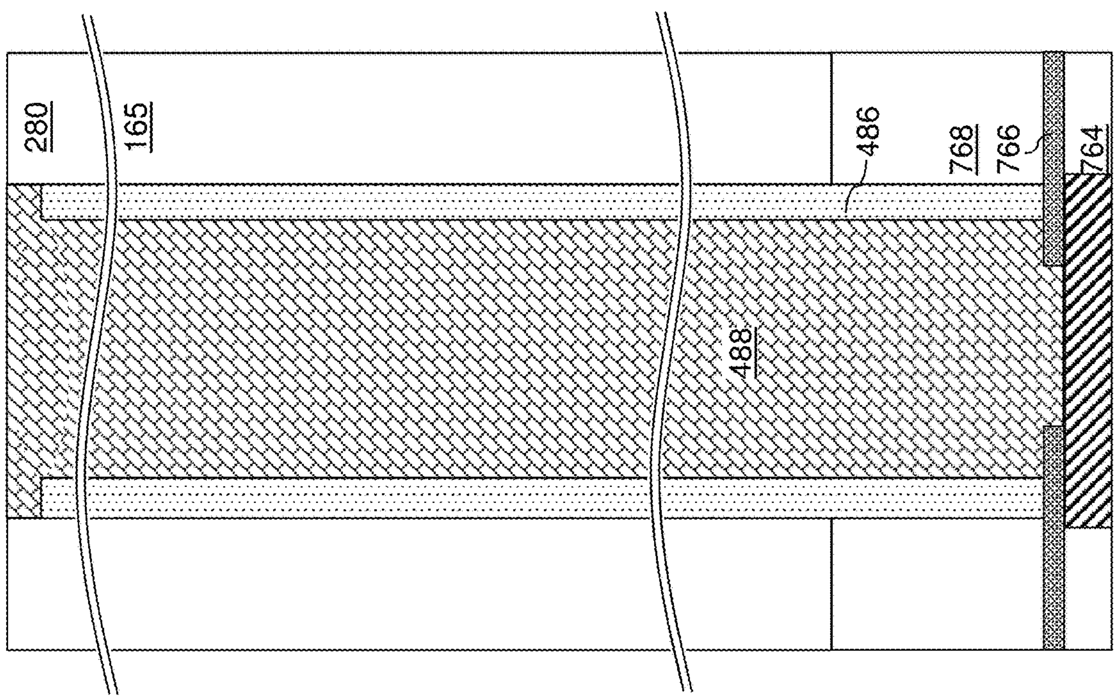
Figure 28F:
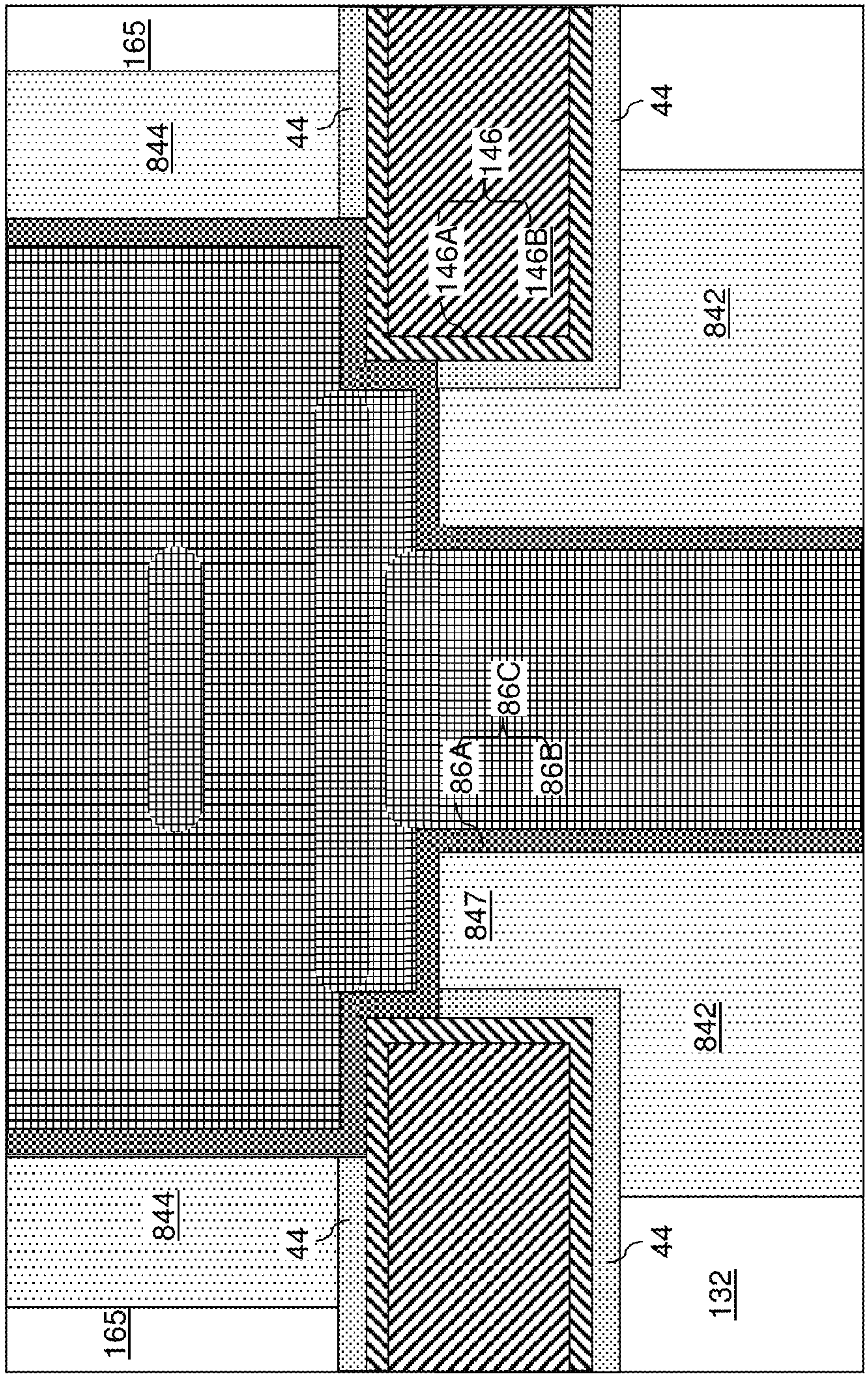
FIG. 28F is a magnified view of a region of a column-shaped conductive via structure that is formed in a staircase region via cavity.

In some embodiments, the conductive via structure (66 or 86C) comprises a metallic liner (66A or 86A) and a metal fill material portion (66B or 86B), and the metallic liner (66A or 86A) of the conductive via structure (66 or 86C) contacts the annular area of the top surface of the metal nitride liner 146A of the one of the electrically conductive layers (146, 246) as illustrated in FIGS. 28A and 66.

In some embodiments, the cylindrical sidewall of the one of the electrically conductive layers (146, 246) comprises a cylindrical sidewall of the metal nitride liner 146A of the one of the electrically conductive layers (146, 246). The metallic liner (66A or 86A) of the conductive via structure (66 or 86C) contacts the cylindrical sidewall of the metal nitride liner 146A of the one of the electrically conductive layers (146, 246).

In some embodiments, memory stack structures 55 extend through the alternating stack {(132, 146), (232, 246)}. Each of the memory stack structures 55 comprises a vertical stack of charge storage elements (as embodied as portions of the charge storage layer 54 located at the levels of the electrically conductive layers (146, 246)), a tunneling dielectric layer 56 laterally surrounded by the vertical stack of charge storage elements, and a vertical semiconductor channel 60 laterally surrounded by the tunneling dielectric layer 56. A driver circuitry containing a metal interconnect structure 780 can be provided below the alternating stack {(132, 146), (232, 246)}. The conductive via structure (66 or 86C) physically contacts the metal interconnect structure 780 located below the alternating stack {(132, 146), (232, 246)}.

The third exemplary structure according to the third embodiment described with reference to FIGS. 54-66 provides reduced contact sizes, which may provide smaller D2 connecting contacts and thus smaller total circuit sizes.

In some embodiments, the device structure comprises a monolithic three-dimensional NAND memory device, the electrically conductive layers (246, 246) comprise, or are electrically connected to, a respective word line of the monolithic three-dimensional NAND memory device, and the substrate 8 comprises a silicon substrate. In one embodiment, the monolithic three-dimensional NAND memory device comprises an array of monolithic three-dimensional NAND strings over the silicon substrate, at least one memory cell in a first device level of the array of monolithic three-dimensional NAND strings is located over another memory cell in a second device level of the array of monolithic three-dimensional NAND strings, and the silicon substrate contains an integrated circuit comprising a driver circuit for the memory device located thereon. In one embodiment, the electrically conductive layers (146, 246) comprise a plurality of control gate electrodes having a strip shape extending substantially parallel to the top surface of the substrate, and he plurality of control gate electrodes comprise at least a first control gate electrode located in the first device level and a second control gate electrode located in the second device level. In one embodiment, the array of monolithic three-dimensional NAND strings comprises: a plurality of semiconductor channels 60, wherein at least one end portion of each of the plurality of semiconductor channels extends substantially perpendicular to a top surface of the substrate 8, and one of the plurality of semiconductor channels 60 including the vertical semiconductor channel 60, and a plurality of charge storage elements, each charge storage element located adjacent to a respective one of the plurality of semiconductor channels 60.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a device structure, comprising:

forming an alternating stack of insulating layers and sacrificial material layers including stepped surfaces in a staircase region over a substrate;

forming a retro-stepped dielectric material portion over the stepped surfaces of the alternating stack;

forming sacrificial via fill structures through the retro-stepped dielectric material portion and the alternating stack, each of the sacrificial via fill structures comprising a respective insulating liner that is a single continuous structure contacting a top surface of only one respective sacrificial material layer of the sacrificial material layers, a sidewall of a respective opening through the retro-stepped dielectric material portion, and a sidewall of a bottommost one of the sacrificial material layers;

replacing the sacrificial material layers with electrically conductive layers while each of the insulating liners are present within the sacrificial via fill structures; and replacing the sacrificial via fill structures with laterally-insulated via structures, wherein each of the laterally-insulated via structures comprises a conductive via structure contacting an annular area of a top surface of a respective one of the electrically conductive layers.

2. The method of claim 1, further comprising:

forming a patterning film over the retro-stepped dielectric material portion and the alternating stack; and forming contact via openings by anisotropically etching through the patterning film and the retro-stepped dielectric material portion, wherein each of the contact via openings has a respective bottommost surface that coincides with a top surface of a respective one of the sacrificial material layers, and the top surfaces of the sacrificial material layers are physically exposed as the bottommost surfaces of the contact via openings, and wherein volumes of the contact via openings are subsequently filled with portions of the sacrificial via fill structures.

3. The method of claim 2, further comprising:

forming sacrificial tubular liners at a periphery of each of the contact via openings; and forming cylindrical via cavities by anisotropically etching through regions of the alternating stack that are not masked by the patterning film or the sacrificial tubular liners, wherein the sacrificial via fill structures are formed within volumes formed by removal of the sacrificial tubular liners and the cylindrical via cavities.

4. The method of claim 3, further comprising:

depositing a continuous sacrificial liner material layer within the contact via openings and over the patterning film; and anisotropically etching the continuous sacrificial liner material layer, wherein remaining portions of the continuous sacrificial liner material layer constitute the sacrificial tubular liners.

5. The method of claim 3, wherein the volumes formed by removal of the sacrificial tubular liners and volumes of the cylindrical via cavities collectively comprise two-tier via cavities;

each of the two-tier via cavities comprises an upper-tier volume extending through the retro-stepped dielectric material portion and a lower-tier volume extending through the respective one of the sacrificial material layers; and wherein the sacrificial via fill structures are formed through the retro-stepped dielectric material portion and the alternating stack within volumes of the two-tier via cavities.

6. The method of claim 5, wherein:

the lower-tier volume has a lesser lateral extent than the upper-tier volume;

the upper-tier volume overlies a physically exposed portion of a top surface of a respective one of the sacrificial material layers; and a respective sidewall of the bottommost one of the sacrificial material layers is physically exposed to the lower-tier volume.

7. The method of claim 5, further comprising forming lower-level metal interconnect structures embedded in lower-level dielectric material layers over the substrate, wherein:

the alternating stack is formed over the lower-level metal interconnect structures; and a top surface of a respective one of the lower-level metal interconnect structures is physically exposed at a bottom of each of the two-tier via cavities.

8. The method of claim 5, further comprising:

depositing an insulating liner layer in the two-tier via cavities;

depositing a sacrificial via fill material on the insulating liner layer; and planarizing the sacrificial via fill material and portions of the insulating liner layer, wherein remaining portions of the sacrificial via fill material and the insulating liner layer constitute the sacrificial via fill structures.

9. The method of claim 8, wherein:

the insulating layers comprise silicon oxide;

the sacrificial material layers comprise silicon nitride;

the insulating liner layer comprises silicon oxide; and the sacrificial via fill material comprises a material selected from silicon nitride and a semiconductor material.

10. The method of claim 8, wherein:

each of the insulating liners is a remaining portion of the insulating liner layer; and each of the sacrificial via fill structures comprises a sacrificial via fill material portions is a remaining portion of the sacrificial via fill material; and the method further comprises removing each sacrificial via fill material portion employing an isotropic etch process after replacing the sacrificial material layers with the electrically conductive layers.

11. The method of claim 10, further comprising anisotropically etching the insulating liners, wherein each of the insulating liners is divided into an upper insulating spacer contacting a top surface of a respective one of the electrically conductive layers and a lower insulating spacer laterally surrounded by a bottommost one of the electrically conductive layers.

12. The method of claim 1, further comprising forming memory stack structures through the alternating stack, wherein each of the memory stack structures comprises a vertical stack of charge storage elements, a tunneling dielectric layer laterally surrounded by the vertical stack of charge storage elements, and a vertical semiconductor channel laterally surrounded by the tunneling dielectric layer.

13. The method of claim 2, wherein the bottommost surfaces of the contact via openings are vertically offset from each other.

14. The method of claim 2, wherein the contact via openings do not extend through any of the sacrificial material layers or any of the insulating layers.

15. The method of claim 5, wherein each of the two-tier cavities comprises:

a first sidewall that extends straight vertically from a top surface of the retro-stepped dielectric material portion to a top surface of a respective one of the sacrificial material layers; and a second sidewall that extends straight vertically from the top surface of the respective one of the sacrificial material layers at least down to a bottom surface of a bottommost layer of the alternating stack.

16. The method of claim 15, further comprising conformally depositing an insulating liner layer on each first sidewall, each second sidewall, and each physically exposed portion of the top surfaces of the sacrificial material layers.

17. The method of claim 16, wherein the insulating liners are formed within the two-tier cavities, wherein each of the insulating liners comprises a respective portion of the insulating liner layer that is located within a respective one of the two-tier cavities, and wherein the sacrificial via fill structures are formed inside a respective one of the insulating liners.

18. The method of claim 17, further comprising dividing each insulating liner into an upper insulating spacer and a lower spacer that do not contact each other, wherein the upper insulating spacer contacts a top surface of a respective one of the electrically conductive layers and the lower insulating spacer is laterally surrounded by a bottommost one of the electrically conductive layers and any additional electrically conductive layer, if any, located between the upper insulating spacer and the bottommost one of the electrically conductive layers.

19. The method of claim 18, wherein each insulating liner is divided into the upper insulating spacer and the lower spacer by an anisotropic etch process that is performed after removal of the sacrificial via fill structures.

20. The method of claim 1, wherein:

each of the sacrificial via fill structures comprises a combination of a sacrificial via fill material portion and the respective insulating liner;

each of the sacrificial via fill material portions is entirely removed after replacement of the sacrificial material layers with the electrically conductive layers;

each of the insulating liners is subsequently divided into an upper insulating spacer and a lower insulating spacer that are incorporated into a respective one of the laterally-insulated via structures; and each of the laterally-insulated via structures comprises the upper insulating spacer and the lower insulating spacer.

* * * * *